(12) United States Patent
Kimura

(10) Patent No.: US 8,780,307 B2
(45) Date of Patent: Jul. 15, 2014

(54) LIQUID CRYSTAL DISPLAY DEVICE AND ELECTRONIC DEVICE

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/409,288

(22) Filed: Mar. 1, 2012

(65) Prior Publication Data

US 2012/0162561 A1 Jun. 28, 2012

Related U.S. Application Data

(63) Continuation of application No. 12/977,217, filed on Dec. 23, 2010, now Pat. No. 8,130,354, which is a continuation of application No. 11/923,128, filed on Oct. 24, 2007, now Pat. No. 7,872,722.

(30) Foreign Application Priority Data

Oct. 31, 2006 (JP) ................................. 2006-297009

(51) Int. Cl.
*G02F 1/1343* (2006.01)
*G02F 1/1368* (2006.01)
*G02F 1/139* (2006.01)

(52) U.S. Cl.
USPC .............................. 349/141; 349/43; 349/139

(58) Field of Classification Search
USPC .......... 349/42, 43, 138, 139, 141; 257/43, 59, 257/72; 345/92
See application file for complete search history.

(56) References Cited

U.S. PATENT DOCUMENTS

| | | | |
|---|---|---|---|
| 5,870,160 A | 2/1999 | Yanagawa et al. |
| 6,034,757 A | 3/2000 | Yanagawa et al. |
| 6,108,066 A | 8/2000 | Yanagawa et al. |
| 6,281,953 B1 | 8/2001 | Lee et al. |

(Continued)

FOREIGN PATENT DOCUMENTS

| | | |
|---|---|---|
| CN | 1841140 A | 10/2006 |
| EP | 1737044 A | 12/2006 |

(Continued)

OTHER PUBLICATIONS

Office Action, Chinese Application No. 200710184974.X, dated Aug. 5, 2010, 22 pages with English translation.

(Continued)

*Primary Examiner* — Dung Nguyen
*Assistant Examiner* — Tai Duong
(74) *Attorney, Agent, or Firm* — Fish & Richardson P.C.

(57) ABSTRACT

To provide a semiconductor device, a liquid crystal display device, and an electronic device which have a wide viewing angle and in which the number of manufacturing steps, the number of masks, and manufacturing cost are reduced compared with a conventional one. The liquid crystal display device includes a first electrode formed over an entire surface of one side of a substrate; a first insulating film formed over the first electrode; a thin film transistor formed over the first insulating film; a second insulating film formed over the thin film transistor; a second electrode formed over the second insulating film and having a plurality of openings; and a liquid crystal over the second electrode. The liquid crystal is controlled by an electric field between the first electrode and the second electrode.

24 Claims, 71 Drawing Sheets

(56) References Cited

U.S. PATENT DOCUMENTS

| | | |
|---|---|---|
| 6,433,842 B1 | 8/2002 | Kaneko et al. |
| 6,462,723 B1 | 10/2002 | Yamazaki et al. |
| 6,590,627 B2 | 7/2003 | Tomioka et al. |
| 6,603,453 B2 | 8/2003 | Yamazaki et al. |
| 6,710,835 B2 | 3/2004 | Kurahashi et al. |
| 6,784,457 B2 | 8/2004 | Yamazaki et al. |
| 6,914,656 B2 | 7/2005 | Sakamoto et al. |
| 6,958,799 B2 | 10/2005 | Tomioka et al. |
| 6,960,787 B2 | 11/2005 | Yamazaki et al. |
| 6,961,111 B1 | 11/2005 | Kuramasu |
| 6,970,222 B2 | 11/2005 | Nakayoshi et al. |
| 7,088,409 B2 | 8/2006 | Itou et al. |
| 7,247,882 B2 | 7/2007 | Yamazaki et al. |
| 7,248,324 B2 | 7/2007 | Ono et al. |
| 7,251,005 B2 | 7/2007 | Ono et al. |
| 7,251,006 B2 | 7/2007 | Ono et al. |
| 7,253,863 B2 | 8/2007 | Ono et al. |
| 7,256,854 B2 | 8/2007 | Ono et al. |
| 7,271,869 B2 | 9/2007 | Ono et al. |
| 7,307,673 B2 | 12/2007 | Nakayoshi et al. |
| 7,423,701 B2 | 9/2008 | Nakayoshi et al. |
| 7,423,713 B2 | 9/2008 | Kurasawa |
| 7,456,924 B2 | 11/2008 | Ono et al. |
| 7,605,876 B2 | 10/2009 | Nakayoshi et al. |
| 7,683,996 B2 | 3/2010 | Ono et al. |
| 7,692,748 B2 | 4/2010 | Ono et al. |
| 7,697,100 B2 | 4/2010 | Ono et al. |
| 7,705,949 B2 | 4/2010 | Ono et al. |
| 7,733,455 B2 | 6/2010 | Ono et al. |
| 7,791,072 B2 | 9/2010 | Kumomi et al. |
| 7,816,682 B2 | 10/2010 | Kimura |
| 7,851,797 B2 | 12/2010 | Yamazaki et al. |
| 7,872,696 B2 | 1/2011 | Nakayoshi et al. |
| 7,928,938 B2 | 4/2011 | Osame et al. |
| 7,936,429 B2 | 5/2011 | Ono et al. |
| 8,035,786 B2 | 10/2011 | Ono et al. |
| 8,045,116 B2 | 10/2011 | Ono et al. |
| 8,072,569 B2 * | 12/2011 | Kaneko et al. ................ 349/141 |
| 8,203,661 B2 | 6/2012 | Nakayoshi |
| 8,218,118 B2 | 7/2012 | Ono et al. |
| 8,218,119 B2 | 7/2012 | Ono et al. |
| 8,237,166 B2 | 8/2012 | Kumomi et al. |
| 8,248,548 B2 | 8/2012 | Nakayoshi |
| 8,248,549 B2 | 8/2012 | Nakayoshi |
| 8,310,641 B2 | 11/2012 | Nakayoshi |
| 8,338,865 B2 | 12/2012 | Kimura |
| 8,345,205 B2 | 1/2013 | Ono et al. |
| 8,493,522 B2 | 7/2013 | Nakayoshi |
| 8,493,537 B2 | 7/2013 | Ono et al. |
| 8,564,752 B2 | 10/2013 | Ono et al. |
| 8,648,989 B2 | 2/2014 | Ono et al. |
| 2003/0001832 A1 | 1/2003 | Yamazaki et al. |
| 2003/0218664 A1 | 11/2003 | Sakamoto et al. |
| 2005/0105033 A1 | 5/2005 | Itou et al. |
| 2005/0259207 A1 | 11/2005 | Yang et al. |
| 2005/0264731 A1 | 12/2005 | Itou et al. |
| 2006/0092356 A1 | 5/2006 | Morimoto et al. |
| 2006/0092363 A1 | 5/2006 | Hasegawa et al. |
| 2006/0187371 A1 | 8/2006 | Nakayoshi et al. |
| 2006/0192912 A1 | 8/2006 | Itou et al. |
| 2006/0215086 A1 | 9/2006 | Kurasawa |
| 2006/0215087 A1 | 9/2006 | Matsushima et al. |
| 2006/0267891 A1 | 11/2006 | Nishimura et al. |
| 2007/0126968 A1 | 6/2007 | Uochi |
| 2007/0126969 A1 | 6/2007 | Kimura et al. |
| 2007/0146591 A1 | 6/2007 | Kimura et al. |
| 2007/0194379 A1 | 8/2007 | Hosono et al. |
| 2007/0236640 A1 | 10/2007 | Kimura |
| 2007/0284627 A1 | 12/2007 | Kimura |
| 2008/0002079 A1 | 1/2008 | Kimura |
| 2009/0096974 A1 | 4/2009 | Ono et al. |
| 2009/0278122 A1 | 11/2009 | Hosono et al. |
| 2009/0280600 A1 | 11/2009 | Hosono et al. |
| 2011/0032435 A1 | 2/2011 | Kimura |
| 2011/0101352 A1 | 5/2011 | Hosono et al. |
| 2011/0187762 A1 | 8/2011 | Osame et al. |
| 2011/0201162 A1 | 8/2011 | Hosono et al. |
| 2012/0012838 A1 | 1/2012 | Hosono et al. |
| 2013/0128174 A1 | 5/2013 | Kimura |
| 2013/0201419 A1 | 8/2013 | Ono et al. |
| 2013/0286313 A1 | 10/2013 | Nakayoshi |
| 2014/0043556 A1 | 2/2014 | Ono et al. |

FOREIGN PATENT DOCUMENTS

| | | |
|---|---|---|
| EP | 1843194 A | 10/2007 |
| EP | 2226847 A | 9/2010 |
| EP | 2246894 A | 11/2010 |
| EP | 2413366 A | 2/2012 |
| JP | 08-078329 A | 3/1996 |
| JP | 10-003092 A | 1/1998 |
| JP | 2000-284326 A | 10/2000 |
| JP | 2001-051292 A | 2/2001 |
| JP | 2001-154218 A | 6/2001 |
| JP | 2001-175198 A | 6/2001 |
| JP | 2002221736 A | 8/2002 |
| JP | 2003-068757 A | 3/2003 |
| JP | 2003-107445 A | 4/2003 |
| JP | 2003-195352 A | 7/2003 |
| JP | 3742836 B2 | 2/2006 |
| JP | 2006-106110 A | 4/2006 |
| JP | 2006-126855 A | 5/2006 |
| JP | 2006-165528 A | 6/2006 |
| JP | 2006-184325 A | 7/2006 |
| JP | 2006-276111 A | 10/2006 |
| JP | 2006-276112 A | 10/2006 |
| JP | 2006-286719 A | 10/2006 |
| JP | 2006-286772 A | 10/2006 |
| JP | 2014-002392 A | 1/2014 |
| KR | 2001-0060835 A | 7/2001 |
| KR | 2002-0041426 A | 6/2002 |
| KR | 2002-0070756 A | 9/2002 |
| KR | 2003-0031443 A | 4/2003 |
| KR | 2006-0110202 A | 10/2006 |
| TW | 589480 A | 6/2004 |
| TW | 200809357 A | 2/2008 |
| WO | 01/18597 A1 | 3/2001 |
| WO | WO-2005/088726 | 9/2005 |

OTHER PUBLICATIONS

S. H. Lee et al.; "29.2: 18.1 Ultra-FFS TFT-LCD with Super Image Quality and Fast Response Time"; SID '01 Digest : SID International Symposium Digest of Technical Papers; vol. 32, pp. 484-487; 2001.

J.H. Song et al.; "Electro-optic Characteristics of Fringe-Field Driven Transflective LCD with Dual Cell Gap"; IDW/AD '05, vol. 1; pp. 103-106; 2005.

M.O. Choi et al.; "P-110: A Single Gap Transflective Display using a Fringe-Field Driven Homogeneously Aligned Nematic Liquid Crystal Display"; SID '05 Digest : SID International Symposium Digest of Technical Papers; vol. 36, pp. 719-721; 2005.

Ruibo Lu et al.; "4.4: Transflective Liquid Crystal Display Using In-plane Switching Effect"; Conference Record of the 2006 IDRC (International Display Research Conference); pp. 39-42; 2006.

Gak Seok Lee et al.; "6.3: Design of Wide-Viewing-Angle Transflective IPS LCD", Conference Record of the 2006 IDRC (International Display Research Conference); pp. 75-77; 2006.

Norio Aoki; "16.3: Invited Paper: Advanced IPS Technology for Mobile Applications", SID '06 Digest : SID International Symposium Digest of Technical Papers; vol. 37, pp. 1087-1090; 2006.

Michiaki Sakamoto et al.; "L-6: Late-News Paper: Development of the Novel Transflective LCD Module Using Super-Fine-TFT Technology"; SID '06 Digest : SID International Symposium Digest of Technical Papers, vol. 37, pp. 1669-1672; 2006.

Gak Seok Lee et al.; "Optical Configurations of Horizontal-Switching Transflective LCDs in Double Cellgap Structure"; IDW/AD '05, vol. 1, pp. 111-114; 2005.

Osamu Itou et al.; "P-231L: Late-News Poster: A Wide Viewing Angle Transflective IPS LCD Applying New Optical Design"; SID '06 Digest : Side International Symposium Digest of Technical Papers; vol. 37, pp. 832-835; 2006.

(56) References Cited

OTHER PUBLICATIONS

Jae Geon You et al.; "23.4 Characteristics and Reliabilities of the Ion Beam Irradiated Polyimide as an LC Alignment Layer"; SID '05 Digest : Side International Symposium Digest of Technical Papers; vol. 36, pp. 1089-1091; 2005.

Taiwanese Office Action (TW Application No. 96139500) dated Oct. 21, 2013, with English translation (14 pages).
Office Action, Korean Application No. 2007-0109956, dated Dec. 29, 2013, 18 pages with English translation.
Korean Office Action (Application No. 2014-0023558) Dated Apr. 30, 2014.

* cited by examiner

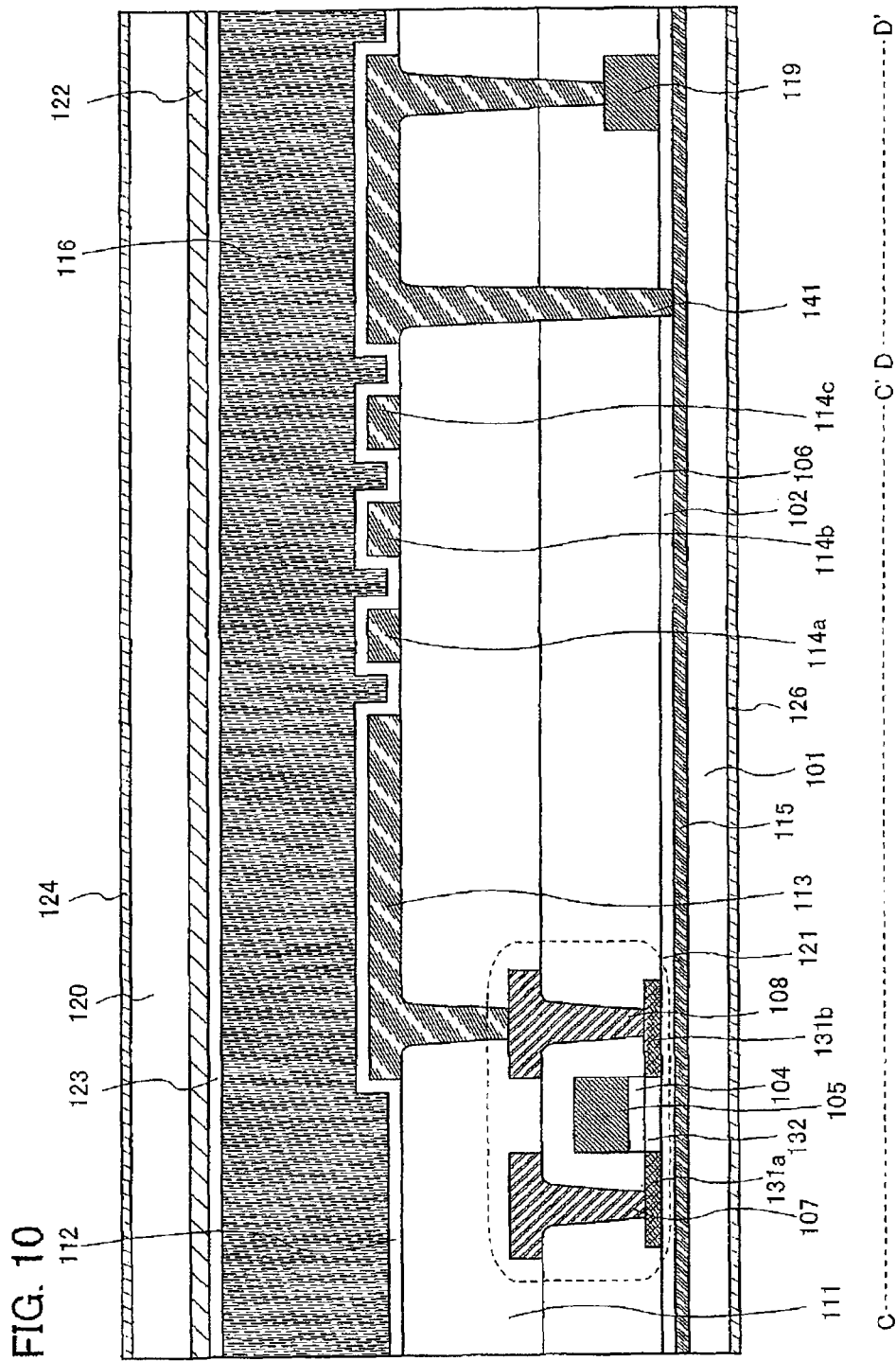

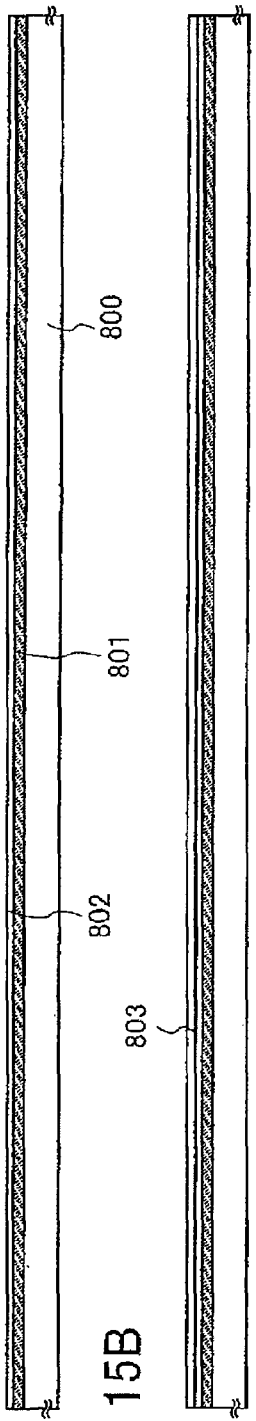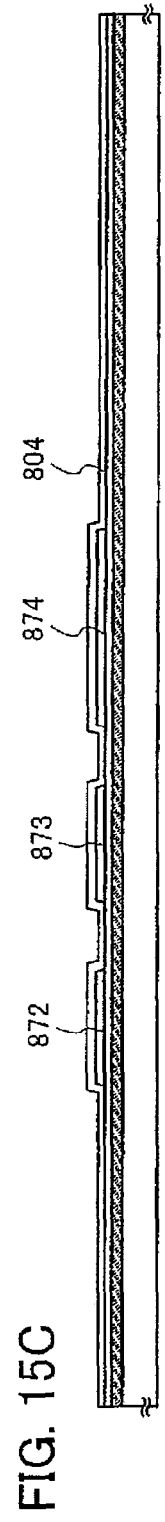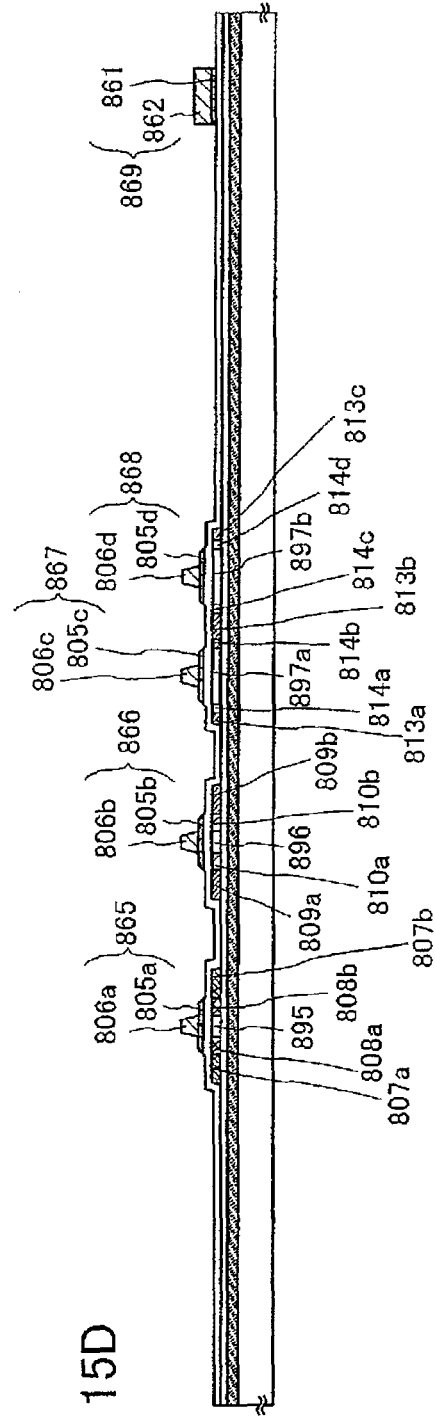
FIG. 15A
FIG. 15B
FIG. 15C
FIG. 15D

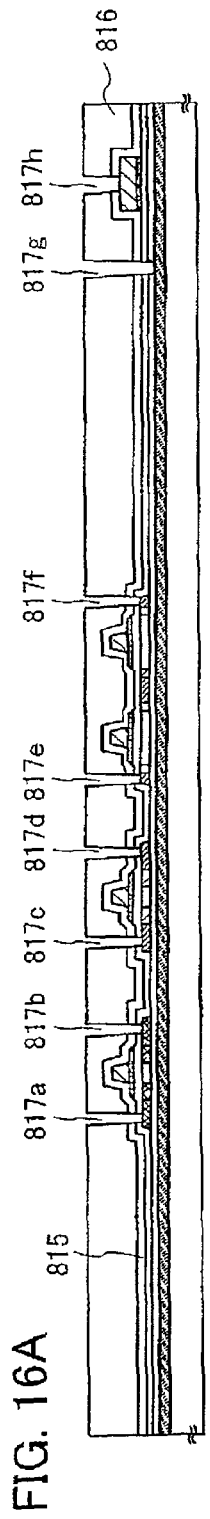
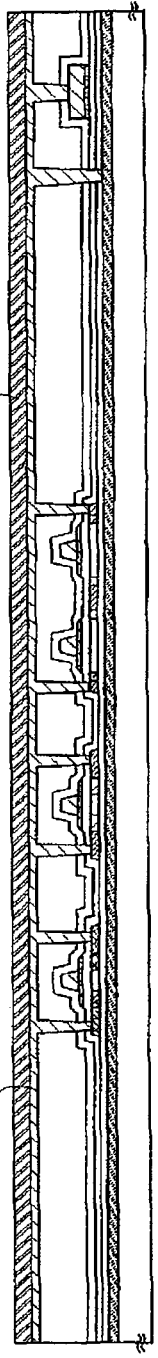
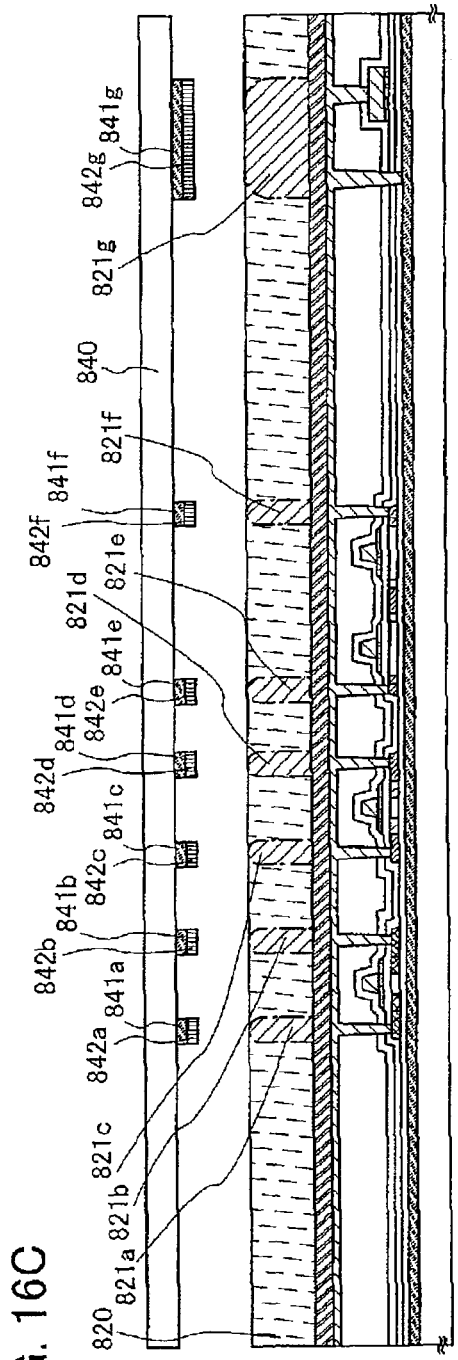

LIQUID CRYSTAL DISPLAY DEVICE AND ELECTRONIC DEVICE

CROSS-REFERENCE TO RELATED APPLICATIONS

This application is a continuation of U.S. application Ser. No. 12/977,217, filed Dec. 23, 2010, which is a continuation of U.S. application Ser. No. 11/923,128, filed Oct. 24, 2007, now U.S. Pat. No. 7,872,722, which claims the benefit of a foreign priority application filed in Japan as Serial No. 2006-297009 on Oct. 31, 2006, all of which are incorporated by reference.

BACKGROUND OF THE INVENTION

1. Field of the Invention

The present invention relates to a semiconductor device and a liquid crystal display device. In particular, the present invention relates to a semiconductor device and a liquid crystal display device in which liquid crystal molecules are controlled by generating an electric field having a component parallel to a substrate.

2. Description of the Related Art

One of technical development strategies of a liquid crystal display device is to widen a viewing angle. As a technique for realizing a wide viewing angle, a method is used in which a gray scale is controlled by generating an electric field parallel (i.e., in a lateral direction) to a substrate to move liquid crystal molecules in a plane parallel to the substrate.

Examples of such a method include an IPS (In-Plane Switching) mode and an FFS (Fringe-Field Switching) mode.

In an IPS mode liquid crystal display device, two comb-shaped electrodes (also referred to as comb-teeth electrodes or comb electrodes) are provided over one of a pair of substrates. Liquid crystal molecules are moved within a plane parallel to the substrate by a horizontal electric field generated by potential difference between these electrodes (one of the comb-shaped electrodes is a pixel electrode and the other thereof is a common electrode).

In an FFS mode liquid crystal display device, a second electrode (e.g., a pixel electrode in which voltage for each pixel is controlled) having an opening is provided below a liquid crystal, and a first electrode (e.g., a common electrode in which common voltage is applied to all pixel) is provided below the opening in some cases. An electric field is applied between the pixel electrode and the common electrode to control the liquid crystal. An electric field in a parallel direction is applied to the liquid crystal, so that liquid crystal molecules can be controlled using the electric field. That is, liquid crystal molecules aligned parallel to a substrate (so-called homogeneous alignment) can be controlled in a direction parallel to the substrate, so that a viewing angle is widened.

In conventional semiconductor device and liquid crystal display device which control liquid crystal molecules, a pixel electrode or a common electrode has been formed of a light-transmitting conductive film, for example, indium tin oxide (ITO) (see Patent Document 1: Japanese Patent No. 3742836).

SUMMARY OF THE INVENTION

As described above, a pixel electrode or a common electrode has been formed of a light-transmitting conductive film, for example, ITO. In order to manufacture a semiconductor device which controls transmissive liquid crystal molecules and a transmissive liquid crystal display device, a pixel electrode and a common electrode are needed to be formed of a light-transmitting conductive film. Conventionally, after formation of a light-transmitting conductive film, the light-transmitting conductive film has been processed to form a pixel electrode and a common electrode by etching or the like. Thus, the number of manufacturing steps and the number of masks have been increased, and manufacturing cost has been increased.

In view of the above, objects of the invention are to provide a semiconductor device, a liquid crystal display device, and an electronic device which have a wide viewing angle and in which the number of manufacturing steps and the number of masks are small and manufacturing cost is low.

In the invention, a light-transmitting conductive film is formed to use as one of a pixel electrode and a common electrode of a liquid crystal display device without processing. Thus, the light-transmitting conductive film is not needed to be processed by etching or the like, so that the number of manufacturing steps and the number of masks can be reduced and manufacturing cost can be suppressed.

Note that a liquid crystal element is acceptable as long as arrangement of liquid crystal molecules controlling the amount of light can be rotated in a direction generally parallel to a substrate by a horizontal electric field generated by potential difference between a pixel electrode and a common electrode which is connected in common with a plurality of pixels in a pixel portion.

One aspect of the invention is a liquid crystal display device which includes a first electrode formed over an entire surface of one side of a substrate; a first insulating film formed over the first electrode; a thin film transistor formed over the first insulating film; a second insulating film formed over the thin film transistor; a second electrode formed over the second insulating film and having a plurality of openings; and a liquid crystal over the second electrode. The liquid crystal is controlled by an electric field between the first electrode and the second electrode.

In the invention, the thin film transistor may be a top-gate thin film transistor.

In the invention, the thin film transistor may be a bottom-gate thin film transistor.

In the invention, the first electrode and the second electrode may be light-transmitting conductive films.

In the invention, one of the first electrode and the second electrode may be a light-transmitting conductive film and the other thereof may be a reflective conductive film.

The invention also relates to an electronic device provided with a liquid crystal display device formed using the invention.

The following description is for structures applicable to a liquid crystal display device and a semiconductor device of the invention. The structures described hereinafter can be applied to a liquid crystal display device and a semiconductor device of the invention when needed.

Note that various types of switches can be used as a switch. An electrical switch, a mechanical switch, and the like are given as examples. That is, any element can be used without being limited to a particular type as long as it can control a current flow. For example, a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), a thyristor, or the like can be used as a switch. Further, a logic circuit combining such elements can be used as a switch.

Examples of a mechanical switch include a switch formed using a micro electro mechanical system (MEMS) technology, such as a digital micro mirror device (DMD).

Such a switch includes an electrode which can be moved mechanically, and operates by controlling connection or non-connection based on movement of the electrode.

In the case where a transistor is used as a switch, polarity (a conductivity type) of the transistor is not particularly limited since it operates just as a switch. However, when off-current is preferably to be suppressed, a transistor of polarity with smaller off-current is preferably used. As a transistor with smaller off-current, a transistor having an LDD region, a transistor having a multi-gate structure, and the like are given as examples. Further, an n-channel transistor is preferably used when the transistor operates with a potential of a source terminal closer to a potential of a low potential side power supply (e.g., Vss, GND, or 0 V). On the other hand, a p-channel transistor is preferably used when the transistor operates with a potential of a source terminal close to a potential of a high potential side power supply (e.g., Vdd). This is because when the n-channel transistor operates with the potential of the source terminal close to a low potential side power supply or the p-channel transistor operates with the potential of the source terminal close to a high potential side power supply, an absolute value of a gate-source voltage can be increased; thus, the transistor can more precisely operate as a switch. This is because reduction in output voltage does not occur often since the transistor does not often perform a source follower operation.

Note that a CMOS switch may also be employed by using both n-channel and p-channel transistors. A CMOS switch can easily function as a switch since a current can flow when one of the n-channel transistor and the p-channel transistor is turned on. For example, a voltage can be output as appropriate whether a voltage of an input signal to the switch is high or low. Further, since a voltage amplitude value of a signal for turning on/off a switch can be decreased, power consumption can be reduced.

Note that when a transistor is used as a switch, the switch includes an input terminal (one of a source terminal and a drain terminal), an output terminal (the other of the source terminal and the drain terminal), and a terminal (a gate terminal) for controlling electrical conduction. On the other hand, when a diode is used as a switch, the switch does not have a terminal for controlling electrical conduction in some cases. Therefore, when a diode is used as a switch, the number of wirings for controlling terminals can be reduced compared with the case where a transistor is used as a switch.

Note that when it is explicitly described that A and B are connected, the case where A and B are electrically connected, the case where A and B are functionally connected, and the case where A and B are directly connected are included. Here, each of A and B is an object (e.g., a device, an element, a circuit, a wiring, an electrode, a terminal, a conductive film, or a layer). Accordingly, another element may be provided in a connection relationship shown in drawings and texts, without being limited to a predetermined connection relationship, for example, connection relationships shown in the drawings and the texts.

For example, when A and B are electrically connected, one or more elements which enable electrical connection of A and B (e.g., a switch, a transistor, a capacitor, an inductor, a resistor, or a diode) may be provided between A and B. In addition, when A and B are functionally connected, one or more circuits which enable functional connection of A and B (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a voltage step-up circuit or a voltage step-down circuit) or a level shifter circuit for changing a potential level of a signal; a voltage source; a current source; a switching circuit; or an amplifier circuit which can increase signal amplitude, the amount of current, or the like, such as an operational amplifier, a differential amplifier circuit, a source follower circuit, or a buffer circuit, a signal generation circuit; a memory circuit; or a control circuit may be provided between A and B. Alternatively, in the case where A and B are directly connected, A and B may be directly connected without interposing another element or another circuit therebetween.

When it is explicitly described that A and B are directly connected, the case where A and B are directly connected (i.e., the case where A and B are connected without interposing another element or another circuit therebetween) and the case where A and B are electrically connected (i.e., the case where A and B are connected by interposing another element or another circuit therebetween) are included.

In addition, when it is explicitly described that A and B are electrically connected, the case where A and B are electrically connected (i.e., the case where A and B are connected by interposing another element or another circuit therebetween), the case where A and B are functionally connected (i.e., the case where A and B are functionally connected by interposing another circuit therebetween), and the case where A and B are directly connected (i.e., the case where A and B are connected without interposing another element or another circuit therebetween) are included. That is, when it is explicitly described that A and B are electrically connected, the description is the same as the case where it is explicitly only described that A and B are connected.

Note that a display element, a display device which is a device including a display element, a light-emitting element, and a light-emitting device which is a device including a light-emitting element can employ various types and can include various elements. For example, as a display element, a display device, a light-emitting element, and a light-emitting device, a display medium, contrast, luminance, reflectivity, transmittance, or the like of which is changed by electromagnetic action, such as an EL (electroluminescence) element (e.g., an EL element including both organic and inorganic materials, an organic EL element, or an inorganic EL element), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube can be used. Note that display devices using an EL element include an EL display; display devices using an electron emitter include a field emission display (FED), an SED-type flat panel display (SED: Surface-conduction Electron-emitter Display), and the like; display devices using a liquid crystal element include a liquid crystal display (e.g., a transmissive liquid crystal display, a transflective liquid crystal display, a reflective liquid crystal display, a direct-view liquid crystal display, or a projection type liquid crystal display; and display devices using electronic ink include electronic paper.

Note that an EL element is an element including an anode, a cathode, and an EL layer interposed between the anode and the cathode.

Examples of the EL layer include various types of EL layers, for example, a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer formed of an organic material, a layer formed of an inorganic material, a layer formed of an organic material and an inorganic material, a layer including a high molecular material, a layer including a low molecular material, and a layer including a low molecular material and a high molecular material.

Note that the invention is not limited thereto, and various types of EL elements can be used.

Note that an electron emitter is an element in which electrons are extracted by high electric field concentration on a pointed cathode.

For example, the electron emitter may be any one of a Spindt type, a carbon nanotube (CNT) type, a metal-insulator-metal (MIM) type in which a metal, an insulator, and a metal are stacked, a metal-insulator-semiconductor (MIS) type in which a metal, an insulator, and a semiconductor are stacked, a MOS type, a silicon type, a thin film diode type, a diamond type, a surface conduction emitter SCD type, a thin film type in which a metal, an insulator, a semiconductor, and a metal are stacked, a HEED type, an EL type, a porous silicon type, a surface-conduction electron-emitter (SED) type, and the like. However, the invention is not limited thereto, and various elements can be used as an electron emitter.

Note that a liquid crystal element is an element which controls transmission or non-transmission of light by optical modulation action of a liquid crystal and includes a pair of electrodes and a liquid crystal.

Optical modulation action of a liquid crystal is controlled by an electric filed applied to the liquid crystal (including a horizontal electric field, a vertical electric field, and an oblique electric field).

The following can be used for a liquid crystal element: a nematic liquid crystal, a cholesteric liquid crystal, a smectic liquid crystal, a discotic liquid crystal, a thermotropic liquid crystal, a lyotropic liquid Crystal, a low molecular liquid crystal, a polymer liquid crystal, a ferroelectric liquid crystal, an anti-ferroelectric liquid crystal, a main chain type liquid crystal, a side chain type polymer liquid crystal, a plasma addressed liquid crystal (PALC), a banana-shaped liquid crystal, a TN (Twisted Nematic) mode, an STN (Super Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASV (Advanced Super View) mode, an ASM (Axially Symmetric aligned Microcell) mode, an OCB (Optical Compensated Birefringence) mode, an ECB (Electrically Controlled Birefringence) mode, an FLC (Ferroelectric Liquid Crystal) mode, an AFLC (Anti-Ferroelectric Liquid Crystal) mode, a PDLC (Polymer Dispersed Liquid Crystal) mode, and a guest-host mode.

Note that the invention is not limited thereto, and various kinds of liquid crystal elements can be used.

Note that examples of electronic paper include a device displayed by molecules which utilizes optical anisotropy, dye molecular orientation or the like; a device displayed by particles which utilizes electrophoresis, particle movement, particle rotation, phase change, or the like; a device displayed by moving one end of a film; a device using light emission or phase change of molecules; a device using optical absorption by molecules; and a device using self-light emission by combining electrons and holes. For example, the following can be used as electronic paper: a microcapsule type electrophoresis device, a horizontal type electrophoresis device, a vertical type electrophoresis device, a device using a spherical twisting ball, a device using a magnetic twisting ball, a device using a column twisting ball, a device using a charged toner, a quick-response liquid powder display, a magnetic electrophoresis type device, a magnetic heat-sensitive type device, an electrowetting type device, a light-scattering (transparent-opaque change) type device, a device using a cholesteric liquid crystal and a photoconductive layer, a cholesteric liquid crystal device, a bistable nematic liquid crystal device, a ferroelectric liquid crystal device, a liquid crystal dispersed type device with a dichroic dye, a device using a movable film, a device using coloring and decoloring properties of a leuco dye, a photochromic device, an electrochromic device, an electrodeposition device, a device using flexible organic EL, and the like.

Note that the invention is not limited thereto, and various types of electronic paper can be used.

By using a microcapsule electrophoretic device, defects of electrophoresis, which are aggregation and precipitation of phoresis particles, can be solved. Quick-response liquid powder has advantages such as high-speed response, high reflectivity, wide viewing angle, low power consumption, and memory properties.

A plasma display includes a substrate having a surface provided with an electrode, and a substrate having a surface provided with an electrode and a minute groove in which a phosphor layer is formed. In the plasma display, the substrates are opposite to each other with a narrow interval and a rare gas is sealed therein. Voltage is applied to the electrodes to generate an ultraviolet ray so as to excite the phosphor; thus, display can be performed. The plasma display panel may be a DC type PDP or an AC type PDP. As a driving method of the plasma display panel, ASW (Address While Sustain) driving, ADS (Address Display Separated) driving in which a subframe is divided into a reset period, an address period, and a sustain period, CLEAR (High-Contrast, Low Energy Address and Reduction of False Contour Sequence) driving, ALIS (Alternate Lighting of Surfaces) method, TERES (Technology of Reciprocal Sustainer) driving, and the like can be used. Note that the invention is not limited thereto, and various types of plasma displays can be used.

Note that electroluminescence, a cold cathode fluorescent lamp, a hot cathode fluorescent lamp, an LED, a laser light source, a mercury lamp, or the like can be used as a light source needed for a display device, such as a liquid crystal display device (a transmissive liquid crystal display, a transflective liquid crystal display, a reflective liquid crystal display, a direct-view liquid crystal display, and a projection type liquid crystal display), a display device using a grating light valve (GLV), and a display device using a digital micromirror device (DMD). Note that the invention is not limited thereto, and various light sources can be used.

Note that as a transistor, various types of transistors can be employed without being limited to a certain type. For example, a thin film transistor (TFT) including a non-single crystalline semiconductor film typified by amorphous silicon, polycrystalline silicon, microcrystalline (also referred to as semi-amorphous) silicon, or the like can be used. The use of the TFT has various advantages. For example, since the TFT can be formed at temperature lower than that of the case of using single crystalline silicon, reduction in manufacturing cost or increase in size of a manufacturing device can be realized. A transistor can be formed using a large substrate with increase in size of the manufacturing device. Therefore, a large number of display devices can be formed at the same time, and thus can be formed at low cost. Further, since manufacturing temperature is low, a substrate having low heat resistance can be used. Accordingly, a transistor can be formed over a light-transmitting substrate; thus, transmission of light in a display element can be controlled by using the transistor formed over the light-transmitting substrate. Alternatively, since the thickness of the transistor is thin, part of a film forming the transistor can transmit light; thus, an aperture ratio can be increased.

The use of a catalyst (e.g., nickel) when polycrystalline silicon is formed enables further improvement in crystallinity and formation of a transistor having excellent electrical characteristics. Thus, a gate driver circuit (a scan line driver circuit), a source driver circuit (a signal line driver circuit), and a signal processing circuit (e.g., a signal generation circuit, a gamma correction circuit, a DA converter circuit) can be formed over the same substrate.

The use of a catalyst (e.g., nickel) when microcrystalline silicon is formed enables further improvement in crystallinity and formation of a transistor having excellent electrical characteristics. At this time, the crystallinity can be improved by performing only heat treatment without laser irradiation. Thus, a gate driver circuit (a scan line driver circuit) and part of a source driver circuit (e.g., an analog switch) can be formed over the same substrate. Further, when laser irradiation is not performed for crystallization, unevenness of silicon crystallinity can be suppressed. Therefore, an image with high image quality can be displayed.

Note that polycrystalline silicon and microcrystalline silicon can be formed without using a catalyst (e.g., nickel).

Note that the crystallinity of silicon is preferably improved to polycrystal or microcrystal in the whole panel, but not limited thereto.

The crystallinity of silicon may be improved only in part of the panel. The selective increase in crystallinity can be achieved by selective laser irradiation or the like.

For example, only a peripheral driver circuit region excluding pixels may be irradiated with laser light.

Alternatively, only a region of a gate driver circuit, a source driver circuit, or the like may be irradiated with laser light.

Further alternatively, only part of a source driver circuit (e.g., an analog switch) may be irradiated with laser light.

As a result, the crystallinity of silicon only in a region necessary for high-speed operation of a circuit can be improved.

A pixel region is not especially needed to operate at high speed. Thus, even if the crystallinity is not improved, the pixel circuit can operate without problems.

Thus, since a region crystallinity of which is improved is small, manufacturing steps can be shortened, throughput can be increased, and manufacturing cost can be reduced.

Since the number of manufacturing devices needed is small, manufacturing cost can be reduced.

In addition, a transistor can be formed using a semiconductor substrate, an SOI substrate, or the like. Therefore, a small transistor with few variations in characteristics, sizes, shapes, or the like, with high current supply capacity can be formed. By using such a transistor, reduction in power consumption or high integration of circuits can be realized.

A transistor including a compound semiconductor or an oxide semiconductor such as ZnO, a-InGaZnO, SiGe, GaAs, IZO, ITO, or SnO, a thin film transistor obtained by thinning such a compound semiconductor or a oxide semiconductor, or the like can be used. Therefore, manufacturing temperature can be lowered and for example, such a transistor can be formed at room temperature. Accordingly, the transistor can be formed directly on a substrate having low heat resistance, such as a plastic substrate or a film substrate. Note that such a compound semiconductor or an oxide semiconductor can be used for not only a channel portion of the transistor but also other applications. For example, such a compound semiconductor or an oxide semiconductor can be used as a resistor, a pixel electrode, or an electrode having a light-transmitting property. Further, since such an element can be formed at the same time as the transistor, cost can be reduced.

A transistor or the like formed by using an ink-jet method or a printing method can also be used. Accordingly, the transistor can be formed at room temperature or at a low vacuum, or can be formed using a large substrate. Since the transistor can be formed without using a mask (reticle), layout of the transistor can be easily changed. Further, since it is not necessary to use a resist, material cost is reduced and the number of steps can be reduced. Moreover, since a film is formed only in a required portion, a material is not wasted and cost can be reduced compared with a manufacturing method in which etching is performed after the film is formed over the entire surface.

A transistor or the like including an organic semiconductor or a carbon nanotube can also be used. Accordingly, a transistor can be formed using a substrate which can be bent, and thus can resist a shock.

In addition, transistors with various structures can be used.

For example, a MOS transistor, a junction transistor, a bipolar transistor, or the like can be used as a transistor.

The use of a MOS transistor can reduce the size of a transistor.

Accordingly, a plurality of transistors can be mounted.

The use of a bipolar transistor can allow large current to flow; thus, a circuit can operate at high speed.

Further, a MOS transistor, a bipolar transistor, and the like may be mixed over one substrate.

Thus, low power consumption, reduction in size, and high-speed operation can be achieved.

In addition, various other transistors can be used.

Note that transistor can be formed using various substrates. The type of a substrate is not limited to a certain type. For example, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate. Alternatively, a skin (e.g., epidermis or corium) or hypodermal tissue of an animal such as a human may be used as the substrate. In addition, the transistor may be formed using one substrate, and then, the transistor may be transferred to another substrate.

As a substrate to which the transistor is transferred, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used.

Alternatively, a skin (e.g., epidermis or corium) or hypodermal tissue of an animal such as a human may be used as the substrate. In addition, a transistor may be formed using a substrate, and the substrate may be thinned by polishing. As a substrate to be polished, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used.

Alternatively, a skin (e.g., epidermis or corium) or hypodermal tissue of an animal such as a human may be used as the substrate. By using such a substrate, a transistor with excellent properties, a transistor with low power consumption can be formed, a device with high durability can be formed, high heat resistance can be provided, and reduction in weight or size can be realized.

Note that a structure of a transistor can employ various modes without being limited to a certain structure. For example, a multi-gate structure having two or more gate electrodes may be employed. When the multi-gate structure is used, a structure where a plurality of transistors are connected in series is provided since channel regions are connected in series. The multi-gate structure realizes reduction in off-current and improvement in reliability due to improvement in withstand voltage of the transistor. Further, by using the multi-gate structure, drain-source current does not change much even if drain-source voltage changes when the transistor operates in a saturation region; thus, the slope of voltage-current characteristics can be flat. By utilizing the characteristics in which the slope of the voltage-current characteristics is flat, an ideal current source circuit and an active load having an extremely high resistance value can be realized. Thus, a differential circuit or a current mirror circuit having excellent properties can be realized. As another example, a structure where gate electrodes are formed above and below a channel may be employed. By using the structure where gate electrodes are formed above and below the channel, a channel region is enlarged, the amount of current can be increased since the number of channel regions is increased, or a subthreshold swing can be reduced since a depletion layer is easily formed. In the structure where the gate electrodes are formed above and below the channel, it seems that a plurality of transistors are connected in parallel.

A structure where a gate electrode is formed above a channel region, a structure where a gate electrode is formed below a channel region, a staggered structure, an inversely staggered structure, a structure where a channel region is divided into a plurality of regions, or a structure where channel regions are connected in parallel or in series can be employed. In addition, a source electrode or a drain electrode may overlap with a channel region (or part thereof). By using the structure where the source electrode or the drain electrode may overlap with the channel region (or part thereof), an unstable operation due to accumulation of charge in part of the channel region can be prevented. Further, a structure where an LDD region is provided may be employed. By providing the LDD region, off-current can be reduced or the withstand voltage of the transistor can be increased to improve reliability. Alternatively, drain-source current does not fluctuate much even if drain-source voltage fluctuates when the transistor operates in the saturation region, so that characteristics where a slope of voltage-current characteristics is flat can be obtained.

Note that various types of transistors can be used for a transistor, and the transistor can be formed using various types of substrates. Accordingly, all of circuits which are necessary to realize a predetermined function can be formed using the same substrate. For example, all of the circuits which are necessary to realize the predetermined function can be formed using various substrates such as a glass substrate, a plastic substrate, a single crystalline substrate, or an SOI substrate. When all of the circuits which are necessary to realize the predetermined function are formed using the same substrate, cost can be reduced by reduction in the number of component parts or reliability can be improved by reduction in the number of connections between circuit components. Alternatively, part of the circuits which are necessary to realize the predetermined function may be formed using one substrate and another part of the circuits which are necessary to realize the predetermined function may be formed using another substrate. That is, not all of the circuits which are necessary to realize the predetermined function are required to be formed using the same substrate. For example, part of the circuits which are necessary to realize the predetermined function may be formed using transistors over a glass substrate and another part of the circuits which are necessary to realize the predetermined function may be formed using a single crystalline substrate, so that an IC chip formed by a transistor on the single crystalline substrate can be connected to the glass substrate by COG (Chip On Glass) and the IC chip may be provided over the glass substrate. Alternatively, the IC chip can be connected to the glass substrate by TAB (Tape Automated Bonding) or a printed wiring board. When part of the circuits are formed using the same substrate in this manner, cost can be reduced by reduction in the number of component parts or reliability can be improved by reduction in the number of connections between circuit components. Alternatively, since circuits in a portion with high driving voltage or a portion with high driving frequency consume large power, the circuits in such portions are formed using a single crystalline substrate and using an IC chip formed by the circuit instead of using the same substrate, for example; thus, increase in power consumption can be prevented.

Note that one pixel corresponds to one element brightness of which can be controlled. For example, one pixel corresponds to one color element and brightness is expressed with the one color element. Accordingly, in the case of a color display device having color elements of R (Red), G (Green), and B (Blue), the smallest unit of an image is formed of three pixels of an R pixel, a G pixel, and a B pixel. Note that the color elements are not limited to three colors, and color elements of more than three colors may be used and/or a color other than RGB may be used. For example, RGBW can be employed by adding W (white). In addition, RGB added with one or more colors of yellow, cyan, magenta emerald green, vermilion, and the like may be used. Further, a color similar to at least one of R, G, and B may be added to RGB. For example, R, G, B1, and B2 may be used. Although both B1 and B2 are blue, they have slightly different frequency. Similarly, R1, R2, G, and B may be used. By using such color elements, display which is closer to the real object can be performed and power consumption can be reduced. As another example, in the case of controlling brightness of one color element by using a plurality of regions, one region may correspond to one pixel. For example, in the case of performing area ratio gray scale display or the case of including a subpixel, a plurality of regions which control brightness are provided in each color element and gray scales are expressed with all of the regions, and one region which controls brightness may correspond to one pixel. In that case, one color element includes a plurality of pixels. Alternatively, even when the plurality of the regions which control brightness are provided in one color element, these regions may be collected and one color element may be referred to as one pixel. In that case, one color element includes one pixel. Further, when brightness is controlled by a plurality of regions in one color element, regions which contribute to display may have different area dimensions depending on pixels. Alternatively, in the plurality of the regions which control brightness in one color element, signals supplied to the regions may be slightly varied to widen a viewing angle. That is, potentials of pixel electrodes included in the plurality of the regions in one color element may be different from each other. Accordingly, voltages applied to liquid crystal molecules are varied depending on the pixel electrodes. Therefore, the viewing angle can be widened.

Note that when it is explicitly described as one pixel (for three colors), it corresponds to the case where three pixels of R, G, and B are considered as one pixel. When it is explicitly described as one pixel (for one color), it corresponds to the case where the plurality of the regions are provided in each color element and collectively considered as one pixel.

Note that pixels are provided (arranged) in matrix in some cases. Here, description that pixels are provided (arranged) in matrix includes the case where the pixels are arranged in a straight line and the case where the pixels are arranged in a jagged line, in a longitudinal direction or a lateral direction. For example, in the case of performing full color display with three color elements (e.g., RGB), the following cases are included therein: the case where the pixels are arranged in stripes, the case where dots of the three color elements are arranged in a delta pattern, and the case where dots of the three color elements are provided in Bayer arrangement. Note that the color elements are not limited to three colors, and color elements of more than three colors may be employed, for example, RGBW (W corresponds to white), RGB added with one or more of yellow, cyan, magenta, and the like, or the like. Note that the size of display regions may be different between respective dots of color elements. Thus, power consumption can be reduced or the life of a light-emitting element can be prolonged.

Note that an active matrix method in which an active element is included in a pixel or a passive matrix method in which an active element is not included in a pixel can be used.

In the active matrix method, as an active element (a non-linear element), not only a transistor but also various active elements (non-linear elements), for example, a MIM (Metal Insulator Metal), a TFD (Thin Film Diode), or the like can be used. Since such an element has few number of manufacturing steps, manufacturing cost can be reduced or a yield can be improved. Since the size of the element is small, an aperture ratio can be increased, and power consumption can be reduced and high luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or the yield can be improved. Further, since an active element (a non-linear element) is not used, the aperture ratio can be increased, and power consumption can be reduced and high luminance can be achieved.

Note that a transistor is an element having at least three terminals of a gate, a drain, and a source. The transistor includes a channel region between a drain region and a source region, and current can flow through the drain region, the channel region, and the source region. Here, since the source and the drain of the transistor may change depending on a structure, operating conditions, and the like of the transistor, it is difficult to define which is a source or a drain. Therefore, in this document (the specification, the claim, the drawing, and the like), a region functioning as a source and a drain is not called the source or the drain in some cases. In such a case, one of the source and the drain may be referred to as a first terminal and the other thereof may be referred to as a second terminal, for example. Alternatively, one of the source and the drain may be referred to as a first electrode and the other thereof may be referred to as a second electrode. Further alternatively, one of the source and the drain may be referred to as a source region and the other thereof may be referred to as a drain region.

In addition, a transistor may be an element having at least three terminals of a base, an emitter, and a collector. In this case also, one of the emitter and the collector may be referred to as a first terminal and the other terminal may be referred to as a second terminal.

A gate corresponds to all or part of a gate electrode and a gate wiring (also referred to as a gate line, a gate signal line, a scan line, a scan signal line, or the like). A gate electrode corresponds to a conductive film which overlaps with a semiconductor forming a channel region with a gate insulating film interposed therebetween. Note that part of the gate electrode overlaps with an LDD (Lightly Doped Drain) region or the source region (or the drain region) with the gate insulating film interposed therebetween in some cases. A gate wiring corresponds to a wiring for connecting a gate electrode of each transistor to each other, a wiring for connecting a gate electrode included in each pixel to each other, or a wiring for connecting a gate electrode to another wiring.

However, there is a portion (a region, a conductive film, a wiring, or the like) which functions as both a gate electrode and a gate wiring. Such a portion (a region, a conductive film, a wiring, or the like) may be called either a gate electrode or a gate wiring. That is, there is a region where a gate electrode and a gate wiring cannot be clearly distinguished from each other. For example, in the case where a channel region overlaps with part of an extended gate wiring, the overlapped portion (region, conductive film, wiring, or the like) functions as both a gate wiring and a gate electrode. Accordingly, such a portion (a region, a conductive film, a wiring, or the like) may be called either a gate electrode or a gate wiring.

Note that a portion (a region, a conductive film, a wiring, or the like) which is formed of the same material as a gate electrode and forms the same island as the gate electrode to be connected to the gate electrode may also be called a gate electrode. Similarly, a portion (a region, a conductive film, a wiring, or the like) which is formed of the same material as a gate wiring and forms the same island as the gate wiring to be connected to the gate wiring may also be called a gate wiring. In a strict sense, such a portion (a region, a conductive film, a wiring, or the like) does not overlap with a channel region or does not have a function to connect the gate electrode to another gate electrode in some cases. However, there is a portion (a region, a conductive film, a wiring, or the like) which is formed of the same material as a gate electrode or a gate wiring and forms the same island as the gate electrode or the gate wiring to be connected to the gate electrode or the gate wiring in relation to a circuit structure and the like. Thus, such a portion (a region, a conductive film, a wiring, or the like) may also be called either a gate electrode or a gate wiring.

In a multi-gate transistor, for example, a gate electrode of one transistor is often connected to a gate electrode of another transistor by using a conductive film which is formed of the same material as the gate electrode. Since such a portion (a region, a conductive film, a wiring, or the like) is a portion (a region, a conductive film, a wiring, or the like) for connecting the gate electrode and another gate electrode, it may be called a gate wiring, and it may also be called a gate electrode since a multi-gate transistor can be considered as one transistor. That is, a portion (a region, a conductive film, a wiring, or the like) which is formed of the same material as a gate electrode or a gate wiring and forms the same island as the gate electrode or the gate wiring to be connected to the gate electrode or the gate wiring may be called either a gate electrode or a gate wiring. In addition, part of a conductive film which connects the gate electrode and the gate wiring and is formed of a material different from that of the gate electrode and the gate wiring may also be called either a gate electrode or a gate wiring.

Note that a gate terminal corresponds to part of a portion (a region, a conductive film, a wiring, or the like) of a gate electrode or a portion (a region, a conductive film, a wiring, or the like) which is electrically connected to the gate electrode.

When a gate electrode is called a gate wiring, a gate line, a gate signal line, a scan line, a scan signal line, or the like, there is the case where a gate of a transistor is not connected to a wiring. In this case, the gate wiring, the gate line, the gate signal line, the scan line, or the scan signal line corresponds to a wiring formed in the same layer as the gate of the transistor, a wiring formed of the same material of the gate of the transistor, or a wiring formed at the same time as the gate of the transistor in some cases. As examples, a wiring for storage capacitance, a power supply line, a reference potential supply line, and the like can be given.

A source corresponds to all or part of a source region, a source electrode, and a source wiring (also referred to as a source line, a source signal line, a data line, a data signal line, or the like). A source region corresponds to a semiconductor region containing a large amount of p-type impurities (e.g., boron or gallium) or n-type impurities (e.g., phosphorus or arsenic). Accordingly, a region containing a small amount of p-type impurities or n-type impurities, namely, an LDD (Lightly Doped Drain) region is not included in the source region. A source electrode is part of a conductive layer formed of a material different from that of a source region and electrically connected to the source region. However, there is the case where a source electrode and a source region are collectively called a source electrode. A source wiring is a wiring for connecting a source electrode of each transistor to each other, a wiring for connecting a source electrode of each pixel to each other, or a wiring for connecting a source electrode to another wiring.

However, there is a portion (a region, a conductive film, a wiring, or the like) functioning as both a source electrode and a source wiring. Such a portion (a region, a conductive film, a wiring, or the like) may be called either a source electrode or a source wiring. That is, there is a region where a source electrode and a source wiring cannot be clearly distinguished from each other. For example, in the case where a source region overlaps with part of an extended source wiring, the overlapped portion (region, conductive film, wiring, or the like) functions as both a source wiring and a source electrode. Accordingly, such a portion (a region, a conductive film, a wiring, or the like) may be called either a source electrode or a source wiring.

A portion (a region, a conductive film, a wiring, or the like) which is formed of the same material as a source electrode and forms the same island as the source electrode to be connected to the source electrode, or a portion (a region, a conductive film, a wiring, or the like) which connects a source electrode and another source electrode may also be called a source electrode. Further, a portion which overlaps with a source region may be called a source electrode. Similarly, a region which is formed of the same material as a source wiring and forms the same island as the source wiring to be connected to the source wiring may also be called a source wiring. In a strict sense, such a portion (a region, a conductive film, a wiring, or the like) does not overlap with a channel region or does not have a function to connect the source electrode to another source electrode in some cases. However, there is a portion (a region, a conductive film, a wiring, or the like) which is formed of the same material as a source electrode or a source wiring and forms the same island as the source electrode or the source wiring to be connected to the source electrode or the source wiring in relation to a circuit structure and the like. Thus, such a portion (a region, a conductive film, a wiring, or the like) may also be called either a source electrode or a source wiring.

For example, part of a conductive film which connects a source electrode and a source wiring and is formed of a material which is different from that of the source electrode or the source wiring may be called either a source electrode or a source wiring.

A source terminal corresponds to part of a source region, a source electrode, or a portion (a region, a conductive film, a wiring, or the like) which is electrically connected to the source electrode.

When a source electrode is called a source wiring, a source line, a source signal line, a data line, a data signal line, or the like, there is the case in which a source (a drain) of a transistor is not connected to a wiring. In this case, the source wiring, the source line, the source signal line, the data line, or the data signal line corresponds to a wiring formed in the same layer as the source (drain) of the transistor, a wiring formed of the same material of the source (drain) of the transistor, or a wiring formed at the same time as the source (drain) of the transistor in some cases. As examples, a wiring for storage capacitance, a power supply line, a reference potential supply line, and the like can be given.

Note that a drain is similar to the source.

Note that a semiconductor device corresponds to a device having a circuit including a semiconductor element (e.g., a transistor, a diode, or a thyristor). The semiconductor device may also refer to all devices which can function by utilizing semiconductor characteristics. Alternatively, the semiconductor device refers to a device including a semiconductor material.

A display element corresponds to an optical modulation element, a liquid crystal element, a light-emitting element, an EL element (an organic EL element, an inorganic EL element, or an EL element including both organic and inorganic materials), an electron emitter, an electrophoresis element, a discharging element, a light-reflecting element, a light diffraction element, a digital micro device (DMD), or the like. Note that the present invention is not limited thereto.

A display device corresponds to a device including a display element. The display device may include a plurality of pixels having a display element. The display device may include a peripheral driver circuit for driving a plurality of pixels. The peripheral driver circuit for driving a plurality of pixels may be formed over the same substrate as the plurality of pixels. In addition, the display device may also include a peripheral driver circuit provided over a substrate by wire bonding or bump bonding, namely, an IC chip connected by so-called chip on glass (COG), TAB, or the like. Further, the display device may also include a flexible printed circuit (FPC) to which an IC chip, a resistor, a capacitor, an inductor, a transistor, or the like is attached. The display device may also include a printed wiring board (PWB) which is connected through a flexible printed circuit (FPC) and to which an IC chip, a resistor, a capacitor, an inductor, a transistor, or the like is attached. The display device may also include an optical sheet such as a polarizing plate or a retardation plate. The display device may also include a lighting device, a housing, an audio input and output device, a light sensor, or the like. Here, a lighting device such as a backlight unit may include a light guide plate, a prism sheet, a diffusion sheet, a reflective sheet, a light source (e.g., an LED or a cold cathode fluorescent lamp), a cooling device (e.g., a water cooling device or an air cooling device), or the like.

A lighting device corresponds to a device including a backlight unit, a light guide plate, a prism sheet, a diffusion sheet, a reflective sheet, a light source (e.g., an LED, a cold cathode fluorescent lamp, or a hot cathode fluorescent lamp), a cooling device, or the like.

A light-emitting device corresponds to a device including a light-emitting element or the like. A light-emitting device including a light-emitting element as a display element is a specific example of a display device.

A reflective device corresponds to a device including a light-reflecting element, a light diffraction element, a light reflecting electrode, or the like.

A liquid crystal display device corresponds to a display device including a liquid crystal element. Liquid crystal display devices include a direct-view liquid crystal display, a projection liquid crystal display, a transmissive liquid crystal display, a reflective liquid crystal display, a transflective liquid crystal display, and the like.

A driving device corresponds to a device including a semiconductor element, an electric circuit, or an electronic circuit. Examples of the driving device include a transistor (also referred to as a selection transistor, a switching transistor, or the like) which controls input of a signal from a source signal line to a pixel, a transistor which supplies voltage or current to a pixel electrode, a transistor which supplies voltage or current to a light-emitting element, and the like. Moreover, examples of the driving device include a circuit (also referred to as a gate driver, a gate line driver circuit, or the like) which supplies a signal to a gate signal line, a circuit (also referred to as a source driver, a source line driver circuit, or the like) which supplies a signal to a source signal line, and the like.

A display device, a semiconductor device, a lighting device, a cooling device, a light-emitting device, a reflective device, a driving device, and the like overlap with each other in some cases. For example, a display device includes a semiconductor device and a light-emitting device in some cases. Further, a semiconductor device includes a display device and a driving device in some cases.

When it is explicitly described that B is formed on A or that B is formed over A, it does not necessarily mean that B is formed in direct contact with A. The description includes the case where A and B are not in direct contact with each other, that is, the case where another object is interposed between A and B. Here, each of A and B corresponds to an object (e.g., a device, an element, a circuit, a wiring, an electrode, a terminal, a conductive film, or a layer).

For example, when it is explicitly described that a layer B is formed on (or over) a layer A, it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., a layer C or a layer D) may be a single layer or a plurality of layers.

Similarly, when it is explicitly described that B is formed above A, it does not necessarily mean that B is in direct contact with A, and another object may be interposed between A and B. For example, when it is explicitly described that a layer B is formed above a layer A, it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., a layer C or a layer D) may be a single layer or a plurality of layers.

When it is explicitly described that B is formed in direct contact with A, it does not include the case where another object is interposed between A and B and includes the case where B is formed in direct contact with A.

Note that the same can be said when it is explicitly described that B is formed below or under A.

Note that explicit singular forms are preferably singular forms. However, without being limited thereto, such singular forms can include plural forms. Similarly, explicit plural forms are preferably plural forms. However, without being limited thereto, such plural forms can include singular forms.

The structures applicable to a liquid crystal display device and a semiconductor device of the invention are described above. The structures described above may be applied to a liquid crystal display device and a semiconductor device of the invention when needed.

According to the invention, a liquid crystal display device with a wide viewing angle and lower manufacturing cost than a conventional liquid crystal display device can be provided.

Since a conductive film is formed over an entire surface of a substrate in the invention, an impurity from the substrate can be prevented from being mixed into an active layer. Thus, a liquid crystal display device with high reliability and a semiconductor device including the liquid crystal display device can be obtained.

In the invention, when a semiconductor device including a top-gate thin film transistor is formed, a potential of a back gate is stabilized; thus, a liquid crystal display device with high reliability and a semiconductor device including the liquid crystal display device can be obtained.

BRIEF DESCRIPTION OF THE DRAWINGS

FIG. 10 is a cross-sectional view of a liquid crystal display device of the invention.

FIGS. 15A to 15D are cross-sectional views showing manufacturing steps of a liquid crystal display device of the invention.

FIGS. 16A to 16C are cross-sectional views showing manufacturing steps of a liquid crystal display device of the invention.

DETAILED DESCRIPTION OF THE INVENTION

Figure 1:
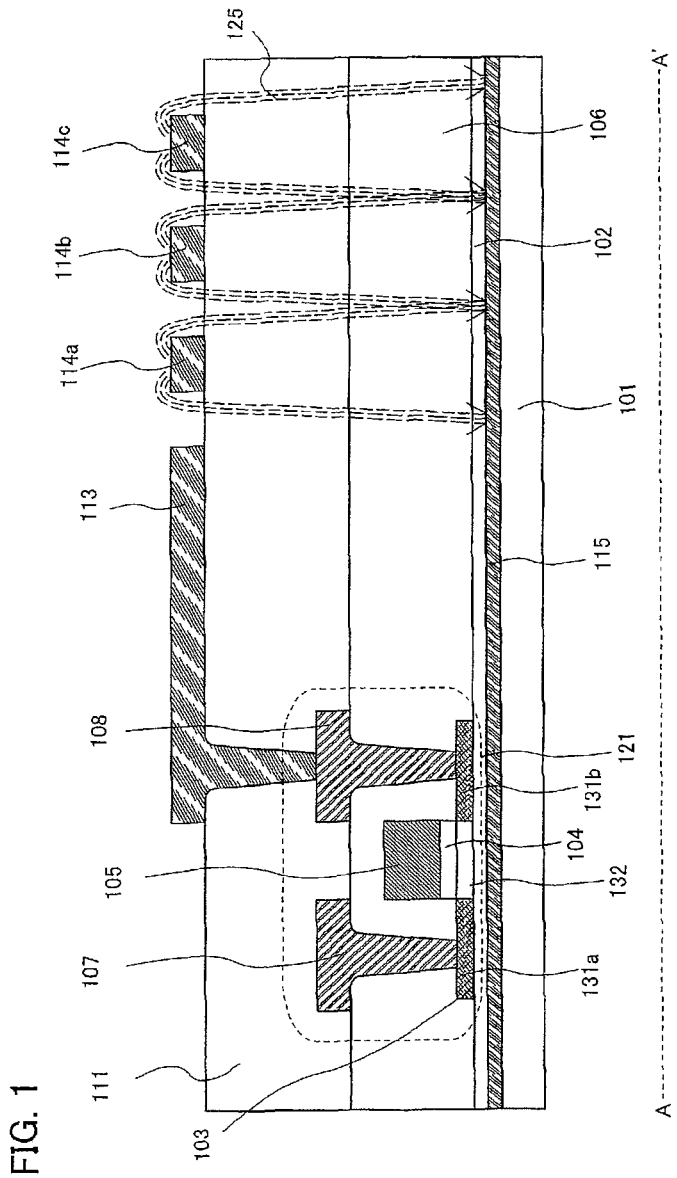
FIG. 1 is a cross-sectional view showing a structure example of a pixel portion using a top-gate thin film transistor.

Hereinafter, embodiment modes of the present invention will be described with reference to drawings. However, the present invention can be implemented in various modes, and it is easily understood by those skilled in the art that modes and details can be variously changed without departing from the scope and the spirit of the present invention. Therefore, the present invention is not construed as being limited to description of the embodiment modes. Note that in the drawings shown below, the same portions or portions having similar functions are denoted by the same reference numerals, and repeated description is omitted.

[Embodiment Mode 1]

This embodiment mode is described with reference to FIGS. 1 and 3 to 5.

FIG. 1 shows an example where a top-gate thin film transistor (TFT) is used as a switching element in a pixel portion. A conductive film 115 to be a first electrode in FFS (Fringe-Field Switching) drive is formed over an entire surface of one side of a substrate 101.

A light-transmitting conductive film is used as the conductive film 115. As such a light-transmitting conductive film, an indium tin oxide (ITO) film, an indium zinc oxide (IZO) film, an indium tin oxide containing silicon (also referred to as ITSO) film, a zinc oxide (ZnO) film, a cadmium tin oxide (CTO) film, a tin oxide (SnO) film, or the like may be used.

A base film 102 is formed over the conductive film 115, and a thin film transistor (TFT) 121 is formed over the base film 102. The TFT 121 includes a region 131a which is one of a source region and a drain region, a region 131b which is the other of the source region and the drain region, an active layer 103 including a channel formation region 132, a gate insulating film 104, and a gate electrode 105. Note that although the gate insulating film 104 in FIG. 1 is formed only above the channel formation region 132, it may be formed over portions other than above the channel formation region 132.

An interlayer insulating film 106 is formed over the TFT 121 and the base film 102. An electrode 107 (a source wiring) which is electrically connected to one of the source region and the drain region through a contact hole in the interlayer insulating film 106, and an electrode 108 which is electrically connected to the other of the source region and the drain region through a contact hole in the interlayer insulating film 106 are formed over the interlayer insulating film 106.

An interlayer insulating film 111 is formed over the interlayer insulating film 106, the electrodes 107 and 108, and an electrode 109. Further, pixel electrodes 113 and 114a to 114c which are electrically connected to the electrode 108 through a contact hole formed in the interlayer insulating film 111 are formed over the interlayer insulating film 111. Note that the pixel electrode 113 may be electrically connected to the electrode 107, not to the electrode 108. In addition, only one of the interlayer insulating films 106 and 111 may be formed.

As shown in FIG. 1, an electric field 125 is generated between the pixel electrodes 113 and 114 (114a to 114c) and the conductive film 115. As described below, liquid crystal molecules are driven by the electric field 125.

Figure 3:
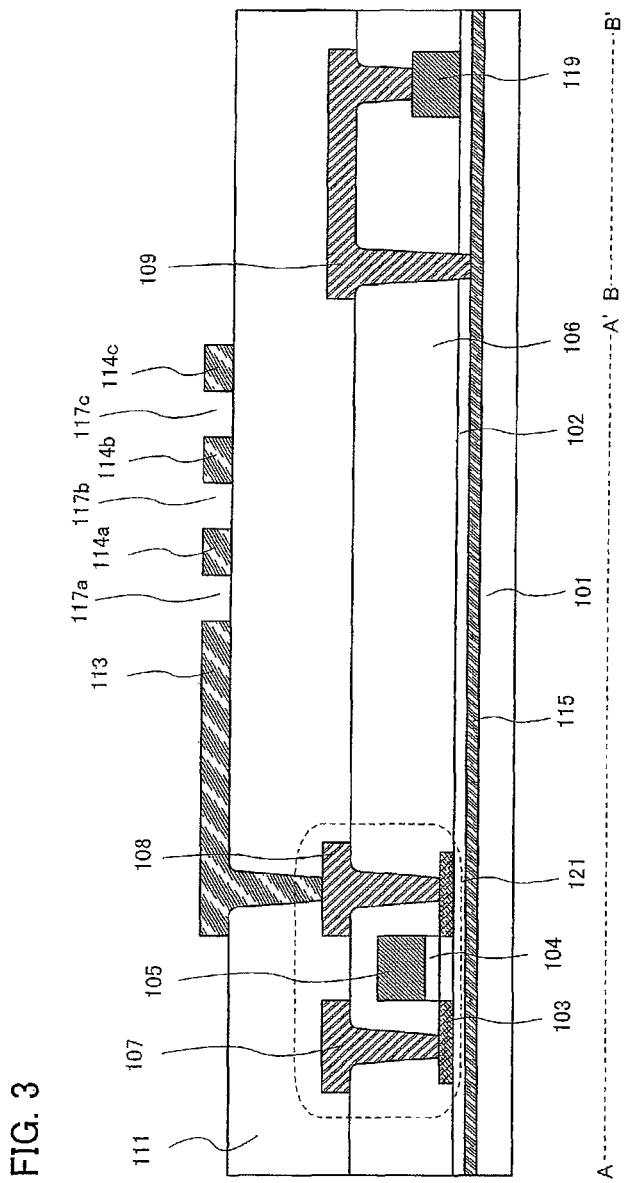
FIG. 3 is a cross-sectional view showing a structure example of a pixel portion using a top-gate thin film transistor.

Further, as shown in FIG. 3, the conductive film 115 is electrically connected to the connection electrode 109 through a contact hole in the interlayer insulating film 106 and the base film 102, and the connection electrode 109 is electrically connected to a wiring 119. Note that the wiring 119 is formed of the same material and in the same step as the gate electrode 105. The connection electrode 109 is formed of the same material and in the same step as the electrodes 107 and 108. Thus, they can be formed without adding a manufacturing step, so that the number of photomasks can be reduced. Note that the same portions in FIGS. 1 and 3 are denoted by the same reference numerals.

Note that the wiring 119 may be arranged in parallel to the gate electrode 105. When the wiring 119 is arranged in parallel to the gate electrode 105, decrease in aperture ratio is reduced.

When the wiring 119 is connected to the conductive film 115 for each pixel, resistance of the conductive film 115 can be reduced. Further, waveform distortion can be reduced.

In addition, the connection electrode 109 may be extended across the pixels, without being connected to the wiring 119. In this case, the connection electrode 109 is preferably arranged in parallel to the source wiring 107.

Figure 4:
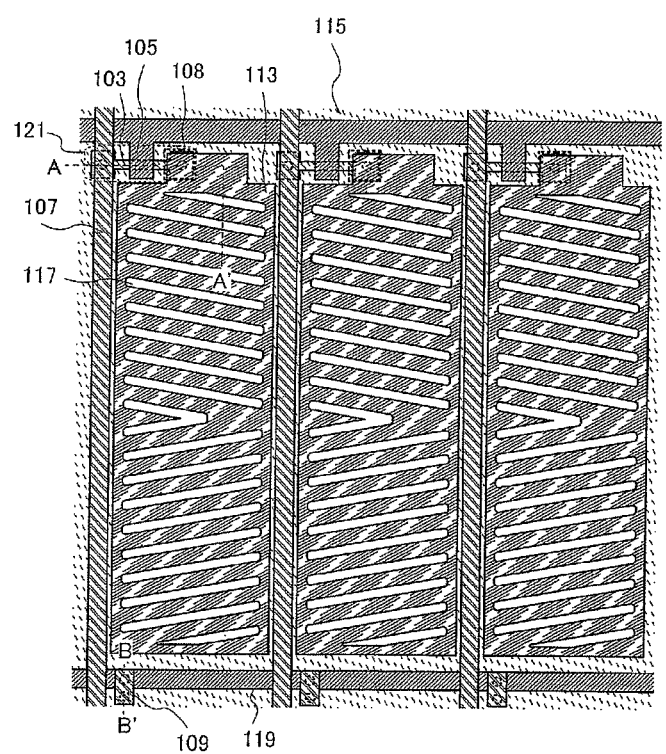
FIG. 4 is a top plan view of the pixel portion shown in FIGS. 1 and 3.

FIG. 4 is a top plan view of FIGS. 1 and 3. FIG. 3 is a cross-sectional view along A-A' and B-B' of FIG. 4. FIG. 1 is a cross-sectional view along A-A' of FIG. 4. The pixel electrodes 113 and 114a to 114c, and the like are provided with grooves (also referred to as openings, slits, apertures, gaps, or spaces) 117.

As shown in FIG. 4, a plurality of source wirings 107 are provided in parallel to each other (extended in a vertical direction in the drawing) and apart from each other. A plurality of gate wirings 105 are extended in a direction generally perpendicular to the source wirings 107 (a horizontal direction in the drawing) and provided apart from each other. The wiring 119 is adjacent to the plurality of gate wirings 105 and extended in a direction parallel to the gate wirings 105, that is, a direction perpendicular to the source wirings 107 (the horizontal direction in the drawing). By such arrangement, an aperture ratio can be increased. A space with a generally rectangular shape, which is surrounded by the source wirings 107, the wiring 119, and the gate wiring 105, is provided with the pixel electrode 113 of a liquid crystal display device. The thin film transistor 121 for driving the pixel electrode 113 is provided at an upper left corner of the drawing. The plurality of pixel electrodes and thin film transistors are arranged in matrix.

Note that in this embodiment mode, the wiring 119 and the conductive film 115 are connected to each pixel through contact holes; however, the invention is not limited thereto.

Figure 27:
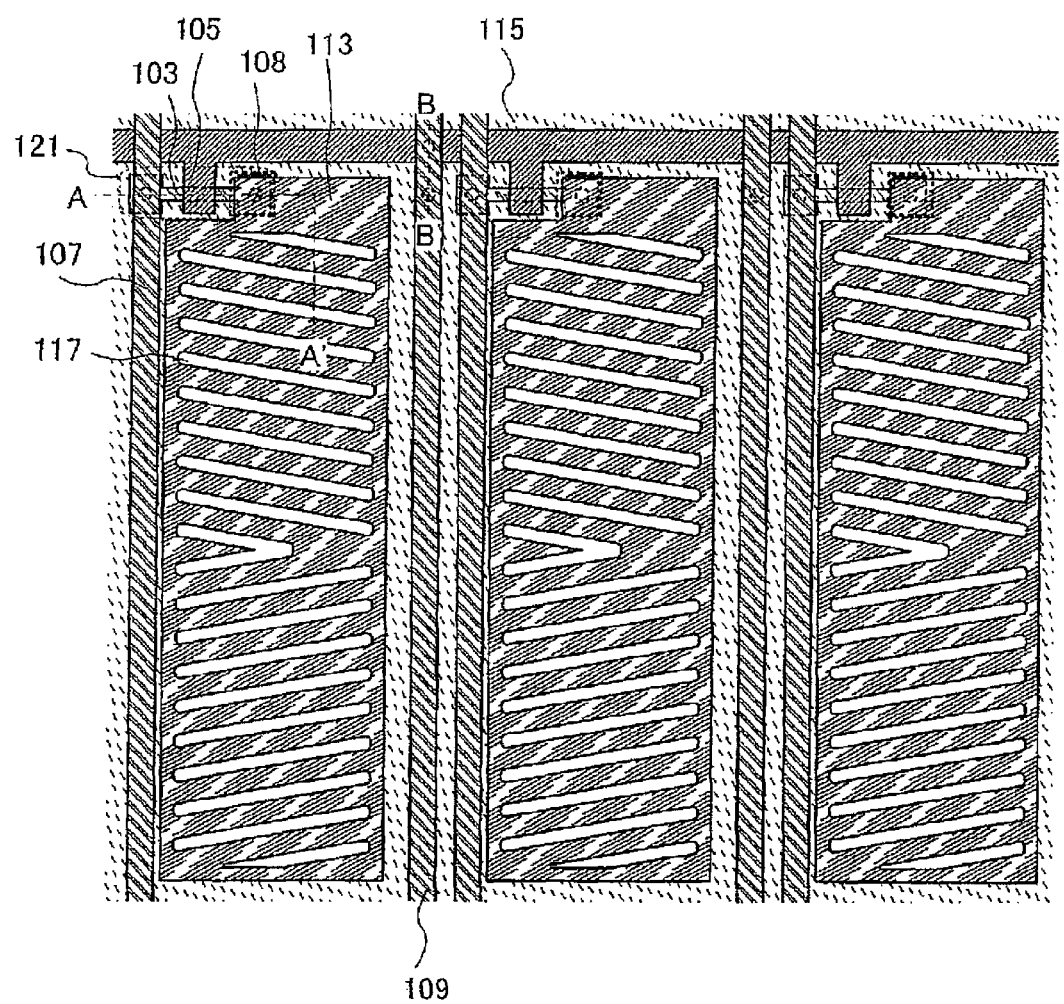
FIG. 27 is a top plan view of a liquid crystal display device of the invention.

Note that the wiring 119 is provided in FIG. 4; FIG. 27 shows an example where the gate wiring 105 is used instead of the wiring 119. A cross-sectional view of FIG. 27 is the same as FIG. 3, except that the wiring 119 is the same wiring as the gate wiring 105.

Note that each of the gate wiring 105, the wiring 119, and the source wiring 107 is preferably formed of one or more elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); or a compound or an alloy material including one or more of the aforementioned elements (e.g., indium tin oxide (ITO), indium zinc oxide (IZO), indium tin oxide containing silicon (ITSO), zinc oxide (ZnO), tin oxide (SnO), cadmium tin oxide (CTO), aluminum neodymium (Al—Nd), magnesium silver (Mg—Ag), or molybdenum-niobium (Mo—Nb)); a substance in which these compounds are combined; or the like. Alternatively, each of the gate wiring 105, the wiring 119, and the source wiring 107 is preferably formed to contain a substance including a compound (silicide) of silicon and one or more of the aforementioned elements (e.g., aluminum silicon, molybdenum silicon, or nickel silicide); or a compound of nitrogen and one or more of the aforementioned elements (e.g., titanium nitride, tantalum nitride, or molybdenum nitride).

Note that silicon (Si) may contain an n-type impurity (such as phosphorus) or a p-type impurity (such as boron). When silicon contains the impurity, the conductivity is increased, and a function similar to a general conductor can be realized. Thus, such silicon can be utilized easily as a wiring, an electrode, or the like.

In addition, silicon with various levels of crystallinity, such as single crystalline silicon, polycrystalline silicon, or microcrystalline silicon can be used. Alternatively, silicon having no crystallinity, such as amorphous silicon can be used. By using single crystalline silicon or polycrystalline silicon, resistance of a wiring, an electrode, a conductive layer, a conductive film, a terminal, or the like can be reduced. By using amorphous silicon or microcrystalline silicon, a wiring or the like can be formed by a simple process.

Aluminum and silver have high conductivity, and thus can reduce a signal delay. Further, since aluminum and silver can be easily etched, they can be minutely processed.

Copper has high conductivity, and thus can reduce a signal delay. When copper is used, a stacked-layer structure is preferably employed to improve adhesion.

Molybdenum and titanium are preferable since even if molybdenum or titanium is in contact with an oxide semiconductor (e.g., ITO or IZO) or silicon, molybdenum or titanium does not cause defects. Further, molybdenum and titanium are preferable since they are easily etched and has high heat resistance.

Tungsten is preferable since it has an advantage such as high heat resistance.

Neodymium is also preferable since it has an advantage such as high heat resistance. In particular, an alloy of neodymium and aluminum is preferable since heat resistance is increased and aluminum hardly causes hillocks.

Silicon is preferable since it can be formed at the same time as a semiconductor layer included in a transistor and has high heat resistance.

Since ITO, IZO, ITSO, zinc oxide (ZnO), silicon (Si), tin oxide (SnO), and cadmium tin oxide (CTO) have light-transmitting properties, they can be used as a portion which transmits light. For example, they can be used for a pixel electrode or a common electrode.

IZO is preferable since it is easily etched and processed. In etching IZO, a residue is hardly left. Thus, when IZO is used for a pixel electrode, defects (such as short circuit or orientation disorder) of a liquid crystal element or a light-emitting element can be reduced.

A wiring, an electrode, a conductive layer, a conductive film, a terminal, or the like may have a single-layer structure or a multi-layer structure. By employing a single-layer structure, each manufacturing process of a wiring, an electrode, a conductive layer, a conductive film, a terminal, or the like can be simplified, the number of days for a process can be reduced, and cost can be reduced. Alternatively, by employing a multi-layer structure, a wiring, an electrode, and the like with high quality can be formed while an advantage of each material is utilized and a disadvantage thereof is reduced. For example, when a low-resistant material (e.g., aluminum) is included in a multi-layer structure, reduction in resistance of a wiring can be realized. Further, when a stacked-layer structure where a low heat-resistant material is interposed between high heat-resistant materials is employed, heat resistance of a wiring, an electrode, and the like can be increased, utilizing advantages of the low heat-resistance material. For example, it is preferable to employ a stacked-layer structure where a layer containing aluminum is interposed between layers containing molybdenum, titanium, neodymium, or the like.

When wirings, electrodes, or the like are in direct contact with each other, they adversely affect each other in some cases. For example, one wiring or one electrode is mixed into a material of another wiring or another electrode and changes its properties, and thus, an intended function cannot be obtained in some cases. As another example, when a high-resistant portion is formed, a problem may occur so that it cannot be normally formed. In such cases, a reactive material is preferably interposed by or covered with a non-reactive material in a stacked-layer structure. For example, when ITO and aluminum are connected, titanium, molybdenum, or an alloy of neodymium is preferably interposed between ITO and aluminum. As another example, when silicon and aluminum are connected, titanium, molybdenum, or an alloy of neodymium is preferably interposed between silicon and aluminum.

Note that the term "wiring" indicates a portion including a conductor. A wiring may be provided linearly or may be short without being extended linearly. Therefore, an electrode is included in a wiring.

Note that the gate wiring 105 is preferably formed of a material with higher heat resistance than that of the source wiring 107. This is because the gate wiring 105 is more likely to be exposed to a high temperature in manufacturing steps than the source wiring 107.

In addition, the source wiring 107 is preferably formed of a material with lower resistance than that of the gate wiring 105. This is because only signals with two values, which is an H-level signal and an L-level signal, are supplied to the gate wiring 105, whereas an analog signal which contributes to display is supplied to the source wiring 107. Accordingly, a material with low resistance is preferably used for the source wiring 107 in order that an accurate signal is supplied to the source wiring 107.

Note that although the wiring 119 does not have to be provided, a potential of a common electrode in each pixel can be stabilized when the wiring 119 is provided. Note also that the wiring 119 is provided in parallel to the gate wiring in FIG. 4; however, the invention is not limited thereto. The wiring 119 may be provided in parallel to the source wiring 107. At this time, the wiring 119 is preferably formed of the same material as the source wiring 107.

Since an aperture ratio can be increased and layout can be efficiently performed, the wiring is preferably parallel to the gate wiring.

The substrate 101 is a glass substrate, a quartz substrate, a substrate formed of an insulator such as alumina, a plastic substrate with heat resistance high enough to withstand a processing temperature of subsequent steps, a single crystalline substrate (e.g., a single crystalline silicon substrate), an SOI substrate, or a metal plate. Alternatively, the substrate 101 may be formed of polycrystalline silicon.

When a display device operates as a transmissive display device, the substrate 101 is preferably has a light-transmitting property.

The conductive film 115 is formed of a conductive film with a light-transmitting property (e.g., an indium tin oxide (ITO) film, an indium zinc oxide (IZO) film, a zinc oxide (ZnO) film, a tin oxide (SnO) film, or a polycrystalline silicon film or an amorphous silicon film into which an impurity is introduced).

An insulating film is formed as the base film 102 over the conductive film 115. The insulating film 102 is for preventing impurities from the substrate 101 from being diffused, and functions as the base film. The insulating film 102 is formed of an insulating material containing oxygen or nitrogen, such as silicon oxide (SiOx), silicon nitride (SiNx), silicon oxide containing nitrogen (SiOxNy: x>y), or silicon nitride containing oxygen (SiNxOy: x>y). Alternatively, the insulating film 102 may be a stacked-layer film in which a plurality of these films are stacked. Note that an insulating film having the same function as the insulating film 102 may be provided between the substrate 101 and the conductive film 115.

For example, a stacked-layer film of a silicon nitride film and a silicon oxide film; or a single-layer film of a silicon oxide film may be used as the base film 102. It is useful to use a silicon oxide film which is thicker than the gate insulating film 104 as the base film 102 because capacitive coupling with the gate wiring 105 can be reduced. Accordingly, the base film 102 is preferably thicker than, more preferably three times thicker than, the gate insulating film 104.

The semiconductor film 103 is formed over the insulating film 102. The region 131*a* to be one of the source region and the drain region, and the region 131*b* to be the other of the source region and the drain region are formed in the semiconductor film 103. The regions 131*a* and 131*b* are n-type impurity regions, for example, but may be p-type impurity regions. As an impurity imparting n-type conductivity, phosphorus (P) or arsenic (As) is used, for example. As an impurity imparting p-type conductivity, boron (B) or gallium (Ga) is used, for example. The channel formation region 132 is formed between the regions 131*a* and 131*b*.

Further, low concentration impurity regions may be formed between the region 131*a* and the channel formation region 132, and the region 131*b* and the channel formation region 132.

As shown in FIG. 4, the conductive film 115 is formed over almost the entire surface of the pixel. Each rectangular region surrounded by the source wirings 107, the wiring 119, and the gate wiring 105, is provided with the thin film transistor 121. That is, the gate wiring 105 is formed as a first wiring, the source wiring 107 is formed as a second wiring, and the wiring 119 is formed as a third wiring. By provision of the thin film transistor 121, a region which is effective for display in the pixel can be formed more efficiently. In other words, an aperture ratio can be increased. Note that the semiconductor film 103 is a polycrystalline silicon film, for example, but may be another semiconductor film (e.g., an amorphous silicon film, a single crystalline silicon film, an organic semiconductor film, or a carbon nanotube) or a microcrystalline silicon film (also referred to as a semi-amorphous silicon film).

Here, a semi-amorphous semiconductor film typified by a semi-amorphous silicon film includes a semiconductor having an intermediate structure between an amorphous semiconductor film and a semiconductor film having a crystalline structure (including single crystal and polycrystalline). A semi-amorphous semiconductor film is a semiconductor film having a third state which is stable in free energy, is a crystalline substance with a short-range order and lattice distortion, and can be dispersed in a non-single crystalline semiconductor film with a grain size of 0.5 to 20 nm. Raman spectrum of a semi-amorphous semiconductor film shifts to a wave number side lower than 520 cm$^{-1}$, and the diffraction peaks of (111) and (220) which are thought to be derived from a silicon crystalline lattice are observed by X-ray diffraction. Further, a semi-amorphous semiconductor film contains hydrogen or halogen of at least 1 atomic % or more to terminate dangling bonds. In this specification, such a semiconductor film is referred to as a semi-amorphous semiconductor (SAS) film for convenience. When a rare gas element such as helium, argon, krypton, or neon is contained to further increase the lattice distortion, stability can be enhanced, and a favorable semi-amorphous semiconductor film can be obtained.

In addition, a SAS film can be obtained by glow discharge decomposition of a gas containing silicon. As a typical gas containing silicon, $SiH_4$, or $Si_2H_6$, $SiH_2Cl_2$, $SiHCl_3$, $SiCl_4$, $SiF_4$, or the like can be used. Further, when the gas containing silicon is diluted with hydrogen or with a gas in which one or more of rare gas elements of helium, argon, krypton, and neon are added to hydrogen, the SAS film can be easily formed. The gas containing silicon is preferably diluted at a dilution ratio in the range of 2 to 1000 times. In addition, a carbide gas such as $CH_4$ or $C_2H_6$; a germanium gas such as $GeH_4$ or $GeF_4$; $F_2$; or the like may be mixed into the gas containing silicon to adjust the energy bandwidth to be from 1.5 to 2.4 eV or 0.9 to 1.1 eV.

A semiconductor layer may be provided below the gate wiring 105. Thus, capacitive coupling between the conductive film 115 and the gate wiring 105 can be reduced. Accordingly, the gate wiring 105 can be rapidly charged and discharged, and waveform distortion can be suppressed.

The gate insulating film 104 of the thin film transistor 121 is formed over the semiconductor film 103.

Note that the gate insulating film 104 is provided only near the channel region and not provided in other portions in some cases. Further, thickness or a stacked-layer structure of the gate insulating film 104 may differ depending on a position. For example, the gate insulating film 104 may be thicker or include more layers only near the channel and may be thinner or include fewer layers in other portions. This makes it easy to control the addition of an impurity to the source region and the drain region. Further, when the thickness or the number of layers of the gate insulating film 104 near the channel differs, the amount of impurity added to the semiconductor film are different depending on a position, so that an LDD region can be formed. When the LDD region is formed, leak current and generation of hot carriers can be suppressed, and reliability can be improved.

The gate insulating film 104 is not necessarily formed in a region in which the pixel electrode 113 is formed. In this case, a distance between the pixel electrode 113 and the conductive film 115 can be reduced, so that an electric field can be easily controlled.

The gate insulating film 104 is formed of, for example, an insulating material containing oxygen or nitrogen, such as silicon oxide (SiOx), silicon nitride (SiNx), silicon oxide containing nitrogen (SiOxNy: x>y), or silicon nitride containing oxygen (SiNxOy: x>y). Alternatively, the gate insulating film 104 may be a stacked-layer film in which a plurality of these films are stacked. The gate electrode 105 provided above the semiconductor film 103 is formed over the gate insulating film 104.

As shown in FIGS. 4 and 3, the gate electrode (the gate wiring) 105 is in the same wiring layer as the wiring 119.

The first interlayer insulating film 106 is formed over the gate insulating film 104 and the gate electrode 105. An inorganic material or an organic material can be used for the first interlayer insulating film 106. As the organic material, polyimide, acrylic, polyamide, polyimide amide, resist, siloxane, polysilazane, or the like can be used. As the inorganic material, an insulating material containing oxygen or nitrogen, such as silicon oxide (SiOx), silicon nitride (SiNx), silicon oxide containing nitrogen (SiOxNy: x>y), or silicon nitride containing oxygen (SiNxOy: x>y); or a stacked-layer film in which a plurality of these films are stacked can be used. Alternatively, a stacked-layer film in which the organic material and the inorganic material are combined may be used.

A contact hole located over the region 131*a*, a contact hole located over the region 131*b*, and a contact hole located over the wiring 119 are formed in the insulating film 102, the gate insulating film 104, and the first interlayer insulating film 106. The source wiring 107, the electrode 108, and the connection electrode 109 are formed over the first interlayer insulating film 106.

Note that when an inorganic material is used for the insulating film, intrusion of moisture and an impurity can be prevented. In particular, a layer containing nitrogen can efficiently block moisture and an impurity.

Note that when an organic material is used for the insulating film, a surface thereof can be planarized. Accordingly, the insulating film can have a good effect on a layer provided thereover. For example, the layer formed over the organic material can also be planarized, so that disturbance of orientation of liquid crystals can be prevented.

The source wiring 107 is located above the region 131a, and is electrically connected to the region 131a through the contact hole. Therefore, the electrode 108 is electrically connected to the region 131b through the contact hole.

Note that the pixel electrode 113 and the impurity region 131b may be directly connected to each other without a conductive film for connection interposed therebetween. In this case, a contact hole for connecting the pixel electrode 113 and the impurity region 131b is needed to be deep; however, a conductive film for connection is not needed, and a region for the conductive film for connection can be used as an opening region for displaying an image. Thus, an aperture ratio can be increased, and reduction in power consumption can be realized.

The connection electrode 109 is located above the wiring 119, and is electrically connected to the wiring 119 and the conductive film 115. The conductive film 115 is electrically connected to the wiring 119 through the connection electrode 109 in this manner. Note that a plurality of connection electrodes 109 may be provided. Thus, a potential of the conductive film 115 is stabilized. Further, the number of times for forming a contact hole can be reduced by connecting the conductive film 115 and the wiring 119 through the connection electrode 109, so that a process can be simplified.

Note that the connection electrode 109 is formed of the same material as the source wiring 107 at the same time; however, the invention is not limited thereto. The connection electrode 109 may be formed of the same material as the pixel electrode 113 at the same time.

The second interlayer insulating film 111 is formed over the source wiring 107, the electrode 108, the connection electrode 109, and the first interlayer insulating film 106. Note that a structure may be employed in which the second interlayer insulating film 111 is not formed (see FIG. 28). An inorganic material or an organic material can be used for the second interlayer insulating film 111. As the organic material, polyimide, acrylic, polyamide, polyimide amide, resist, siloxane, polysilazane, or the like can be used. As the inorganic material, an insulating material containing oxygen or nitrogen, such as silicon oxide (SiOx), silicon nitride (SiNx), silicon oxide containing nitrogen (SiOxNy: x>y), or silicon nitride containing oxygen (SiNxOy: x>y); or a stacked-layer film in which a plurality of these films are stacked can be used. Alternatively, a stacked-layer film in which the organic material and the inorganic material are combined may be used.

Figure 28:
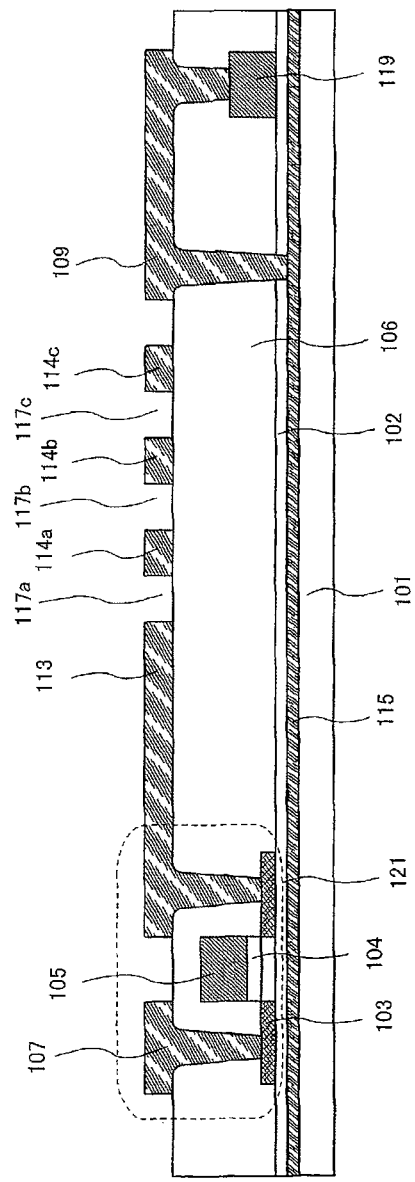
FIG. 28 shows a liquid crystal display device of the invention.

FIG. 28 is a cross-sectional view in the case where the second interlayer insulating film 111 is not formed. In FIG. 28, the portions same as those in FIG. 3 are denoted by the same reference numerals. Since the electrode 108 is not formed, the pixel electrode 113 is directly connected to the island-shaped semiconductor film 103. The source wiring 107, the pixel electrodes 113 and 114, and the connection electrode 109 are formed of the same material in the same step. In a structure shown in FIG. 28, a distance between the pixel electrode 113 and the conductive film 115 can be reduced, and an electric field can be easily controlled.

The pixel electrodes 113, 114a, 114b, and 114c, and the like which are second electrodes in FFS drive are formed over the second interlayer insulating film 111. Note that the pixel electrode 113 and the pixel electrodes 114 (114a, 114b, 114c, and the like) are separated in FIGS. 1 and 3, which are cross-sectional views, for convenience; as is apparent from FIG. 4, which is a top plan view, the pixel electrodes are formed in such a manner that grooves (also referred to as openings, slits, apertures, gaps, or spaces) 117 (117a, 117b, 117c, and the like) are formed in a conductive film formed of the same material in the same step. Accordingly, in the following description, the pixel electrodes 113 and 114 (114a, 114b, 114c, and the like) may be collectively referred to as the pixel electrode 113 in some cases.

The pixel electrode 113 functions as a pixel electrode to which voltage depending on each pixel is applied, and is formed of ITO (indium tin oxide), ZnO (zinc oxide), IZO formed by using a target in which ZnO of 2 to 20 wt % is mixed to indium oxide, tin oxide (SnO), or the like. Part of the pixel electrode 113 is located above the electrode 108 and is electrically connected to the electrode 108. Thus, the pixel electrode 113 is electrically connected to the region 131b of the thin film transistor 121 through the electrode 108.

Note that when the connection electrode 109 is not provided, the pixel electrode 113 is directly connected to the region 131b of the thin film transistor 121.

As shown in FIGS. 3 and 4, the pixel electrode 113 is generally rectangular and includes a plurality of grooves 117a, 117b, 117c, and the like. Examples of the grooves 117a, 117b, 117c, and the like often include grooves which are slit-shaped and in parallel to each other.

In an example in FIG. 4, the grooves 117a, 117b, 117c, and the like are directed obliquely to the source wiring 107, and directions of the grooves in the upper half of the pixel in the drawing and the grooves in the lower half thereof are different from each other. By formation of the grooves 117a, 117b, 117c, and the like, an electric field having a component parallel to the substrate between the conductive film 115 and the pixel electrode 113 is generated from each pixel electrode 114 to the conductive film 115. Thus, orientation of liquid crystals described below can be controlled by controlling potentials of the pixel electrodes 113 and 114.

In addition, as shown in FIG. 4, the directions of the groves 117 (117a, 117b, 117c, and the like) vary. Thus, a plurality of regions in which a direction toward which liquid crystal molecules move varies can be provided. In other words, a multi-domain structure can be employed. With a multi-domain structure, a display defect can be prevented when an image is seen from a particular direction. Accordingly, a viewing angle can be improved.

Note that a shape of the groove is not limited to those in this embodiment mode. A shape of the groove includes a space in which a conductor is not formed, for example, a space between comb-shaped portions of a comb-shaped electrode.

When the thickness of the pixel electrode 113 and the thickness of the conductive film 115 are compared, the conductive film 115 is preferably thicker than the pixel electrode 113. More preferably, the conductive film 115 is 1.5 times or more as thick as the pixel electrode 113. Accordingly, resistance can be reduced.

Figure 5:
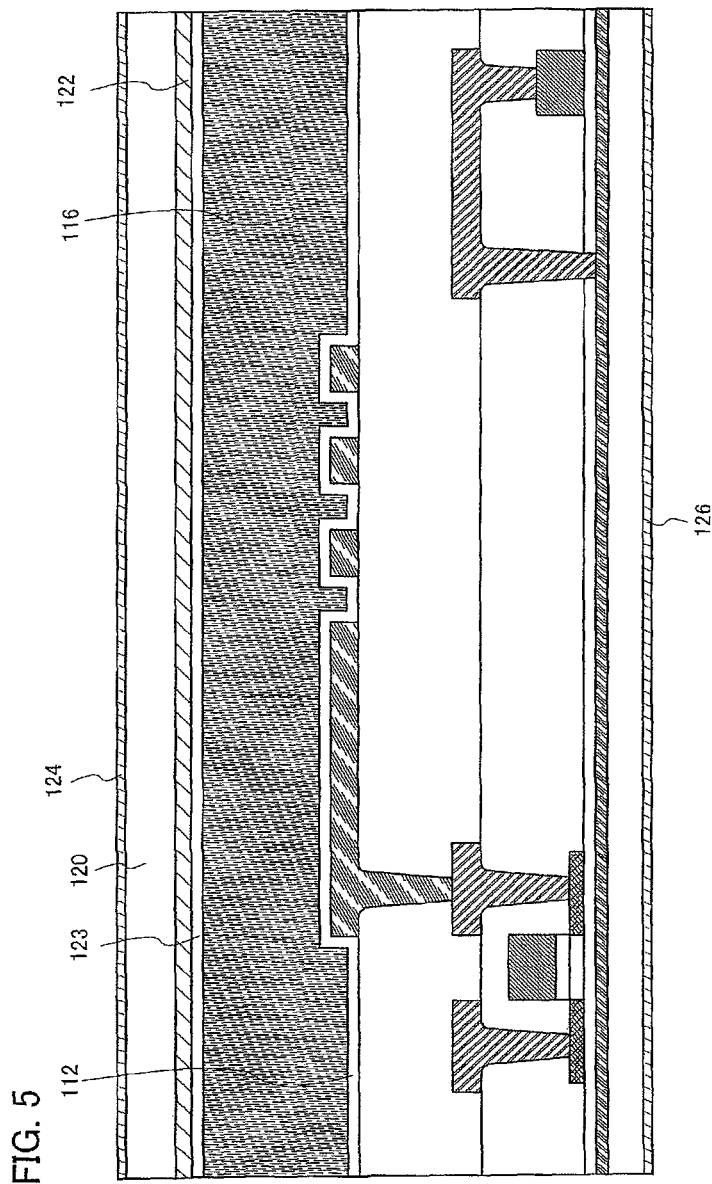
FIG. 5 is a cross-sectional view of a liquid crystal display device of the invention.

As shown in FIG. 5, a first alignment film 112 and a liquid crystal 116 are stacked over the second interlayer insulating film 111 and the pixel electrode 113. As the liquid crystal 116, a ferroelectric liquid crystal (FLC), a bistable liquid crystal, a nematic liquid crystal, a smectic liquid crystal, a polymer dispersed liquid crystal, a liquid crystal to be homogeneously aligned, a liquid crystal to be homeotropically aligned, or the like can be used. Alternatively, an element other than a liquid crystal, for example, an electrical image element may be used. An opposite substrate 120 is provided over the liquid crystal 116 with a second alignment film 123 and a color filter 122 interposed therebetween. The substrate 101 and the opposite substrate 120 are provided with polarizing plates 126 and 124, respectively.

Note that a retardation plate, a λ/4 plate, or the like is often provided in addition to the polarizing plate.

Note that in the aforementioned structure, capacitance is formed by portions of the conductive film 115 and the pixel electrode 113, in which grooves are not formed, and by each insulating film interposed between the conductive film 115 and the pixel electrode 113. Storage capacitance is increased by the formation of the capacitance.

Next, an example of a manufacturing method of a semiconductor device and a liquid crystal display device in the invention is described. First, the conductive film 115 having a light-transmitting property (e.g., indium tin oxide (ITO), indium zinc oxide (IZO), zinc oxide (ZnO), tin oxide (SnO), or silicon (Si)) is formed over the entire surface of the substrate 101.

Figure 25:
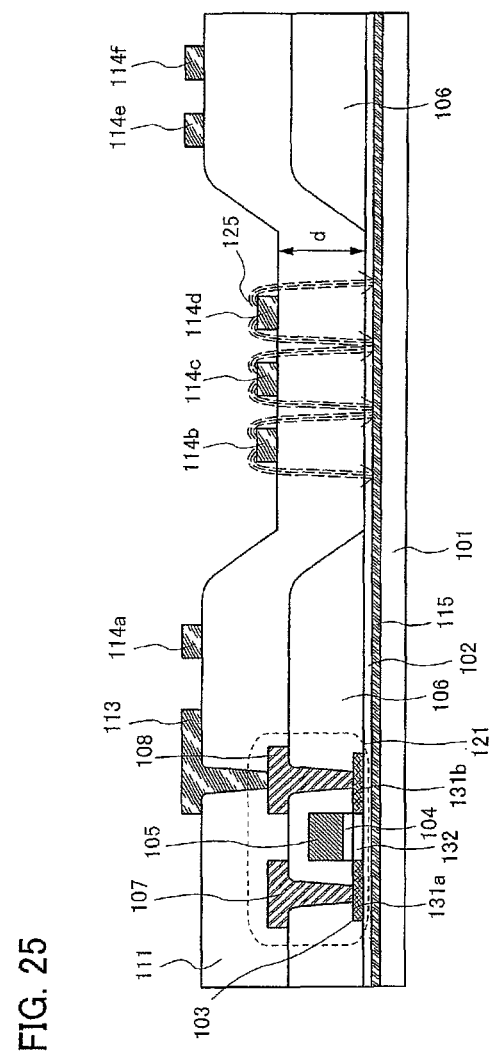
FIG. 25 is a cross-sectional view of a liquid crystal display device of the invention.

As shown in FIG. 25, the interlayer insulating film 106 may be removed in an opening portion. Alternatively, the gate insulating film 104 and the base film 102 may be removed. That is, a semiconductor device in which the interlayer insulating film 106 is removed at an opening portion, a semiconductor device in which the insulating film 106 and the gate insulating film 104 are removed at an opening portion, or a semiconductor device in which the interlayer insulating film 106, the gate insulating film 104, and the base film 102 are removed at an opening portion can be formed. Accordingly, a distance d between the conductive film 115 and the pixel electrodes 114 (in FIG. 25, the pixel electrodes 114b, 114c, and 114d among the pixel electrodes 114a to 114f) can be reduced; thus, an electric field can be easily controlled.

Next, the insulating film 102 is formed over each of the substrate 101 and the conductive film 115. The insulating film 102 is preferably formed thicker than the gate insulating film 104 described below. Then, a semiconductor film (e.g., a polycrystalline silicon film) is formed over the insulating film 102 and is selectively removed by etching with the use of a resist. Thus, the island-shaped semiconductor film 103 is formed over the insulating film 102.

As the semiconductor film, an amorphous silicon film or another non-crystalline silicon film may be used as well as the polycrystalline silicon film. Further, the invention is not limited to silicon, and a compound semiconductor such as ZnO, a-InGaZnO, SiGe, or GaAs may also be used.

Alternatively, a semiconductor substrate or an SOI (Silicon On Insulator) substrate may be used as the substrate 101 to form the island-shaped semiconductor film 103.

Next, the gate insulating film 104 is formed over the semiconductor film 103 and the insulating film 102. The gate insulating film 104 is a silicon oxide film containing nitrogen or a silicon oxide film, for example, and is formed by a plasma CVD method. Note that the gate insulating film 104 may be formed of a silicon nitrogen film or a stacked-layer film containing silicon nitride and silicon oxide. Next, a conductive film is formed over the gate insulating film 104 and is selectively removed by etching. Thus, the gate electrode 105 is formed over the gate insulating film 104 located over the semiconductor film 103. Further, the gate wiring 105 and the wiring 119 are formed in this step.

Note that by provision of the wiring 119 as described above, a potential of the conductive film 115 in each pixel can be stabilized. Alternatively, the wiring 119 is not formed in some cases. Further, the wiring 119 may be in another layer (e.g., the same layer as the source wiring 107, the same layer as the conductive film 115, or the same layer as the pixel electrode 113), or may be separately provided in a plurality of layers. In addition, although the wiring 119 is extended in a direction perpendicular to the source wiring 107 in the drawing, it may be extended in the same direction as the source wiring 107.

The conductive film forming the gate electrode 105 and the wiring 119 is preferably formed of one or a plurality of elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); a compound or an alloy material containing one or a plurality of the aforementioned elements (e.g., indium tin oxide (ITO), indium zinc oxide (IZO), indium tin oxide containing silicon oxide (ITSO), zinc oxide (ZnO), tin oxide (SnO), cadmium tin oxide (CTO), aluminum-neodymium (Al—Nd), magnesium-silver (Mg—Ag), or molybdenum-niobium (Mo—Nb)); a substance in which these compounds are combined; or the like. Alternatively, the conductive film is preferably formed of a compound (silicide) of silicon and one or a plurality of the aforementioned elements (e.g., aluminum-silicon, molybdenum-silicon, or nickel-silicide), or a compound of nitrogen and one or a plurality of the aforementioned elements (e.g., titanium nitride, tantalum nitride, or molybdenum nitride).

Note that silicon (Si) may contain an n-type impurity (such as phosphorus) or a p-type impurity (such as boron). When silicon contains the impurity, the conductivity is increased, and a function similar to a general conductor can be realized. Thus, such silicon can be utilized easily as a wiring, an electrode, or the like.

In addition, silicon with various levels of crystallinity, such as single crystalline silicon, polycrystalline silicon, or microcrystalline silicon can be used. Alternatively, silicon having no crystallinity, such as amorphous silicon can be used. By using single crystalline silicon or polycrystalline silicon, resistance of a wiring, an electrode, a conductive layer, a conductive film, a terminal, or the like can be reduced. By using amorphous silicon or microcrystalline silicon, a wiring or the like can be formed by a simple process.

Aluminum and silver have high conductivity, and thus can reduce a signal delay. Further, since aluminum and silver can be easily etched, they can be minutely processed.

Copper has high conductivity, and thus can reduce a signal delay. When copper is used, a stacked-layer structure is preferably employed to improve adhesion.

Molybdenum and titanium are preferable since even if molybdenum or titanium is in contact with an oxide semiconductor (e.g., ITO or IZO) or silicon, molybdenum or titanium does not cause defects. Further, molybdenum and titanium are preferable since they are easily etched and has high heat resistance.

Tungsten is preferable since it has an advantage such as high heat resistance.

Neodymium is also preferable since it has an advantage such as high heat resistance. In particular, an alloy of neodymium and aluminum is preferable since heat resistance is increased and aluminum hardly causes hillocks.

Silicon is preferable since it can be formed at the same time as a semiconductor layer included in a transistor and has high heat resistance.

Since ITO, IZO, ITSO, zinc oxide (ZnO), silicon (Si), tin oxide (SnO), and cadmium tin oxide (CTO) have light-transmitting properties, they can be used as a portion which transmits light. For example, they can be used for a pixel electrode or a common electrode.

IZO is preferable since it is easily etched and processed. In etching IZO, a residue is hardly left. Thus, when IZO is used for a pixel electrode, defects (such as short circuit or orientation disorder) of a liquid crystal element or a light-emitting element can be reduced.

The conductive film forming the gate electrode 105 and the wiring 119 may have a single-layer structure or a multi-layer structure. By employing a single-layer structure, a manufacturing process of the conductive film forming the gate electrode 105 and the wiring 119 can be simplified, the number of days for a process can be reduced, and cost can be reduced. Alternatively, by employing a multi-layer structure, a wiring, an electrode, and the like with high quality can be formed while an advantage of each material is utilized and a disadvantage thereof is reduced. For example, when a low-resistant material (e.g., aluminum) is included in a multi-layer structure, reduction in resistance of a wiring can be realized. Further, when a stacked-layer structure where a low heat-resistant material is interposed between high heat-resistant materials is employed, heat resistance of a wiring, an electrode, and the like can be increased, utilizing advantages of the low heat-resistance material. For example, it is preferable to employ a stacked-layer structure where a layer containing aluminum is interposed between layers containing molybdenum, titanium, neodymium, or the like.

When wirings, electrodes, or the like are in direct contact with each other, they adversely affect each other in some cases. For example, one wiring or one electrode is mixed into a material of another wiring or another electrode and changes its properties, and thus, an intended function cannot be obtained in some cases. As another example, when a high-resistant portion is formed, a problem may occur so that it cannot be normally formed. In such cases, a reactive material is preferably interposed by or covered with a non-reactive material in a stacked-layer structure. For example, when ITO and aluminum are connected, titanium, molybdenum, or an alloy of neodymium is preferably interposed between ITO and aluminum. As another example, when silicon and aluminum are connected, titanium, molybdenum, or an alloy of neodymium is preferably interposed between silicon and aluminum.

Note that the term "wiring" indicates a portion including a conductor. A wiring may be provided linearly or may be short without being extended linearly. Therefore, an electrode is included in a wiring.

Next, an impurity is injected into the semiconductor film 103 by using the gate electrode 105 as a mask. Thus, the region 131a which is one of the source region and the drain region, the region 131b which is the other of the source region and the drain region, and the channel formation region 132 are formed in the semiconductor film 103. Note that an n-type impurity element and a p-type impurity element may be separately injected, or both the n-type impurity element and the p-type impurity element may be injected into a particular region. In the latter case, the mount of one of the n-type impurity element and the p-type impurity element should be larger than the other. Note that in the step, a resist may be used for a mask.

At this time, an LDD region may be formed by changing the thickness or a stacked-layer structure of the gate insulating film 104. In a portion in which the LDD region is to be formed, the gate insulating film 104 may be thickened or the number of layers may be increased. Thus, the amount of impurity to be injected is reduced, and an LDD region can be easily formed.

Note that the impurity may be injected into the semiconductor film 103 before the gate electrode 105 is formed, for example, before or after the gate insulating film 104 is formed. In this case, a resist is used a mask. Accordingly, capacitance can be formed between the electrode in the same layer as the gate and the semiconductor film into which the impurity is injected. The gate insulating film is provided between the electrode in the same layer as the gate and the semiconductor film into which the impurity is injected, so that capacitance with thin thickness and large capacity can be formed.

Next, the first interlayer insulating film 106 is formed, and further, a contact hole is formed. Then, a conductive film (e.g., a metal film) is formed over the first interlayer insulating film 106 and is selectively removed by etching with the use of a mask. Thus, the source wiring 107, the electrode 108, and the connection electrode 109 are formed.

Next, the second interlayer insulating film 111 is formed, and further, a contact hole is formed. Then, a conductive film having a light-transmitting property (e.g., indium tin oxide (ITO), indium zinc oxide (IZO), zinc oxide (ZnO), tin oxide (SnO), or silicon (Si)) is formed over the second interlayer insulating film 111, and is selectively removed by etching with the use of a resist. Thus, the pixel electrode 113 is formed.

When the contact hole filled with part of the electrode 108 and the contact hole filled with part of the pixel electrode 113 are located at the same position, layout can be efficiently performed because the contact holes are located at one place. Thus, an aperture ratio of the pixel can be improved.

On the other hand, the contact hole filled with part of the electrode 108 and the contact hole filled with part of the pixel electrode 113 may be located at different positions. Thus, when portions of the electrode 108 and the pixel electrode 113, which are located above the contact holes, are depressed, the depressed portions do not overlap with each other. Thus, the deeply depressed portion is not formed at the pixel electrode 113, and generation of a defect of the resist can be suppressed. Thereafter, the resist is removed.

Next, the first alignment film 112 is formed, and the liquid crystal 116 is sealed between the first alignment film 112 and the opposite substrate 120 on which the color filter 122 and the second alignment film 123 are formed. Thereafter, sides of the opposite substrate 120 and the substrate 101, which are not in contact with the liquid crystal 116, are provided with the polarizing plates 126 and 124, a retardation plate (not shown), an optical film (not shown) such as a $\lambda/4$ plate, an optical film such as a diffusing plate or a prism sheet, or the like. Further, a backlight or a front light is provided. As the backlight, a direct type backlight or a sidelight type backlight can be used. As a light source, a cold cathode tube or an LED (a light-emitting diode) can be used. As the LED, a white LED or a combination of LEDs of respective colors (e.g., white, red, blue, green, cyan, magenta, and/or yellow) may be used. By using the LED, color purity can be improved because the LED has a sharp peak of light wavelength. In the case of a sidelight type backlight, a light guide plate is provided to realize a uniform surface light source. The liquid crystal display device is formed in such a manner.

Note that a liquid crystal display device may only refer to a substrate, an opposite substrate, and a liquid crystal interposed therebetween. Alternatively, the liquid crystal display device may further include an optical film such as a polarizing plate or a retardation plate. Further alternatively, the liquid crystal display device may also include a diffusing plate, a prism sheet, a light source (such as a cold cathode tube or an LED), a light-guide plate, and the like.

In this embodiment mode, a so-called top-gate thin film transistor in which a gate electrode is located above a channel region is described; however, the present invention is not particularly limited thereto. A so-called bottom-gate thin film transistor in which a gate electrode located below a channel region, or a transistor having a structure in which gate electrodes are arranged above and below a channel region may be formed.

In this embodiment mode, a so-called single-gate thin film transistor in which one gate electrode is formed is described; however, a so-called multi-gate thin film transistor in which two or more gate electrodes are formed may be formed.

A liquid crystal display device may be a transmissive liquid crystal display device or a reflective liquid crystal display device. For example, the conductive film 115 is formed of a light-transmitting film (e.g., an indium tin oxide (ITO) film, an indium zinc oxide (IZO) film, a zinc oxide (ZnO) film, or a polycrystalline silicon film or an amorphous silicon film into which an impurity is introduced), and the pixel electrode 113 is formed of a reflective conductive film, for example, a metal film. Thus, a reflective liquid crystal display device can be realized. In addition, the pixel electrode 113 is formed of a light-transmitting film, and part of the conductive film 115 is formed of a reflective conductive film, for example, a metal film, whereas the other part of the conductive film 115 is formed of a light-transmitting film; thus, a transflective liquid crystal display device can be realized.

In a reflective liquid crystal display device, when a reflective conductive film, for example, a metal film is used as the conductive film 115, the conductive film 115 can have a function as a reflecting plate. A reflective conductive film can be used as one or both of the pixel electrode 113 and the conductive film 115. Further, an insulating film (e.g., a silicon oxide film) may be provided between the substrate 101 and the conductive film 115, and a metal film as a reflecting film may be formed in the insulating film. A reflecting sheet (e.g., an aluminum film) as a reflecting film may be formed on an external surface of the substrate 101. Note that the contents described here can be similarly applied to embodiment modes described below.

According to this embodiment mode, a liquid crystal display device with a wide viewing angle and lower manufacturing cost than a conventional liquid crystal display device can be provided.

In this embodiment mode, since a conductive film is formed over an entire surface of a substrate, an impurity from the substrate can be prevented from being mixed into an active layer. Thus, a semiconductor device with high reliability can be obtained.

In this embodiment mode, since a semiconductor device including a top-gate thin film transistor is formed, a potential of a back gate is stabilized; thus, a semiconductor device with high reliability can be obtained.

[Embodiment Mode 2]

In this embodiment mode, an example in which a bottom-gate TFT is formed as a switching element in a pixel portion is described with reference to FIG. 2.

A conductive film 202, a base film 203, a gate electrode 204, a gate insulating film 213, an island-shaped semiconductor film 206 to be an active layer, a region 208a which is one of a source region and a drain region, a region 208b which is the other of the source region and the drain region, an electrode 207a which is one of a source electrode and a drain electrode, an electrode 207b which is the other of the source electrode and the drain electrode, and pixel electrodes 209 and 214 (214a, 214b, 214c, and the like) are formed over a substrate 201. A TFT 212 includes the gate electrode 204, the gate insulating film 213, the island-shaped semiconductor film 206, and the regions 208a and 208b.

A horizontal electric field 225 is generated between the pixel electrodes 214 and the conductive film 202. Liquid crystal molecules are driven by the horizontal electric field 225.

An electrode 205 formed of the same material and in the same step as the gate electrode 204 is formed over the base film 203. An electrode 211 formed of the same material and in the same step as the pixel electrode 209 is formed over an insulating film 210. The electrode 211 is electrically connected to the conductive film 202 and the electrode 205 through contact holes formed in the base film 203, the gate insulating film 213, and the insulating film 210.

As the substrate 201, a material similar to that of the substrate 101 may be used.

As the conductive film 202, a conductive film similar to the conductive film 115 described in Embodiment Mode 1 may be used.

The base film 203 may be formed of a material similar to that of the base film 102.

The gate electrode 204 and the electrode 205 may be formed of a material and in a step similar to those of the gate electrode 105. The gate insulating film 213 is formed of a material similar to that of the gate insulating film 104 or the interlayer insulating film 106 over an entire surface of the substrate 201.

In this embodiment mode, a so-called single-gate thin film transistor in which one gate electrode is formed is described; however, a so-called multi-gate thin film transistor in which two or more gate electrodes are formed may be formed.

The island-shaped semiconductor film 206, which is the active layer, is formed of a material similar to that of the island-shaped semiconductor film 103, and preferably, an amorphous semiconductor film or a microcrystalline semiconductor film (a semi-amorphous semiconductor film). In that case, after an intrinsic semiconductor film (the island-shaped semiconductor film 206) is formed, a semiconductor film containing an impurity imparting one conductivity type is formed. As the impurity imparting one conductivity type, phosphorus (P) or arsenic (As) may be used as an impurity imparting n-type conductivity, and boron (B) may be used as an impurity imparting p-type conductivity. A bottom-gate TFT in this embodiment mode employs a channel etch type; thus, after an island-shaped semiconductor film, a source electrode, and a drain electrode are formed, part of a channel formation region is needed to be etched.

Next, a conductive film is formed over the gate insulating film 213 and the island-shaped semiconductor film 206, and the electrodes 207a and 207b are formed by etching. Thereafter, by using the electrodes 207a and 207b as masks, part of the semiconductor film containing the impurity imparting one conductivity type is etched to form the regions 208a and 208b.

The insulating film 210 is formed over the island-shaped semiconductor film 206, the regions 208a and 208b, and the electrodes 207a and 207b. The insulating film 210 may be formed of a material and in a step similar to those of the interlayer insulating film 106 or the interlayer insulating film 111. Note that when an organic material is not used for the insulating film 210, a distance d between the pixel electrode 214 and the conductive film 202 can be reduced; thus, an electric field can be easily controlled.

The pixel electrodes 209 and 214 (214a, 214b, 214c, and the like) and the electrode 211 are formed over the insulating film 210. The pixel electrodes 209 and 214 are formed in such a manner that grooves are formed in a conductive film, similar to the pixel electrodes 113 and 114.

The electrode 211 is electrically connected to the electrode 205 through a contact hole formed in the gate insulating film 213 and the insulating film 210, and is also electrically connected to the conductive film 202 through a contact hole formed in the base film 203, the gate insulating film 213, and the insulating film 210.

An alignment film 215 is formed over the pixel electrodes 209 and 214, and the electrode 211. The alignment film 215 may be formed of a material similar to that of the alignment film 112.

A color filter 222 and an alignment film 223 are formed over an opposite substrate 221. The opposite substrate 221, the color filter 222, and the alignment film 223 may be formed of a material similar to that of the opposite substrate 120, the color filter 122, and the alignment film 123, respectively.

The alignment film 223 over the opposite substrate 221 and the alignment film 215 over the substrate 201 face each other, and a liquid crystal 216 is injected into a space.

Thereafter, sides of the opposite substrate 221 and the substrate 201, which are not in contact with the liquid crystal 216, are provided with polarizing plates 224 and 217, a retardation plate (not shown), an optical film (not shown) such as a λ/4 plate, an optical film such as a diffusing plate or a prism sheet, or the like. Further, a backlight or a front light is provided. As the backlight, a direct type backlight or a sidelight type backlight can be used. As a light source, a cold cathode tube or an LED (a light-emitting diode) can be used. As the LED, a white LED or a combination of LEDs of respective colors (e.g., white, red, blue, green, cyan, magenta, and/or yellow) may be used. By using the LED, color purity can be improved because the LED has a sharp peak of light wavelength. In the case of a sidelight type backlight, a light guide plate is provided to realize a uniform surface light source. The liquid crystal display device is formed in such a manner.

Figure 26:
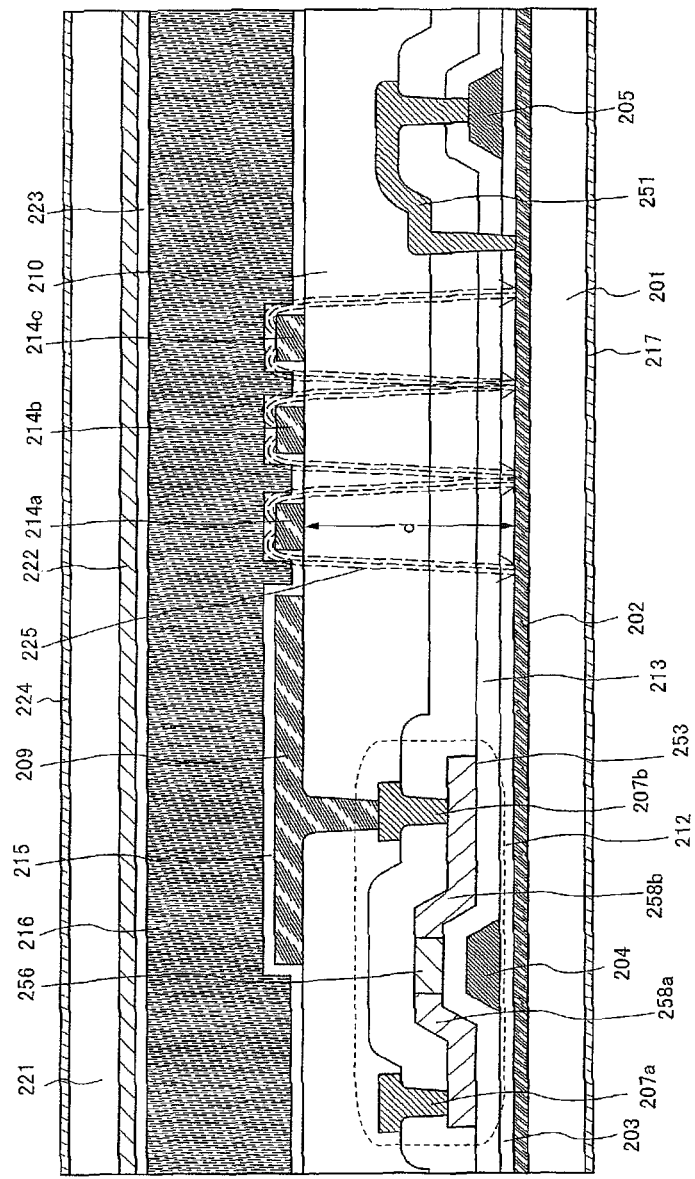
FIG. 26 is a cross-sectional view of a liquid crystal display device of the invention.

FIG. 26 shows an example where an active layer of the TFT 212 is formed of a crystalline semiconductor film. In FIG. 26, the portions same as those in FIG. 2 are denoted by the same reference numerals. In FIG. 26, the TFT 212 includes an island-shaped crystalline semiconductor film 253 as an active layer. The island-shaped crystalline semiconductor film 253 includes a channel formation region 256, a region 258a which is one of a source region and a drain region, and a region 258b which is the other of the source region and the drain region.

Figure 2:
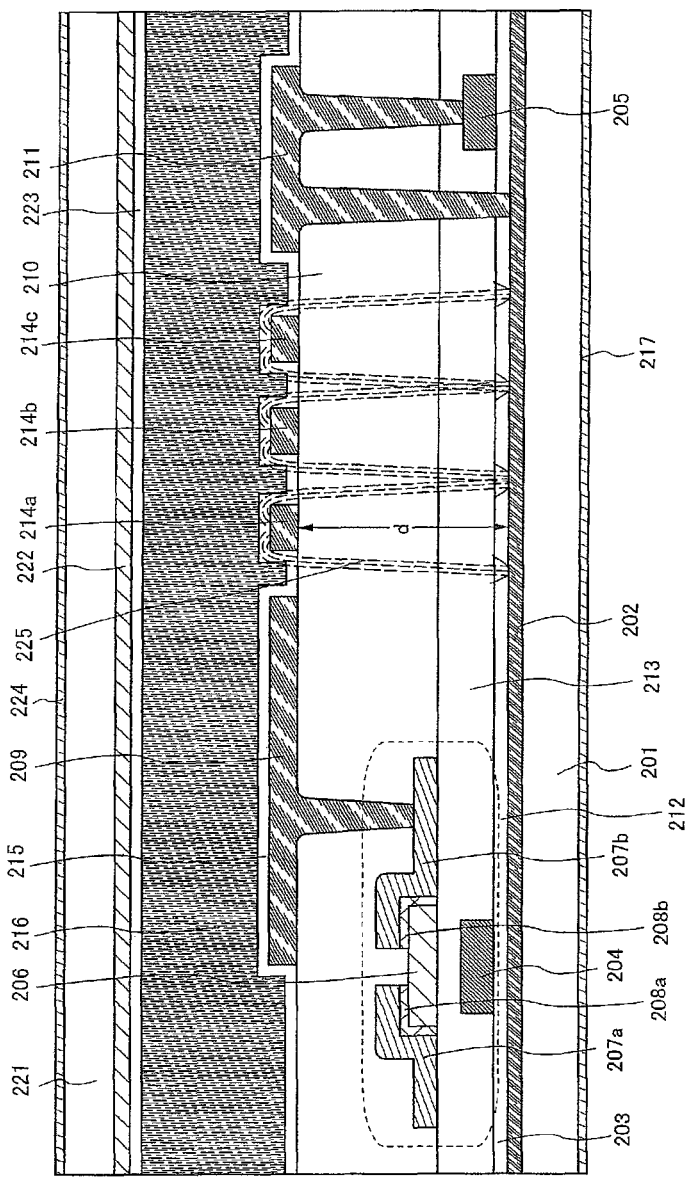
FIG. 2 is a cross-sectional view showing a structure example of a pixel portion using a bottom-gate thin film transistor.

Instead of the electrode 211 in FIG. 2, an electrode 251 formed of the same material and in the same step as the electrode 207a which is one of the source electrode and the drain electrode and the electrode 207b which is the other of the source electrode and the drain electrode is used.

Note that since this embodiment mode is similar to Embodiment Mode 1, except that the TFT 121 in Embodiment Mode 1 is replaced with the bottom-gate TFT 212 in this embodiment mode, materials and manufacturing steps of the other structures can refer to those described in Embodiment Mode 1.

According to this embodiment mode, a liquid crystal display device with a wide viewing angle and lower manufacturing cost than a conventional liquid crystal display device can be provided.

In the invention, since a conductive film is formed over an entire surface of a substrate, an impurity from the substrate can be prevented from being mixed into an active layer. Thus, a semiconductor device with high reliability can be obtained.

[Embodiment Mode 3]

Figure 6:
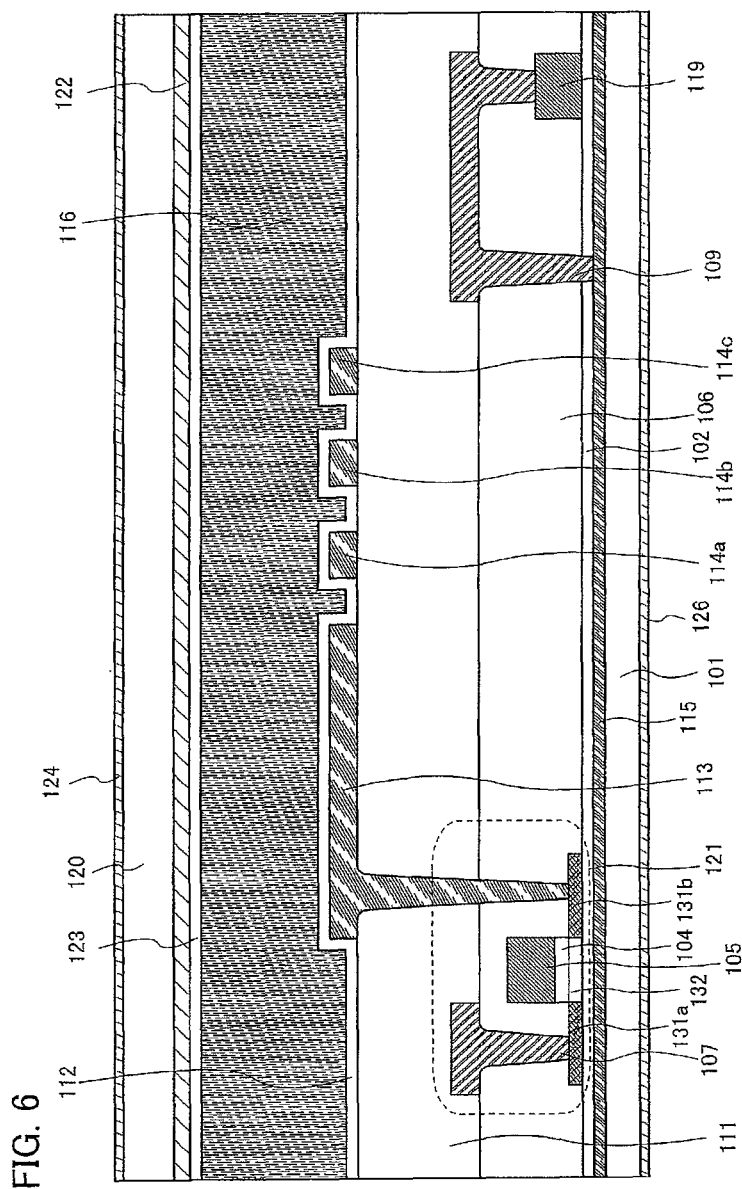
FIG. 6 is a cross-sectional view of a liquid crystal display device of the invention.

In this embodiment mode, FIG. 6 shows an example where the electrode 108 in Embodiment Mode 1 is not formed and the pixel electrode 113 is formed to be directly connected to the region 131b. The reference numerals in Embodiment Mode 1 are used for reference numerals in FIG. 6. Materials and manufacturing steps of the other structures can refer to those described in Embodiment Mode 1. This embodiment mode has an advantage of improvement in aperture ratio because the electrode 108 is not formed.

A bottom-gate TFT described in Embodiment Mode 2 may be used when needed.

According to this embodiment mode, a liquid crystal display device with a wide viewing angle and lower manufacturing cost than a conventional liquid crystal display device can be provided.

In the invention, since a conductive film is formed over an entire surface of a substrate, an impurity from the substrate can be prevented from being mixed into an active layer. Thus, a semiconductor device with high reliability can be obtained.

In the invention, when a semiconductor device including a top-gate thin film transistor is formed, a potential of a back gate is stabilized; thus, a semiconductor device with high reliability can be obtained.

[Embodiment Mode 4]

This embodiment mode is described with reference to FIGS. 10 to 13. The reference numerals in Embodiment Mode 1 are used for reference numerals in FIGS. 10 to 13. Materials and manufacturing steps of the other structures may refer to those described in Embodiment Mode 1.

A bottom-gate TFT described in Embodiment Mode 2 may be used when needed.

Further, a structure where a pixel electrode is directly connected to an active layer, which is described in Embodiment Mode 3, may be used when needed.

In FIG. 10, an electrode 141 formed of a material and in a step similar to those of the pixel electrode 113 is used instead of the connection electrode 109 in FIG. 6. The wiring 119 and the conductive film 115 are electrically connected through the electrode 141.

Figure 11:
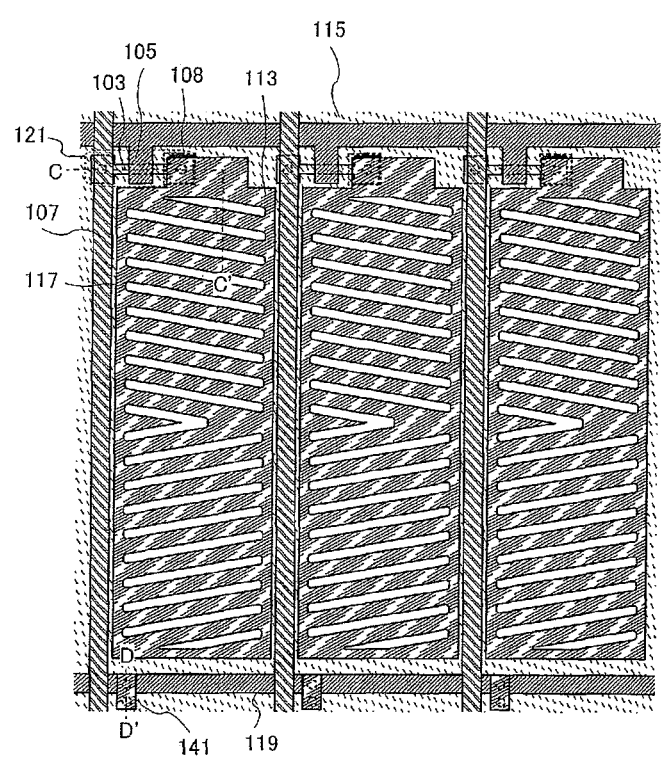
FIG. 11 is a top plan view of a liquid crystal display device of the invention.

FIG. 11 is a top plan view of FIG. 10. In FIG. 11, the portions same as those in FIGS. 4 and 10 are denoted by the same reference numerals. FIG. 10 is a cross-sectional view of C-C' and D-D' in FIG. 11.

Figure 12:
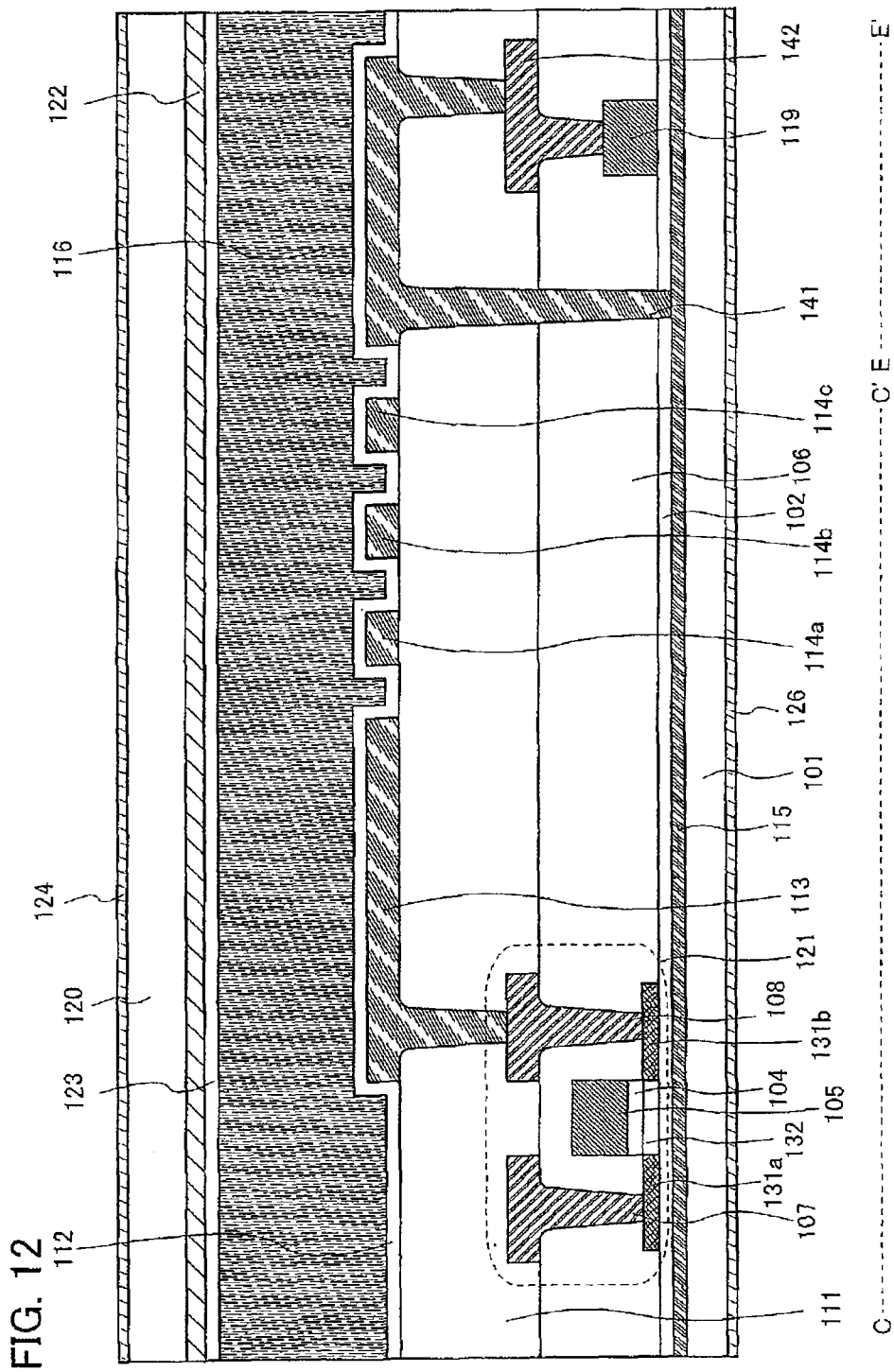
FIG. 12 is a cross-sectional view of a liquid crystal display device of the invention.

In FIG. 12, the electrode 141 formed of a material and in a step similar to those of the pixel electrode 113; and an electrode 142 formed of a material and in a step similar to those of the electrodes 107 and 108 are used instead of the connection electrode 109 in FIG. 6. The wiring 119 and the conductive film 115 are electrically connected through the electrodes 141 and 142.

Figure 13:
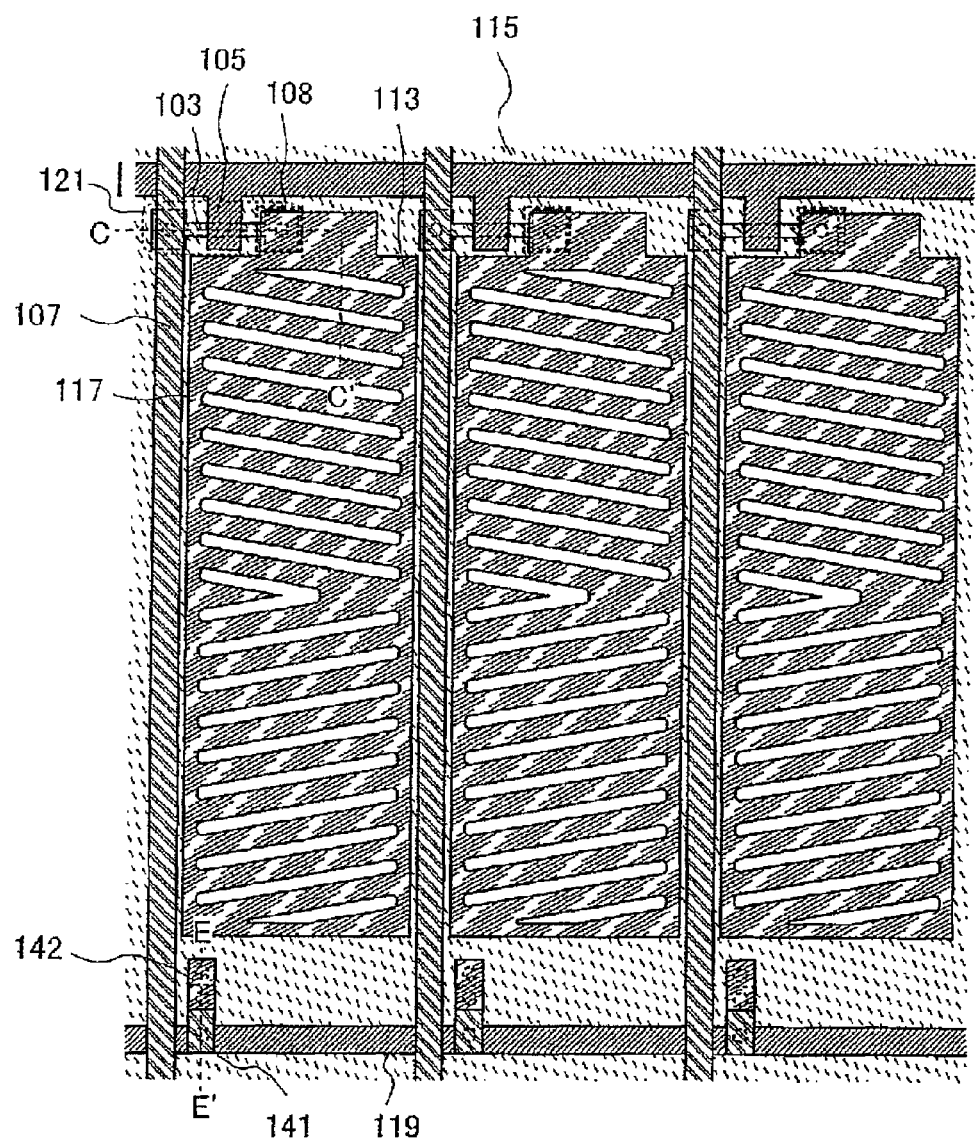
FIG. 13 is a top plan view of a liquid crystal display device of the invention.

FIG. 13 is a top plan view of FIG. 12. In FIG. 13, the portions same as those in FIGS. 4 and 12 are denoted by the same reference numerals. FIG. 12 is a cross-sectional view of C-C' and D-D' in FIG. 13.

According to this embodiment mode, a liquid crystal display device with a wide viewing angle and lower manufacturing cost than a conventional liquid crystal display device can be provided.

In the invention, since a conductive film is formed over an entire surface of a substrate, an impurity from the substrate can be prevented from being mixed into an active layer. Thus, a semiconductor device with high reliability can be obtained.

In the invention, when a semiconductor device including a top-gate thin film transistor is formed, a potential of a back gate is stabilized; thus, a semiconductor device with high reliability can be obtained.

[Embodiment Mode 5]

In this embodiment mode, FIGS. 7, 8A to 8D, and 9A to 9D show examples of pixel electrodes with various shapes. The reference numerals in Embodiment Mode 1 are used for reference numerals in FIGS. 7, 8A to 8D, and 9A to 9D. Materials and manufacturing steps of the other structures may refer to those described in Embodiment Mode 1.

A bottom-gate TFT described in Embodiment Mode 2 may be used when needed.

Further, a structure where a pixel electrode is directly connected to an active layer, which is described in Embodiment Mode 3, may be used when needed.

Moreover, a connection structure of the conductive film 115 and the wiring 119, which is described in Embodiment Mode 4, may be used when needed.

Figure 7:
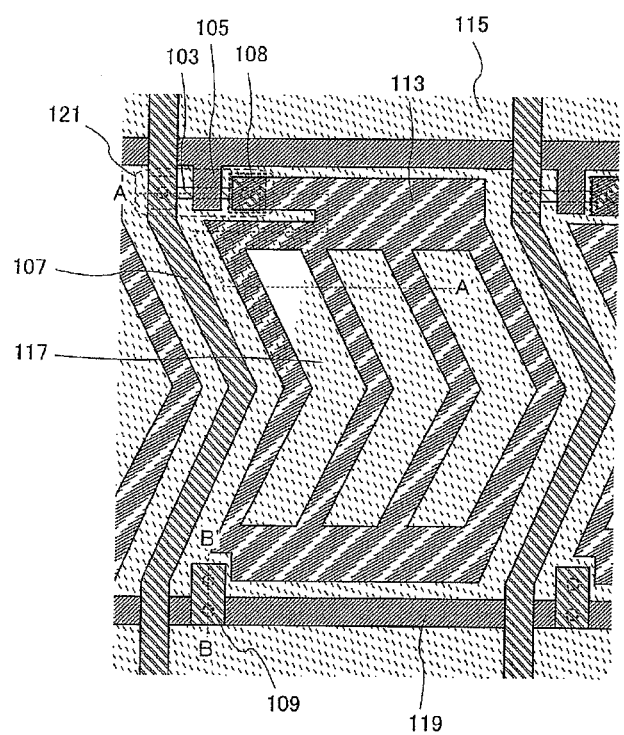
FIG. 7 is a top plan view of a liquid crystal display device of the invention.

FIG. 7 shows the pixel electrode 113 with a comb shape. A cross-sectional view of A-A' and B-B' is same as FIG. 3. FIGS. 8A to 8D and 9A to 9D only show the pixel electrode 113 and the conductive film 115 so that each drawing is understandable.

Figure 8A:
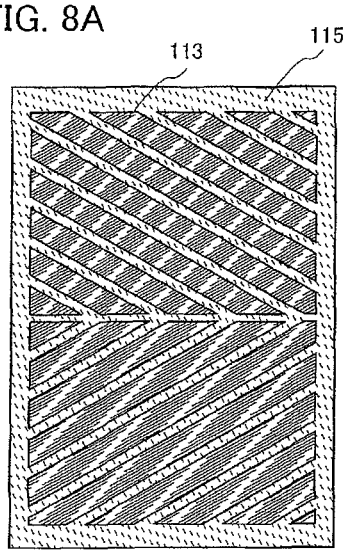
FIGS. 8A to 8D are top plan views of a liquid crystal display device of the invention.

In FIG. 8A, a plurality of slit-shaped openings are formed in the pixel electrode 113. The slit-shaped openings are oblique to the source wiring. The slit-shaped openings in the upper half of the pixel electrode 113 and the slit-shaped openings in the lower half thereof have different angles with respect to the center line of the pixel electrode 113. The slit-shaped openings in the upper half of the pixel electrode 113 and the slit-shaped openings in the lower half thereof may be line-symmetrical with respect to the central line.

Figure 8B:
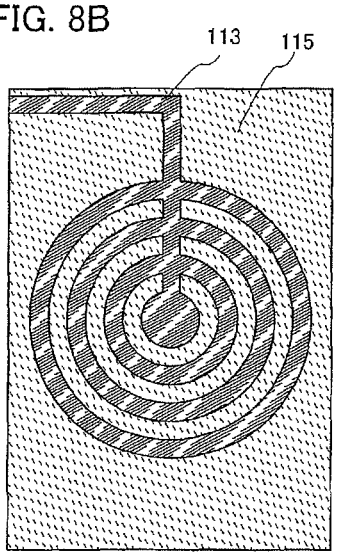

In FIG. 8B, the pixel electrode 113 has a shape in which a plurality of electrodes each having a shape along a circumference of a circle, radius of which is different from each other, are arranged in a concentric pattern and are connected to each other. Each space between the electrodes functions as an opening.

Figure 8C:
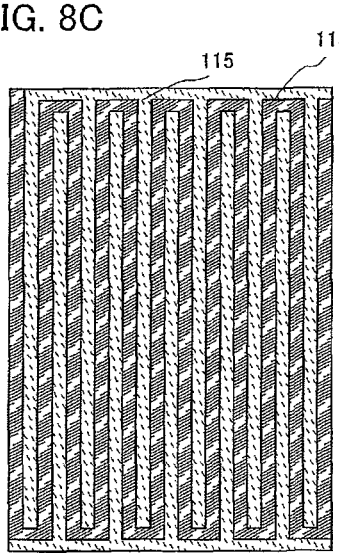

In FIG. 8C, the pixel electrode 113 is arranged so that two comb-shaped electrodes are arranged to face opposite directions to each other and comb-shaped portions are alternately arranged. Each space between comb-shaped portions functions as an opening.

Figure 8D:
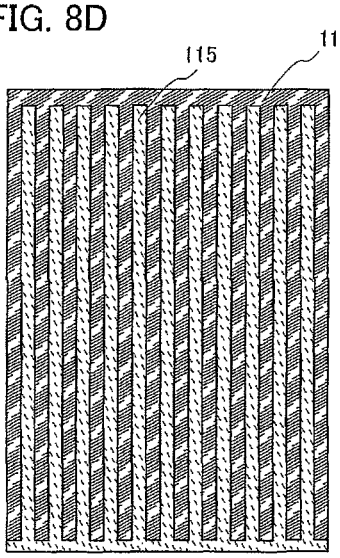

In FIG. 8D, the pixel electrode 113 is comb-shaped. Each space between comb-shaped portions functions as an opening.

Figure 9A:
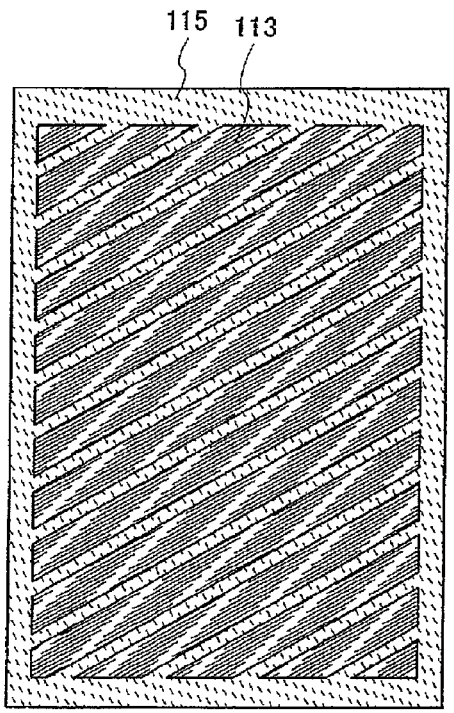
FIGS. 9A to 9D are top plan views of a liquid crystal display device of the invention.

In FIG. 9A, the pixel electrode 113 is formed in stripes in an oblique direction. Each space between stripe portions functions as an opening.

Figure 9B:
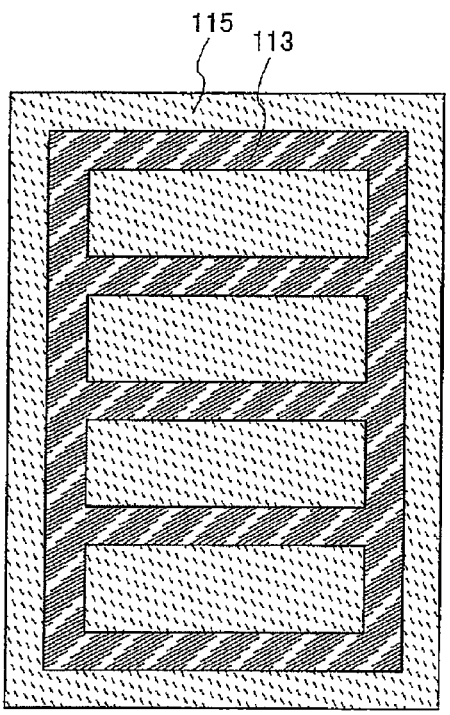

In FIG. 9B, a plurality of rectangular opening portions are formed in the pixel electrode 113.

Figure 9C:
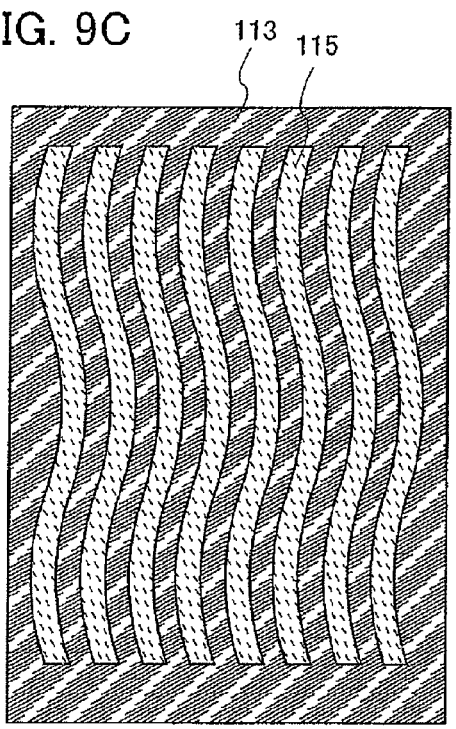

In FIG. 9C, an opening portion with a shape in which two sides of an elongated rectangular, which face each other, are wave-shaped, is formed in the pixel electrode 113.

Figure 9D:
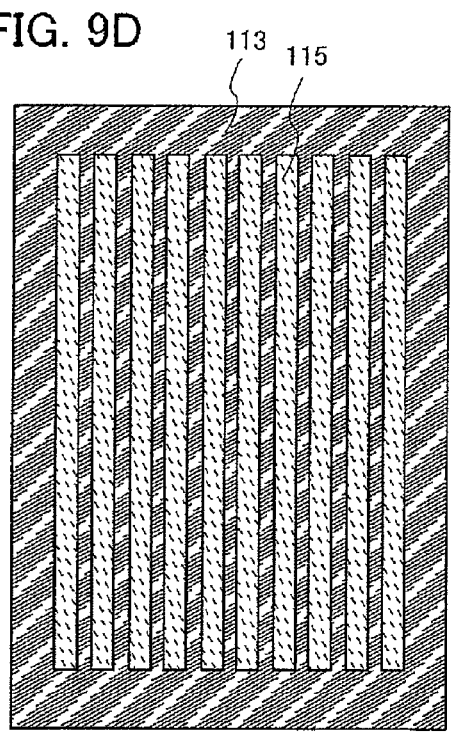

In FIG. 9D, an opening portion with an elongated rectangular shape is formed in the pixel electrode 113.

According to the invention, a liquid crystal display device with a wide viewing angle and lower manufacturing cost than a conventional liquid crystal display device can be provided.

In the invention, since a conductive film is formed over an entire surface of a substrate, an impurity from the substrate can be prevented from being mixed into an active layer. Thus, a semiconductor device with high reliability can be obtained.

In the invention, when a semiconductor device including a top-gate thin film transistor is formed, a potential of a back gate is stabilized; thus, a semiconductor device with high reliability can be obtained.

[Embodiment Mode 6]

In this embodiment mode, examples where a color filter is provided at a place different from that in Embodiment Mode 1 are described with reference to FIGS. 22, 23A, 23B, and 24.

Figure 22:
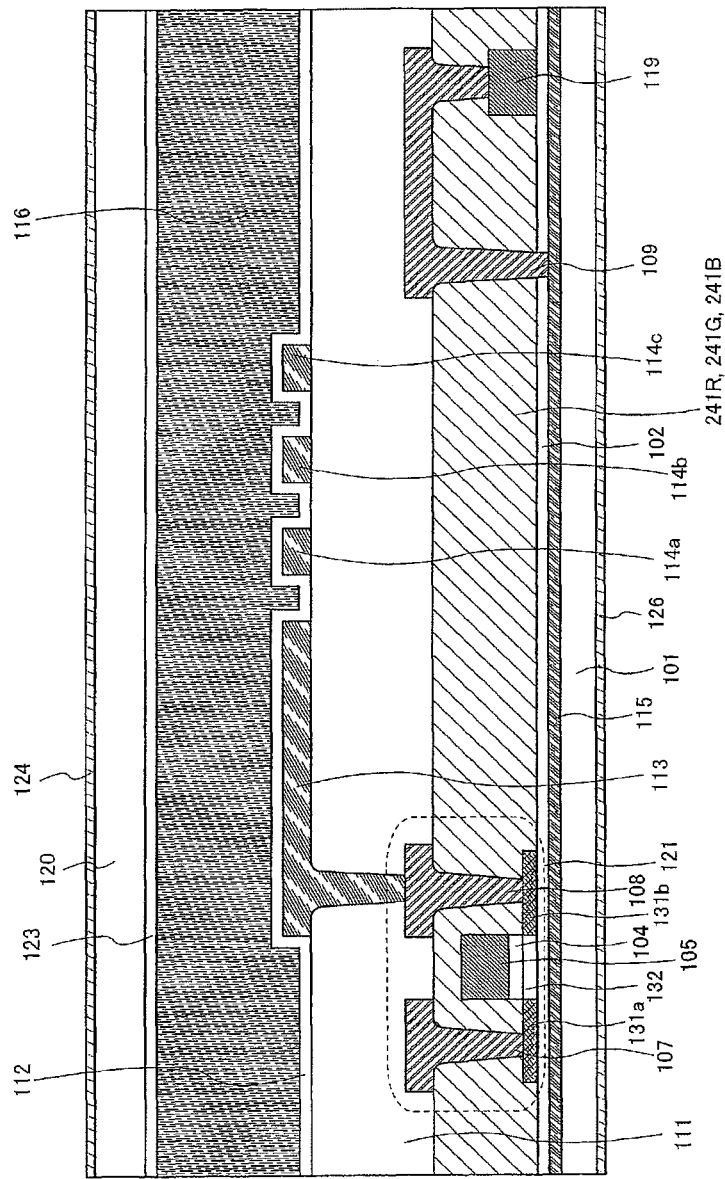
FIG. 22 is a cross-sectional view of a liquid crystal display device of the invention.

FIG. 22 is a cross-sectional view for describing a structure of a pixel portion in an FFS mode liquid crystal display device according to this embodiment mode. The pixel portion in the liquid crystal display device according to this embodiment mode has a structure similar to that of the liquid crystal display device in Embodiment Mode 1, except that a color filter is not provided on the opposite substrate 120 side and color filters 241 (a red color filter 241R, a blue color filter 241B, and a green color filter 241G) are provided instead of the interlayer insulating film 106.

Accordingly, the contents described in other embodiment modes except Embodiment Mode 1 can also be applied to this embodiment mode. Hereinafter, the portions similar to those in Embodiment Mode 1 are denoted by the same reference numerals, and description thereof is omitted.

Note that an insulating film formed of an inorganic material may be provided between the color filter 241 and the gate electrode 105. The inorganic material is formed of an insulating material containing oxygen or nitrogen, such as silicon oxide, silicon nitride, silicon oxide containing nitrogen, or silicon nitride containing oxygen. It is preferable to use a material containing a large amount of nitrogen in order to prevent penetration of an impurity. Further, a planarization film may be formed over the color filter 241.

Note that colors of the color filters 241 may be colors other than red, blue, and green, and may be more than three colors, for example, four colors or six colors. For example, yellow, cyan, magenta, or white may be added. Further, a black matrix may be provided as well as a color filter. The black matrix may be formed using a resin material, a metal film, or carbon black.

By providing the color filters 241 over the substrate 101 in such a manner, it is not necessary to perform precise alignment with the opposite substrate 120; thus, a liquid crystal display device can be easily formed, cost is reduced, and manufacturing yield is improved.

A method for manufacturing the liquid crystal display device according to this embodiment mode is similar to the method for manufacturing the liquid crystal display device in Embodiment Mode 1, except that a step of forming the color filters 241 (241R, 241G, and 241B) is added instead of the step of forming the interlayer insulating film 106.

The color filters 241R, 241G, and 241B are formed by repeating the following steps three times: a step of forming a color filter layer, a step of forming a resist over the color filter layer, and a step of selectively dry-etching the color filter layer with use of the resist as a mask.

Alternatively, the color filters may be formed by using a photosensitive material, pigment, or the like without using a resist. Note that a space is generated between the color filter layers, and the interlayer insulating film 111 is embedded in this space. Alternatively, an inorganic material or an organic material may be further stacked. Further alternatively, a black matrix or the like may be stacked. The color filters 241R, 241G, and 241B, or the black matrix can also be formed by using a droplet discharging method (e.g., an ink-jet method).

Thus, the number of manufacturing steps of the liquid crystal display device can be reduced. Since the color filters are provided on the substrate 101 side, decrease in aperture ratio can be suppressed even when misalignment with the opposite substrate 120 is caused, as compared with the case where the color filters are provided on the opposite substrate 120. That is, a margin for misalignment of the opposite substrate 120 increases.

Figure 23A:
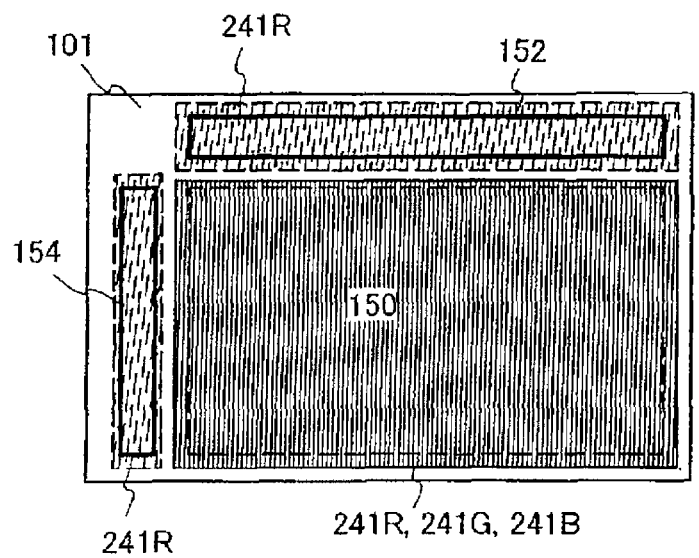
FIGS. 23A and 23B are top plan views of a liquid crystal display device of the invention.

FIG. 23A is a plan view of the liquid crystal display device shown in FIG. 22. As shown in FIG. 23A, in the liquid crystal display device of this embodiment mode, a source line driver circuit 152 and a gate line driver circuit 154 which are peripheral driver circuits are provided around a pixel portion 150.

The red color filter 241R may be provided over each of the source line driver circuit 152 and the gate line driver circuit 154. Provision of the color filter 241R prevents light deterioration of an active layer of each thin film transistor included in the source line driver circuit 152 and the gate line driver circuit 154 and realizes planarization.

Figure 23B:
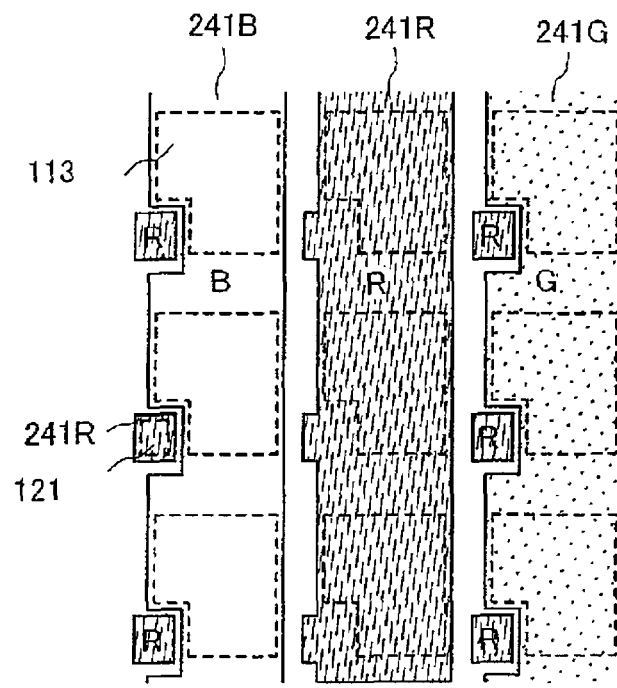
Figure 24:
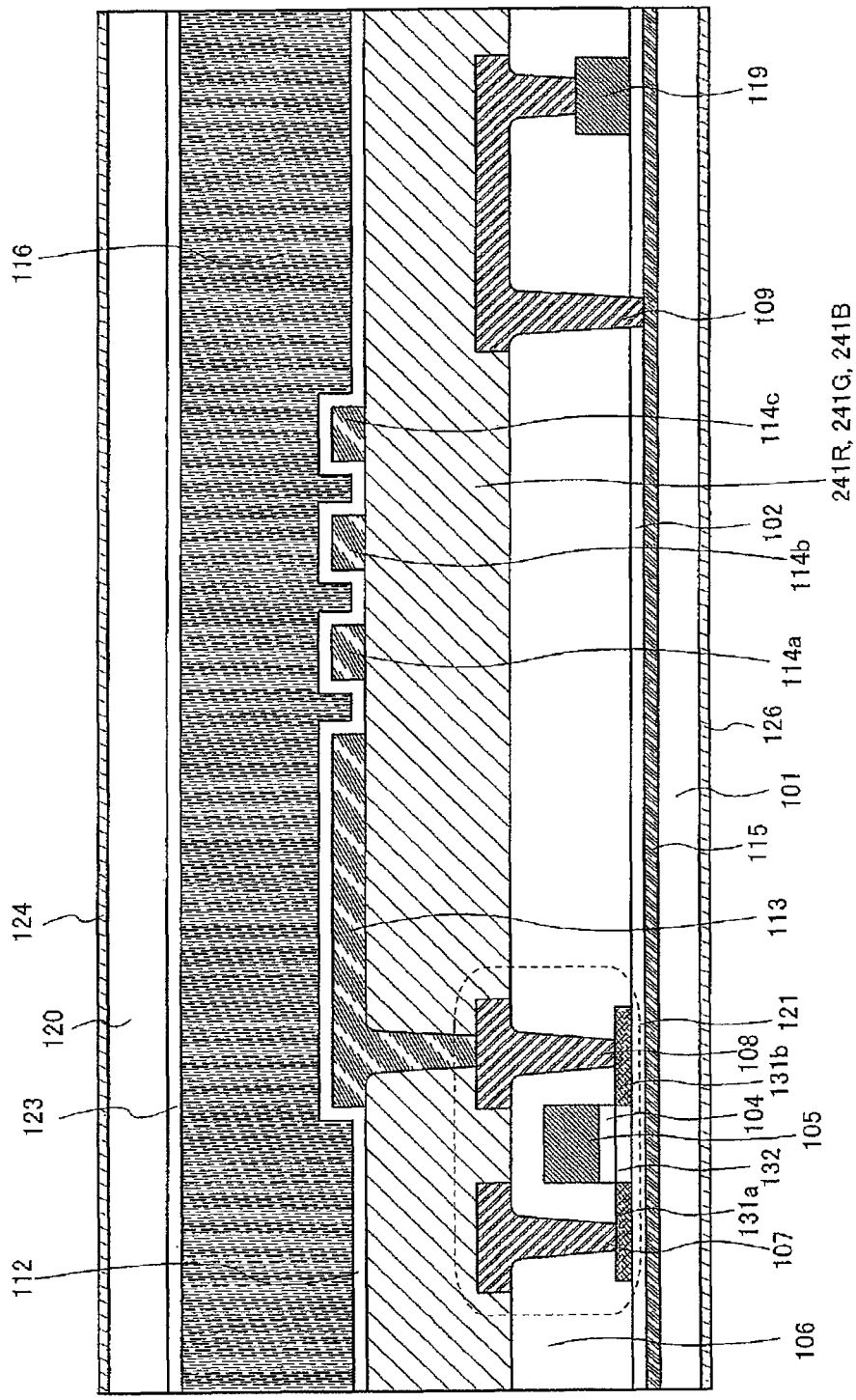
FIG. 24 is a cross-sectional view of a liquid crystal display device of the invention.

FIG. 23B is an enlarged view of a part (three rows×three columns) of the pixel portion 150 in FIG. 23A. In the pixel portion 150, the red color filter 241R, the blue color filter 241B, and the green color filter 241G are alternately arranged in stripes. Further, the red color filter 241R is provided over a thin film transistor included in each pixel.

Since a source wiring (not shown) and a gate wiring (not shown) are arranged to overlap with the space between the color filters, light leakage is suppressed.

Since the color filter 241 functions as a black matrix in this manner, a step of forming a black matrix, which is conventionally required, can be omitted.

As described above, according to this embodiment mode, advantageous effects similar to other embodiment modes can be obtained. Further, since the color filters 241R, 241G, and 241B are provided instead of the interlayer insulating film 106, the number of manufacturing steps of the liquid crystal display device can be reduced. Moreover, reduction in aperture ratio can be suppressed even when misalignment with the opposite substrate 120 is caused, as compared with the case where the color filter is provided on the opposite substrate 120. That is, a margin for misalignment of the opposite substrate 120 is increased.

In addition, a black matrix may be provided in addition to a color filter.

Note that in the FFS mode liquid crystal display devices shown in other embodiment modes, the color filters 241 (241R, 241G, and 241B) may be provided instead of the interlayer insulating film 106 or instead of the second interlayer insulating film 111 (see FIG. 24), similar to this embodiment mode. In this case also, advantageous effects similar to those of this embodiment mode can be obtained.

[Embodiment Mode 7]

In this embodiment mode, a structure and a manufacturing method of a transistor are described.

Figure 29A:
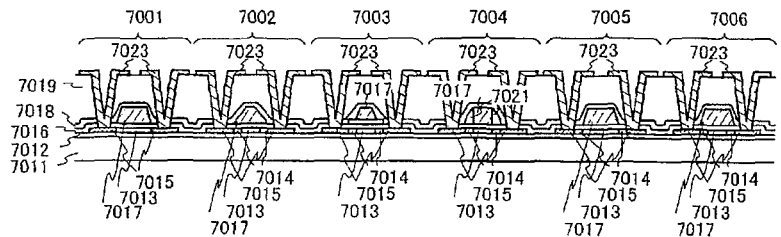
FIGS. 29A to 29G are cross-sectional views showing transistors according to the invention.
Figure 29B:
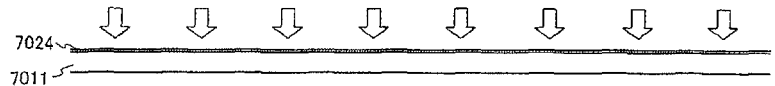
Figure 29C:
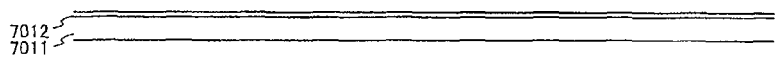
Figure 29D:
Figure 29E:
Figure 29F:
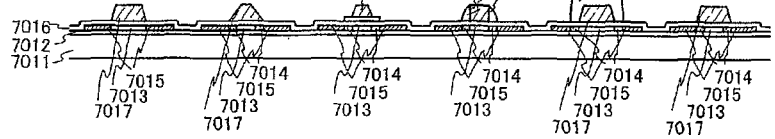
Figure 29G:
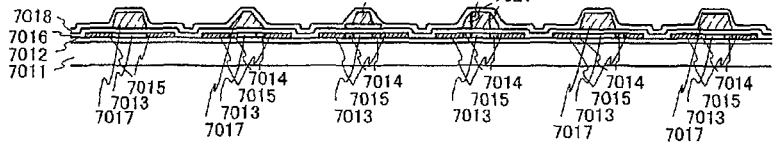

FIGS. 29A to 29G show a structure and a manufacturing method of a transistor. FIG. 29A shows a structure example of a transistor. FIGS. 29B to 29G show an example of a manufacturing method of the transistor.

Note that the structure and the manufacturing method of a transistor are not limited to those shown in FIGS. 29A to 29G and various structures and manufacturing methods can be employed.

First, a structure example of a transistor is described with reference to FIG. 29A. FIG. 29A is a cross-sectional view of a plurality of transistors each having a different structure. Here, in FIG. 29A, the plurality of transistors each having a different structure are juxtaposed, which is for describing structures of the transistors. Therefore, the transistors are not needed to be actually juxtaposed as shown in FIG. 29A and can be separately formed as needed.

Next, characteristics of each layer forming the transistor are described.

A substrate 7011 can be a glass substrate using barium borosilicate glass, aluminoborosilicate glass, or the like, a quartz substrate, a ceramic substrate, a metal substrate containing stainless steel, or the like. In addition, a substrate formed of plastics typified by polyethylene terephthalate (PET), polyethylene naphthalate (PEN), or polyethersulfone (PES), or a substrate formed of a flexible synthetic resin such as acrylic can also be used. By using a flexible substrate, a semiconductor device capable of being bent can be formed. A flexible substrate has no strict limitations on an area or a shape of the substrate. Therefore, for example, when a substrate having a rectangular shape, each side of which is 1 meter or more, is used as the substrate 7011, productivity can be significantly improved. Such an advantage is highly favorable as compared with the case where a circular silicon substrate is used.

An insulating film 7012 functions as a base film and is provided to prevent alkali metal such as Na or alkaline earth metal from the substrate 7011 from adversely affecting characteristics of a semiconductor element. The insulating film 7012 can have a single-layer structure or a stacked-layer structure of an insulating film containing oxygen or nitrogen, such as silicon oxide (SiOx), silicon nitride (SiNx), silicon oxynitride (SiOxNy) (x>y), or silicon nitride oxide (SiNxOy) (x>y). For example, when the insulating film 7012 is provided to have a two-layer structure, it is preferable that a silicon nitride oxide film be used as a first insulating film and a silicon oxynitride film be used as a second insulating film. As another example, when the insulating film 7012 is provided to have a three-layer structure, it is preferable that a silicon oxynitride film be used as a first insulating film, a silicon nitride oxide film be used as a second insulating film, and a silicon oxynitride film be used as a third insulating film.

Semiconductor layers 7013, 7014, and 7015 can be formed using an amorphous semiconductor, a microcrystalline semiconductor, or a semi-amorphous semiconductor (SAS). Alternatively, a polycrystalline semiconductor layer may be used. SAS is a semiconductor having an intermediate structure between amorphous and crystalline (including single crystal and polycrystalline) structures and having a third state which is stable in free energy. Moreover, SAS includes a crystalline region with a short-range order and lattice distortion. A crystalline region of 0.5 to 20 nm can be observed at least in part of a film. When silicon is contained as a main component, Raman spectrum shifts to a wave number side lower than 520 $cm^{-1}$. The diffraction peaks of (111) and (220), which are thought to be derived from a silicon crystalline lattice, are observed by X-ray diffraction. SAS contains hydrogen or halogen of at least 1 atomic % or more to compensate dangling bonds. SAS is formed by glow discharge decomposition (plasma CVD) of a material gas. As the material gas, $SiH_4$, $Si_2H_6$, $SiH_2Cl_2$, $SiHCl_3$, $SiCl_4$, $SiF_4$, or the like can be used. Further, $GeF_4$ may be mixed. Alternatively, the material gas may be diluted with $H_2$, or $H_2$ and one or more kinds of rare gas elements selected from He, Ar, Kr, and Ne. A dilution ratio is in the range of 2 to 1000 times. Pressure is in the range of approximately 0.1 to 133 Pa, and a power supply frequency is 1 to 120 MHz, preferably 13 to 60 MHz. A substrate heating temperature may be 300° C. or lower. A concentration of impurities in atmospheric components such as oxygen, nitrogen, and carbon is preferably $1×10^{20}$ $cm^{-1}$ or less as impurity elements in the film. In particular, an oxygen concentration is $5×10^{19}$/$cm^3$ or less, preferably $1×10^{19}$/$cm^3$ or less. Here, an amorphous semiconductor layer is formed using a material containing silicon (Si) as its main component (e.g., $Si_xGe_{1-x}$) by a sputtering method, an LPCVD method, a plasma CVD method, or the like. Then, the amorphous semiconductor layer is crystallized by a crystallization method such as a laser crystallization method, a thermal crystallization method using RTA or an annealing furnace, or a thermal crystallization method using a metal element which promotes crystallization.

An insulating film 7016 can have a single-layer structure or a stacked-layer structure of an insulating film containing oxygen or nitrogen, such as silicon oxide (SiOx), silicon nitride (SiNx), silicon oxynitride (SiOxNy) (x>y), or silicon nitride oxide (SiNxOy) (x>y).

A gate electrode 7017 can have a single-layer structure of a conductive film or a stacked-layer structure of two or three conductive films. As a material for the gate electrode 7017, a conductive film can be used. For example, a single film of an element such as tantalum (Ta), titanium (Ti), molybdenum (Mo), tungsten (W), chromium (Cr), silicon (Si), or the like; a nitride film containing the aforementioned element (typically, a tantalum nitride film, a tungsten nitride film, or a titanium nitride film); an alloy film in which the aforementioned elements are combined (typically, a Mo—W alloy or a Mo—Ta alloy); a silicide film containing the aforementioned element (typically, a tungsten silicide film or a titanium silicide film); and the like can be used. Note that the aforementioned single film, nitride film, alloy film, silicide film, and the like can have a single-layer structure or a stacked-layer structure.

An insulating film 7018 can have a single-layer structure or a stacked-layer structure of an insulating film containing oxygen or nitrogen, such as silicon oxide (SiOx), silicon nitride (SiNx), silicon oxynitride (SiOxNy) (x>y), or silicon nitride oxide (SiNxOy) (x>y); or a film containing carbon, such as a DLC (Diamond-Like Carbon), by a sputtering method, a plasma CVD method, or the like.

An insulating film 7019 can have a single-layer structure or a stacked-layer structure of a siloxane resin; an insulating film containing oxygen or nitrogen, such as silicon oxide (SiOx), silicon nitride (SiNx), silicon oxynitride (SiOxNy) (x>y), or silicon nitride oxide (SiNxOy) (x>y); a film containing carbon, such as a DLC (Diamond-Like Carbon); or an organic material such as epoxy, polyimide, polyamide, polyvinyl phenol, benzocyclobutene, or acrylic. Note that a siloxane resin corresponds to a resin having Si—O—Si bonds. Siloxane includes a skeleton structure of a bond of silicon (Si) and oxygen (O). As a substituent, an organic group containing at least hydrogen (such as an alkyl group or aromatic hydrocarbon) is used. Alternatively, a fluoro group, or a fluoro group and an organic group containing at least hydrogen can be used as a substituent. Note that the insulating film 7019 can be provided to cover the gate electrode 7017 directly without provision of the insulating film 7018.

As a conductive film 7023, a single film of an element such as Al, Ni, C, W, Mo, Ti, Pt, Cu, Ta, Au, Mn, or the like, a nitride film containing the aforementioned element, an alloy film in which the aforementioned elements are combined, a silicide film containing the aforementioned element, or the like can be used. For example, as an alloy containing a plurality of the aforementioned elements, an Al alloy containing C and Ti, an Al alloy containing Ni, an Al alloy containing C and Ni, an Al alloy containing C and Mn, or the like can be used. When the conductive film has a stacked-layer structure, a structure can be such that Al is interposed between Mo, Ti, or the like; thus, resistance of Al to heat and chemical reaction can be improved.

Next, characteristics of each structure are described with reference to the cross-sectional view of the plurality of transistors each having a different structure in FIG. 29A.

A transistor 7001 is a single drain transistor. Since it can be formed by a simple method, it is advantageous in low manufacturing cost and high yield. Note that a tapered angle is 45° or more and less than 95°, and preferably, 60° or more and less than 95°. The tapered angle may be less than 45°. Here, the semiconductor layers 7013 and 7015 have different concentrations of impurities, and the semiconductor layer 7013 is used as a channel region and the semiconductor layers 7015 are used as a source region and a drain region. By controlling the concentration of impurities in this manner, resistivity of the semiconductor layer can be controlled. Further, an electrical connection state of the semiconductor layer and the conductive film 7023 can be closer to ohmic contact. Note that as a method of separately forming the semiconductor layers each having different amount of impurities, a method where impurities are doped in the semiconductor layer using the gate electrode 7017 as a mask can be used.

In a transistor 7002, the gate electrode 7017 is tapered at an angle of at least certain degrees. Since it can be formed by a simple method, it is advantageous in low manufacturing cost and high yield. Here, the semiconductor layers 7013, 7014, and 7015 have different concentrations of impurities. The semiconductor layer 7013 is used as a channel region, the semiconductor layers 7014 as lightly doped drain (LDD) regions, and the semiconductor layers 7015 as a source region and a drain region. By controlling the amount of impurities in this manner, resistivity of the semiconductor layer can be controlled. Further, an electrical connection state of the semiconductor layer and the conductive film 7023 can be closer to ohmic contact. Moreover, since the transistor includes the LDD regions, high electric field is hardly applied inside the transistor, so that deterioration of the element due to hot carriers can be suppressed. Note that as a method of separately forming the semiconductor layers having different amount of impurities, a method where impurities are doped in the semiconductor layer using the gate electrode 7017 as a mask can be used. In the transistor 7002, since the gate electrode 7017 is tapered at an angle of at least certain degrees, gradient of the concentration of impurities doped in the semiconductor layer through the gate electrode 7017 can be provided, and the LDD region can be easily formed. Note that the tapered angle is 45° or more and less than 95°, and preferably, 60° or more and less than 95°. Alternatively, the tapered angle can be less than 45°.

A transistor 7003 has a structure where the gate electrode 7017 is formed of at least two layers and a lower gate electrode is longer than an upper gate electrode. In this specification, a shape of the lower and upper gate electrodes is called a hat shape. When the gate electrode 7017 has a hat shape, an LDD region can be formed without addition of a photomask. Note that a structure where the LDD region overlaps with the gate electrode 7017, like the transistor 7003, is particularly called a GOLD (Gate Overlapped LDD) structure. As a method of forming the gate electrode 7017 with a hat shape, the following method may be used.

First, when the gate electrode 7017 is etched, the lower and upper gate electrodes are etched by dry etching so that side surfaces thereof are inclined (tapered). Then, an inclination of the upper gate electrode is processed to be almost perpendicular by anisotropic etching. Thus, the gate electrode a cross section of which is a hat shape is formed. After that, impurity elements are doped twice, so that the semiconductor layer 7013 used as the channel region, the semiconductor layers 7014 used as the LDD regions, and the semiconductor layers 7015 used as a source electrode and a drain electrode are formed.

Note that part of the LDD region, which overlaps with the gate electrode 7017, is referred to as an Lov region, and part of the LDD region, which does not overlap with the gate electrode 7017, is referred to as an Loff region. The Loff region is highly effective in suppressing an off-current value, whereas it is not very effective in preventing deterioration in an on-current value due to hot carriers by relieving an electric field in the vicinity of the drain. On the other hand, the Lov region is highly effective in preventing deterioration in the on-current value by relieving the electric field in the vicinity of the drain, whereas it is not very effective in suppressing the off-current value. Thus, it is preferable to form a transistor having a structure appropriate for characteristics of each of the various circuits. For example, when a semiconductor device is used for a display device, a transistor having a Loff region is preferably used as a pixel transistor in order to suppress the off-current value. On the other hand, as a transistor in a peripheral circuit, a transistor having an Lov region is preferably used in order to prevent deterioration in the on-current value by relieving the electric field in the vicinity of the drain.

A transistor 7004 includes a sidewall 7021 in contact with the side surface of the gate electrode 7017. When the transistor includes the sidewall 7021, a region overlapping with the sidewall 7021 can be made to be an LDD region.

In a transistor 7005, an LDD (Loff) region is formed by doping in the semiconductor layer with the use of a mask 7022. Thus, the LDD region can surely be formed, and an off-current value of the transistor can be reduced.

In a transistor 7006, an LDD (Lov) region is formed by doping in the semiconductor layer with the use of a mask. Thus, the LDD region can surely be formed, and deterioration in an on-current value can be prevented by relieving the electric field in the vicinity of the drain of the transistor.

Next, an example of a method for manufacturing a transistor is described with reference to FIGS. 29B to 29G.

Note that a structure and a manufacturing method of a transistor are not limited to those in FIGS. 29A to 29G, and various structures and manufacturing methods can be used.

In this embodiment mode, surfaces of the substrate 7011, the insulating film 7012, the semiconductor layers 7013, 7014, and 7015, the insulating film 7016, the insulating film 7018, or the insulating film 7019 are oxidized or nitrided by plasma treatment, so that the semiconductor layer or the insulating film can be oxidized or nitrided. By oxidizing or nitriding the semiconductor layer or the insulating film by plasma treatment in such a manner, a surface of the semiconductor layer or the insulating film is modified, and the insulating film can be formed to be denser than an insulating film formed by a CVD method or a sputtering method. Thus, a defect such as a pinhole can be suppressed, and characteristics and the like of a semiconductor device can be improved. Note that an insulating film 7024 formed by plasma treatment is referred to as a plasma-treated insulating film.

Silicon oxide (SiOx) or silicon nitride (SiNx) can be used for the sidewall 7021. As a method of forming the sidewall 7021 on the side surface of the gate electrode 7017, a method where a silicon oxide (SiOx) film or a silicon nitride (SiNx) film is formed after the gate electrode 7017 is formed, and then, the silicon oxide (SiOx) film or the silicon nitride (SiNx) film is etched by anisotropic etching can be used, for example. Thus, the silicon oxide (SiOx) film or the silicon nitride (SiNx) film remains only on the side surface of the gate electrode 7017, so that the sidewall 7021 can be formed on the side surface of the gate electrode 7017.

Note that a conductive film may be provided under the insulating film 7012. This conductive film functions as a common electrode in some cases.

Figure 33:
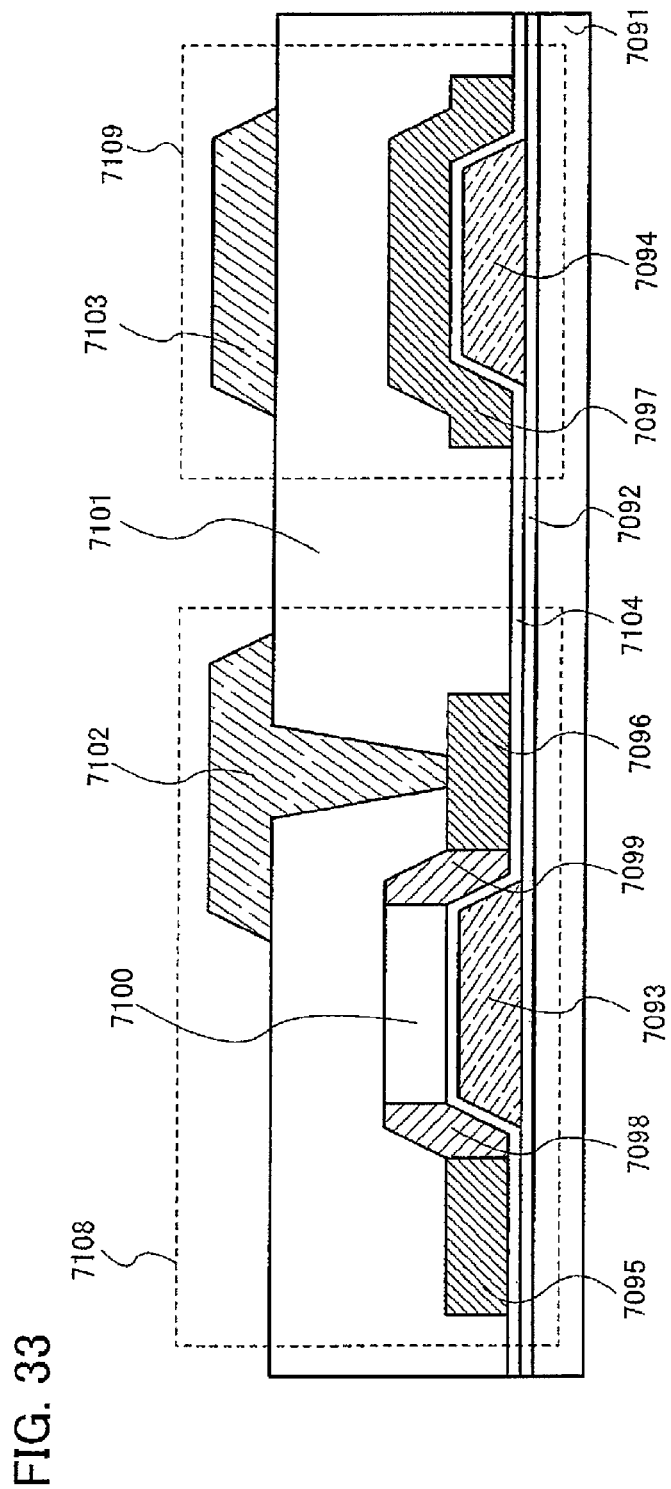
FIG. 33 is a cross-sectional view showing a transistor according to the invention.

FIG. 33 shows cross-sectional structures of a bottom-gate transistor and a capacitor.

A first insulating film (an insulating film 7092) is formed over an entire surface of a substrate 7091. Note that the structure is not limited thereto, and the first insulating film (the insulating film 7092) is not formed in some cases. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film (SiOxNy), or the like can be used.

A first conductive layer (a conductive layer 7093 and a conductive layer 7094) is formed over the first insulating film. The conductive layer 7093 includes a portion functioning as a gate electrode of a transistor 7108. The conductive layer 7094 includes a portion functioning as a first electrode of a capacitor 7109. As the first conductive layer, Ti, Mo, Ta, Cr, W, Al, Nd, Cu, Ag, Au, Pt, Nb, Si, Zn, Fe, Ba, Ge, or the like, or an alloy of these elements can be used. Further, a stacked layer of these elements (including the alloy thereof) can be used.

A second insulating film (an insulating film 7104) is formed to cover at least the first conductive layer. The second insulating film functions as a gate insulating film. As the second insulating film, a single layer or a stacked layer of a silicon oxide film, a silicon nitride film, a silicon oxynitride film (SiOxNy), or the like can be used.

Note that as a portion of the second insulating film, which is in contact with the semiconductor layer, a silicon oxide film is preferably used. This is because the trap level at the interface between the semiconductor layer and the second insulating film is lowered.

When the second insulating film is in contact with Mo, a silicon oxide film is preferably used as a portion of the second insulating film in contact with Mo. This is because the silicon oxide film does not oxidize Mo.

A semiconductor layer is formed in part of a portion over the second insulating film, which overlaps with the first conductive layer, by a photolithography method, an ink-jet method, a printing method, or the like. Part of the semiconductor layer extends to a portion over the second insulating film, which does not overlap with the first conductive layer. The semiconductor layer includes a channel formation region (a channel formation region 7100), an LDD region (LDD regions 7098 and 7099), and an impurity region (impurity regions 7095, 7096, and 7097). The channel formation region 7100 functions as a channel formation region of the transistor 7108. The LDD regions 7098 and 7099 function as LDD regions of the transistor 7108. Note that the LDD regions 7098 and 7099 are not always necessarily formed. The impurity region 7095 includes a portion functioning as one of a source electrode and a drain electrode of the transistor 7108. The impurity region 7096 includes a portion functioning as the other of the source electrode and the drain electrode of the transistor 7108. The impurity region 7097 includes a portion functioning as a second electrode of the capacitor 7109.

A third insulating film (an insulating film 7101) is formed over the entire surface. A contact hole is selectively formed in part of the third insulating film. The insulating film 7101 functions as an interlayer film. As the third insulating film, an inorganic material (e.g., silicon oxide, silicon nitride, or silicon oxynitride), an organic compound material having a low dielectric constant (e.g., a photosensitive or nonphotosensitive organic resin material), or the like can be used. Alternatively, a material containing siloxane may be used. Note that siloxane is a material in which a skeleton structure is formed by a bond of silicon (Si) and oxygen (O). As a substitute, an organic group containing at least hydrogen (such as an alkyl group or aromatic hydrocarbon) is used. Alternatively, a fluoro group, or a fluoro group and an organic group containing at least hydrogen may be used as a substituent.

A second conductive layer (a conductive layer 7102 and a conductive layer 7103) is formed over the third insulating film. The conductive layer 7102 is connected to the other of the source electrode and the drain electrode of the transistor 7108 through the contact hole formed in the third insulating film. Thus, the conductive layer 7102 includes a portion functioning as the other of the source electrode and the drain electrode of the transistor 7108. When the conductive layer 7103 is electrically connected to the conductive layer 7094, the conductive layer 7103 includes a portion functioning as the first electrode of the capacitor 7109. Alternatively, when the conductive layer 7103 is electrically connected to the impurity region 7097 which is a conductive layer, the conductive layer 7103 includes a portion functioning as the second electrode of the capacitor 7109. Further alternatively, when the conductive layer 7103 is not connected to the conductive layer 7094 and the impurity region 7097, a capacitor other than the capacitor 7109 is formed. In this capacitor, the conductive layer 7103, the impurity region 7097, and the insulating film 7101 are used as a first electrode, a second electrode, and an insulating film, respectively. Note that as the second conductive layer, Ti, Mo, Ta, Cr, W, Al, Nd, Cu, Ag, Au, Pt, Nb, Si, Zn, Fe, Ba, Ge, or the like, or an alloy of these elements can be used. Further, a stacked layer of these elements (including the alloy thereof) can be used.

In steps after forming the second conductive layer, various insulating films or various conductive films may be formed.

Note that a conductive film may be provided under the insulating film 7092. This conductive film functions as a common electrode in some cases.

Next, structures of a transistor and a capacitor are described when an amorphous silicon (a-Si:H) film, a microcrystalline silicon film, or the like is used as a semiconductor layer of the transistor.

Figure 30:
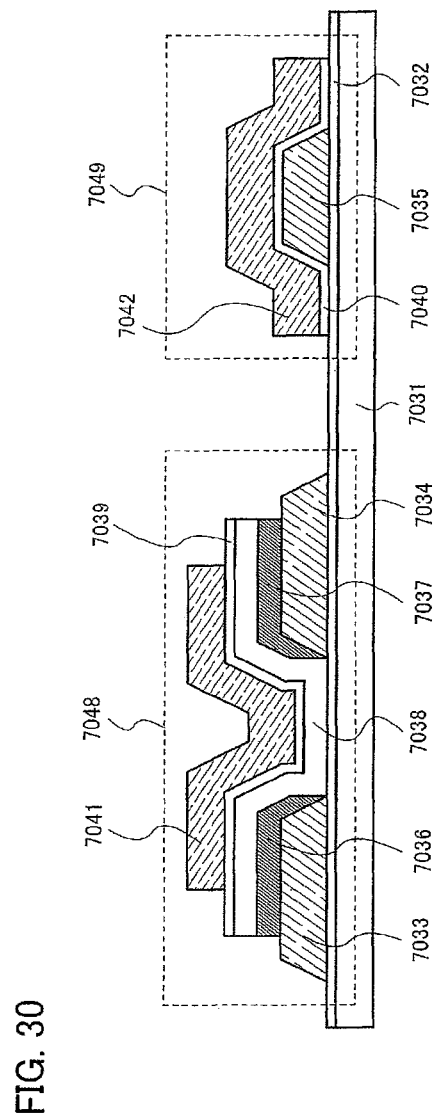
FIG. 30 is a cross-sectional view showing a transistor according to the invention.

FIG. 30 shows cross-sectional structures of a top-gate transistor and a capacitor.

A first insulating film (an insulating film 7032) is formed over an entire surface of a substrate 7031. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film (SiOxNy), or the like can be used.

Note that the first insulating film is not always necessarily formed. When the first insulating film is not formed, reduction in the number of steps and manufacturing cost can be realized. Further, since the structure can be simplified, the yield can be improved.

A first conductive layer (a conductive layer 7033, a conductive layer 7034, and a conductive layer 7035) is formed over the first insulating film. The conductive layer 7033 includes a portion functioning as one of a source electrode and a drain electrode of a transistor 7048. The conductive layer 7034 includes a portion functioning as the other of the source electrode and the drain electrode of the transistor 7048. The conductive layer 7035 includes a portion functioning as a first electrode of a capacitor 7049. As the first conductive layer, Ti, Mo, Ta, Cr, W, Al, Nd, Cu, Ag, Au, Pt, Nb, Si, Zn, Fe, Ba, Ge, or the like, or an alloy of these elements can be used. Further, a stacked layer of these elements (including the alloy thereof) can be used.

A first semiconductor layer (a semiconductor layer 7036 and a semiconductor layer 7037) is formed above the conductive layers 7033 and 7034. The semiconductor layer 7036 includes a portion functioning as one of the source electrode and the drain electrode. The semiconductor layer 7037 includes a portion functioning as the other of the source electrode and the drain electrode. As the first semiconductor layer, silicon containing phosphorus or the like can be used.

A second semiconductor layer (a semiconductor layer 7038) is formed over the first insulating film and between the conductive layer 7033 and the conductive layer 7034. Part of the semiconductor layer 7038 extends over the conductive layers 7033 and 7034. The semiconductor layer 7038 includes a portion functioning as a channel region of the transistor 7048. As the second semiconductor layer, a semiconductor layer having no crystallinity such as amorphous silicon (a-Si:H), a semiconductor layer such as a microcrystalline semiconductor (s-Si:H), or the like can be used.

A second insulating film (an insulating film 7039 and an insulating film 7040) is formed to cover at least the semiconductor layer 7038 and the conductive layer 7035. The second insulating film functions as a gate insulating film. As the second insulating film, a single layer or a stacked layer of a silicon oxide film, a silicon nitride film, a silicon oxynitride film (SiOxNy), or the like can be used.

Note that as a portion of the second insulating film, which is in contact with the second semiconductor layer, a silicon oxide film is preferably used. This is because the trap level at the interface between the second semiconductor layer and the second insulating film is lowered.

Note that when the second insulating film is in contact with Mo, a silicon oxide film is preferably used as a portion of the second insulating film in contact with Mo. This is because the silicon oxide film does not oxidize Mo.

A second conductive layer (a conductive layer 7041 and a conductive layer 7042) is formed over the second insulating film. The conductive layer 7041 includes a portion functioning as a gate electrode of the transistor 7048. The conductive layer 7042 functions as a second electrode of the capacitor 7049 or a wiring. As the second conductive layer, Ti, Mo, Ta, Cr, W, Al, Nd, Cu, Ag, Au, Pt, Nb, Si, Zn, Fe, Ba, Ge, or the like, or an alloy of these elements can be used. Further, a stacked layer of these elements (including the alloy thereof) can be used.

In steps after forming the second conductive layer, various insulating films or various conductive films may be formed.

Note that a conductive film may be provided under the insulating film 7032. This conductive film functions as a common electrode in some cases.

Figure 31:
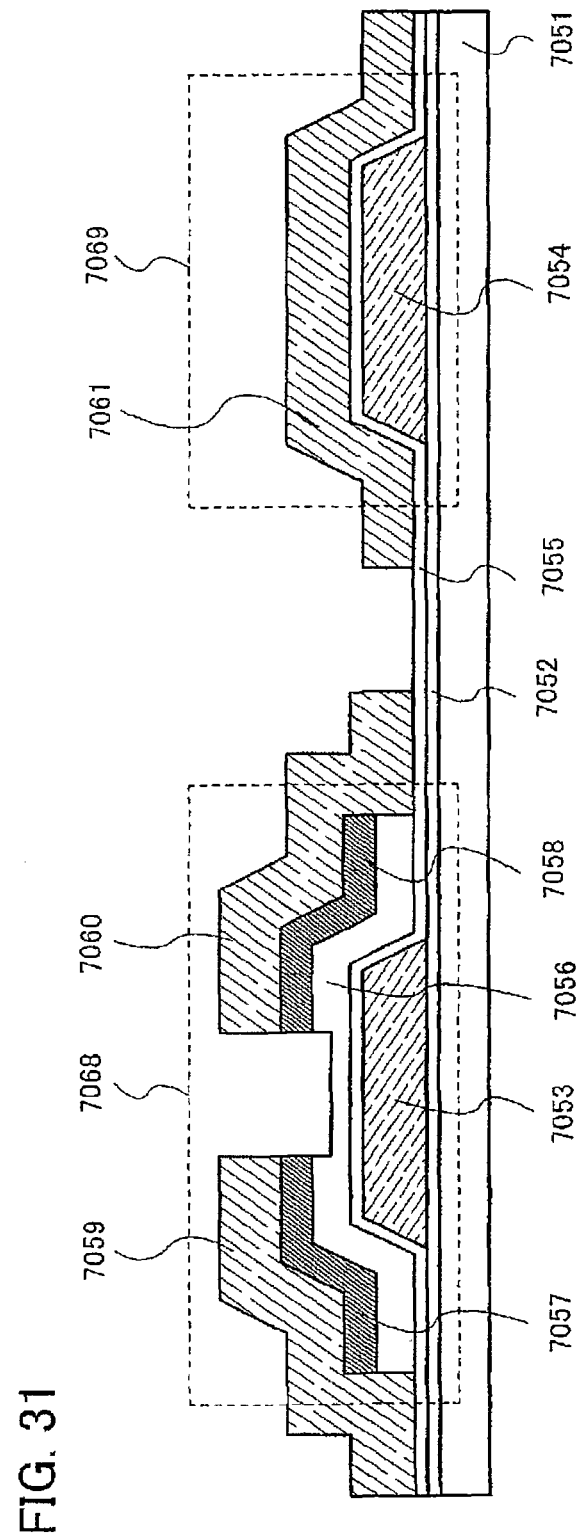
FIG. 31 is a cross-sectional view showing a transistor according to the invention.

FIG. 31 shows cross-sectional structures of an inversely staggered (bottom gate) transistor and a capacitor. In particular, the transistor shown in FIG. 31 has a channel etch structure.

A first insulating film (an insulating film 7052) is formed over an entire surface of a substrate 7051. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film (SiOxNy), or the like can be used.

Note that the first insulating film is not always necessarily formed. When the first insulating film is not formed, reduction in the number of steps and manufacturing cost can be realized. Further, since the structure can be simplified, the yield can be improved.

A first conductive layer (a conductive layer 7053 and a conductive layer 7054) is formed over the first insulating film. The conductive layer 7053 includes a portion functioning as a gate electrode of a transistor 7068. The conductive layer 7054 includes a portion functioning as a first electrode of a capacitor 7069. As the first conductive layer, Ti, Mo, Ta, Cr, W, Al, Nd, Cu, Ag, Au, Pt, Nb, Si, Zn, Fe, Ba, Ge, or the like, or an alloy of these elements can be used. Further, a stacked layer of these elements (including the alloy thereof) can be used.

A second insulating film (an insulating film 7055) is formed to cover at least the first conductive layer. The second insulating film functions as a gate insulating film. As the second insulating film, a single layer or a stacked layer of a silicon oxide film, a silicon nitride film, a silicon oxynitride film (SiOxNy), or the like can be used.

Note that as a portion of the second insulating film, which is in contact with the semiconductor layer, a silicon oxide film is preferably used. This is because the trap level at the interface between the semiconductor layer and the second insulating film is lowered.

When the second insulating film is in contact with Mo, a silicon oxide film is preferably used as a portion of the second insulating film in contact with Mo. This is because the silicon oxide film does not oxidize Mo.

A first semiconductor layer (a semiconductor layer 7056) is formed in part of a portion over the second insulating film, which overlaps with the first conductive layer, by a photolithography method, an ink-jet method, a printing method, or the like. Part of the semiconductor layer 7056 extends to a portion over the second insulating film, which does not overlap with the first conductive layer. The semiconductor layer 7056 includes a portion functioning as a channel region of the transistor 7068. As the semiconductor layer 7056, a semiconductor layer having no crystallinity such as amorphous silicon (a-Si:H), a semiconductor layer such as a microcrystalline semiconductor (μ-Si:H), or the like can be used.

A second semiconductor layer (a semiconductor layer 7057 and a semiconductor layer 7058) is formed over part of the first semiconductor layer. The semiconductor layer 7057 includes a portion functioning as one of a source electrode and a drain electrode. The semiconductor layer 7058 includes a portion functioning as the other of the source electrode and the drain electrode. As the second semiconductor layer, silicon containing phosphorus or the like can be used.

A second conductive layer (a conductive layer 7059, a conductive layer 7060, and a conductive layer 7061) is formed over the second semiconductor layer and the second insulating film. The conductive layer 7059 includes a portion functioning as one of a source electrode and a drain electrode of the transistor 7068. The conductive layer 7060 includes a portion functioning as the other of the source electrode and the drain electrode of the transistor 7068. The conductive layer 7061 includes a portion functioning as a second electrode of the capacitor 7069. As the second conductive layer, Ti, Mo, Ta, Cr, W, Al, Nd, Cu, Ag, Au, Pt, Nb, Si, Zn, Fe, Ba, Ge, or the like, or an alloy of these elements can be used. Further, a stacked layer of these elements (including the alloy thereof) can be used.

In steps after forming the second conductive layer, various insulating films or various conductive films may be formed.

Here, an example of a step of forming a channel etch type transistor is described. The first semiconductor layer and the second semiconductor layer can be formed using the same mask. Specifically, the first semiconductor layer and the second semiconductor layer are sequentially formed. At this time, the first semiconductor layer and the second semiconductor layer are formed using the same mask.

Another example of a step of forming a channel etch type transistor is described. Without using an additional mask, a channel region of a transistor can be formed. Specifically, after the second conductive layer is formed, part of the second semiconductor layer is removed using the second conductive layer as a mask. Alternatively, part of the second semiconductor layer is removed by using the same mask as the second conductive layer. The first semiconductor layer below the removed second semiconductor layer functions as a channel region of the transistor.

Note that a conductive film may be provided under the insulating film 7052. This conductive film functions as a common electrode in some cases.

Figure 32:
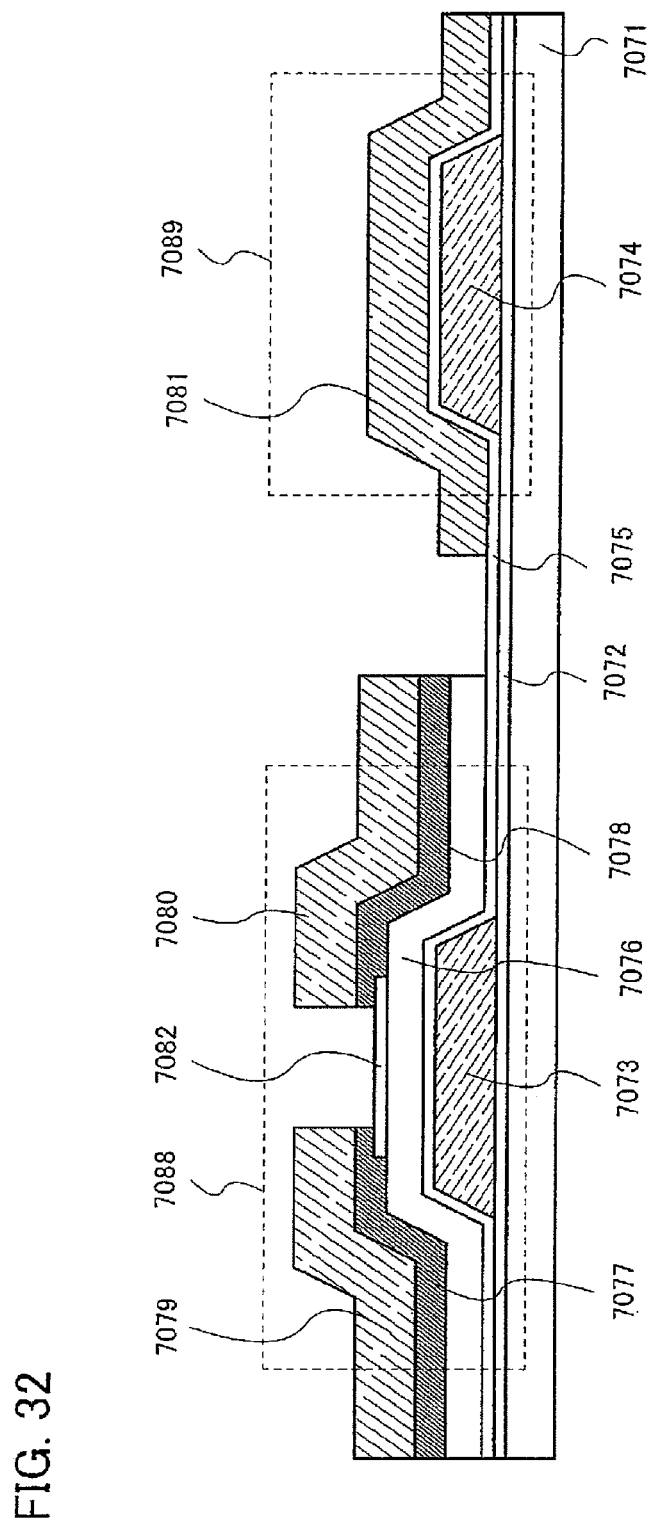
FIG. 32 is a cross-sectional view showing a transistor according to the invention.

FIG. 32 shows cross-sectional structures of an inversely staggered (bottom gate) transistor and a capacitor. In particular, the transistor shown in FIG. 32 has a channel protection (channel stop) structure.

A first insulating film (an insulating film 7072) is formed over an entire surface of a substrate 7071. The first insulating film can prevent impurities from the substrate from adversely affecting a semiconductor layer and changing properties of a transistor. That is, the first insulating film functions as a base film. Thus, a transistor with high reliability can be formed. As the first insulating film, a single layer or a stacked layer of a silicon oxide film, a silicon nitride film, a silicon oxynitride film (SiOxNy), or the like can be used.

Note that the first insulating film is not always necessarily formed. When the first insulating film is not formed, reduction in the number of steps and manufacturing cost can be realized. Further, since the structure can be simplified, the yield can be improved.

A first conductive layer (a conductive layer 7073 and a conductive layer 7074) is formed over the first insulating film. The conductive layer 7073 includes a portion functioning as a gate electrode of a transistor 7088. The conductive layer 7074 includes a portion functioning as a first electrode of a capacitor 7089. As the first conductive layer, Ti, Mo, Ta, Cr, W, Al, Nd, Cu, Ag, Au, Pt, Nb, Si, Zn, Fe, Ba, Ge, or the like, or an alloy of these elements can be used. Further, a stacked layer of these elements (including the alloy thereof) can be used.

A second insulating film (an insulating film 7075) is formed to cover at least the first conductive layer. The second insulating film functions as a gate insulating film. As the second insulating film, a single layer or a stacked layer of a silicon oxide film, a silicon nitride film, a silicon oxynitride film (SiOxNy), or the like can be used.

Note that as a portion of the second insulating film, which is in contact with the semiconductor layer, a silicon oxide film is preferably used. This is because the trap level at the interface between the semiconductor layer and the second insulating film is lowered.

When the second insulating film is in contact with Mo, a silicon oxide film is preferably used as a portion of the second insulating film in contact with Mo. This is because the silicon oxide film does not oxidize Mo.

A first semiconductor layer (a semiconductor layer 7076) is formed in part of a portion over the second insulating film, which overlaps with the first conductive layer, by a photolithography method, an ink-jet method, a printing method, or the like. Part of the semiconductor layer 7076 extends to a portion over the second insulating film, which does not overlap with the first conductive layer. The semiconductor layer 7076 includes a portion functioning as a channel region of the transistor 7088. As the semiconductor layer 7076, a semiconductor layer having no crystallinity such as amorphous silicon (a-Si:H), a semiconductor layer such as a microcrystalline semiconductor (μ-Si:H), or the like can be used.

A third insulating film (an insulating film 7082) is formed over part of the first semiconductor layer. The insulating film 7082 has a function to prevent the channel region of the transistor 7088 from being removed by etching. That is, the insulating film 7082 functions as a channel protection film (a channel stop film). As the third insulating film, a single layer or a stacked layer of a silicon oxide film, a silicon nitride film, a silicon oxynitride film (SiOxNy), or the like can be used.

A second semiconductor layer (a semiconductor layer 7077 and a semiconductor layer 7078) is formed over part of the first semiconductor layer and part of the third insulating film. The semiconductor layer 7077 includes a portion functioning as one of a source electrode and a drain electrode. The semiconductor layer 7078 includes a portion functioning as the other of the source electrode and the drain electrode. As the second semiconductor layer, silicon containing phosphorus or the like can be used.

A second conductive layer (a conductive layer 7079, a conductive layer 7080, and a conductive layer 7081) is formed over the second semiconductor layer. The conductive layer 7079 includes a portion functioning as one of the source electrode and the drain electrode of the transistor 7088. The conductive layer 7080 includes a portion functioning as the other of the source electrode and the drain electrode of the transistor 7088. The conductive layer 7081 includes a portion functioning as a second electrode of the capacitor 7089. As the second conductive layer, Ti, Mo, Ta, Cr, W, Al, Nd, Cu, Ag, Au, Pt, Nb, Si, Zn, Fe, Ba, Ge, or the like, or an alloy of these elements can be used. Further, a stacked layer of these elements (including the alloy thereof) can be used.

In steps after forming the second conductive layer, various insulating films or various conductive films may be formed.

Note that a conductive film may be provided under the insulating film 7072. This conductive film functions as a common electrode in some cases.

Next, an example where a semiconductor substrate is used as a substrate for a transistor. Since a transistor formed using a semiconductor substrate has high mobility, the size of the transistor can be decreased. Accordingly, the number of transistors per unit area can be increased (the degree of integration can be improved), and the size of the substrate can be decreased as the degree of integration is increased in the case of the same circuit structure. Thus, manufacturing cost can be reduced. Further, since the circuit scale can be increased as the degree of integration is increased in the case of the same substrate size, more advanced function can be provided without increase in manufacturing cost. Moreover, reduction in variations in characteristics can improve manufacturing yield. Reduction in operating voltage can reduce power consumption. High mobility can realize high-speed operation.

When a circuit which is formed by integrating transistors formed using a semiconductor substrate is mounted on a device in the form of an IC chip or the like, the circuit can provide the device with various functions. For example, a peripheral driver circuit (e.g., a data driver (a source driver), a scan driver (a gate driver), a timing controller, an image processing circuit, an interface circuit, a power supply circuit, or an oscillation circuit) of a display device is formed by integrating transistors formed using a semiconductor substrate, so that a small peripheral circuit which can operate with low power consumption and at high speed can be formed at low cost in high yield. Note that a circuit which is formed by integrating transistors formed using a semiconductor substrate may have a unipolar transistor. Thus, a manufacturing process can be simplified, so that manufacturing cost can be reduced.

A circuit which is formed by integrating transistors formed using a semiconductor substrate may also be used for a display panel, for example. More specifically, the circuit can be used for a reflective liquid crystal panel such as a liquid crystal on silicon (LCOS) device, a digital micromirror device (DMD) in which micromirrors are integrated, an EL panel, and the like. When such a display panel is formed using a semiconductor substrate, a small display panel which can operate with low power consumption and at high speed can be formed at low cost in high yield. Note that the display panel may be formed over an element having a function other than a function to drive the display panel, such as a large-scale integration (LSI).

Note that a structure of a transistor is not limited to the structure shown in each drawing. For example, a transistor may have an inversely staggered structure, a FinFET structure, or the like. It is preferable to have a FinFET structure since a short channel effect due to miniaturization of transistor size can be suppressed.

The above is the description of the structures and manufacturing methods of transistors. Here, a wiring, an electrode, a conductive layer, a conductive film, a terminal, a via, a plug, and the like are preferably formed of one or more elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); or a compound or an alloy material including one or more of the aforementioned elements (e.g., indium tin oxide (ITO), indium zinc oxide (IZO), indium tin oxide containing silicon (ITSO), zinc oxide (ZnO), tin oxide (SnO), cadmium tin oxide (CTO), aluminum neodymium (Al—Nd), magnesium silver (Mg—Ag), or molybdenum-niobium (Mo—Nb)); a substance in which these compounds are combined; or the like. Alternatively, they are preferably formed to contain a substance including a compound (silicide) of silicon and one or more of the aforementioned elements (e.g., aluminum silicon, molybdenum silicon, or nickel silicide); or a compound of nitrogen and one or more of the aforementioned elements (e.g., titanium nitride, tantalum nitride, or molybdenum nitride).

Note that silicon (Si) may contain an n-type impurity (such as phosphorus) or a p-type impurity (such as boron). When silicon contains the impurity, the conductivity is increased, and a function similar to a general conductor can be realized. Thus, such silicon can be utilized easily as a wiring, an electrode, or the like.

In addition, silicon with various levels of crystallinity, such as single crystalline silicon, polycrystalline silicon, or microcrystalline silicon can be used. Alternatively, silicon having no crystallinity, such as amorphous silicon can be used. By using single crystalline silicon or polycrystalline silicon, resistance of a wiring, an electrode, a conductive layer, a conductive film, a terminal, or the like can be reduced. By using amorphous silicon or microcrystalline silicon, a wiring or the like can be formed by a simple process.

Aluminum and silver have high conductivity, and thus can reduce a signal delay. Further, since aluminum and silver can be easily etched, they can be minutely processed.

Copper has high conductivity, and thus can reduce a signal delay. When copper is used, a stacked-layer structure is preferably employed to improve adhesion.

Molybdenum and titanium are preferable since even if molybdenum or titanium is in contact with an oxide semiconductor (e.g., ITO or IZO) or silicon, molybdenum or titanium does not cause defects. Further, molybdenum and titanium are preferable since they are easily etched and has high heat resistance.

Tungsten is preferable since it has an advantage such as high heat resistance.

Neodymium is also preferable since it has an advantage such as high heat resistance. In particular, an alloy of neodymium and aluminum is preferable since heat resistance is increased and aluminum hardly causes hillocks.

Silicon is preferable since it can be formed at the same time as a semiconductor layer included in a transistor and has high heat resistance.

Since ITO, IZO, ITSO, zinc oxide (ZnO), silicon (Si), tin oxide (SnO), and cadmium tin oxide (CTO) have light-transmitting properties, they can be used as a portion which transmits light. For example, they can be used for a pixel electrode or a common electrode.

IZO is preferable since it is easily etched and processed. In etching IZO, a residue is hardly left. Thus, when IZO is used for a pixel electrode, defects (such as short circuit or orientation disorder) of a liquid crystal element or a light-emitting element can be reduced.

A wiring, an electrode, a conductive layer, a conductive film, a terminal, a via, a plug, or the like may have a single-layer structure or a multi-layer structure. By employing a single-layer structure, each manufacturing process of a wiring, an electrode, a conductive layer, a conductive film, a terminal, or the like can be simplified, the number of days for a process can be reduced, and cost can be reduced. Alternatively, by employing a multi-layer structure, a wiring, an electrode, and the like with high quality can be formed while an advantage of each material is utilized and a disadvantage thereof is reduced. For example, when a low-resistant material (e.g., aluminum) is included in a multi-layer structure, reduction in resistance of a wiring can be realized. As another example, when a stacked-layer structure where a low heat-resistant material is interposed between high heat-resistant materials is employed, heat resistance of a wiring, an electrode, and the like can be increased, utilizing advantages of the low heat-resistance material. For example, it is preferable to employ a stacked-layer structure where a layer containing aluminum is interposed between layers containing molybdenum, titanium, neodymium, or the like.

When wirings, electrodes, or the like are in direct contact with each other, they adversely affect each other in some cases. For example, one wiring or one electrode is mixed into a material of another wiring or another electrode and changes its properties, and thus, an intended function cannot be obtained in some cases. As another example, when a high-resistant portion is formed, a problem may occur so that it cannot be normally formed. In such cases, a reactive material is preferably interposed by or covered with a non-reactive material in a stacked-layer structure. For example, when ITO and aluminum are connected, titanium, molybdenum, or an alloy of neodymium is preferably interposed between ITO and aluminum. As another example, when silicon and aluminum are connected, titanium, molybdenum, or an alloy of neodymium is preferably interposed between silicon and aluminum.

The term "wiring" indicates a portion including a conductor. A wiring may be a linear shape or may be short without a linear shape. Therefore, an electrode is included in a wiring.

Note that a carbon nanotube may be used for a wiring, an electrode, a conductive layer, a conductive film, a terminal, a via, a plug, or the like. Since a carbon nanotube has a light-transmitting property, it can be used for a portion which transmits light. For example, a carbon nanotube can be used for a pixel electrode or a common electrode.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

[Embodiment Mode 8]

In this embodiment mode, a structure of a display device is described.

Figure 34A:
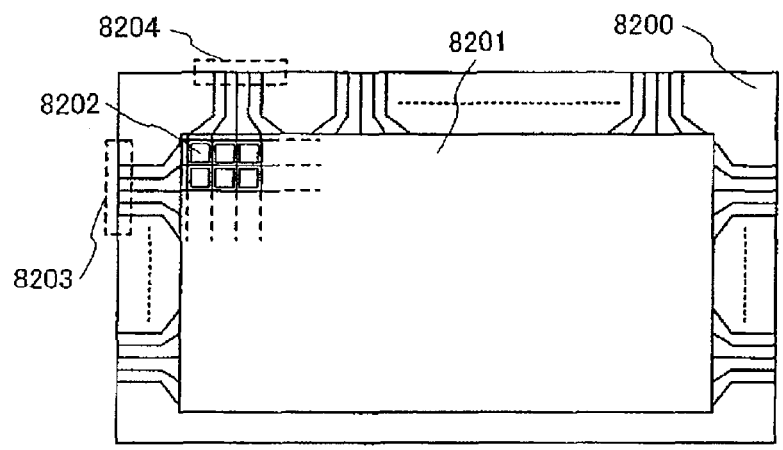
FIGS. 34A to 34C show structures of a display device according to the invention.

A structure of a display device is described with reference to FIG. 34A. FIG. 34A is a top plan view of the display device.

A pixel portion 8201, a scan line input terminal 8203, and a signal line input terminal 8204 are formed over a substrate 8200. Scan lines extending in a row direction from the scan line input terminal 8203 are formed over the substrate 8200, and signal lines extending in a column direction from the signal line input terminal 8204 are formed over the substrate 8200. Pixels 8202 are arranged in matrix at each intersection of the scan lines and the signal lines in the pixel portion 8201.

The above is the description of the case where a signal is input from an external driver circuit; however, the invention is not limited thereto, and an IC chip can be mounted on a display device.

Figure 35A:
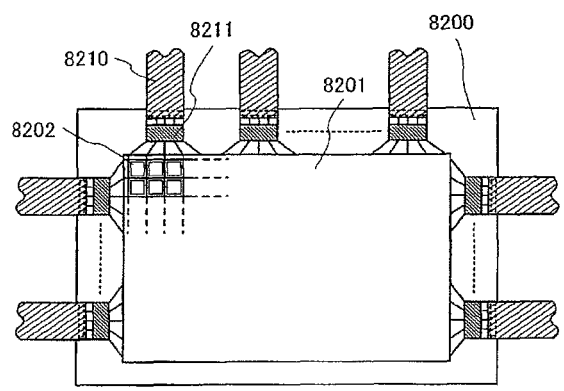
FIGS. 35A and 35B show structures of a display device according to the invention.

For example, as shown in FIG. 35A, an IC chip 8211 can be mounted on the substrate 8200 by a COG (Chip On Glass) method. In this case, the IC chip 8211 can be examined before being mounted on the substrate 8200, so that improvement in yield and reliability of the display device can be realized. Note that portions common to those in FIG. 34A are denoted by common reference numerals, and description thereof is omitted.

Figure 35B:
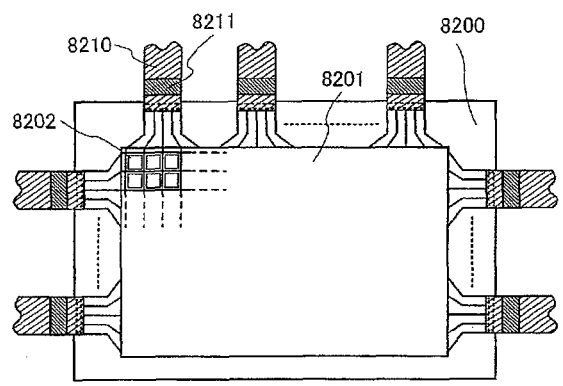

As another example, as shown in FIG. 35B, the IC chip 8211 can be mounted on an FPC (Flexible Printed Circuit) 8210 by a TAB (Tape Automated Bonding) method. In this case, the IC chip 8211 can be examined before being mounted on the FPC 8210, so that improvement in yield and reliability of the display device can be realized. Note that portions common to those in FIG. 34A are denoted by common reference numerals, and description thereof is omitted.

Not only the IC chip can be mounted on the substrate 8200, but also a driver circuit can be formed over the substrate 8200.

Figure 34B:
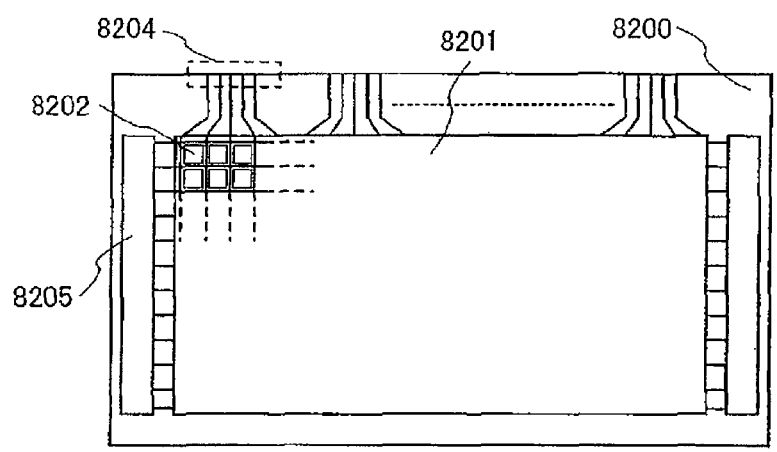

For example, as shown in FIG. 34B, a scan line driver circuit 8205 can be formed over the substrate 8200. In this case, the cost can be reduced by reduction in the number of components. Further, reliability can be improved by reduction in the number of connection points between components. Since the driving frequency of the scan line driver circuit 8205 is low, the scan line driver circuit 8205 can be easily formed using amorphous silicon or microcrystalline silicon as a semiconductor layer of a transistor. Note that an IC chip for outputting a signal to the signal line may be mounted on the substrate 8200 by a COG method. Alternatively, an FPC on which an IC chip for outputting a signal to the signal line is mounted by a TAB method may be provided on the substrate 8200. In addition, an IC chip for controlling the scan line driver circuit 8205 may be mounted on the substrate 8200 by a COG method. Alternatively, an FPC on which an IC chip for controlling the scan line driver circuit 8205 is mounted by a TAB method may be provided on the substrate 8200. Note that portions common to those in FIG. 34A are denoted by common reference numerals, and description thereof is omitted.

Figure 34C:
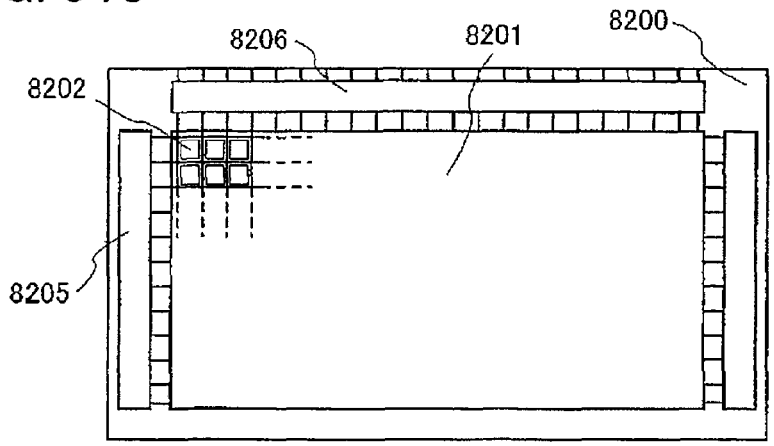

As another example, as shown in FIG. 34C, the scan line driver circuit 8205 and a signal line driver circuit 8206 can be formed over the substrate 8200. Thus, the cost can be reduced by reduction in the number of components. Further, reliability can be improved by reduction in the number of connection points between components. Note that an IC chip for controlling the scan line driver circuit 8205 may be mounted on the substrate 8200 by a COG method. Alternatively, an FPC on which an IC chip for controlling the scan line driver circuit 8205 is mounted by a TAB method may be provided on the substrate 8200. In addition, an IC chip for controlling the signal line driver circuit 8206 may be mounted on the substrate 8200 by a COG method. Alternatively, an FPC on which an IC chip for controlling the signal line driver circuit 8206 is mounted by a TAB method may be provided on the substrate 8200. Note that portions common to those in FIG. 34A are denoted by common reference numerals, and description thereof is omitted.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

[Embodiment Mode 9]

In this embodiment mode, an operation of a display device is described.

Figure 36:
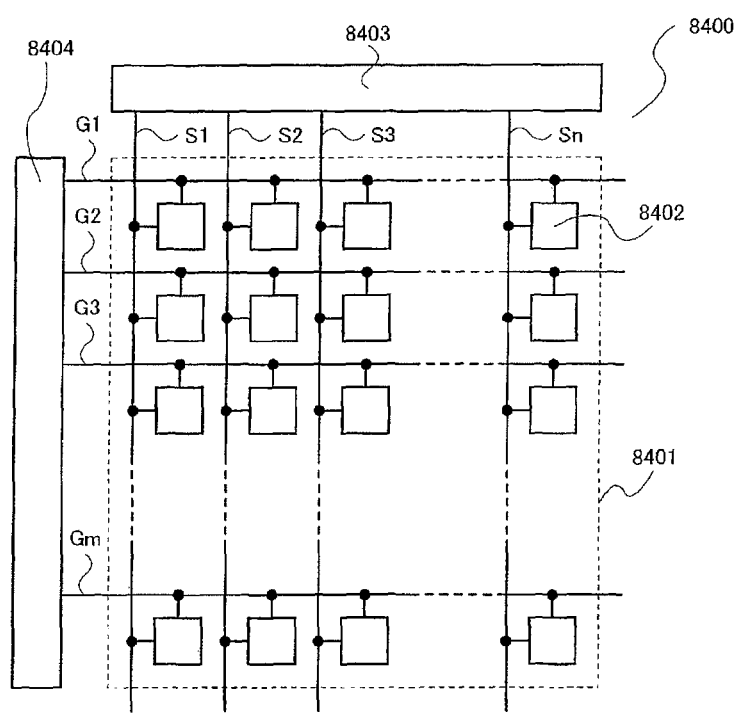
FIG. 36 shows a structure of a display device according to the invention.

FIG. 36 shows a structure example of a display device.

A display device 8400 includes a pixel portion 8401, a signal line driver circuit 8403, and a scan line driver circuit 8404. In the pixel portion 8401, a plurality of signal lines S1 to Sn extend from the signal line driver circuit 8403 in a column direction. In the pixel portion 8401, a plurality of scan lines G1 to Gm extend from the scan line driver circuit 8404 in a row direction. Pixels 8402 are arranged in matrix at each intersection of the plurality of signal lines S1 to Sn and the plurality of scan lines G1 to Gm.

The signal line driver circuit 8403 has a function to output a signal to each of the signal lines S1 to Sn. This signal may be referred to as a video signal. The scan line driver circuit 8404 has a function to output a signal to each of the scan lines G1 to Gm. This signal may be referred to as a scan signal.

The pixel 8402 may include at least a switching element connected to the signal line. On/off of the switching element is controlled by a potential of a scan line (a scan signal). When the switching element is turned on, the pixel 8402 is selected. On the other hand, when the switching element is turned off, the pixel 8402 is not selected.

When the pixel 8402 is selected (a selection state), a video signal is input to the pixel 8402 from the signal line. A state (e.g., luminance, transmittance, or voltage of a storage capacitor) of the pixel 8402 is changed in accordance with the video signal input.

When the pixel 8402 is not selected (a non-selection state), the video signal is not input to the pixel 8402. Note that the pixel 8402 holds a potential corresponding to the video signal which is input when selected; thus, the pixel 8402 maintains the state (e.g., luminance, transmittance, or voltage of a storage capacitor) in accordance with the video signal.

A structure of the display device is not limited to that shown in FIG. 36. For example, an additional wiring (such as a scan line, a signal line, a power supply line, a capacitor line, or a common line) may be added in accordance with the structure of the pixel 8402. As another example, a circuit having various functions may be added.

Figure 37:
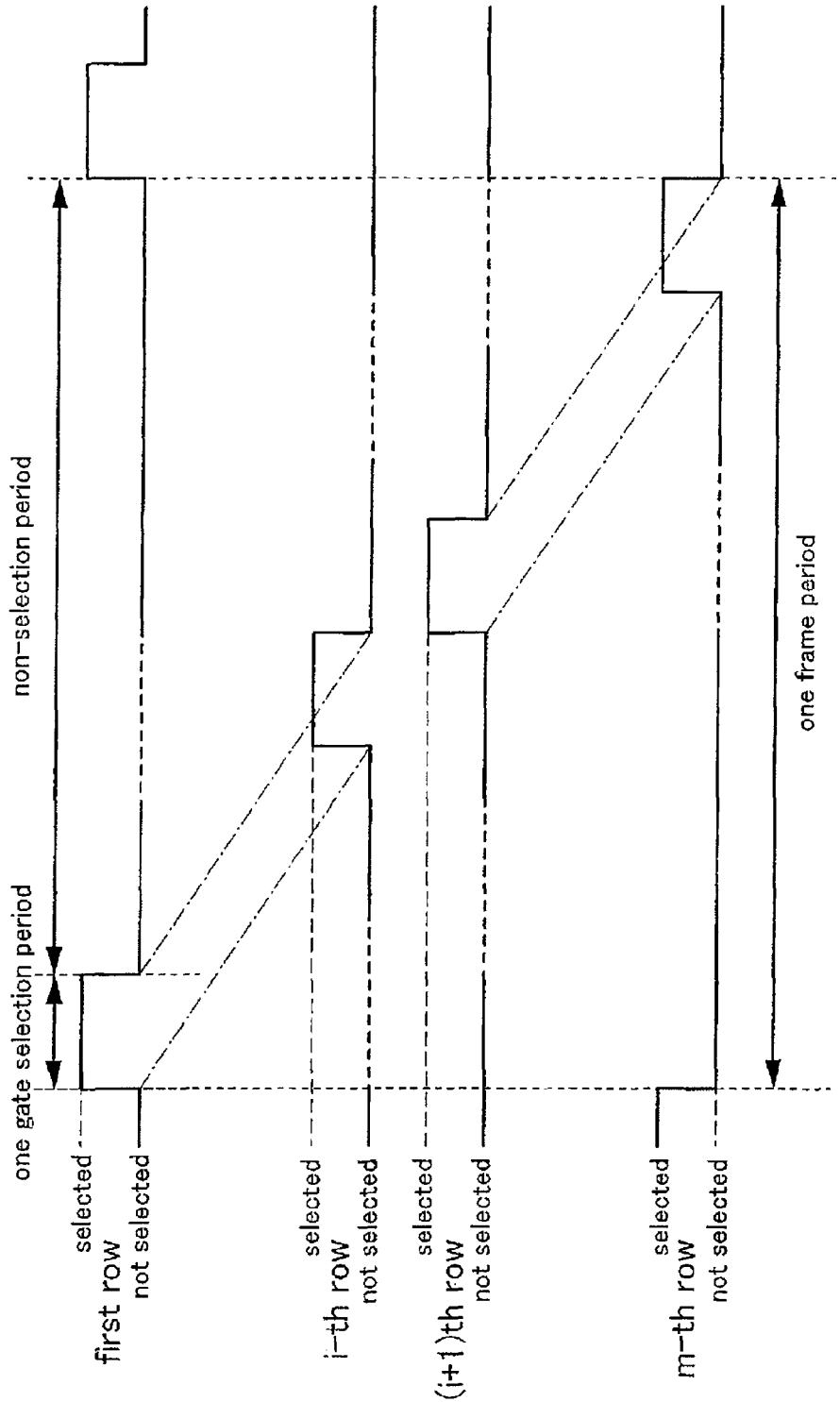
FIG. 37 shows one driving method of a display device according to the invention.

FIG. 37 shows an example of a timing chart for describing an operation of a display device.

The timing chart of FIG. 37 shows one frame period corresponding to a period when an image of one screen is displayed. On one frame period is not particularly limited, but one frame period is preferably 1/60 second or less so that a viewer does not perceive a flicker.

The timing chart of FIG. 37 shows timing for selecting the scan line G1 in the first row, the scan line Gi (one of the scan lines G1 to Gm) in the i-th row, the scan line Gi+1 in the (i+1)th row, and the scan line Gm in the m-th row.

At the same time as the scan line is selected, the pixel 8402 connected to the scan line is also selected. For example, when the scan line Gi in the i-th row is selected, the pixel 8402 connected to the scan line Gi in the i-th row is also selected.

The scan lines G1 to Gm are sequentially selected (also referred to as scanned) from the scan line G1 in the first row to the scan line Gm in the m-th row. For example, while the scan line Gi in the i-th row is selected, the scan lines (G1 to Gi−1 and Gi+1 to Gm) other than the scan line Gi in the i-th row are not selected. Then, during the next period, the scan line Gi+1 in the (i+1)th row is selected. The period during which one scan line is selected is referred to as one gate selection period.

Therefore, when a scan line in a certain row is selected, a plurality of pixels 8402 connected to the scan line receive a video signal from each of the signal lines S1 to Sn. For example, when the scan line Gi in the i-th row is selected, the plurality of pixels 8402 connected to the scan line Gi in the i-th row receive a given video signal from each of the signal lines S1 to Sn. Thus, each of the plurality of pixels 8402 can be controlled individually by the scan signal and the video signal.

Next, the case where one gate selection period is divided into a plurality of subgate selection periods is described.

Figure 38:
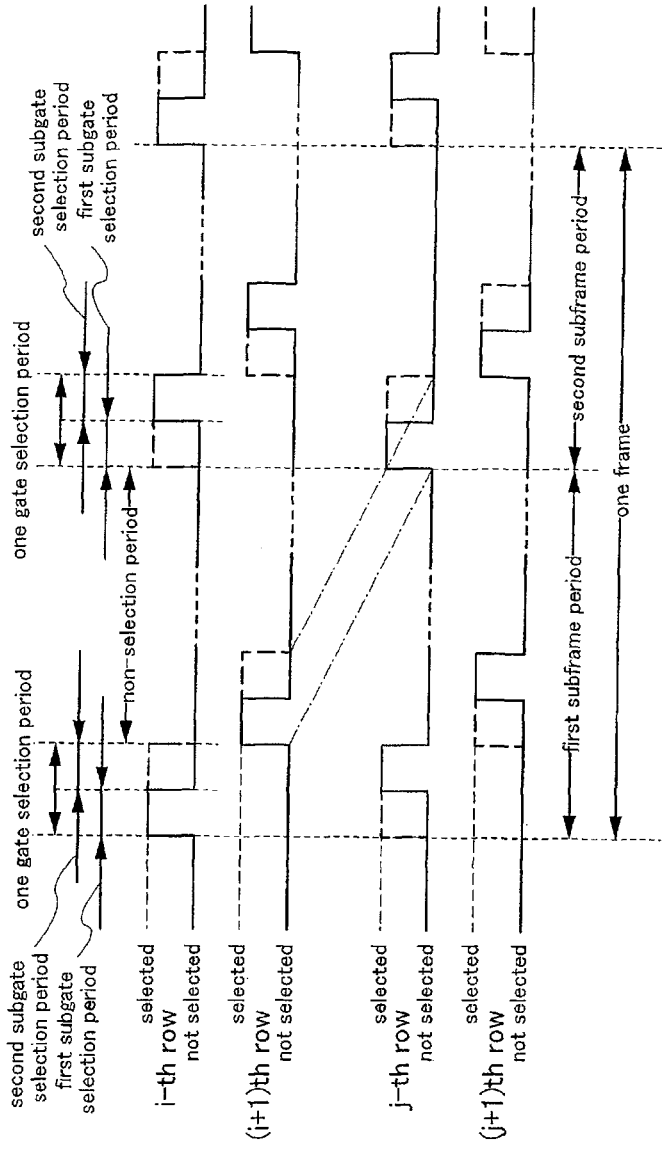
FIG. 38 shows one driving method of a display device according to the invention.

FIG. 38 is a timing chart in the case where one gate selection period is divided into two subgate selection periods (a first subgate selection period and a second subgate selection period).

Note that one gate selection period may be divided into three or more subgate selection periods.

The timing chart of FIG. 38 shows one frame period corresponding to a period when an image of one screen is displayed. One frame period is not particularly limited, but one frame period is preferably 1/60 second or less so that a viewer does not perceive a flicker.

Note that one frame is divided into two subframes (a first subframe and a second subframe).

The timing chart of FIG. 38 shows timing for selecting the scan line Gi in the i-th row, the scan line Gi+1 in the (i+1)th row, the scan line Gj (one of the scan lines Gi+1 to Gm) in the j-th row, and the scan line Gj+1 in the (j+1)th row.

At the same time as the scan line is selected, the pixel 8402 connected to the scan line is also selected. For example, when the scan line Gi in the i-th row, the pixel 8402 connected to the scan line Gi in the i-th row is also selected.

The scan lines G1 to Gm are sequentially scanned in each subgate selection period. For example, in a certain one gate selection period, the scan line Gi in the i-th row is selected in the first subgate selection period, and the scan line Gj in the j-th row is selected in the second subgate selection period. Thus, in one gate selection period, an operation can be performed as if the scan signals of two rows are selected. At this time, different video signals are input to the signal lines Si to Sn in the first subgate selection period and the second subgate selection period. Accordingly, a plurality of pixels 8402 connected to the scan line Gi in the i-th row can receive a different video signal from a plurality of pixels 8402 connected to the scan line Gj in the j-th row.

Next, a driving method for displaying images with high quality is described.

Figure 39A:
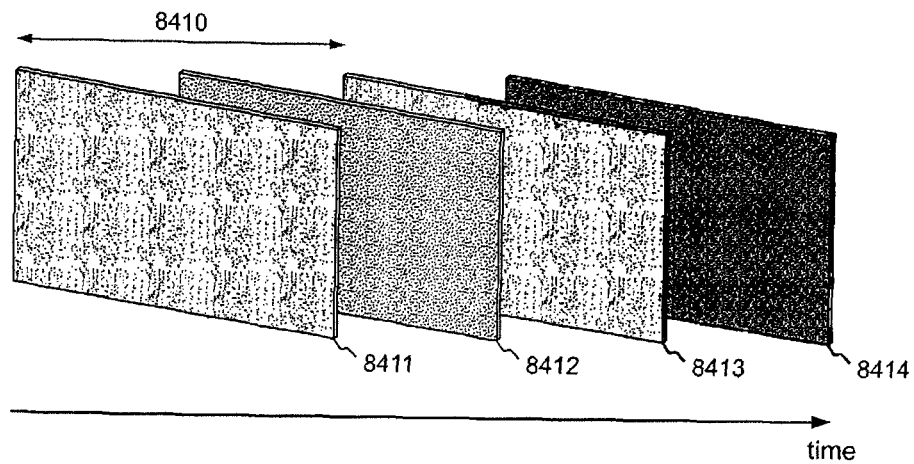
FIGS. 39A and 39B each show one driving method of a display device according to the invention.
Figure 39B:
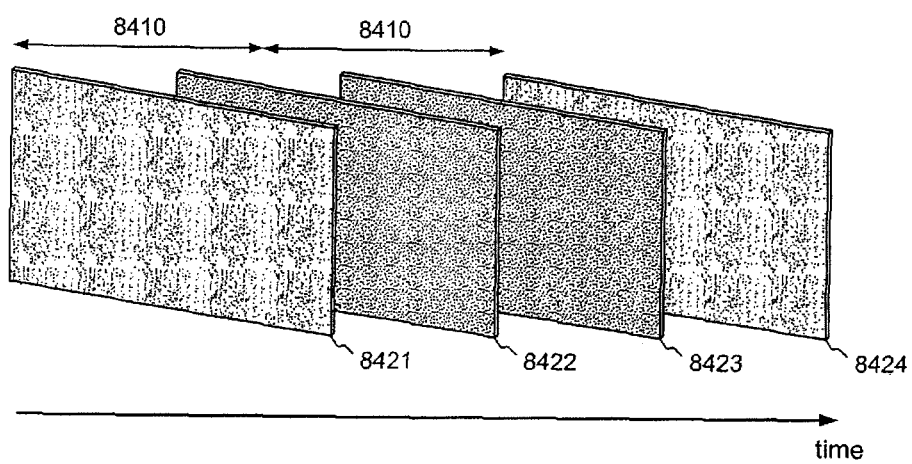

FIGS. 39A and 39B are views for describing high frequency driving.

FIG. 39A shows the case where an interpolation image is displayed between two input images. A period 8410 is a cycle of an input image signal. An image 8411, an image 8412, an image 8413, and an image 8414 are a first input image, a first interpolation image, a second input image, and a second interpolation image, respectively. Here, the input image corresponds to an image based on a signal input from outside of a display device. Further, the interpolation image corresponds to an image which is displayed at a timing different from that of the input image so as to interpolate an image.

The image 8412 is an image formed based on image signals of the images 8411 and 8413. Specifically, movement of an object is estimated by difference between a position of the object included in the image 8411 and a position of the object included in the image 8413, and the image can be made in which the position of the object included in the image 8412 is at an intermediate state between the image 8411 and the image 8413. This process is referred to as motion compensation. Since the image 8412 is formed by motion compensation, the object at the intermediate (½) position, which cannot be displayed only by the input image, can be displayed, and the movement of the object can be smoothed to be displayed. Alternatively, the image 8412 can be formed by an average value of the image signals of the images 8411 and 8413. Thus, the load to a circuit due to formation of the interpolation image can be reduced, so that power consumption can be reduced.

Alternatively, the image 8412 can be formed from the image 8411. Specifically, the image 8412 can be formed by increasing or decreasing brightness of the image 8411 entirely or partially. More specifically, the image with the entire brightness higher or lower can be made by converting gamma characteristics of the image 8411.

Note that the image 8412 may be a black image. Thus, the quality of a moving image in a hold-type display device can be improved.

FIG. 39B shows the case where two interpolation images are displayed between two input images. The period 8410 is a cycle of an input image signal. An image 8421, an image 8422, an image 8423, and an image 8424 are a first input image, a first interpolation image, a second interpolation image, and a second input image, respectively.

Each of the image 8422 and the image 8423 can be formed based on image signals of the images 8421 and 8424. Specifically, the images 8422 and 8423 can be formed by motion compensation using difference between a position of an object included in the image 8421 and a position of the object included in the image 8424. Since the images 8422 and 8423 are formed by motion compensation, the object at the intermediate (⅓ and ⅔) positions, which cannot be displayed only by the input image, can be displayed, movement of the object can be smoothed to be displayed. In addition, the images 8422 and 8423 can be formed by an average value of the image signals of the images 8421 and 8424. Thus, the load to a circuit due to formation of the interpolation image can be reduced, so that power consumption can be reduced.

Alternatively, the images 8422 and 8423 can be formed from the images 8421 and 8424. Specifically, the images 8422 and 8423 can be formed by increasing or decreasing brightness of the image 8421 entirely or partially. More specifically, the image with the entire brightness higher or lower can be made by converting the gamma characteristics of the image 8411.

Note that the images 8422 and 8423 may be black images. Thus, the quality of a moving image in a hold-type display device can be improved.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

[Embodiment Mode 10]

In this embodiment mode, a peripheral portion of a liquid crystal panel is described.

Figure 40:
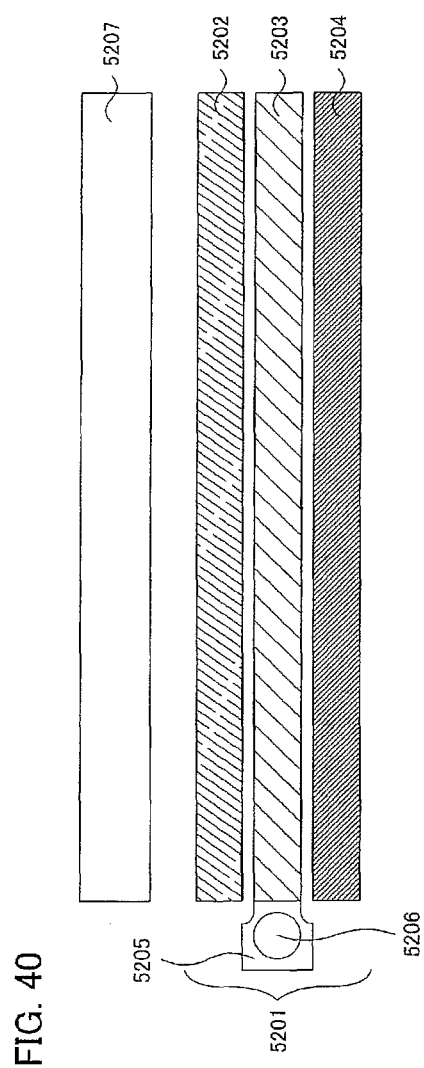
FIG. 40 is a cross-sectional view of a liquid crystal display device according to the invention.

FIG. 40 shows an example of a liquid crystal display device including a so-called edge-light type backlight unit 5201 and a liquid crystal panel 5207. An edge-light type corresponds to a type in which a light source is provided at an end of a backlight unit and fluorescence of the light source is emitted from the entire light-emitting surface. The edge-light type backlight unit is thin and can save power.

The backlight unit 5201 includes a diffusion plate 5202, a light guide plate 5203, a reflection plate 5204, a lamp reflector 5205, and a light source 5206.

The light source 5206 has a function to emit light as necessary. As the light source 5206, a cold cathode fluorescent lamp, a hot cathode fluorescent lamp, a light-emitting diode, an inorganic EL element, an organic EL element, or the like can be used, for example.

FIGS. 41A to 41D each show a detailed structure of the edge-light type backlight unit. Note that description of a diffusion plate, a light guide plate, a reflection plate, and the like is omitted.

Figure 41A:
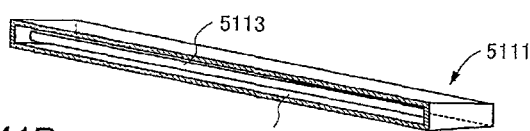
FIGS. 41A to 41D are cross-sectional views of a liquid crystal display device according to the invention.

A backlight unit 5111 shown in FIG. 41A has a structure in which a cold cathode fluorescent lamp 5113 is used as a light source. A lamp reflector 5112 is provided to efficiently reflect light from the cold cathode fluorescent lamp 5113. Such a structure is often used for a large display device because luminance from the cold cathode fluorescent lamp is high.

Figure 41B:
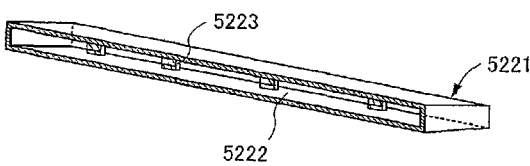

A backlight unit 5221 shown in FIG. 41B has a structure in which light-emitting diodes (LEDs) 5223 are used as light sources. For example, the light-emitting diodes (LEDs) 5223 which emit white light are provided at a predetermined interval. Further, a lamp reflector 5222 is provided to efficiently reflect light from the light-emitting diodes (LEDs) 5223.

Figure 41C:
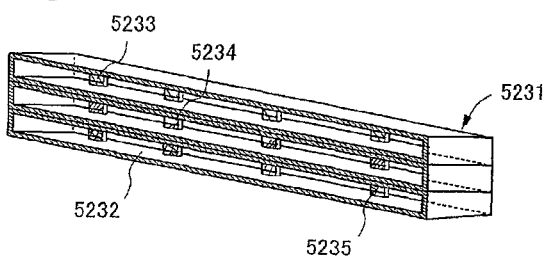

A backlight unit 5231 shown in FIG. 41C has a structure in which light-emitting diodes (LEDs) 5233, light-emitting diodes (LEDs) 5234, and light-emitting diodes (LEDs) 5235 of each color of RGB are used as light sources. The light-emitting diodes (LEDs) 5233, 5234, and 5235 of each color of RGB are provided at a predetermined interval. By using the light-emitting diodes (LEDs) 5233, 5234, and 5235 of each color of RGB, color reproducibility can be improved. In addition, a lamp reflector 5232 is provided to efficiently reflect light from the light-emitting diodes.

Figure 41D:
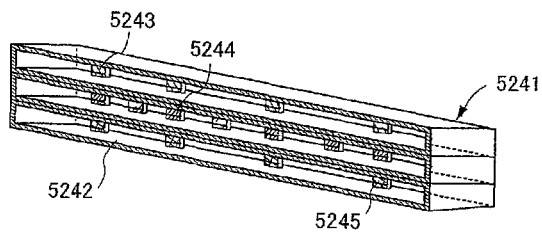

A backlight unit 5241 shown in FIG. 41D has a structure in which light-emitting diodes (LEDs) 5243, light-emitting diodes (LEDs) 5244, and light-emitting diodes (LEDs) 5245 of each color of RGB are used as light sources. For example, among the light-emitting diodes (LEDs) 5243, 5244, and 5245 of each color of RGB, the light-emitting diodes of a color with low emission intensity (e.g., green) are provided more than other light-emitting diodes. By using the light-emitting diodes (LEDs) 5243, 5244, and 5245 of each color of RGB, color reproducibility can be improved. In addition, a lamp reflector 5242 is provided to efficiently reflect light from the light-emitting diodes.

Figure 44:
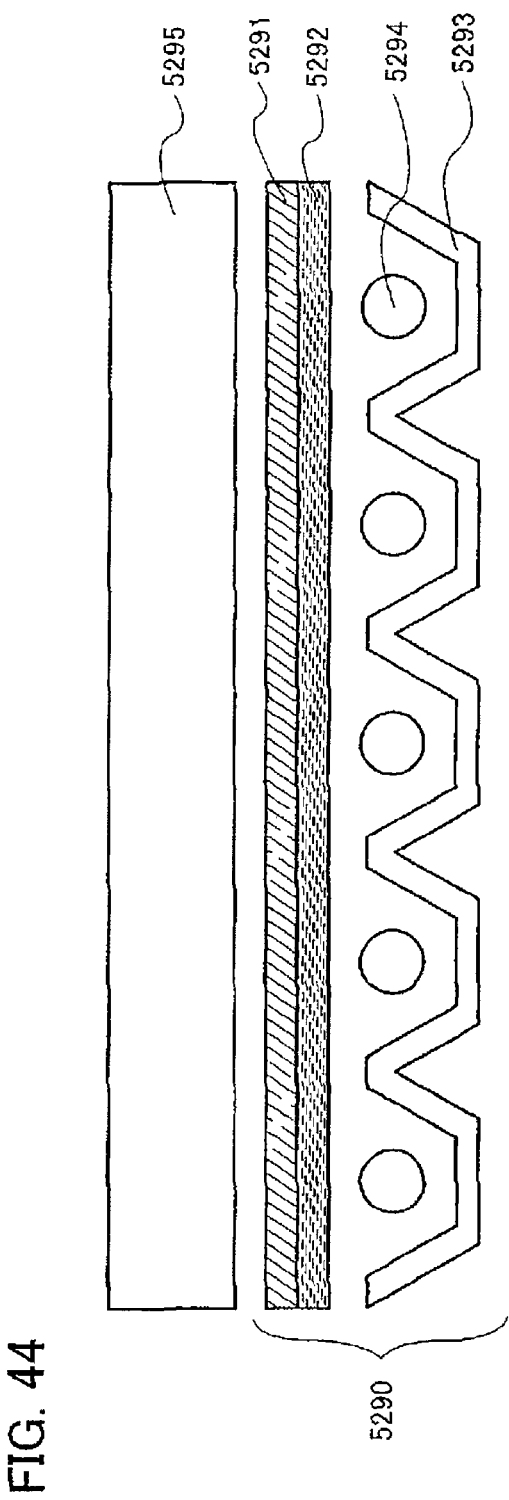
FIG. 44 is a cross-sectional view of a liquid crystal display device according to the invention.

FIG. 44 shows an example of a liquid crystal display device including a so-called direct-type backlight unit and a liquid crystal panel. A direct type corresponds to a type in which a light source is provided directly under a light-emitting surface and fluorescence of the light source is emitted from the entire light-emitting surface. The direct-type backlight unit can efficiently utilize the amount of emitted light.

A backlight unit 5290 includes a diffusion plate 5291, a light-shielding plate 5292, a lamp reflector 5293, and a light source 5294.

The light source 5294 has a function to emit light as necessary. As the light source 5294, a cold cathode fluorescent lamp, a hot cathode fluorescent lamp, a light-emitting diode, an inorganic EL element, an organic EL element, or the like can be used, for example.

Figure 42:
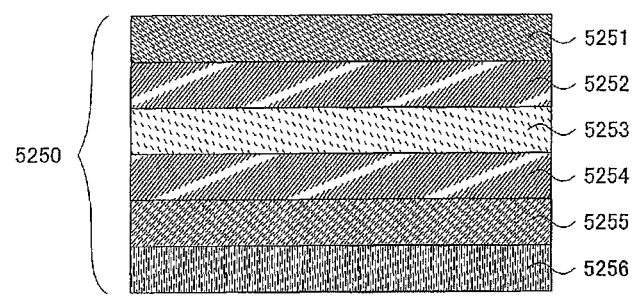
FIG. 42 is a cross-sectional view of a liquid crystal display device according to the invention.

FIG. 42 shows an example of a structure of a polarizing plate (also referred to as a polarizing film).

A polarizing film 5250 includes a protective film 5251, a substrate film 5252, a PVA polarizing film 5253, a substrate film 5254, an adhesive layer 5255, and a mold release film 5256.

When the PVA polarizing film 5253 is interposed between films (the substrate films 5252 and 5254) to be base materials, reliability can be improved. Note that the PVA polarizing film 5253 may be interposed by triacetyl cellulose (TAC) films with high light-transmitting properties and high durability. The substrate films and the TAC films each function as a protective film of a polarizer included in the PVA polarizing film 5253.

The adhesive layer 5255 which is to be attached to a glass substrate of the liquid crystal panel is attached to one of the substrate films (the substrate film 5254). Note that the adhesive layer 5255 is formed by applying an adhesive to one of the substrate films (the substrate film 5254). The adhesive layer 5255 is provided with the mold release film 5256 (a separate film).

The other of the substrates films (the substrate film 5252) is provided with the protective film 5251.

A hard coating scattering layer (an anti-glare layer) may be provided on a surface of the polarizing film 5250. Since the surface of the hard coating scattering layer has minute unevenness formed by AG treatment and has an anti-glare function which scatters external light, reflection of external light in the liquid crystal panel and surface reflection can be prevented.

A treatment in which a plurality of optical thin film layers having different refractive indexes are layered (also referred to as anti-reflection treatment or AR treatment) may be performed on the surface of the polarizing film 5250. The plurality of layered optical thin film layers having different refractive indexes can reduce reflectivity on the surface by an interference effect of light.

Figure 43A:
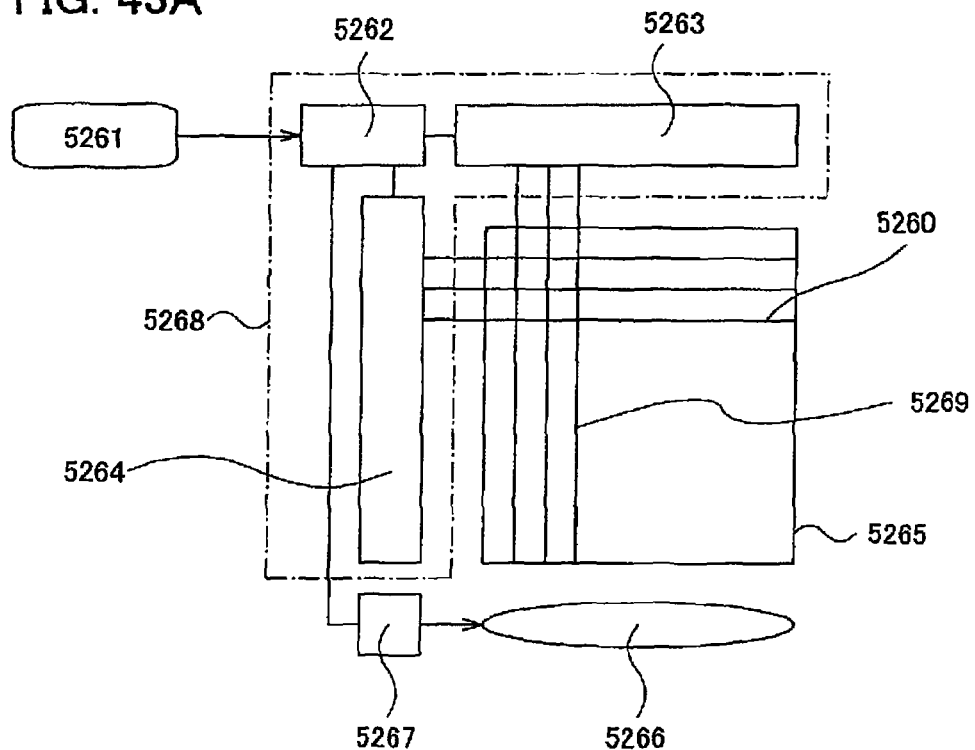
FIGS. 43A to 43C each show a structure of a liquid crystal display device according to the invention.
Figure 43B:
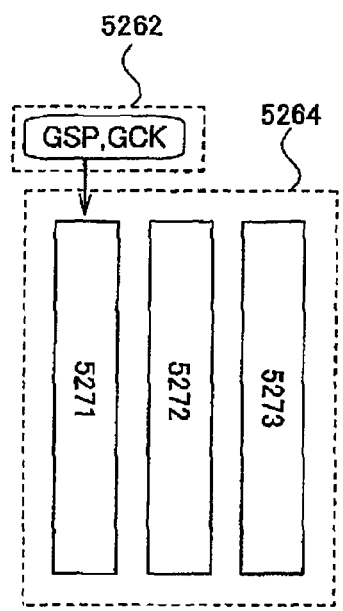
Figure 43C:
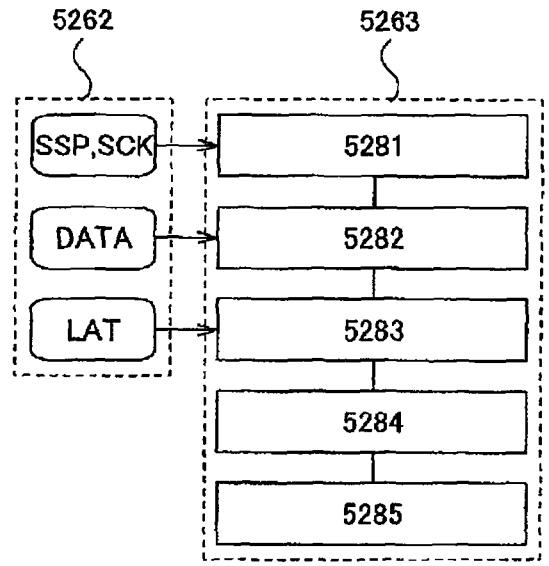

FIGS. 43A to 43C show examples of a system block of a liquid crystal display device.

In a pixel portion 5265, signal lines 5269 which are extended from a signal line driver circuit 5263 are provided. In the pixel portion 5265, scan lines 5260 which are extended from a scan line driver circuit 5264 are also provided. Further, a plurality of pixels are arranged in matrix at intersections of the signal lines 5269 and the scan lines 5260. Note that each of the plurality of pixels includes a switching element. Therefore, voltage for controlling inclination of liquid crystal molecules can be separately input to each of the plurality of pixels. A structure in which a switching element is provided at each intersection in this manner is referred to as an active matrix type. Note that the invention is not limited to such an active matrix type, and a structure of a passive matrix type may be used. In a passive matrix type, a switching element is not included in each pixel, so that a process is simple.

A driver circuit portion 5268 includes a control circuit 5262, the signal line driver circuit 5263, and the scan line driver circuit 5264. An image signal 5261 is input to the control circuit 5262. The control circuit 5262 controls the signal line driver circuit 5263 and the scan line driver circuit 5264 in accordance with the image signal 5261. Accordingly, the control circuit 5262 inputs a control signal to each of the signal line driver circuit 5263 and the scan line driver circuit 5264. Then, in accordance with the control signal, the signal line driver circuit 5263 inputs a video signal to each of the signal lines 5269 and the scan line driver circuit 5264 inputs a scan signal to each of the scan lines 5260. Then, the switching element included in the pixel is selected in accordance with the scan signal, and the video signal is input to a pixel electrode of the pixel.

In addition, the control circuit 5262 also controls a power supply 5267 in accordance with the image signal 5261. The power supply 5267 includes a means to supply power to a lighting unit 5266. As the lighting unit 5266, an edge-light type backlight unit or a direct-type backlight unit can be used. Note that a front light may be used as the lighting unit 5266. A front light corresponds to a plate-like lighting unit including a luminous body and a light conducting body, which is attached to the front surface side of a pixel portion and illuminates the whole area. Such a lighting unit can uniformly illuminate the pixel portion at low power consumption.

As shown in FIG. 43B, the scan line driver circuit 5264 includes a shift register 5271, a level shifter 5272, and a circuit functioning as a buffer 5273. A signal such as a gate start pulse (GSP) or a gate clock signal (GCK) is input to the shift register 5271.

As shown in FIG. 43C, the signal line driver circuit 5263 includes a shift register 5281, a first latch 5282, a second latch 5283, a level shifter 5284, and a circuit functioning as a buffer 5285. The circuit functioning as the buffer 5285 corresponds to a circuit which has a function to amplify a weak signal and includes an operational amplifier or the like. A signal such as a start pulse (SSP) is input to the shift register 5281, and data (DATA) such as a video signal is input to the first latch 5282. A latch (LAT) signal can be temporally held in the second latch 5283 and is simultaneously input to the pixel portion 5265. This is referred to as line sequential driving. Therefore, when a pixel in which not line sequential driving but dot sequential driving is performed is employed, the second latch can be omitted.

In this embodiment mode, various types of liquid crystal panels can be used. For example, a structure in which a liquid crystal layer is sealed between two substrates can be used for the liquid crystal panel. A transistor, a capacitor, a pixel electrode, an alignment film, or the like is formed over one substrate. A polarizing plate, a retardation plate, or a prism sheet may be provided on the surface opposite to a top surface of one substrate. A color filter, a black matrix, an opposite electrode, an alignment film, or the like is provided on the other substrate. A polarizing plate or a retardation plate may be provided on the surface opposite to a top surface of the other substrate. Note that the color filter and the black matrix may be formed over the top surface of one substrate. In addition, three-dimensional display can be performed by providing a slit (a grid) on the top surface or the surface opposite to the top surface of one substrate.

Each of the polarizing plate, the retardation plate, and the prism sheet can be provided between the two substrates. Alternatively, each of the polarizing plate, the retardation plate, and the prism sheet can be integrated with one of the two substrates.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

[Embodiment Mode 11]

In this embodiment mode, a structure and an operation of a pixel which can be applied to a liquid crystal display device are described.

In this embodiment mode, as an operation mode of a liquid crystal element, a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Microcell) mode, an OCB (Optical Compensated Birefringence) mode, an FLC (Ferroelectric Liquid Crystal) mode, an AFLC (AntiFerroelectric Liquid Crystal) mode, or the like can be used.

Figure 45A:
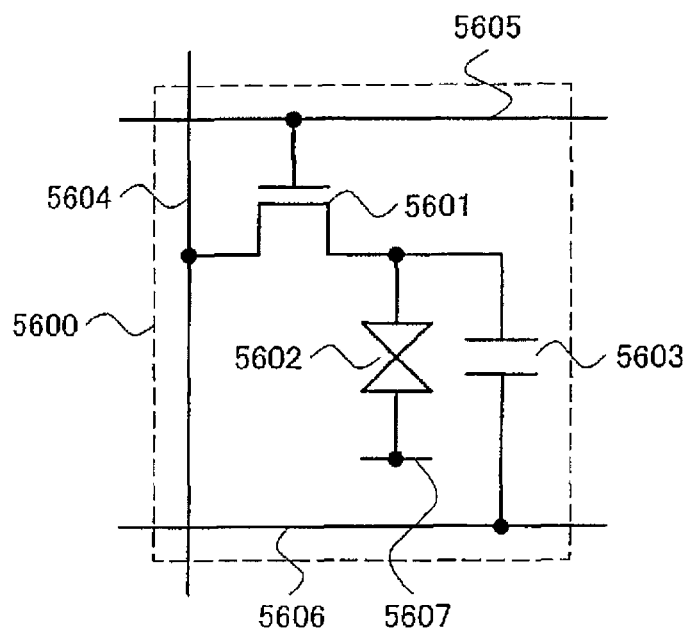
FIGS. 45A and 45B are circuit diagrams of a pixel according to the invention.

FIG. 45A shows an example of a pixel structure which can be applied to the liquid crystal display device.

A pixel 5600 includes a transistor 5601, a liquid crystal element 5602, and a capacitor 5603. A gate of the transistor 5601 is connected to a wiring 5605. A first terminal of the transistor 5601 is connected to a wiring 5604. A second terminal of the transistor 5601 is connected to a first electrode of the liquid crystal element 5602 and a first electrode of the capacitor 5603. A second electrode of the liquid crystal element 5602 corresponds to an opposite electrode 5607. A second electrode of the capacitor 5603 is connected to a wiring 5606.

The wiring 5604 functions as a signal line. The wiring 5605 functions as a scan line. The wiring 5606 functions as a capacitor line. The transistor 5601 functions as a switch. The capacitor 5603 functions as a storage capacitor.

It is only necessary that the transistor 5601 function as a switch, and the transistor 5601 may be a p-channel transistor or an n-channel transistor.

Figure 45B:
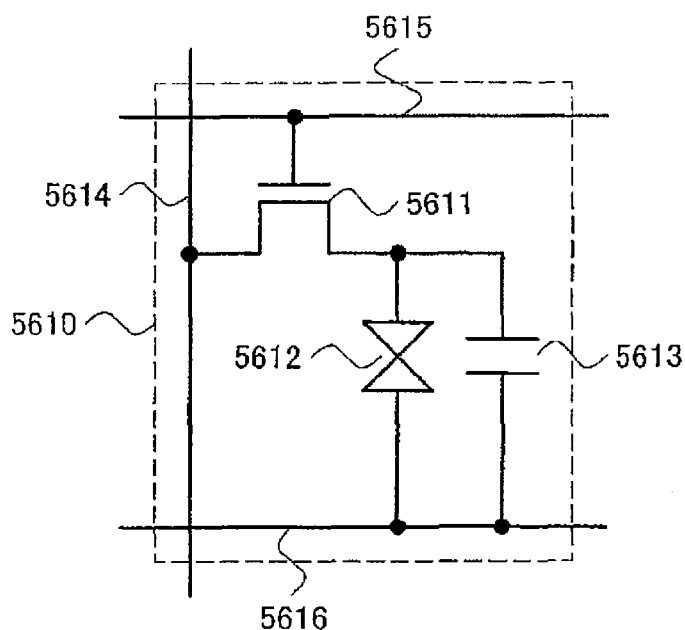

FIG. 45B shows an example of a pixel structure which can be applied to the liquid crystal display device. In particular, FIG. 45B shows an example of a pixel structure which can be applied to a liquid crystal display device suitable for a lateral electric field mode (including an IPS mode and an FFS mode).

A pixel 5610 includes a transistor 5611, a liquid crystal element 5612, and a capacitor 5613. A gate of the transistor 5611 is connected to a wiring 5615. A first terminal of the transistor 5611 is connected to a wiring 5614. A second terminal of the transistor 5611 is connected to a first electrode of the liquid crystal element 5612 and a first electrode of the capacitor 5613. A second electrode of the liquid crystal element 5612 is connected to a wiring 5616. A second electrode of the capacitor 5613 is connected to the wiring 5616.

The wiring 5614 functions as a signal line. The wiring 5615 functions as a scan line. The wiring 5616 functions as a capacitor line. The transistor 5611 functions as a switch. The capacitor 5613 functions as a storage capacitor.

It is only necessary that the transistor 5611 function as a switch, and the transistor 5611 may be a p-channel transistor or an n-channel transistor.

Figure 46:
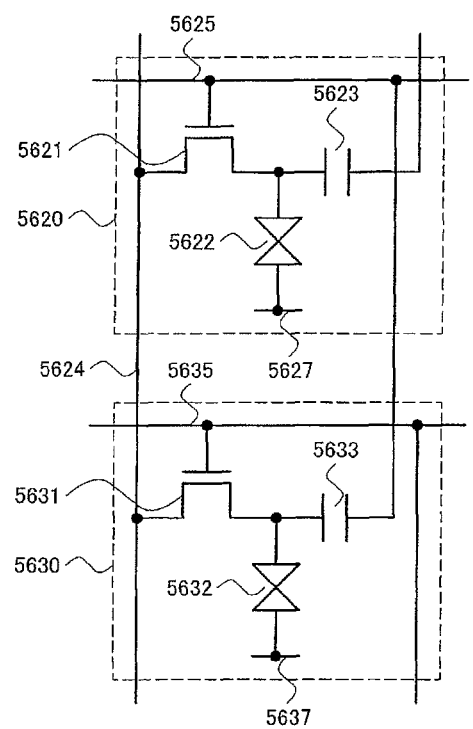
FIG. 46 is a circuit diagram of a pixel according to the invention.

FIG. 46 shows an example of a pixel structure which can be applied to the liquid crystal display device. In particular, FIG. 46 shows an example of a pixel structure in which an aperture ratio of a pixel can be increased by reducing the number of wirings.

FIG. 46 shows two pixels (a pixel 5620 and a pixel 5630) which are provided in the same column direction. For example, when the pixel 5620 is provided in the N-th row, the pixel 5630 is provided in the (N+1)th row.

A pixel 5620 includes a transistor 5621, a liquid crystal element 5622, and a capacitor 5623. A gate of the transistor 5621 is connected to a wiring 5625. A first terminal of the transistor 5621 is connected to a wiring 5624. A second terminal of the transistor 5621 is connected to a first electrode of the liquid crystal element 5622 and a first electrode of the capacitor 5623. A second electrode of the liquid crystal element 5622 corresponds to an opposite electrode 5627. A second electrode of the capacitor 5623 is connected to a wiring which is the same as that connected to a gate of a transistor in the previous row.

A pixel 5630 includes a transistor 5631, a liquid crystal element 5632, and a capacitor 5633. A gate of the transistor 5631 is connected to a wiring 5635. A first terminal of the transistor 5631 is connected to the wiring 5624. A second terminal of the transistor 5631 is connected to a first electrode of the liquid crystal element 5632 and a first electrode of the capacitor 5633. A second electrode of the liquid crystal element 5632 corresponds to an opposite electrode 5637. A second electrode of the capacitor 5633 is connected to a wiring which is the same as that connected to the gate of the transistor in the previous row (i.e., the wiring 5625).

The wiring 5624 functions as a signal line. The wiring 5625 functions as a scan line of the N-th row, and also as a capacitor line of the (N+1)th row. The transistor 5621 functions as a switch. The capacitor 5623 functions as a storage capacitor.

The wiring 5635 functions as a scan line of the (N+1)th row, and also as a capacitor line of the (N+2)th row. The transistor 5631 functions as a switch. The capacitor 5633 functions as a storage capacitor.

It is only necessary that each of the transistor 5621 and the transistor 5631 function as a switch, and each of the transistor 5621 and the transistor 5631 may be a p-channel transistor or an n-channel transistor.

Figure 47:
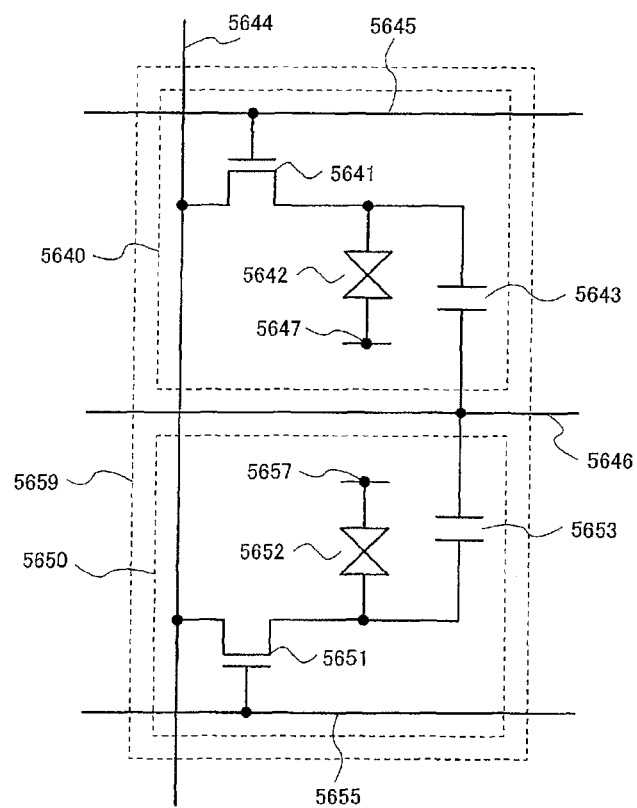
FIG. 47 is a circuit diagram of a pixel according to the invention.

FIG. 47 shows an example of a pixel structure which can be applied to the liquid crystal display device. In particular, FIG. 47 shows an example of a pixel structure in which a viewing angle can be improved by using a subpixel.

A pixel 5659 includes a subpixel 5640 and a subpixel 5650. Although the case where the pixel 5659 includes two subpixels is described below, the pixel 5659 may include three or more subpixels.

The subpixel 5640 includes a transistor 5641, a liquid crystal element 5642, and a capacitor 5643. A gate of the transistor 5641 is connected to a wiring 5645. A first terminal of the transistor 5641 is connected to a wiring 5644. A second terminal of the transistor 5641 is connected to a first electrode of the liquid crystal element 5642 and a first electrode of the capacitor 5643. A second electrode of the liquid crystal element 5642 corresponds to an opposite electrode 5647. A second electrode of the capacitor 5643 is connected to a wiring 5646.

The subpixel 5650 includes a transistor 5651, a liquid crystal element 5652, and a capacitor 5653. A gate of the transistor 5651 is connected to a wiring 5655. A first terminal of the transistor 5651 is connected to the wiring 5644. A second terminal of the transistor 5651 is connected to a first electrode of the liquid crystal element 5652 and a first electrode of the capacitor 5653. A second electrode of the liquid crystal element 5652 corresponds to an opposite electrode 5657. A second electrode of the capacitor 5653 is connected to the wiring 5646.

The wiring 5644 functions as a signal line. The wiring 5645 functions as a scan line. The wiring 5655 functions as a scan line. The wiring 5646 functions as a capacitor line. The transistor 5641 functions as a switch. The transistor 5651 functions as a switch. The capacitor 5643 functions as a storage capacitor. The capacitor 5653 functions as a storage capacitor.

It is only necessary that the transistor 5641 function as a switch, and the transistor 5641 may be a p-channel transistor or an n-channel transistor. It is only necessary that the transistor 5651 function as a switch, and the transistor 5651 may be a p-channel transistor or an n-channel transistor.

A video signal input to the subpixel 5640 may be a value different from that of a video signal input to the subpixel 5650. In this case, the viewing angle can be widened because alignment of liquid crystal molecules of the liquid crystal element 5642 can be different from alignment of liquid crystal molecules of the liquid crystal element 5652.

Note that although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

Note that this embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

[Embodiment Mode 12]

In this embodiment mode, a method for driving a display device is described. In particular, a method for driving a liquid crystal display device is described.

A liquid crystal display panel which can be used for a liquid crystal display device described in this embodiment mode has a structure in which a liquid crystal material is interposed between two substrates. Each of the two substrates is provided with an electrode for controlling an electric field applied to the liquid crystal material. A liquid crystal material corresponds to a material optical and electrical properties of which are changed by an electric field externally applied. Accordingly, a liquid crystal panel corresponds to a device in which desired optical and electrical properties can be obtained by controlling voltage applied to the liquid crystal material with use of the electrode included in each of the two substrates. In addition, a plurality of electrodes are arranged in a planar manner so that each of the electrodes corresponds to a pixel, and voltages applied to the pixels are individually controlled; therefore, a liquid crystal display panel which can display a high-definition image can be obtained.

Here, response time of the liquid crystal material due to change in an electric field depends on a space (a cell gap) between the two substrates and a type or the like of the liquid crystal material, and is generally several milliseconds to several ten milliseconds. When the amount of change in the electric field is small, the response time of the liquid crystal material is further lengthened. This characteristic causes defects in image display, such as an after image, a phenomenon in which traces can be seen, and decrease in contrast when the liquid crystal panel displays a moving image. In particular, when a half tone is changed into another half tone (when change in the electric field is small), a degree of the above-described defects become noticeable.

On the other hand, as a particular problem of a liquid crystal panel using an active matrix method, fluctuation in writing voltage due to constant charge driving is given. Constant charge driving in this embodiment mode is described below.

A pixel circuit using an active matrix method includes a switch which controls writing and a capacitor which holds a charge. A method for driving the pixel circuit using the active matrix method corresponds to a method in which predetermined voltage is written in a pixel circuit with a switch in an on state, and immediately after that, the switch is turned off and a charge in the pixel circuit is held (a hold state). At the time of the hold state, exchange of the charge between inside and outside of the pixel circuit is not performed (a constant charge). In general, a period when the switch is in an off state is approximately several hundreds (the number of scan lines) of times longer than a period when the switch is in an on state. Accordingly, it is likely that the switch of the pixel circuit is almost always in an off state. As described above, constant charge driving in this embodiment mode corresponds to a driving method in which a pixel circuit is in a hold state in almost all periods when a liquid crystal panel is driven.

Next, electrical properties of the liquid crystal material are described. A dielectric constant as well as optical properties of the liquid crystal material are changed when an electric field externally applied is changed. That is, when it is considered that each pixel of the liquid crystal panel is a capacitor (a liquid crystal element) interposed between two electrodes, the capacitor corresponds to a capacitor, capacitance of which is changed in accordance with applied voltage. This phenomenon is called dynamic capacitance.

When a capacitor, the capacitance of which is changed in accordance with applied voltage in this manner, is driven by the constant charge driving, the following problem occurs. When capacitance of a liquid crystal element is changed in a hold state in which a charge is not moved, applied voltage is also changed. This can be understood from the fact that the amount of charges is constant in a relational expression of (the amount of charges)=(capacitance)×(applied voltage).

Figure 51A:
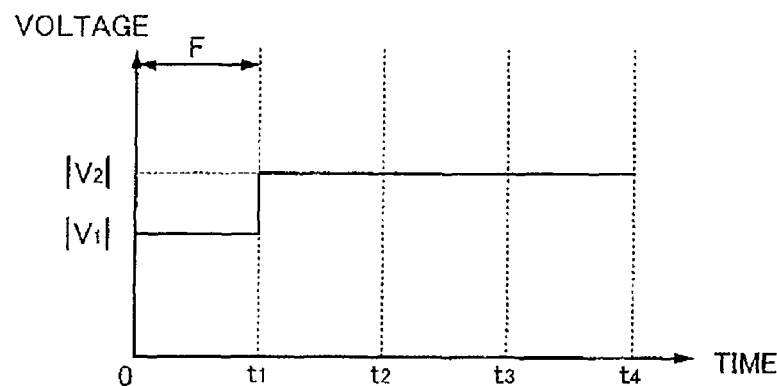
FIGS. 51A to 51C each show one driving method of a liquid crystal display device according to the invention.
Figure 51B:
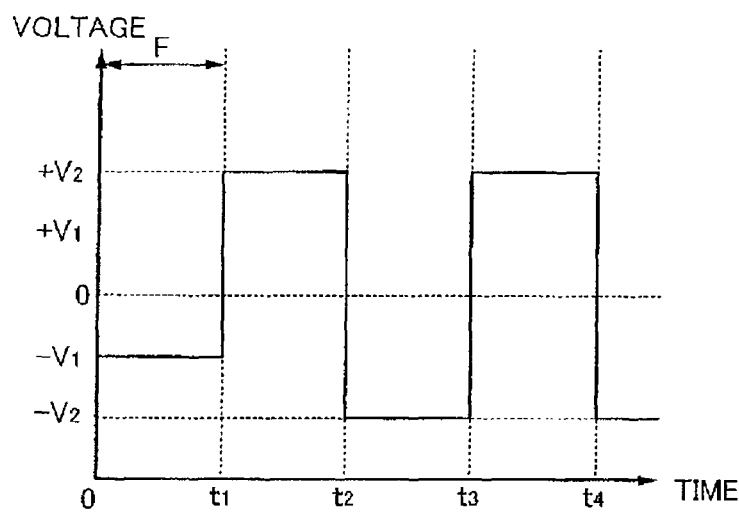
Figure 51C:
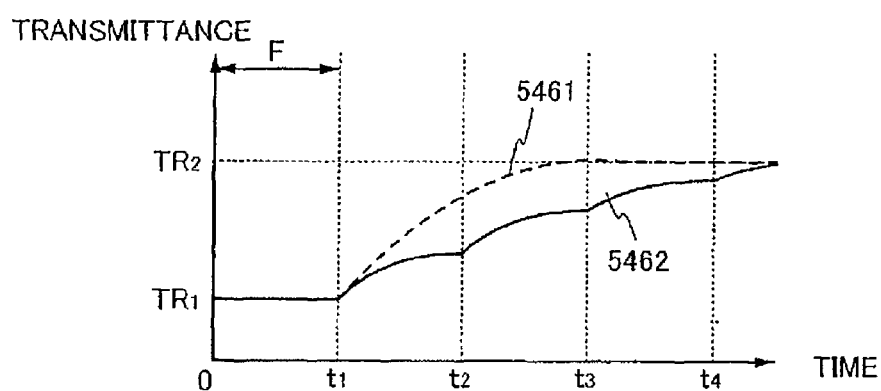

For the above-described reasons, voltage at the time of a hold state is changed from voltage at the time of writing because constant charge driving is performed in a liquid crystal panel using an active matrix method. Accordingly, change in transmittance of the liquid crystal element is different from change in transmittance of a liquid crystal element in a driving method which does not take a hold state. FIGS. 51A to 51C show this state. FIG. 51A shows an example of controlling voltage written in a pixel circuit when time is represented by a horizontal axis and an absolute value of the voltage is represented by a vertical axis. FIG. 51B shows an example of controlling voltage written in the pixel circuit when time is represented by a horizontal axis and the voltage is represented by a vertical axis. FIG. 51C shows change in transmittance of the liquid crystal element over time in the case where the voltage shown in FIG. 51A or 51B is written in the pixel circuit when time is represented by a horizontal axis and transmittance of the liquid crystal element is represented by a vertical axis. In each of FIGS. 51A to 51C, a period F indicates a period for rewriting the voltage, and time for rewriting the voltage is denoted by $t_1$, $t_2$, $t_3$, $t_4$, and the like.

Here, writing voltage corresponding to image data input to the liquid crystal display device corresponds to $|V_1|$ in rewriting at the time of 0 and corresponds to $|V_2|$ in rewriting at the time of $t_1$, $t_2$, $t_3$, $t_4$, and the like (see FIG. 51A).

Note that polarity of the writing voltage corresponding to image data input to the liquid crystal display device may be switched periodically (inversion driving: see FIG. 51B). Since direct voltage can be prevented from being applied to a liquid crystal as much as possible by using this method, burn-in or the like caused by deterioration of the liquid crystal element can be prevented. Note that a period of switching the polarity (an inversion period) may be the same as a period of rewriting voltage. In this case, generation of a flicker caused by inversion driving can be reduced because the inversion period is short. Further, the inversion period may be a period which is integral times the period of rewriting voltage. In this case, power consumption can be reduced because the inversion period is long and frequency of writing voltage can be decreased by changing the polarity.

FIG. 51C shows change in transmittance of the liquid crystal element over time when voltage as shown in FIG. 51A or 51B is applied to the liquid crystal element. Here, the voltage $|V_1|$ is applied to the liquid crystal element, and transmittance of the liquid crystal element after enough time passes corresponds to $TR_1$. Similarly, the voltage $|V_2|$ is applied to the liquid crystal element, and transmittance of the liquid crystal element after enough time passes corresponds to $TR_2$. When the voltage applied to the liquid crystal element is changed from $|V_1|$ to $|V_2|$ at the time of $t_1$, transmittance of the liquid crystal element does not immediately become $TR_2$ but slowly changes as shown by a dashed line 5461. For example, when the period of rewriting voltage is the same as a frame period (16.7 milliseconds) of an image signal of 60 Hz, time for several frames is necessary until transmittance is changed to $TR_2$.

Note that smooth change in transmittance over time as shown in the dashed line 5461 corresponds to change in transmittance over time when the voltage $|V_2|$ is accurately applied to the liquid crystal element. In an actual liquid crystal panel, for example, in a liquid crystal panel using an active matrix method, transmittance of the liquid crystal element does not changed over time as shown by the dashed line 5461 but gradually changes over time as shown by a solid line 5462. This is because voltage at the time of a hold state is changed from voltage at the time of writing due to constant charge driving, and it is impossible to reach intended voltage only by one writing. Accordingly, the response time of transmittance of the liquid crystal element becomes further longer than original response time (the dashed line 5461) in appearance, so that defects when an image is displayed, such as an after image, a phenomenon in which traces can be seen, or decrease in contrast noticeably occur.

Figure 52A:
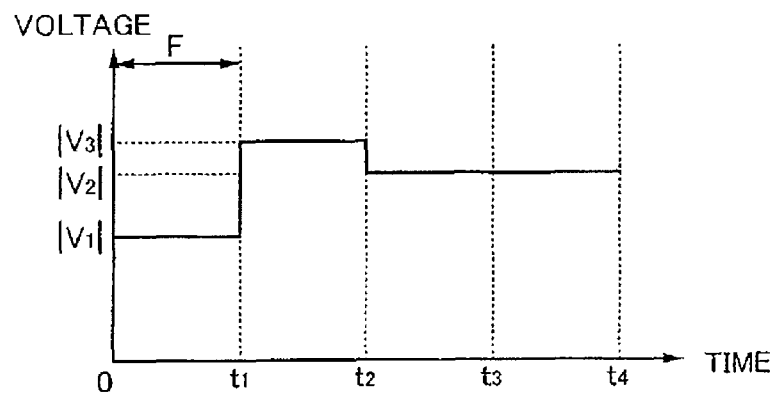
FIGS. 52A to 52C each show one driving method of a liquid crystal display device according to the invention.
Figure 52B:
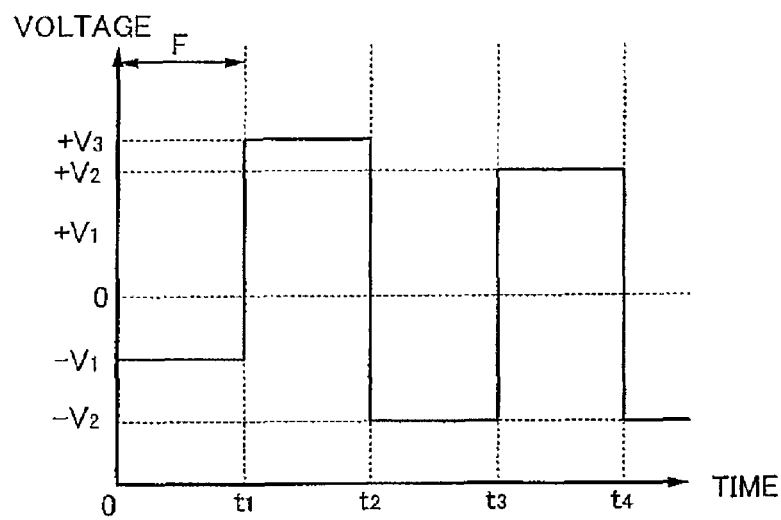
Figure 52C:
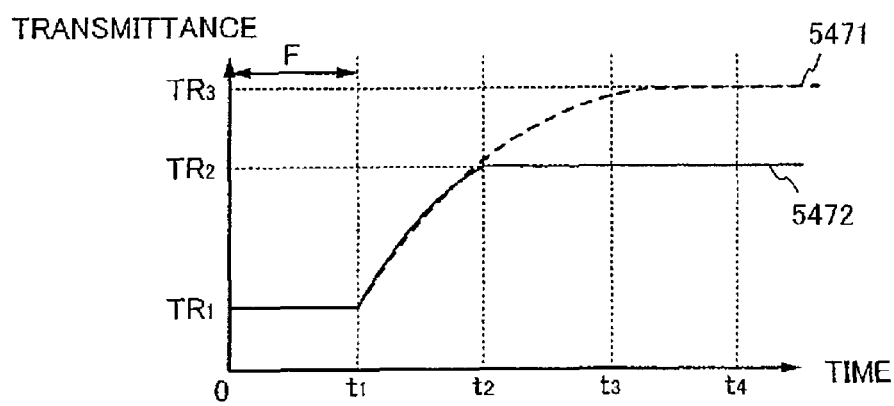

By using overdriving, it is possible to solve a phenomenon in which the response time in appearance becomes further longer because of shortage of writing by dynamic capacitance and constant charge driving as well as length of the original response time of the liquid crystal element. FIGS. 52A to 52C show this state. FIG. 52A shows an example of controlling voltage written in a pixel circuit when time is represented by a horizontal axis and an absolute value of the voltage is represented by a vertical axis. FIG. 52B shows an example of controlling voltage written in the pixel circuit when time is represented by a horizontal axis and the voltage is represented by a vertical axis. FIG. 52C shows change in transmittance of the liquid crystal element over time in the case where the voltage shown in FIG. 52A or 52B is written in the pixel circuit when time is represented by a horizontal axis and transmittance of the liquid crystal element is represented by a vertical axis. In each of FIGS. 52A to 52C, a period F indicates a period for rewriting the voltage, and time for rewriting the voltage is denoted by $t_1$, $t_2$, $t_3$, $t_4$, and the like.

Here, writing voltage corresponding to image data input to the liquid crystal display device corresponds to $|V_1|$ in rewriting at the time of 0, corresponds to $|V_3|$ in rewriting at the time of $t_1$, and corresponds to $|V_2|$ in rewriting at the time of $t_2$, $t_3$, $t_4$, and the like (see FIG. 52A).

Note that polarity of the writing voltage corresponding to image data input to the liquid crystal display device may be switched periodically (inversion driving: see FIG. 52B).

Since direct voltage can be prevented from being applied to a liquid crystal as much as possible by using this method, burn-in or the like caused by deterioration of the liquid crystal element can be prevented. Note that a period of switching the polarity (an inversion period) may be the same as a period of rewriting voltage. In this case, generation of a flicker caused by inversion driving can be reduced because the inversion period is short. Further, the inversion period may be a period which is integral times the period of rewriting voltage. In this case, power consumption can be reduced because the inversion period is long and frequency of writing voltage can be decreased by changing the polarity.

FIG. 52C shows change in transmittance of the liquid crystal element over time when voltage as shown in FIG. 52A or 52B is applied to the liquid crystal element. Here, the voltage $|V_1|$ is applied to the liquid crystal element and transmittance of the liquid crystal element after enough time passes corresponds to $TR_1$. Similarly, the voltage $|V_2|$ is applied to the liquid crystal element and transmittance of the liquid crystal element after enough time passes corresponds to $TR_2$. Similarly, the voltage $|V_3|$ is applied to the liquid crystal element and transmittance of the liquid crystal element after enough time passes corresponds to $TR_3$. When the voltage applied to the liquid crystal element is changed from $|V_1|$ to $|V_3|$ at the time of $t_1$, transmittance of the liquid crystal element is tried to be changed to $TR_3$ for several frames as shown by a dashed line 5471. However, application of the voltage $|V_3|$ is terminated at the time of $t_2$, and the voltage $|V_2|$ is applied after the time of $t_2$. Therefore, transmittance of the liquid crystal element does not become as shown by the dashed line 5471 but becomes as shown by a solid line 5472. It is preferable that a value of the voltage $|V_3|$ be set so that transmittance is approximately $TR_2$ at the time of $t_2$. Here, the voltage $|V_3|$ is also referred to as overdriving voltage.

That is, the response time of the liquid crystal element can be controlled to some extent by changing $|V_3|$, which is the overdriving voltage. This is because the response time of the liquid crystal element is changed by the strength of an electric field. Specifically, the response time of the liquid crystal element becomes shorter as the electric field is stronger, and the response time of the liquid crystal element becomes longer as the electric field is weaker.

It is preferable that $|V_3|$, which is the overdriving voltage, be changed in accordance with the amount of change in the voltage, that is, the voltage $|V_1|$ and the voltage $|V_2|$ which provide intended transmittance $|V_1|$ and $TR_2$. This is because appropriate response time can be always obtained by changing $|V_3|$, which is the overdriving voltage, in accordance with change in the response time of the liquid crystal element even when the response time of the liquid crystal element is changed by the amount of change in the voltage.

It is preferable that $|V_3|$, which is the overdriving voltage, be changed depending on a mode of the liquid crystal element, such as a TN mode, a VA mode, an IPS mode, or an OCB mode. This is because appropriate response time can be always obtained by changing $|V_3|$, which is the overdriving voltage, in accordance with change in the response time of the liquid crystal element even when the response time of the liquid crystal element is changed depending on the mode of the liquid crystal element.

Note that the voltage rewriting period F may be the same as a frame period of an input signal. In this case, a liquid crystal display device with low manufacturing cost can be obtained since a peripheral driver circuit of the liquid crystal display device can be simplified.

Note that the voltage rewriting period F may be shorter than the frame period of the input signal. For example, the voltage rewriting period F may be one half the frame period of the input signal, or one third or less the frame period of the input signal. It is effective to combine this method with a measure against deterioration in quality of a moving image caused by hold driving of the liquid crystal display device, such as black data insertion driving, backlight blinking, backlight scanning, or intermediate image insertion driving by motion compensation. That is, since required response time of the liquid crystal element is short in the measure against deterioration in quality of a moving image caused by hold driving of the liquid crystal display device, the response time of the liquid crystal element can be relatively shortened easily by using the overdriving method described in this embodiment mode. Although the response time of the liquid crystal element can be shortened by a cell gap, a liquid crystal material, a mode of the liquid crystal element, or the like, it is technically difficult to shorten the response time of the liquid crystal element. Therefore, it is very important to use a method for shortening the response time of the liquid crystal element by a driving method, such as overdriving.

Note also that the voltage rewriting period F may be longer than the frame period of the input signal. For example, the voltage rewriting period F may be twice the frame period of the input signal, or three times or more the frame period of the input signal. It is effective to combine this method with a means (a circuit) which determines whether voltage is not rewritten for a long period or not. That is, when the voltage is not rewritten for a long period, an operation of the circuit can be stopped during a period where no voltage is rewritten without performing a rewriting operation of the voltage. Thus, a liquid crystal display device with low power consumption can be obtained.

Next, a specific method for changing the overdriving voltage $|V_3|$ in accordance with the voltage $|V_1|$ and the voltage $|V_2|$, which provide intended transmittance $TR_1$ and $TR_2$, is described.

Since an overdriving circuit corresponds to a circuit for appropriately controlling the overdriving voltage $|V_3|$ in accordance with the voltage $|V_1|$ and the voltage $|V_2|$, which provide intended transmittance $TR_1$ and $TR_2$, signals input to the overdriving circuit are a signal related to the voltage $|V_1|$, which provides intended transmittance $TR_1$, and a signal related to the voltage $|V_1|$, which provides intended transmittance $TR_2$; and a signal output from the overdriving circuit is a signal related to the overdriving voltage $|V_3|$. Here, each of these signals may have an analog voltage value such as the voltage ($|V_1|$, $|V_2|$, or $|V_3|$) applied to the liquid crystal element or may be a digital signal for supplying the voltage applied to the liquid crystal element. Here, the signal related to the overdriving circuit is described as a digital signal.

Figure 48A:
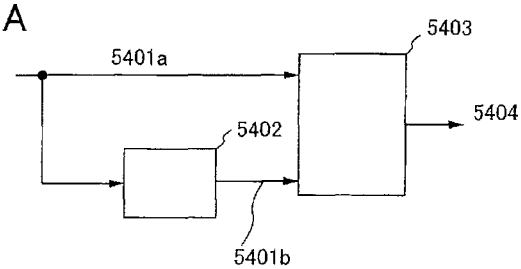
FIGS. 48A to 48E each show one driving method of a liquid crystal display device according to the invention.

First, a general structure of the overdriving circuit is described with reference to FIG. 48A. Here, input image signals 5401a and 5401b are used as signals for controlling the overdriving voltage. As a result of processing these signals, an output image signal 5404 is to be output as a signal which provides the overdriving voltage.

Since the voltage $|V_1|$ and the voltage $|V_2|$, which provide intended transmittance $TR_3$ and $TR_2$, are image signals in adjacent frames, it is preferable that the input image signals 5401a and 5401b be also image signals in adjacent frames. In order to obtain such signals, the input image signal 5401a is input to a delay circuit 5402 in FIG. 48A, and a signal which is consequently output can be used as the input image signal 5401b. An example of the delay circuit 5402 includes a memory. That is, the input image signal 5401a is stored in the memory in order to delay the input image signal 5401a for one frame, and at the same time, a signal stored in the previous frame is extracted from the memory as the input image signal 5401*b*, and the input image signals 5401*a* and 5401*b* are simultaneously input to a correction circuit 5403. Thus, the image signals in adjacent frames can be handled. By inputting the image signals in adjacent frames to the correction circuit 5403, the output image signal 5404 can be obtained. Note that when a memory is used as the delay circuit 5402, a memory having capacity for storing an image signal for one frame in order to delay the input image signal 5401*a* for one frame (i.e., a frame memory) can be obtained. Thus, the memory can have a function as a delay circuit without causing excess and deficiency of memory capacity.

Next, the delay circuit 5402 formed mainly for reducing memory capacity is described. Since memory capacity can be reduced by using such a circuit as the delay circuit 5402, manufacturing cost can be reduced.

Figure 48B:
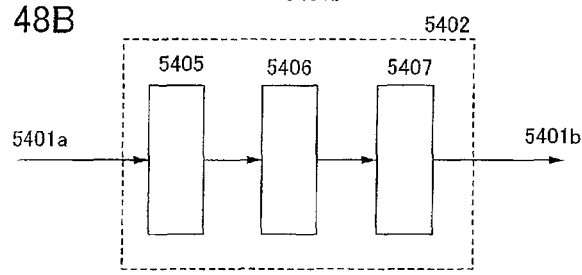

Specifically, a delay circuit as shown in FIG. 48B can be used as the delay circuit 5402 having such characteristics. The delay circuit shown in FIG. 48B includes an encoder 5405, a memory 5406, and a decoder 5407.

Operations of the delay circuit 5402 shown in FIG. 48B are as follows. First, compression processing is performed by the encoder 5405 before the input image signal 5401*a* is stored in the memory 5406. Thus, the size of data to be stored in the memory 5406 can be reduced. Accordingly, memory capacity can be reduced, and manufacturing cost can be reduced. Then, a compressed image signal is transferred to the decoder 5407 and extension processing is performed here. Thus, the signal which has been compressed by the encoder 5405 can be restored. Here, compression and extension processing which is performed by the encoder 5405 and the decoder 5407 may be reversible processing. Accordingly, since the image signal does not deteriorate even after compression and extension processing is performed, memory capacity can be reduced without causing deterioration of quality of an image, which is finally displayed on a device. Alternatively, compression and extension processing which is performed by the encoder 5405 and the decoder 5407 may be non-reversible processing. Accordingly, since the size of data of the compressed image signal can be made extremely small, memory capacity can be significantly reduced.

As a method for reducing memory capacity, various methods can be used as well as the above-described method. For example, a method in which color information included in an image signal is reduced (e.g., tone reduction from 260 thousand colors to 65 thousand colors is performed) or the amount of data is reduced (resolution is reduced) without performing image compression by an encoder can be used.

Figure 48C:
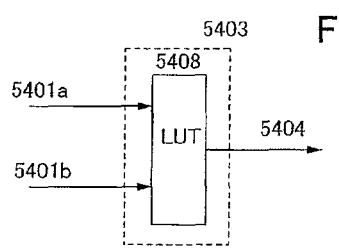

Next, specific examples of the correction circuit 5403 are described with reference to FIGS. 48C to 44E. The correction circuit 5403 corresponds to a circuit for outputting an output image signal of a certain value from two input image signals. Here, when a relation between the two input image signals and the output image signal is non-linear and it is difficult to calculate the relation by simple operation, a look up table (LUT) may be used as the correction circuit 5403. Since the relation between the two input image signals and the output image signal is calculated in advance by measurement in a LUT, the output image signal corresponding to the two input image signals can be calculated only by seeing the LUT (see FIG. 48C). By using a LUT 5408 as the correction circuit 5403, the correction circuit 5403 can be realized without complicated circuit design or the like.

Since the LUT is one of memories, it is preferable to reduce memory capacity as much as possible in order to reduce manufacturing cost. As an example of the correction circuit 5403 for realizing reduction in memory capacity, a circuit shown in FIG. 48D can be considered. The correction circuit 5403 shown in FIG. 48D includes a LUT 5409 and an adder 5410. Difference data between the input image signal 5401*a* and the output image signal 5404 to be output is stored in the LUT 5409. That is, corresponding difference data from the input image signal 5401*a* and the input image signal 5401*b* is extracted from the LUT 5409, and the extracted difference data and the input image signal 5401*a* are added by the adder 5410, so that the output image signal 5404 can be obtained. Note that when data stored in the LUT 5409 is difference data, memory capacity of the LUT can be reduced. This is because the size of difference data is smaller than that of the output image signal 5404 as it is, so that memory capacity necessary for the LUT 5409 can be reduced.

In addition, when the output image signal can be calculated by simple operation such as four arithmetic operations of the two input image signals, the correction circuit 5403 can be realized by combination of simple circuits such as an adder, a subtractor, and a multiplier. Accordingly, it is not necessary to use the LUT, and manufacturing cost can be significantly reduced. As such a circuit, a circuit shown in FIG. 48E can be considered. The correction circuit 5403 shown in FIG. 48E includes a subtractor 5411, a multiplier 5412, and an adder 5413. First, difference between the input image signal 5401*a* and the input image signal 5401*b* is calculated by the subtractor 5411. After that, a differential value is multiplied by an appropriate coefficient by using the multiplier 5412. Then, the differential value multiplied by the appropriate coefficient is added to the input image signal 5401*a* by the adder 5413; thus, the output image signal 5404 can be obtained. By using such a circuit, it is not necessary to use the LUT. Therefore, manufacturing cost can be significantly reduced.

Figure 48E:
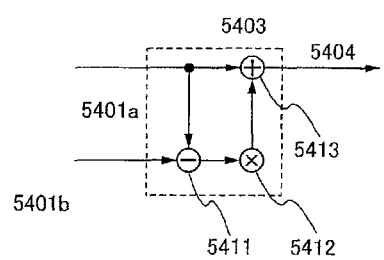
Figure 48D:
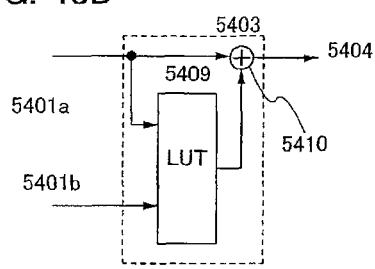

By using the correction circuit 5403 shown in FIG. 48E under a certain condition, inappropriate output of the output image signal 5404 can be prevented. The condition is that the output image signal 5404 applying the overdriving voltage and a differential value between the input image signals 5401*a* and 5401*b* have linearity. The slope of this linearity is a coefficient to be multiplied by the multiplier 5412. That is, it is preferable that the correction circuit 5403 in FIG. 48E be used for a liquid crystal element having such properties. As a liquid crystal element having such properties, an IPS mode liquid crystal element in which response time has little grayscale dependency is considered. For example, when the correction circuit 5403 shown in FIG. 48E is used for an IPS mode liquid crystal element in this manner, manufacturing cost can be significantly reduced and an overdriving circuit which can prevent output of the inappropriate output image signal 5404 can be obtained.

Note that operations which are similar to those of the circuit shown in FIGS. 48A to 48E may be realized by software processing. As the memory used for the delay circuit, another memory included in the liquid crystal display device, a memory included in a device which transfers an image displayed on the liquid crystal display device (e.g., a video card or the like included in a personal computer or a device similar to the personal computer), or the like can be used. Accordingly, not only can manufacturing cost be reduced, intensity of overdriving, availability, or the like can be selected in accordance with user's preference.

Figure 49A:
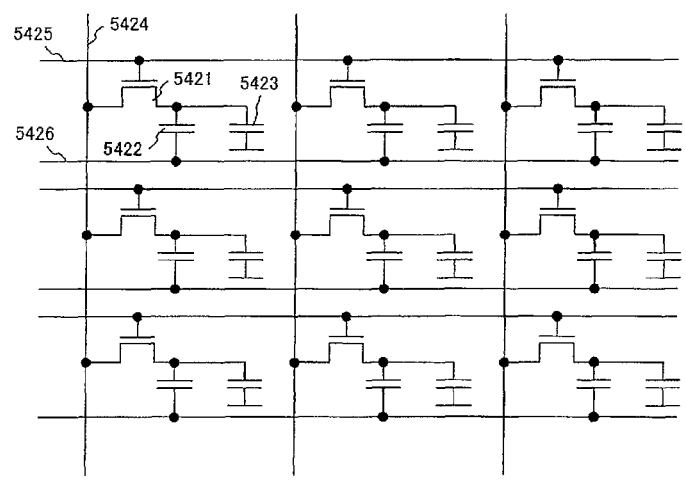
FIGS. 49A and 49B each show one driving method of a liquid crystal display device according to the invention.

Next, driving which controls a potential of a common line is described with reference to FIGS. 49A and 49B. FIG. 49A shows a plurality of pixel circuits in which one common line is provided with respect to one scan line in a display device using a display element which has capacitive properties, such as a liquid crystal element. Each of the pixel circuits shown in FIG. 49A includes a transistor 5421, an auxiliary capacitor 5422, a display element 5423, a video signal line 5424, a scan line 5425, and a common line 5426.

A gate electrode of the transistor 5421 is electrically connected to the scan line 5425. One of a source electrode and a drain electrode of the transistor 5421 is electrically connected to the video signal line 5424. The other of the source electrode and the drain electrode of the transistor 5421 is electrically connected to one electrode of the auxiliary capacitor 5422 and one electrode of the display element 5423. The other electrode of the auxiliary capacitor 5422 is electrically connected to the common line 5426.

First, in each pixel selected by the scan line 5425, voltage corresponding to a video signal is applied to the display element 5423 and the auxiliary capacitor 5422 through the video signal line 5424 since the transistor 5421 is turned on. At this time, when the video signal is a signal which makes all of pixels connected to the common line 5426 display a minimum gray scale or a maximum gray scale, it is not necessary that the video signal be written in each of the pixels through the video signal line 5424. Voltage applied to the display element 5423 can be changed by changing a potential of the common line 5426 instead of writing the video signal through the video signal line 5424.

Figure 49B:
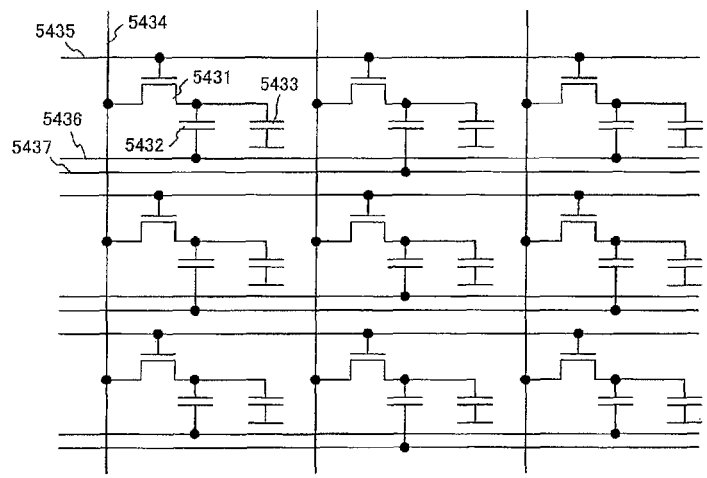

Next, FIG. 49B shows a plurality of pixel circuits in which two common lines are provided with respect to one scan line in a display device using a display element which has capacitive properties, such as a liquid crystal element. Each of the pixel circuits shown in FIG. 49B includes a transistor 5431, an auxiliary capacitor 5432, a display element 5433, a video signal line 5434, a scan line 5435, a first common line 5436, and a second common line 5437.

A gate electrode of the transistor 5431 is electrically connected to the scan line 5435. One of a source electrode and a drain electrode of the transistor 5431 is electrically connected to the video signal line 5434. The other of the source electrode and the drain electrode of the transistor 5431 is electrically connected to one electrode of the auxiliary capacitor 5432 and one electrode of the display element 5433. The other electrode of the auxiliary capacitor 5432 is electrically connected to the first common line 5436. Further, in a pixel which is adjacent to the pixel, the other electrode of the auxiliary capacitor 5432 is electrically connected to the second common line 5437.

In the pixel circuits shown in FIG. 49B, the number of pixels which are electrically connected to one common line is small. Accordingly, by changing a potential of the first common line 5436 or the second common line 5437 instead of writing a video signal through the video signal line 5434, frequency of changing voltage applied to the display element 5433 is significantly increased. In addition, source inversion driving or dot inversion driving can be performed. By performing source inversion driving or dot inversion driving, reliability of the element can be improved and a flicker can be suppressed.

Figure 50A:
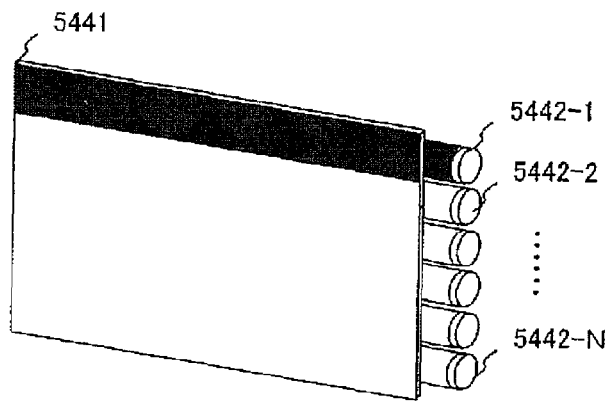
FIGS. 50A to 50C each show one driving method of a liquid crystal display device according to the invention.
Figure 50B:
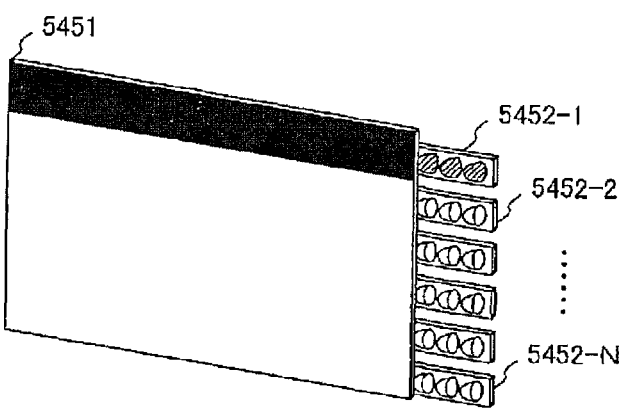

Next, a scanning backlight is described with reference to FIGS. 50A to 50C. FIG. 50A shows a scanning backlight in which cold cathode fluorescent lamps are arranged. The scanning backlight shown in FIG. 50A includes a diffusion plate 5441 and N pieces of cold cathode fluorescent lamps 5442-1 to 5442-N. The N pieces of the cold cathode fluorescent lamps 5442-1 to 5442-N are arranged on the back side of the diffusion plate 5441, so that the N pieces of the cold cathode fluorescent lamps 5442-1 to 5442-N can be scanned while luminance thereof is changed.

Change in luminance of each cold cathode fluorescent lamp in scanning is described with reference to FIG. 50C. First, luminance of the cold cathode fluorescent lamp 5442-1 is changed for a certain period. After that, luminance of the cold cathode fluorescent lamp 5442-2 which is provided adjacent to the cold cathode fluorescent lamp 5442-1 is changed for the same period. In this manner, luminance is changed sequentially from the cold cathode fluorescent lamps 5442-1 to 5442-N. Note that although luminance which is changed for a certain period is set to be lower than original luminance in FIG. 50C, it may be higher than original luminance. In addition, although scanning is performed from the cold cathode fluorescent lamps 5442-1 to 5442-N, scanning may be performed from the cold cathode fluorescent lamps 5442-N to 5442-1, which is in a reversed order.

Figure 50C:
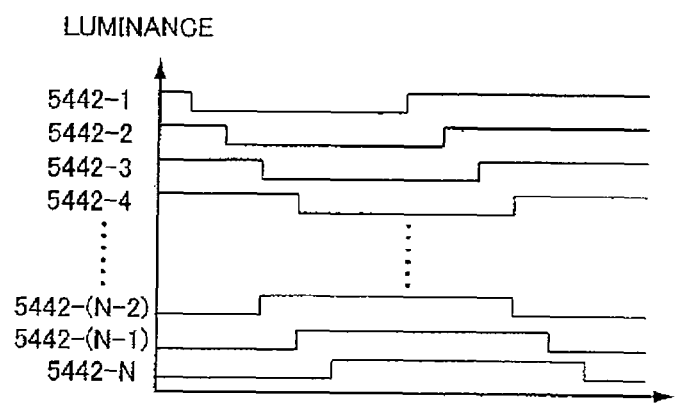

By performing driving as in FIG. 50C, average luminance of the backlight can be decreased. Therefore, power consumption of the backlight, which mainly takes up power consumption of the liquid crystal display device, can be reduced.

Note that an LED may be used as a light source of the scanning backlight. FIG. 50B shows the scanning backlight in that case. The scanning backlight in FIG. 50B includes a diffusion plate 5451 and light sources 5452-1 to 5452-N, in each of which LEDs are arranged. When the LED is used as the light source of the scanning backlight, it is advantageous in that the backlight can be thin and lightweight and that a color reproduction area can be widened. Further, since the LEDs which are arranged in each of the light sources 5452-1 to 5452-N can be similarly scanned, a dot scanning backlight can also be obtained. By using the dot scanning backlight, image quality of a moving image can be further improved.

When the LED is used as the light source of the backlight, driving can be performed by changing luminance as shown in FIG. 50C as well.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

[Embodiment Mode 13]

In this embodiment mode, an example of a display device is described. In particular, the case where a display device is optically treated is described.

Figure 53A:
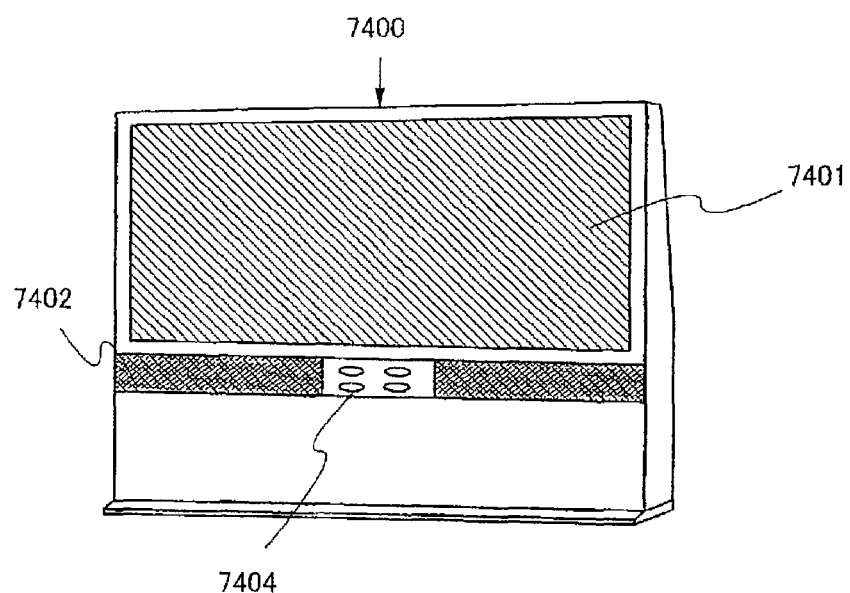
FIGS. 53A and 53B show a structure of a display device according to the invention.
Figure 53B:
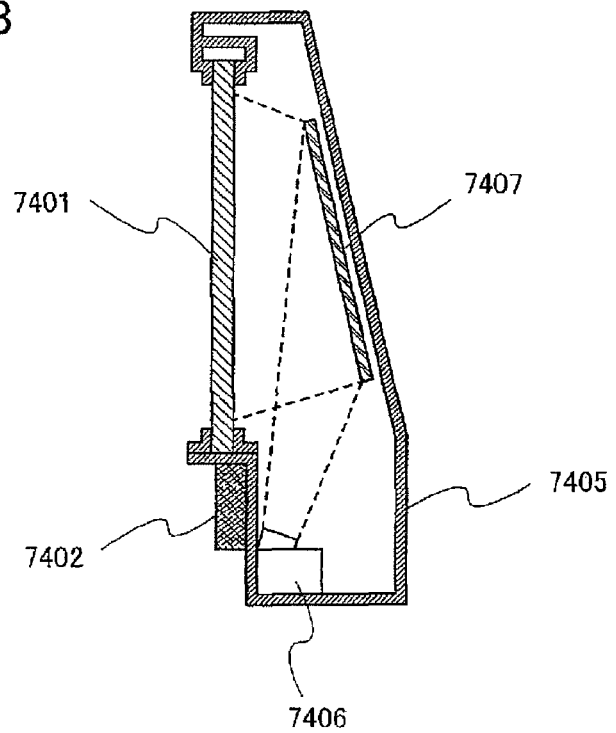

A rear projection display device 7400 in FIGS. 53A and 53B is provided with a projector unit 7406, a mirror 7407, and a screen 7401. The rear projection display device 7400 may also be provided with a speaker 7402 and operation switches 7404. The projector unit 7406 is provided at a lower portion of a housing 7405 of the rear projection display device 7400, and projects incident light for projecting an image based on a video signal to the mirror 7407. The rear projection display device 7400 displays an image projected from a rear surface of the screen 7401.

Figure 54:
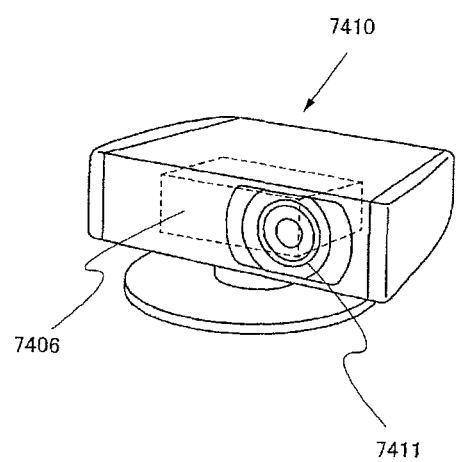
FIG. 54 shows a structure of a display device according to the invention.

FIG. 54 shows a front projection display device 7410. The front projection display device 7410 is provided with the projector unit 7406 and a projection optical system 7411. The projection optical system 7411 projects an image to a screen or the like provided at the front.

Hereinafter, a structure of the projector unit 7406 which is applied to the rear projection display device 7400 in FIGS. 53A and 53B and the front projection display device 7410 in FIG. 54 is described.

Figure 55:
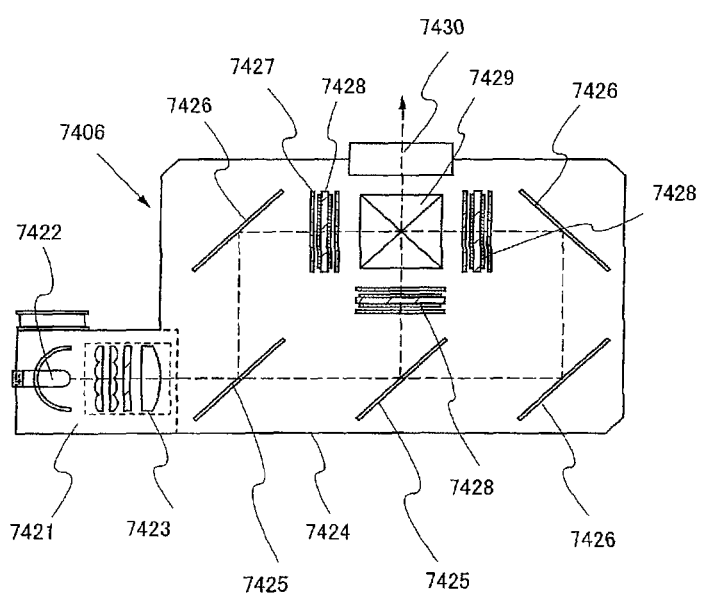
FIG. 55 shows a structure of a display device according to the invention.

FIG. 55 shows a structure example of the projector unit 7406. The projector unit 7406 is provided with a light source unit 7421 and a modulation unit 7424. The light source unit 7421 is provided with a light source optical system 7423 including lenses and a light source lamp 7422. The light source lamp 7422 is stored in a housing so that stray light is not scattered. As the light source lamp 7422, a high-pressure mercury lamp or a xenon lamp, for example, which can emit a large amount of light is used. The light source optical system 7423 is provided with an optical lens, a film having a function to polarize light, a film for adjusting phase difference, an IR film, or the like as appropriate. The light source unit 7421 is provided so that incident light is incident on the modulation unit 7424. The modulation unit 7424 is provided with a plurality of display panels 7428, a color filter, a retardation plate 7427, a dichroic mirror 7425, a total reflection mirror 7426, a prism 7429, and a projection optical system 7430. Light emitted from the light source unit 7421 is split into a plurality of optical paths by the dichroic mirror 7425.

Each optical path is provided with the display panel 7428 and a color filter which transmits light with a predetermined wavelength or wavelength range. The transmissive display panel 7428 modulates transmitted light based on a video signal. Light of each color transmitted through the display panel 7428 is incident on the prism 7429, and an image is displayed on the screen through the projection optical system 7430. Note that a Fresnel lens may be provided between the mirror and the screen. Projected light which is projected by the projector unit 7406 and reflected by the mirror is converted into generally parallel light by the Fresnel lens to be projected on the screen. Displacement between a chief ray and an optical axis of the parallel light is preferably ±10° or less, and more preferably, ±5° or less.

Figure 56:
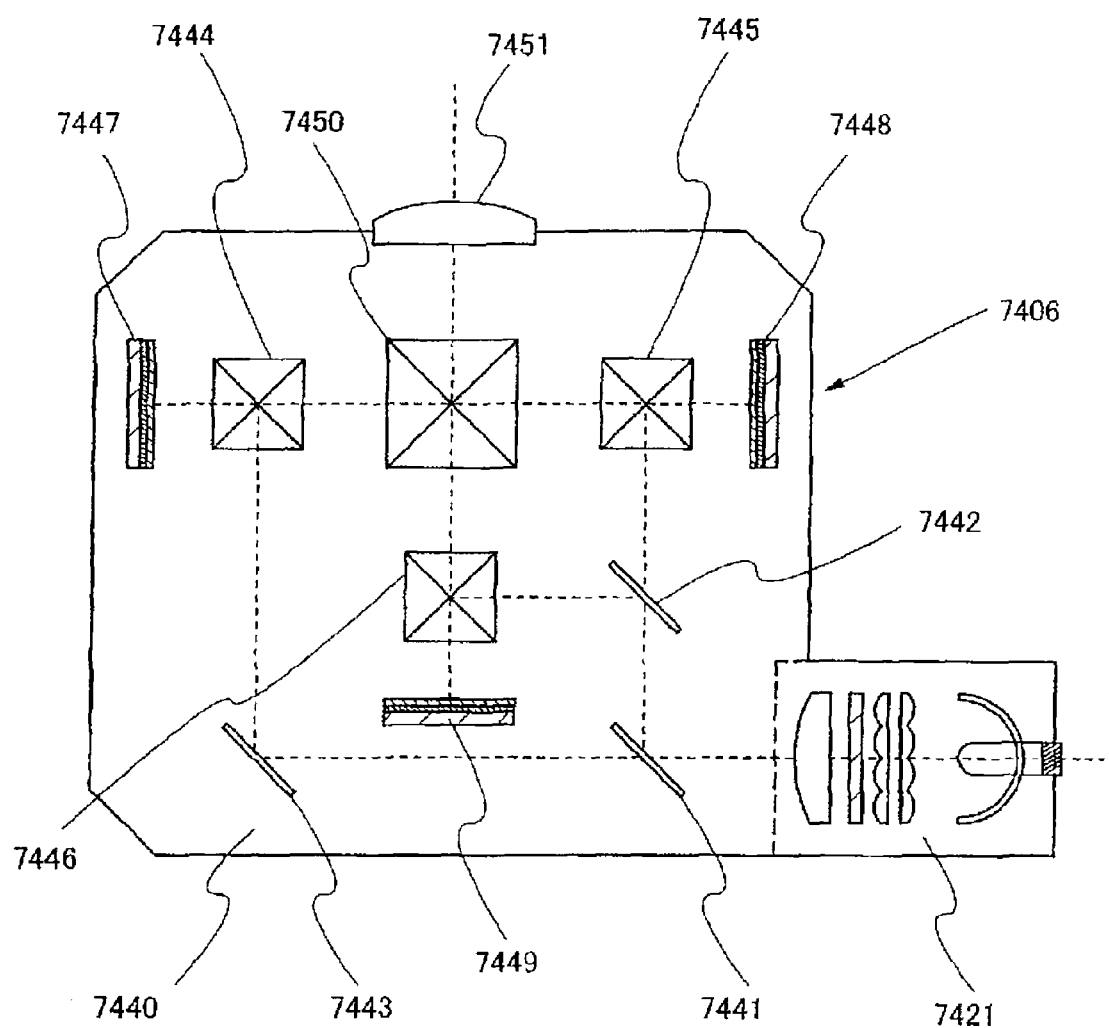
FIG. 56 shows a structure of a display device according to the invention.

The projector unit 7406 shown in FIG. 56 is provided with reflective display panels 7447, 7448, and 7449.

The projector unit 7406 in FIG. 56 is provided with the light source unit 7421 and a modulation unit 7440. The light source unit 7421 may have a structure similar to FIG. 55. Light from the light source unit 7421 is split into a plurality of optical paths by dichroic mirrors 7441 and 7442 and a total reflection mirror 7443 to be incident on polarization beam splitters 7444, 7445, and 7446. The polarization beam splitters 7444, 7445, and 7446 are provided corresponding to the reflective display panels 7447, 7448, and 7449 which correspond to respective colors. The reflective display panels 7447, 7448, and 7449 modulate reflected light based on a video signal. Light of each color, which are reflected by the reflective display panels 7447, 7448, and 7449, is incident on the prism 7450 to be composed, and projected through a projection optical system 7451.

Among light emitted from the light source unit 7421, only light in a wavelength region of red is transmitted through the dichroic mirror 7441 and light in wavelength regions of green and blue is reflected by the dichroic mirror 7441. Further, only the light in the wavelength region of green is reflected by the dichroic mirror 7442. The light in the wavelength region of red, which is transmitted through the dichroic mirror 7441, is reflected by the total reflection mirror 7443 and incident on the polarization beam splitter 7444. The light in the wavelength region of blue is incident on the polarization beam splitter 7445. The light in the wavelength region of green is incident on the polarization beam splitter 7446. The polarization beam splitters 7444, 7445, and 7446 have a function to split incident light into P-polarized light and S-polarized light and a function to transmit only P-polarized light. The reflective display panels 7447, 7448, and 7449 polarize incident light based on a video signal.

Only the S-polarized light corresponding to each color is incident on the reflective display panels 7447, 7448, and 7449 corresponding to each color. Note that the reflective display panels 7447, 7448, and 7449 may be liquid crystal panels. In this case, the liquid crystal panel operates in an electrically controlled birefringence (ECB) mode. Liquid crystal molecules are vertically aligned at an angle to a substrate. Accordingly, in the reflective display panels 7447, 7448, and 7449, when a pixel is turned off, display molecules are aligned not to change a polarization state of incident light so as to reflect the incident light. When the pixel is turned on, alignment of the display molecules is changed, and the polarization state of the incident light is changed.

The projector unit 7406 in FIG. 56 can be applied to the rear projection display device 7400 in FIGS. 53A and 53B and the front projection display device 7410 in FIG. 54.

Figure 57A:
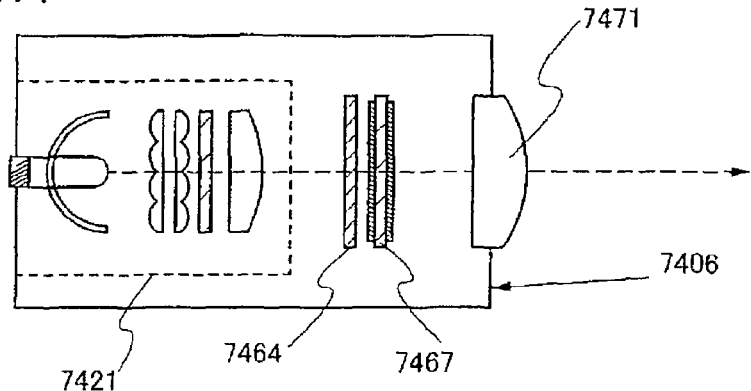
FIGS. 57A to 57C each show a structure of a display device according to the invention.
Figure 57B:
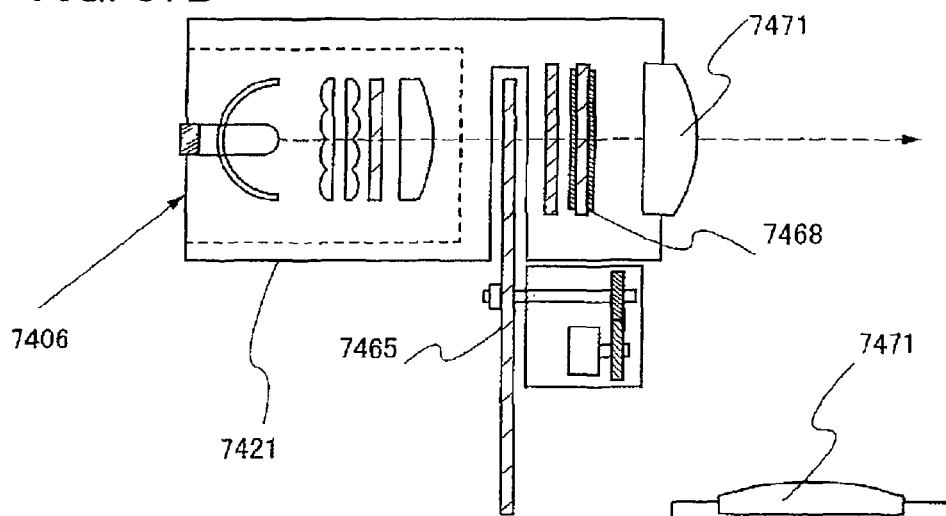
Figure 57C:
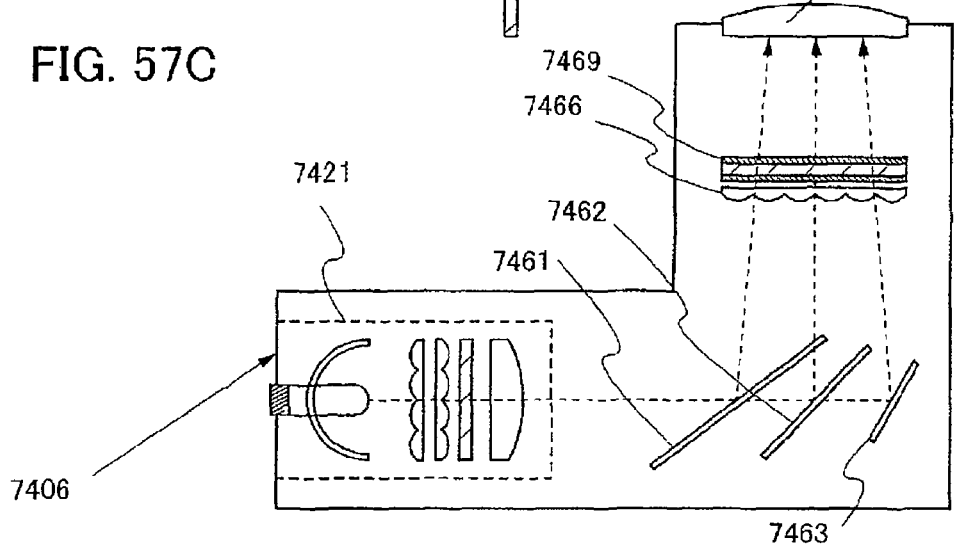

FIGS. 57A to 57C each show a single-panel type projector unit. The projector unit 7406 shown in FIG. 57A is provided with the light source unit 7421, a display panel 7467, a projection optical system 7471, and a retardation plate 7464. The projection optical system 7471 includes one or a plurality of lenses. The display panel 7467 may be provided with a color filter.

FIG. 57B shows a structure of the projector unit 7406 operating in a field sequential mode. A field sequential mode corresponds to a mode in which color display is performed by light of respective colors such as red, green, and blue sequentially incident on a display panel with a time lag, without a color filter. A high-definition image can be displayed particularly by combination with a display panel with high-speed response to change in input signal. The projector unit 7406 in FIG. 57B is provided with a rotating color filter plate 7465 including a plurality of color filters with red, green, blue, or the like between the light source unit 7421 and a display panel 7468.

FIG. 57C shows a structure of the projector unit 7406 with a color separation method using a micro lens, as a color display method. This method corresponds to a method in which color display is realized by providing a micro lens array 7466 on the side of a display panel 7469, on which light is incident, and light of each color is emitted from each direction. The projector unit 7406 employing this method has little loss of light due to a color filter, so that light from the light source unit 7421 can be efficiently utilized. The projector unit 7406 in FIG. 57C is provided with dichroic mirrors 7461, 7462, and 7463 so that light of each color is emitted to the display panel 7469 from each direction.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

[Embodiment Mode 14]

In this embodiment mode, examples of electronic devices are described.

Figure 58:
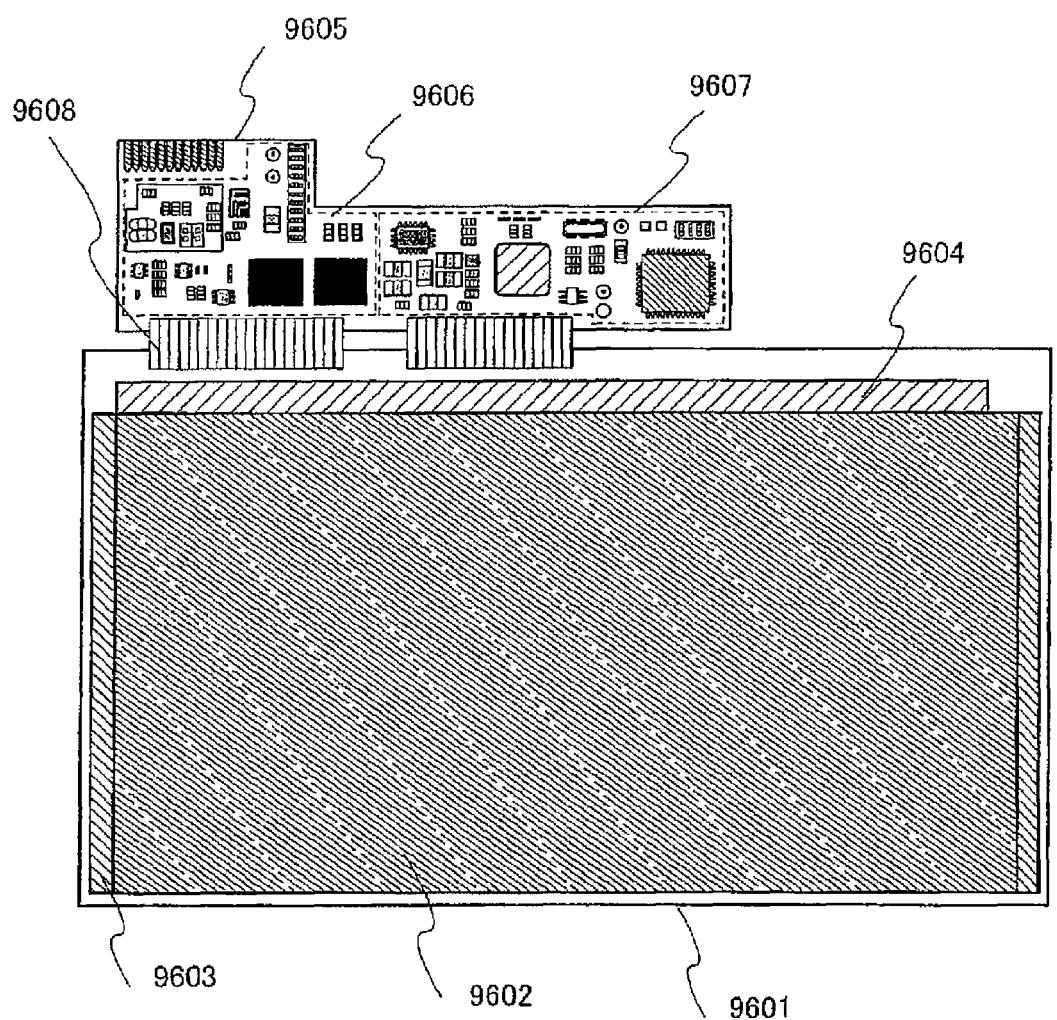
FIG. 58 shows an electronic device according to the invention.

FIG. 58 shows a display panel module combining a display panel 9601 and a circuit board 9605. The display panel 9601 includes a pixel portion 9602, a scan line driver circuit 9603, and a signal line driver circuit 9604. The circuit board 9605 is provided with a control circuit 9606, a signal dividing circuit 9607, and the like, for example. The display panel 9601 and the circuit board 9605 are connected to each other by a connection wiring 9608. An FPC or the like can be used as the connection wiring.

Figure 59:
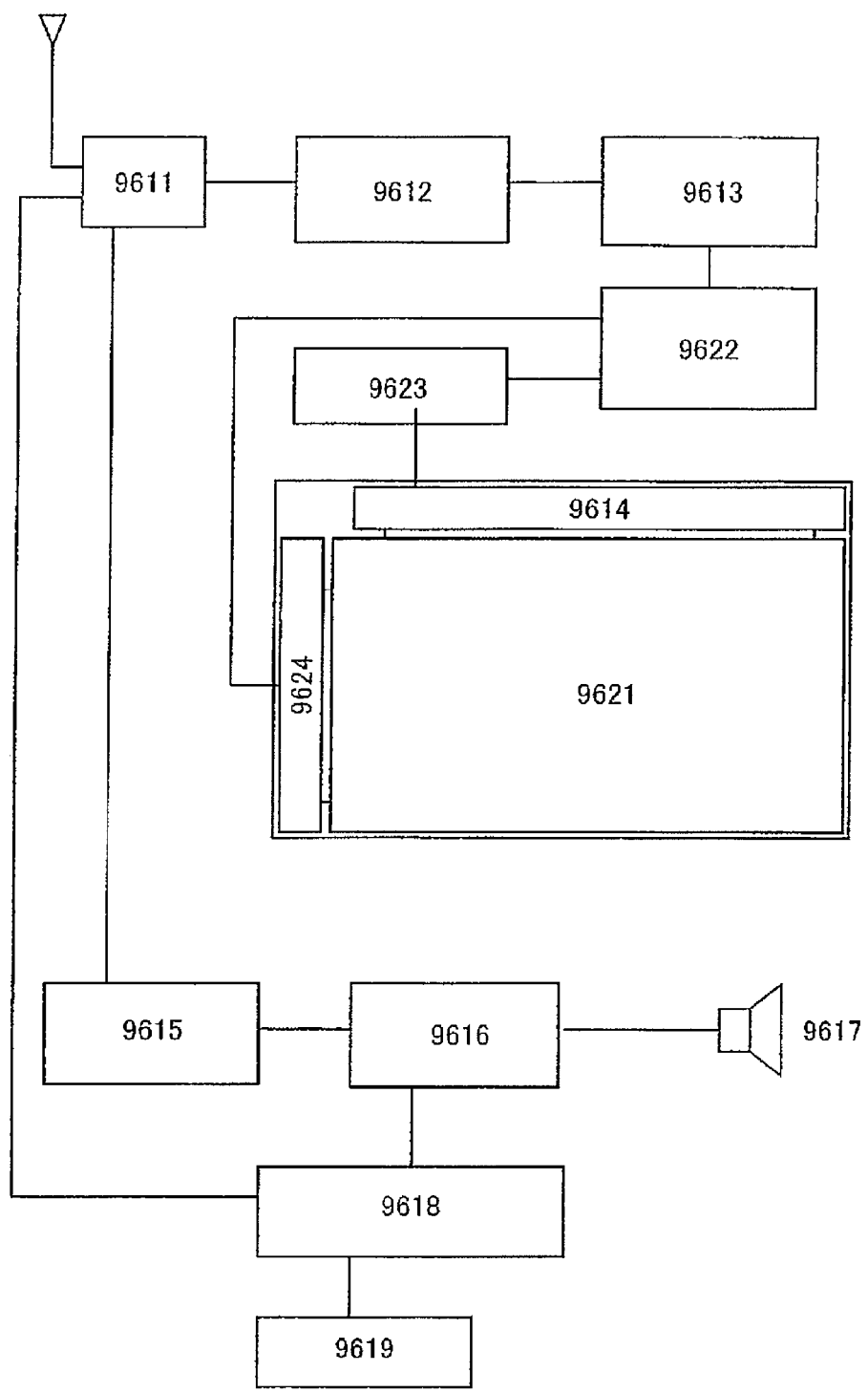
FIG. 59 shows an electronic device according to the invention.

FIG. 59 is a block diagram showing a main structure of a television receiver. A tuner 9611 receives a video signal and an audio signal. The video signals are processed by an video signal amplifier circuit 9612; a video signal processing circuit 9613 which converts a signal output from the video signal amplifier circuit 9612 into a color signal corresponding to each color of red, green, and blue; and a control circuit 9622 which converts the video signal into the input specification of a driver circuit. The control circuit 9622 outputs a signal to each of a scan line driver circuit 9624 and a signal line driver circuit 9614. The scan line driver circuit 9624 and the signal line driver circuit 9614 drive a display panel 9621. When performing digital drive, a structure may be employed in which a signal dividing circuit 9623 is provided on the signal line side so that an input digital signal is divided into m signals (m is a positive integer) to be supplied.

Among the signals received by the tuner 9611, an audio signal is transmitted to an audio signal amplifier circuit 9615, and an output thereof is supplied to a speaker 9617 through an audio signal processing circuit 9616. A control circuit 9618 receives control information on receiving station (receiving frequency) and volume from an input portion 9619 and transmits signals to the tuner 9611 or the audio signal processing circuit 9616.

Figure 60A:
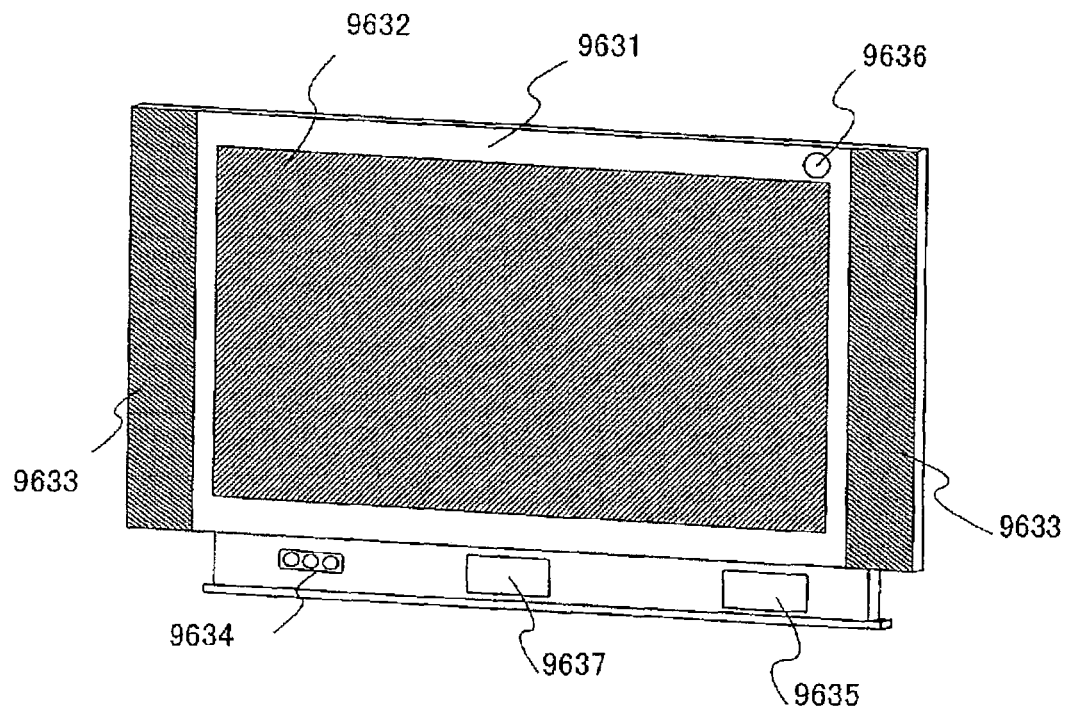
FIGS. 60A and 60B each show an electronic device according to the invention.

FIG. 60A shows a television receiver incorporated with a display panel module, which is different from FIG. 59. In FIG. 60A, a display screen 9632 incorporated in a housing 9631 is formed using the display panel module. Note that speakers 9633, input means (an operation key 9634, a connection terminal 9635, a sensor 9636 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9637), and the like may be provided as appropriate.

Figure 60B:
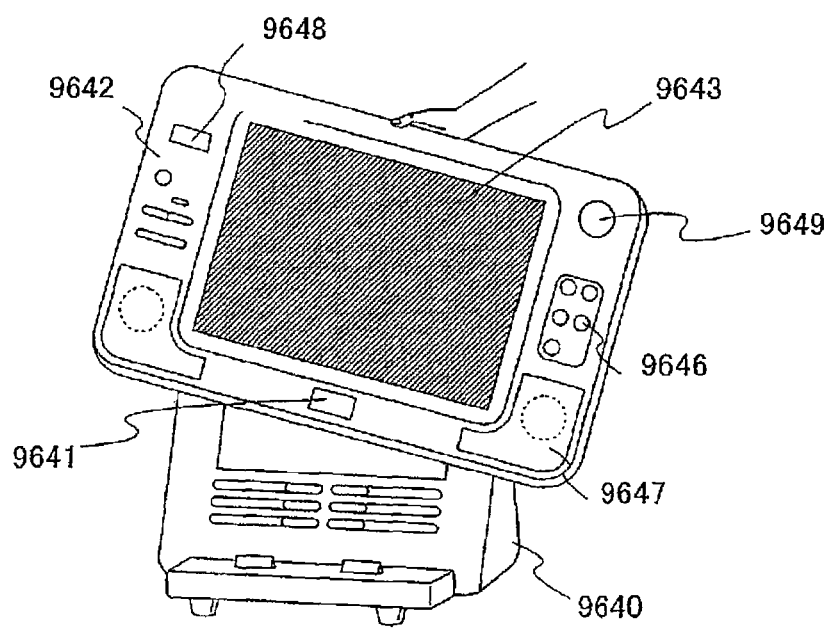

FIG. 60B shows a television receiver in which only a display can be carried wirelessly. The television receiver is provided with a display portion 9643, a speaker portion 9647, input means (an operation key 9646, a connection terminal 9648, a sensor 9649 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9641), and the like as appropriate. A battery and a signal receiver are incorporated in a housing 9642. The battery drives the display portion 9643, the speaker portion 9647, the sensor 9649, and the microphone 9641. The battery can be repeatedly charged by a charger 9640. The charger 9640 can transmit and receive a video signal and transmit the video signal to the signal receiver of the display. The device in FIG. 60B is controlled by the operation key 9646. Alternatively, the device in FIG. 60B can transmit a signal to the charger 9640 by operating the operation key 9646. That is, the device may be an image and audio interactive communication device. Further alternatively, by operating the operation key 9646, the device in FIG. 60B may transmit a signal to the charger 9640 and another electronic device is made to receive a signal which can be transmitted from the charger 9640; thus, the device in FIG. 60B can control communication of another electronic device. That is, the device may be a general-purpose remote control device. Note that the contents (or part thereof) described in each drawing of this embodiment mode can be applied to the display portion 9643.

Next, a structure example of a mobile phone is described with reference to FIG. 61.

A display panel 9662 is detachably incorporated in a housing 9650. The shape and size of the housing 9650 can be changed as appropriate in accordance with the size of the display panel 9662. The housing 9650 which fixes the display panel 9662 is fitted in a printed wiring board 9651 to be assembled as a module.

The display panel 9662 is connected to the printed wiring board 9651 through an FPC 9663. The printed wiring board 9651 is provided with a speaker 9652, a microphone 9653, a transmitting/receiving circuit 9654, a signal processing circuit 9655 including a CPU, a controller, and the like, and a sensor 9661 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray). Such a module, an operation key 9656, a battery 9657, and an antenna 9660 are combined and stored in a housing 9659. A pixel portion of the display panel 9662 is provided to be seen from an opening window formed in the housing 9659.

In the display panel 9662, the pixel portion and part of peripheral driver circuits (a driver circuit having a low operation frequency among a plurality of driver circuits) may be formed over the same substrate by using transistors, and another part of the peripheral driver circuits (a driver circuit having a high operation frequency among the plurality of driver circuits) may be formed over an IC chip. Then, the IC chip may be mounted on the display panel 9662 by COG (Chip On Glass). Alternatively, the IC chip may be connected to a glass substrate by using TAB (Tape Automated Bonding) or a printed wiring board. With such a structure, power consumption of a display device can be reduced and operation time of the mobile phone per charge can be extended. Further, reduction in cost of the mobile phone can be realized.

Figure 61:
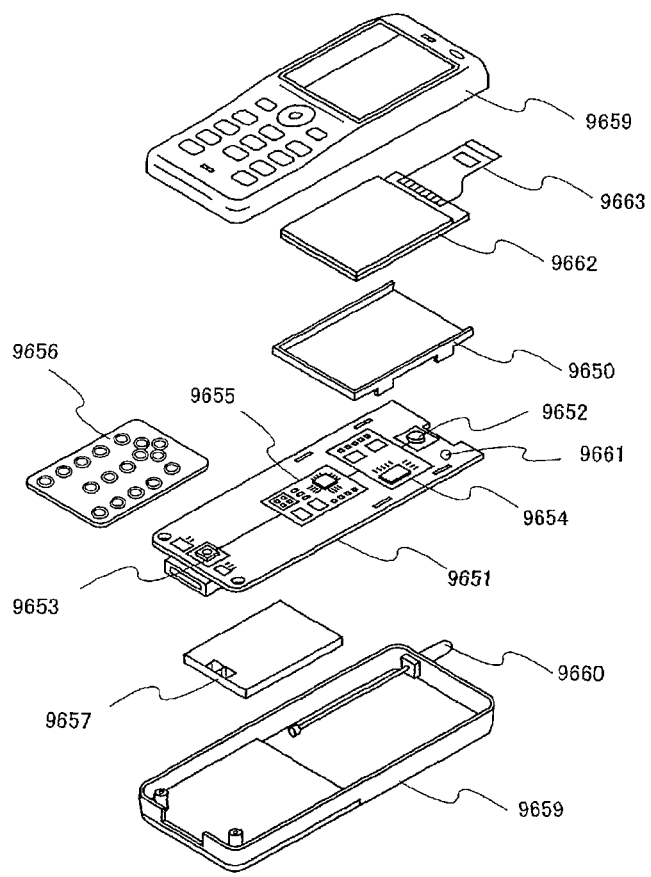
FIG. 61 shows an electronic device according to the invention.

The mobile phone in FIG. 61 has various functions such as, but not limited to, a function to display various kinds of information (e.g., a still image, a moving image, and a text image); a function to display a calendar, a date, the time, and the like on a display portion; a function to operate or edit the information displaying on the display portion; a function to control processing by various kinds of software (programs); a function of wireless communication; a function to communicate with another mobile phone, a fixed phone, or an audio communication device by using the wireless communication function; a function to connect with various computer networks by using the wireless communication function; a function to transmit or receive various kinds of data by using the wireless communication function; a function to operate a vibrator in accordance with incoming call, reception of data, or an alarm; and a function to generate a sound in accordance with incoming call, reception of data, or an alarm.

Figure 62A:
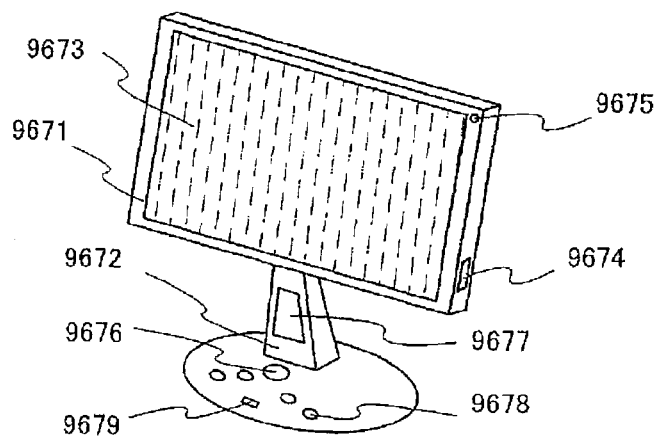
FIGS. 62A to 62C each show an electronic device according to the invention.

FIG. 62A shows a display, which includes a housing 9671, a support base 9672, a display portion 9673, a speaker 9677, an LED lamp 9679, input means (a connection terminal 9674, a sensor 9675 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), a microphone 9676, and an operation key 9678), and the like. The display in FIG. 62A can have various functions such as, but not limited to, a function to display various kinds of information (e.g., a still image, a moving image, and a text image) on the display portion.

Figure 62B:
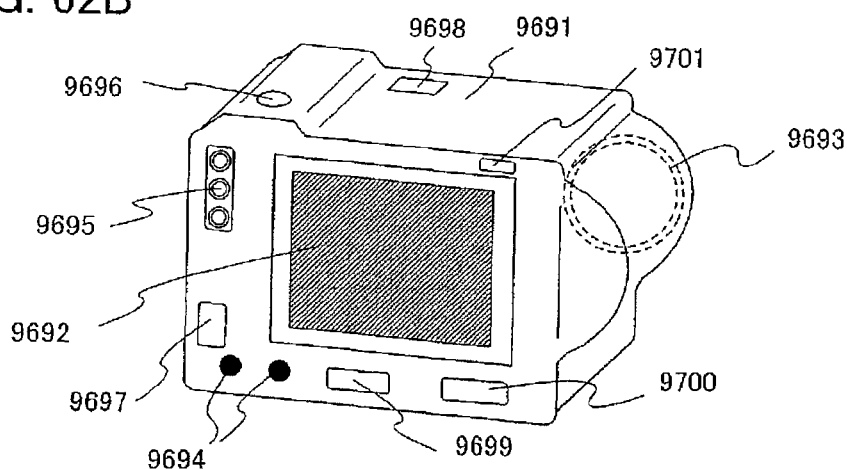

FIG. 62B shows a camera, which includes a main body 9691, a display portion 9692, a shutter button 9696, a speaker 9700, an LED lamp 9701, input means (an image receiving portion 9693, operation keys 9694, an external connection port 9695, a connection terminal 9697, a sensor 9698 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9699), and the like. The camera in FIG. 62B can have various functions such as, but not limited to, a function to photograph a still image and a moving image; a function to automatically adjust the photographed image (the still image or the moving image); a function to store the photographed image in a recording medium (provided externally or incorporated in the camera); and a function to display the photographed image on the display portion.

Figure 62C:
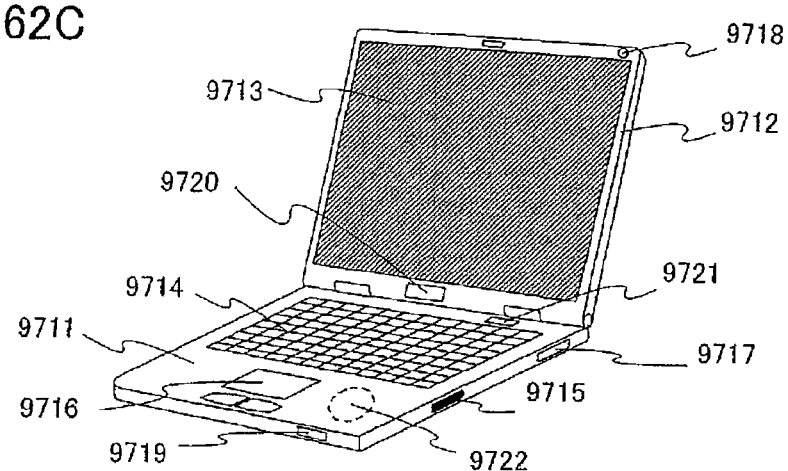

FIG. 62C shows a computer, which includes a main body 9711, a housing 9712, a display portion 9713, a speaker 9720, an LED lamp 9721, a reader/writer 9722, input means (a keyboard 9714, an external connection port 9715, a pointing device 9716, a connection terminal 9717, a sensor 9718 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9719), and the like. The computer in FIG. 62C can have various functions such as, but not limited to, a function to display various kinds of information (e.g., a still image, a moving image, and a text image) on the display portion; a function to control processing by various kinds of software (programs); a communication function such as wireless communication or wire communication; a function to connect with various computer networks by using the communication function; and a function to transmit or receive various kinds of data by using the communication function.

Figure 69A:
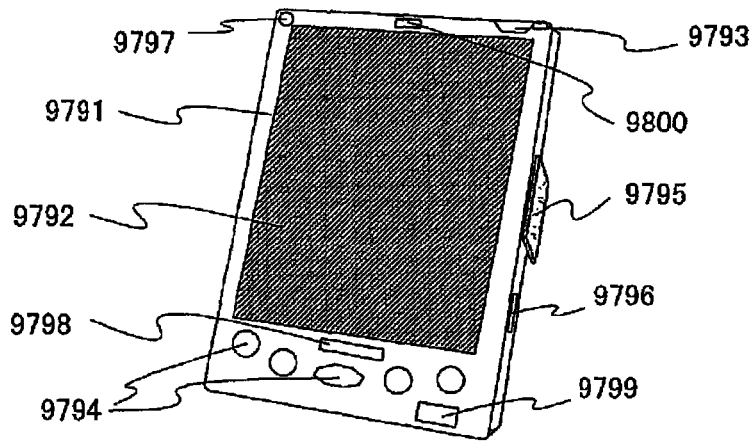
FIGS. 69A to 69C each show an electronic device according to the invention.

FIG. 69A shows a mobile computer, which includes a main body 9791, a display portion 9792, a switch 9793, a speaker 9799, an LED lamp 9800, input means (operation keys 9794, an infrared port 9795, a connection terminal 9796, a sensor 9797 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9798), and the like. The mobile computer in FIG. 69A can have various functions such as, but not limited to, a function to display various kinds of information (e.g., a still image, a moving image, and a text image) on the display portion; a touch panel function provided on the display portion; a function to display a calendar, a date, the time, and the like on the display portion; a function to control processing by various kinds of software (programs); a function of wireless communication; a function to connect with various computer networks by using the wireless communication function; and a function to transmit or receive various kinds of data by using the wireless communication function.

Figure 69B:
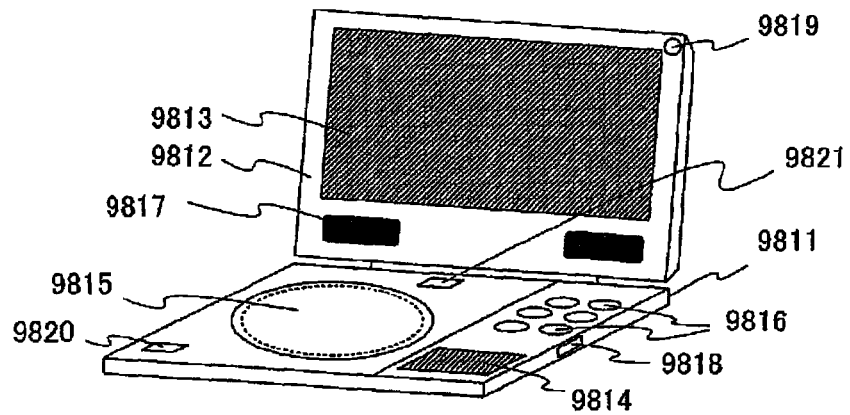

FIG. 69B shows a portable image reproducing device having a recording medium (e.g., a DVD reproducing device), which includes a main body 9811, a housing 9812, a display portion A 9813, a display portion B 9814, a speaker portion 9817, an LED lamp 9821, input means (a recording medium reading portion 9815 (a recording medium thereof is a DVD or the like), operation keys 9816, a connection terminal 9818, a sensor 9819 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9820), and the like. The display portion A 9813 can mainly display image information, and the display portion B 9814 can mainly display text information.

Figure 69C:
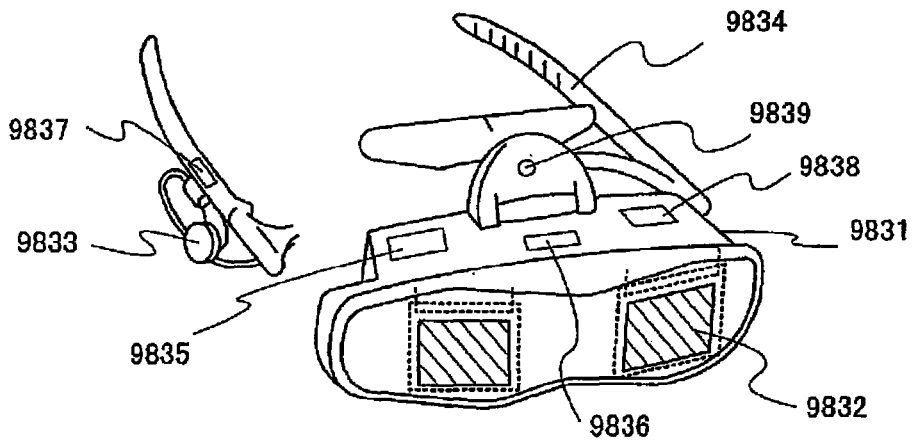

FIG. 69C shows a goggle-type display, which includes a main body 9831, a display portion 9832, an earphone 9833, a support portion 9834, an LED lamp 9839, a speaker 9838, input means (a connection terminal 9835, a sensor 9836 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9837), and the like. The goggle-type display in FIG. 69C can have various functions such as, but not limited to, a function to display an externally obtained image (e.g., a still image, a moving image, and a text image) on the display portion.

Figure 70A:
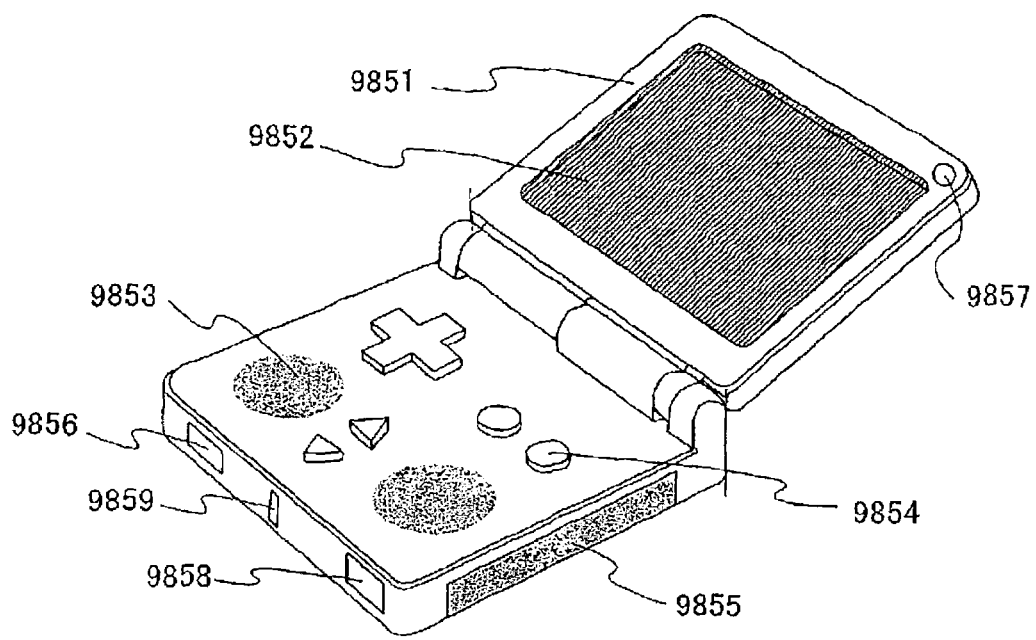
FIGS. 70A and 70B each show an electronic device according to the invention.

FIG. 70A shows a portable game machine, which includes a housing 9851, a display portion 9852, a speaker portion 9853, a recording medium insert portion 9855, an LED lamp 9859, input means (an operation key 9854, a connection terminal 9856, a sensor 9857 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9858), and the like. The portable game machine in FIG. 70A can have various functions such as, but not limited to, a function to read a program or data stored in the recording medium to display on the display portion; and a function to share information by wireless communication with another portable game machine.

Figure 70B:
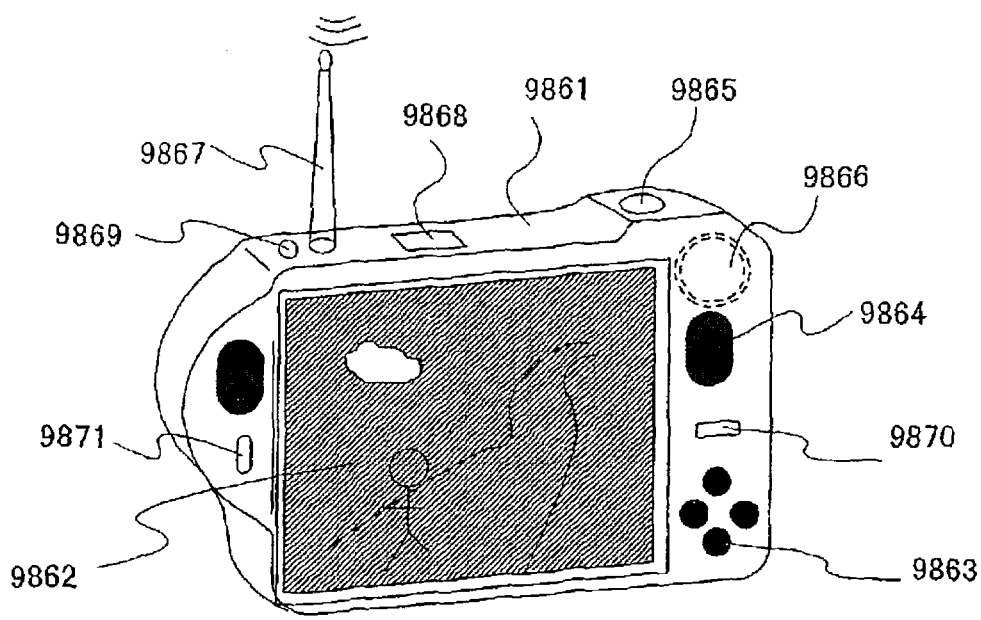

FIG. 70B shows a digital camera having a television reception function, which includes a housing 9861, a display portion 9862, a speaker 9864, a shutter button 9865, an LED lamp 9871, input means (an operation key 9863, an image receiving portion 9866, an antenna 9867, a connection terminal 9868, a sensor 9869 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9870), and the like. The digital camera having a television reception function in FIG. 70B can have various functions such as, but not limited to, a function to photograph a still image and a moving image; a function to automatically adjust the photographed image; a function to obtain various kinds of information from the antenna; a function to store the photographed image or the information obtained from the antenna; and a function to display the photographed image or the information obtained from the antenna on the display portion.

Figure 71:
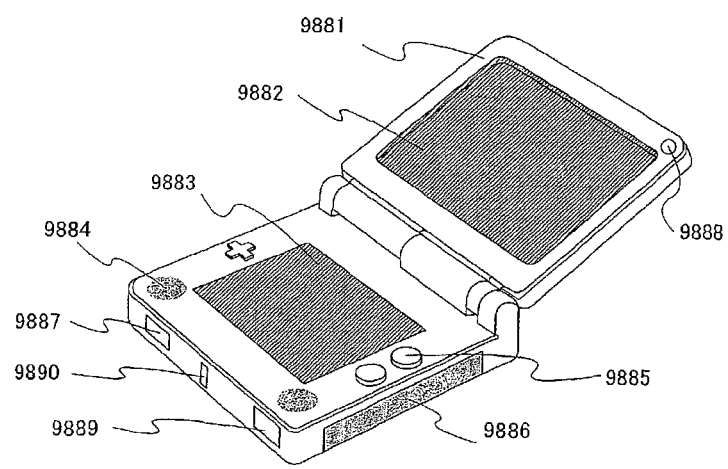
FIG. 71 shows an electronic device according to the invention.

FIG. 71 shows a portable game machine, which includes a housing 9881, a first display portion 9882, a second display portion 9883, a speaker portion 9884, a recording medium insert portion 9886, an LED lamp 9890, input means (an operation key 9885, a connection terminal 9887, a sensor 9888 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9889), and the like. The portable game machine in FIG. 71 can have various functions such as, but not limited to, a function to read a program or data stored in the recording medium to display on the display portion; and a function to share information by wireless communication with another portable game machine.

As shown in FIGS. 62A to 62C, 69A to 69C, 70A, 70B, and 71, each electronic device includes a display portion for displaying some kind of information.

Next, application examples of a semiconductor device are described.

Figure 63:
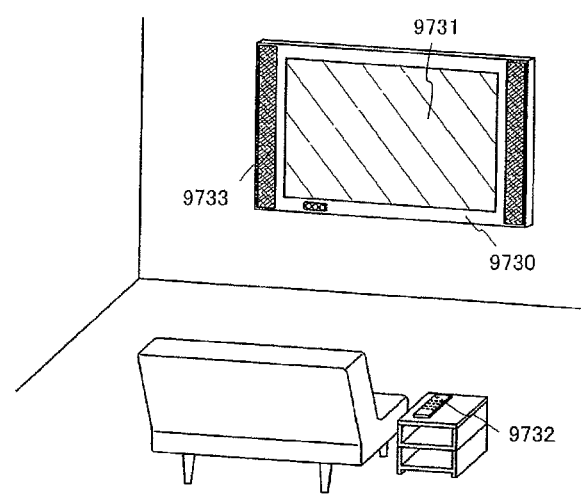
FIG. 63 shows an electronic device according to the invention.

FIG. 63 shows an example where a semiconductor device is incorporated in a constructed object. FIG. 63 shows a housing 9730, a display portion 9731, a remote control device 9732 which is an operation portion, a speaker portion 9733, and the like. The semiconductor device is incorporated in the constructed object as a wall-hanging type and can be provided without requiring a large space.

Figure 64:
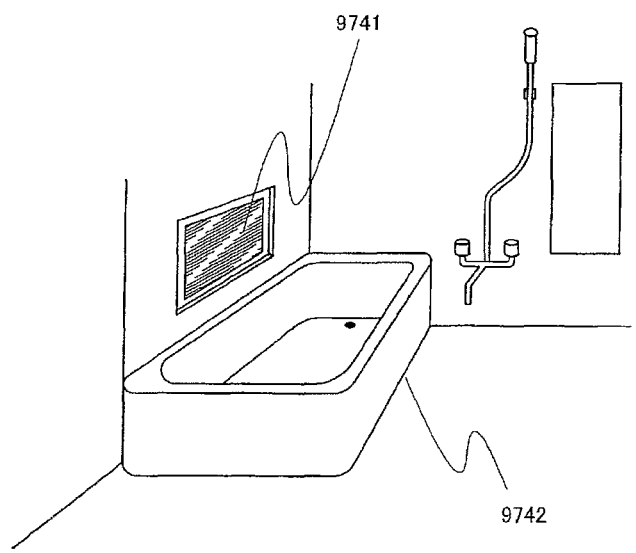
FIG. 64 shows an electronic device according to the invention.

FIG. 64 shows another example where a semiconductor device is incorporated in a constructed object. A display panel 9741 is incorporated with a prefabricated bath 9742, and a person who takes a bath can view the display panel 9741. The display panel 9741 has a function to display information by an operation by a person who takes a bath; and a function to be used as an advertisement or an entertainment means.

Note that the semiconductor device can be provided not only to a side wall of the prefabricated bath 9742 as shown in FIG. 64, but also to various places. For example, the semiconductor device can be incorporated with part of a mirror, a bathtub itself, or the like. At this time, a shape of the display panel 9741 may be changed in accordance with a shape of the mirror or the bathtub.

Figure 65:
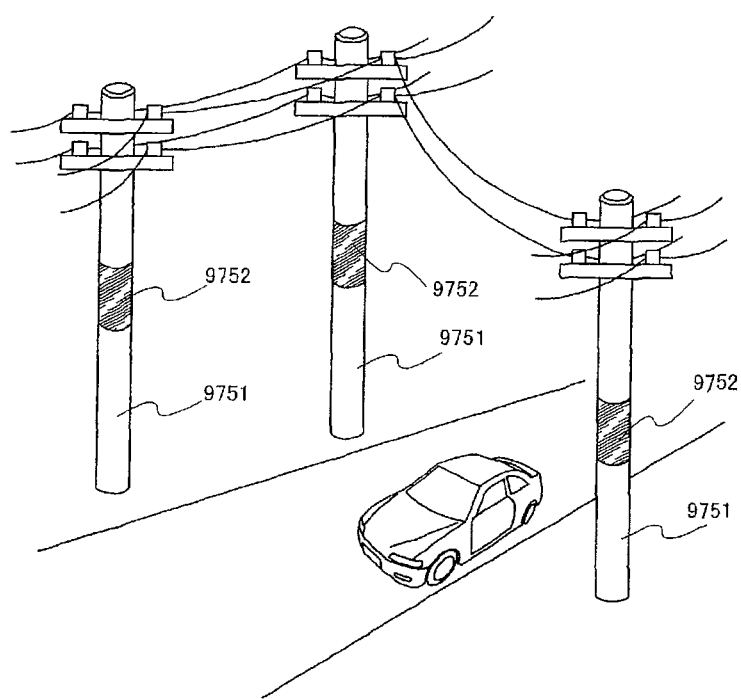
FIG. 65 shows an electronic device according to the invention.

FIG. 65 shows another example where a semiconductor device is incorporated in a constructed object. A display panel 9752 is bent and attached to a curved surface of a column-shaped object 9751. Here, a utility pole is described as the column-shaped object 9751.

The display panel 9752 in FIG. 65 is provided at a position higher than a human viewpoint. When the same images are displayed on the display panels 9752 provided in constructed objects which stand together in large numbers outdoors, such as utility poles, advertisement can be performed to a plurality of unspecified viewers. Since it is easy for the display panel 9752 to display the same images and instantly switch images by external control, highly efficient information display and advertisement effect can be obtained. When provided with self-luminous display elements, the display panel 9752 can be effectively used as a highly visible display medium even at night. When the display panel 9752 is provided in the utility pole, a power supply means for the display panel 9752 can be easily obtained. In an emergency such as disaster, the display panel 9752 can also be used as a means to transmit correct information to victims rapidly.

An example of the display panel 9752 includes a display panel in which a switching element such as an organic transistor is provided over a film-shaped substrate and a display element is driven so as to display an image.

Note that in this embodiment mode, a wall, a column-shaped object, and a prefabricated bath are shown as examples of a constructed object; however, this embodiment mode is not limited thereto, and various constructed objects can be provided with a semiconductor device.

Next, examples where a semiconductor device is incorporated with a moving object are described.

Figure 66:
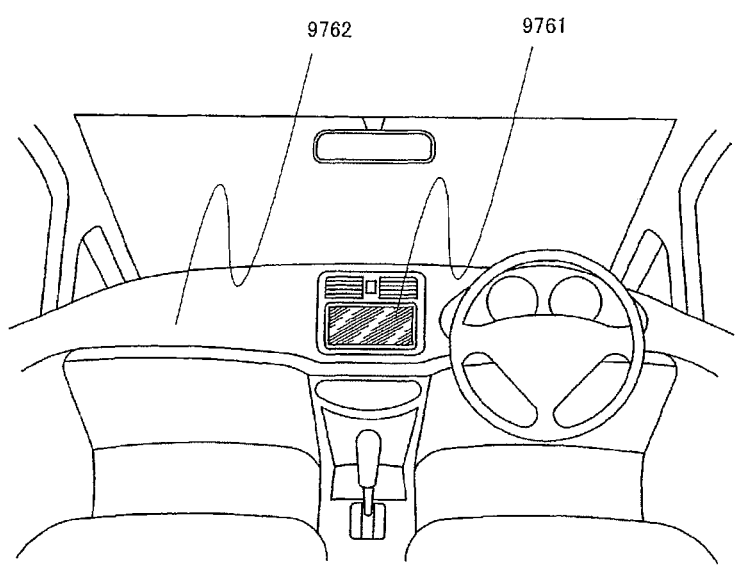
FIG. 66 shows an electronic device according to the invention.

FIG. 66 shows an example where a semiconductor device is incorporated with a car. A display panel 9761 is incorporated with a car body 9762, and can display an operation of the car body or information input from inside or outside the car body on demand. Note that a navigation function may be provided.

The semiconductor device can be provided not only to the car body 9762 as shown in FIG. 66, but also to various places. For example, the semiconductor device can be incorporated with a glass window, a door, a steering wheel, a gear shift, a seat, a rear-view mirror, and the like. At this time, a shape of the display panel 9761 may be changed in accordance with a shape of an object provided with the semiconductor device.

Figure 67A:
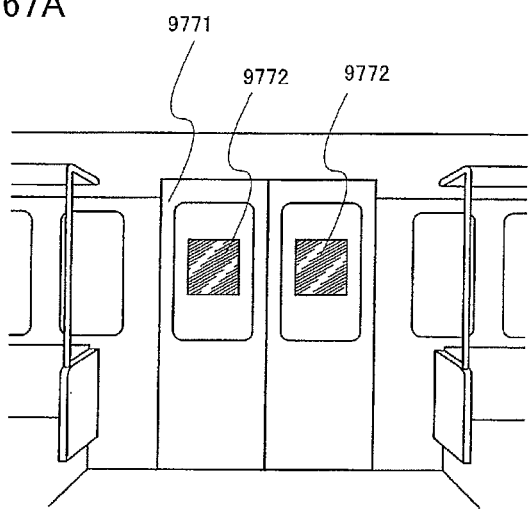
FIGS. 67A and 67B show an electronic device according to the invention.
Figure 67B:
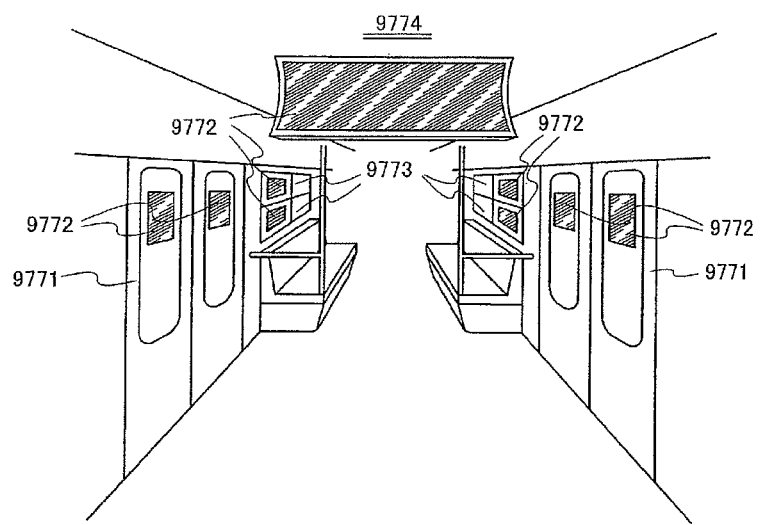

FIGS. 67A and 67B show examples where a semiconductor device is incorporated with a train car.

FIG. 67A shows an example where a display panel 9772 is provided in glass of a door 9771 in a train car, which has an advantage compared with a conventional advertisement using paper in that labor cost for changing an advertisement is not necessary. Since the display panel 9772 can instantly switch images displaying on a display portion by an external signal, images on the display panel can be switched in every time period when types of passengers on the train are changed, for example; thus, more effective advertisement effect can be obtained.

FIG. 67B shows an example where the display panels 9772 are provided to a glass window 9773 and a ceiling 9774 as well as the glass of the door 9771 in the train car. In this manner, the semiconductor device can be easily provided to a place where a semiconductor device has been difficult to be provided conventionally; thus, effective advertisement effect can be obtained. Further, the semiconductor device can instantly switch images displayed on a display portion by an external signal; thus, cost and time for changing an advertisement can be reduced, and more flexible advertisement management and information transmission can be realized.

The semiconductor device can be provided not only to the door 9771, the glass window 9773, and the ceiling 9774 as shown in FIG. 67, but also to various places. For example, the semiconductor device can be incorporated with a strap, a seat, a handrail, a floor, and the like. At this time, a shape of the display panel 9772 may be changed in accordance with a shape of an object provided with the semiconductor device.

Figure 68A:
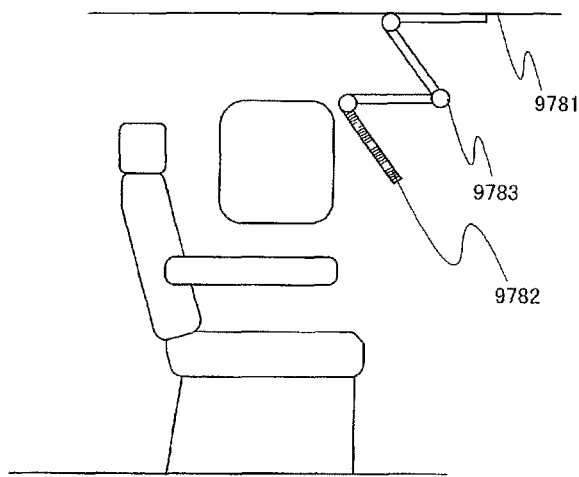
FIGS. 68A and 68B show an electronic device according to the invention.
Figure 68B:
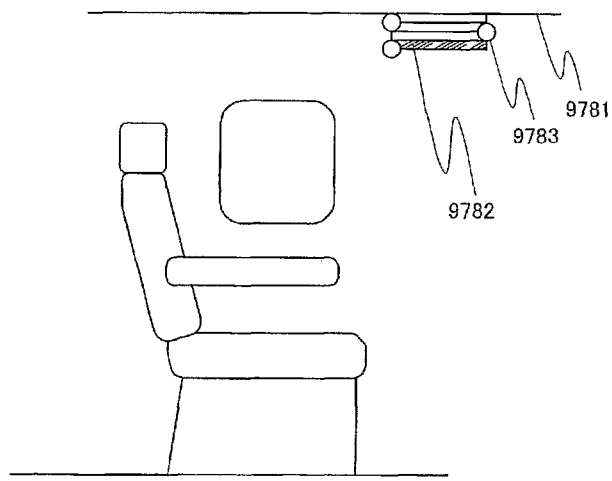

FIGS. 68A and 68B show an example where a semiconductor device is incorporated with a passenger airplane.

FIG. 68A shows a shape of a display panel 9782 attached to a ceiling 9781 above a seat of the passenger airplane when the display panel 9782 is used. The display panel 9782 is incorporated with the ceiling 9781 using a hinge portion 9783, and a passenger can view the display panel 9782 by stretching of the hinge portion 9783. The display panel 9782 has a function to display information by an operation by the passenger and a function to be used as an advertisement or an entertainment means. As shown in FIG. 68B, the hinge portion is bent and the display panel is stored in the ceiling 9781 of the airplane, so that safety in taking-off and landing can be assured. Note that a display element in the display panel is lit in an emergency, so that the display panel can also be used as an information transmission means and an evacuation light.

The semiconductor device can be provided not only to the ceiling 9781 as shown in FIGS. 68A and 68B, but also to various places. For example, the semiconductor device can be incorporated with a seat, a table attached to a seat, an armrest, a window, and the like. A large display panel which a plurality of people can view may be provided at a wall of an airframe. At this time, a shape of the display panel 9782 may be changed in accordance with a shape of an object provided with the semiconductor device.

Note that in this embodiment mode, bodies of a train car, a car, and an airplane are shown as a moving object; however, the invention is not limited thereto, and a semiconductor device can be provided to various objects such as a motorcycle, an four-wheel drive car (including a car, a bus, and the like), a train (including a monorail, a railroad car, and the like), and a vessel. Since the semiconductor device can instantly switch images displayed on a display panel in a moving object by an external signal, the moving object provided with the semiconductor device can be used as an advertisement display board for a plurality of unspecified customers, an information display board in disaster, and the like.

Although this embodiment mode is described with reference to various drawings, the contents (or part of the contents) described in each drawing can be freely applied to, combined with, or replaced with the contents (or part of the contents) described in another drawing. Further, much more drawings can be formed by combining each part with another part in the above-described drawings.

Similarly, the contents (or part of the contents) described in each drawing in this embodiment mode can be freely applied to, combined with, or replaced with the contents (or part of the contents) described in a drawing in another embodiment mode. Further, much more drawings can be formed by combining each part in each drawing in this embodiment mode with part of another embodiment mode.

This embodiment mode shows examples of embodying, slightly transforming, partially modifying, improving, describing in detailed, or applying the contents (or part of the contents) described in other embodiment modes, an example of related part thereof, or the like. Therefore, the contents described in other embodiment modes can be freely applied to, combined with, or replaced with this embodiment mode.

[Embodiment 1]

In this embodiment, an example where a liquid crystal display device is actually manufactured using the structure in Embodiment Mode 1 is described with reference to FIGS. 14A, 14B, 15A to 15D, 16A to 16C, 17A to 17C, and 18. Note that this embodiment can be completed by using, as a basic structure, each part of the structures in Embodiment Modes 2 to 6 as well as the structure in Embodiment Mode 1.

It is needless to say that a bottom-gate TFT described in Embodiment Mode 2, a structure described in Embodiment Mode 3, in which a pixel electrode is directly connected to an island-shaped semiconductor film, a connection structure of electrodes described in Embodiment Mode 4, a shape of a pixel electrode described in Embodiment Mode 5, a color filter described in Embodiment Mode 6, or the like can be combined with this embodiment when needed.

Figures 14A, 14B:
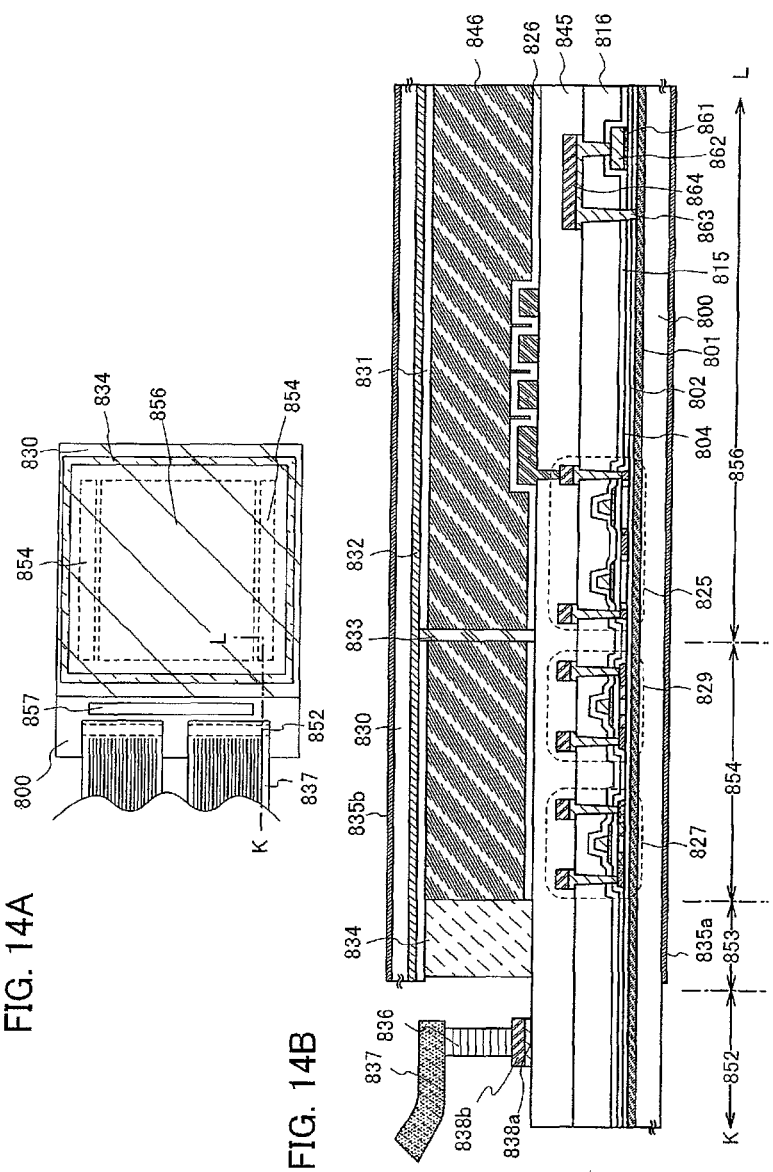
FIG. 14A is a top plan view of a liquid crystal display device of the invention.
FIG. 14B is a cross-sectional view thereof.

FIG. 14A is a top plan view of a liquid crystal display device in this embodiment, and FIG. 14B is a cross-sectional view thereof. This embodiment is an example of a manufacturing method of a liquid crystal display device which has the structure shown in Embodiment Mode 1. Accordingly, the degree of freedom of a space between a common electrode (corresponding to the conductive film 115 in FIG. 1) and a pixel electrode (corresponding to the pixel electrodes 113 and 114 in FIG. 1) is increased. Since optimal values for an arrangement interval and the width of an opening of a pixel electrode are changed depending on a distance between the pixel electrode and the common electrode, the size, the width, and the interval of the opening can be freely set. Further, a gradient of an electric field applied between the electrodes can be controlled, and an electric field parallel to a substrate can be easily increased, for example. That is, in a display device using a liquid crystal, since liquid crystal molecules aligned in parallel to a substrate (so-called homogeneous alignment) can be controlled in a direction parallel to the substrate, a viewing angle is widened by applying an optimal electric field.

First, as shown in FIG. 15A, a conductive film 801 having a light-transmitting property is formed over a substrate 800. The substrate 800 is a glass substrate, a quartz substrate, a substrate formed of an insulator such as alumina, a plastic substrate with heat resistance high enough to withstand a processing temperature of subsequent steps, a silicon substrate, or a metal plate. Alternatively, the substrate 800 may be a substrate in which an insulating film such as a silicon oxide film or a silicon nitride film is formed on a surface of metal such as stainless steel, a semiconductor substrate, or the like. Note that when a plastic substrate is used as the substrate 800, it is preferable to use a plastic substrate having a relatively high glass transition point, such as PC (polycarbonate), PES (polyethersulfone), PET (polyethylene terephthalate), or PEN (polyethylene naphthalate).

The conductive film 801 is, for example, an indium tin oxide (ITO) film, an indium tin oxide film containing a Si element, or an film using a material (in this specification, also referred to as indium zinc oxide (IZO)) formed using a target in which zinc oxide (ZnO) of 2 to 20 wt % is mixed with indium oxide.

Next, an insulating film 802 is formed as a base film over the conductive film 801 and the substrate 800. The insulating film 802 is, for example, a film in which a silicon oxide film is stacked on a silicon nitride film; however, it may be another insulator (e.g., a silicon oxide film containing nitrogen or a silicon nitride film containing oxygen).

Here, by performing nitriding with high-density plasma on a surface of the insulating film 802 formed of the silicon oxide film, the silicon oxide film containing nitrogen, or the like, a silicon nitride film may be formed on the surface of the insulating film 802.

For example, high-density plasma is generated by using a microwave of 2.45 GHz, and has an electron density of $1\times10^{11}$ to $1\times10^{13}$/cm$^3$, an electron temperature of 2 eV or less, and an ion energy of 5 eV or less. Such high-density plasma has low kinetic energy of active species, and can form a film with less plasma damage and fewer defects compared with conventional plasma treatment. A distance from an antenna generating a microwave to the insulating film 802 is set to 20 to 80 mm, and preferably 20 to 60 mm.

The surface of the insulating film 802 can be nitrided by performing the high-density plasma treatment in a nitrogen atmosphere, such as an atmosphere including nitrogen and rare gas, an atmosphere including nitrogen, hydrogen, and rare gas, or an atmosphere including ammonia and rare gas.

Since a silicon nitride film can suppress impurity diffusion from the substrate 800 and can be formed to be extremely thin by the high-density plasma treatment, influence of stress on a semiconductor film to be formed thereover can be reduced.

Then, as shown in FIG. 15B, a crystalline semiconductor film (e.g., a polycrystalline silicon film) is formed as a semiconductor film 803 over the insulating film 802. Examples of a method of forming the crystalline semiconductor film include a method of directly forming the crystalline semiconductor film over the insulating film 802, and a method of forming an amorphous semiconductor film over the insulating film 802 and then crystallizing the amorphous semiconductor film.

As a method for crystallizing the amorphous semiconductor film, a method of laser light irradiation, a method of thermal crystallization using an element which promotes crystallization of a semiconductor film (e.g., a metal element such as nickel), or a method of laser light irradiation after thermal crystallization using an element which promotes crystallization of the semiconductor film can be used. It is needless to say that a method of thermal crystallization of the amorphous semiconductor film without using the above-described element can also be used; however, it is limited to the case of a substrate which can withstand high temperature, such as a quartz substrate or a silicon wafer.

When laser irradiation is used, a continuous wave laser beam (a CW laser beam) or a pulsed laser beam (a pulse laser beam) can be used. As a laser beam which can be used here, a laser emitted from one or more of the following can be used: a gas laser such as an Ar laser, a Kr laser, or an excimer laser; a laser of which a medium is single crystalline YAG; YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, added with one or more of Nd, Yb, Cr, Ti, Ho, Er, Tm, and Ta as a dopant; a glass laser; a ruby laser; an alexandrite laser; a Ti:sapphire laser; a copper vapor laser; or a gold vapor laser. Crystals with a large grain size can be obtained by irradiation with a fundamental wave of such a laser beam or second to fourth harmonics of the fundamental wave. For example, the second harmonic (532 nm) or the third harmonic (355 nm) of an Nd:YVO4 laser (fundamental wave of 1064 nm) can be used. In this case, a power density of the laser is needed to be approximately 0.01 to 100 MW/cm$^2$ (preferably, 0.1 to 10 MW/cm$^2$). Irradiation is performed with a scanning rate of approximately 10 to 2000 cm/sec.

Note that a laser of which a medium is single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ added with one or more of Nd, Yb, Cr, Ti, Ho, Er, Tm, and Ta as a dopant; an Ar ion laser; or a Ti:sapphire laser can be continuously oscillated, and pulse oscillation thereof can be performed at a repetition rate of 10 MHz or more by performing Q-switch operation, mode locking, or the like. When a laser beam is oscillated at a repetition rate of 10 MHz or more, a semiconductor film is irradiated with the next pulse while the semiconductor film is melted by the laser and solidified. Accordingly, unlike the case of using a pulsed laser with a low repetition rate, a solid-liquid interface can be continuously moved in the semiconductor film; thus, crystal grains which continuously grow in a scanning direction can be obtained.

When ceramic (polycrystal) is used as a medium, the medium can be formed to have a desired shape for a short time and at low cost. When a single crystalline is used, a columnar medium with several mm in diameter and several tens of mm in length is used. When the ceramic is used, a medium larger than the case of using the single crystalline can be formed.

A concentration of a dopant such as Nd or Yb in a medium, which directly contributes to light emission, cannot be changed largely in either case of the single crystalline or the polycrystal; thus, there is some limitation on improvement in output of a laser by increasing the concentration of the dopant. However, in the case of ceramic, the size of the medium can be significantly increased as compared with the case of the single crystalline; thus, drastic improvement in output of a laser can be realized.

In addition, in the case of ceramic, a medium with a parallelepiped shape or a rectangular parallelepiped shape can be easily formed. When a medium having such a shape is used and oscillated light is made travel in a zigzag manner inside the medium, a path of the oscillated light can be made long. Therefore, amplification is increased, and a laser beam can be oscillated at high output. Further, since a cross section of a laser beam emitted from the medium having such a shape has a quadrangular shape, it has an advantage over a circular beam in being shaped into a linear beam. By shaping a laser beam emitted in such a manner by using an optical system, a linear beam having a length of 1 mm or less on a lateral side and a length of several mm to several m on a longitudinal side can be easily obtained. Furthermore, when a medium is uniformly irradiated with excited light, energy distribution of a linear beam becomes uniform in a longitudinal direction.

A semiconductor film is irradiated with this linear beam, so that the whole surface of the semiconductor film can be annealed more uniformly. When uniform annealing is needed from one end to the other end of the linear beam, ingenuity such as arrangement in which slits are provided in both ends of the linear beam to shield light at a portion where energy is attenuated is necessary.

When a semiconductor film is annealed using the thus obtained linear beam having uniform intensity and an electronic device is formed by using this semiconductor film, characteristics of the electronic device are favorable and uniform.

As the method for crystallizing the amorphous semiconductor film by heating with an element which promotes crystallization of the semiconductor film, an amorphous semiconductor film (also referred to as an amorphous silicon film) is doped with a metal element which promotes crystallization of the semiconductor film, and then heat treatment is performed so that the amorphous semiconductor film is crystallized with the doped region as a nucleus.

Alternatively, an amorphous semiconductor film can be crystallized by performing irradiation with strong light instead of heat treatment. In this case, one or a combination of infrared light, visible light, and ultraviolet light can be used. Typically, light emitted from a halogen lamp, a metal halide lamp, a xenon arc lamp, a carbon arc lamp, a high pressure sodium lamp, or a high pressure mercury lamp is used. A lamp light source is lighted for 1 to 60 seconds, preferably 30 to 60 seconds, and such lighting is repeated 1 to 10 times, preferably 2 to 6 times. The light emission intensity of the lamp light source is decided as appropriate, so that the semiconductor film is instantaneously heated up to approximately 600 to 1000° C. Note that when necessary, heat treatment may be performed in order to discharge hydrogen contained in the amorphous semiconductor film having an amorphous structure before irradiation with strong light. Alternatively, crystallization may be performed by both heat treatment and irradiation with strong light.

After the heat treatment, the crystalline semiconductor film may be irradiated with the laser light in the atmospheric air or an oxygen atmosphere in order to increase the degree of crystallinity (a ratio of crystalline components in the whole volume of the film) of the crystalline semiconductor film and to correct defects which remain in crystalline grains. The laser light can be selected from the aforementioned laser light.

The doped elements are needed to be removed from the crystalline semiconductor film, and the method is described below.

First, a surface of the crystalline semiconductor film is treated with a solution containing ozone (typically, ozone water), so that a barrier layer formed of an oxide film (called chemical oxide) having a thickness of 1 to 10 nm is formed on the surface of the crystalline semiconductor film. The barrier layer functions as an etching stopper when only a gettering layer is selectively removed in a subsequent step.

Then, a gettering layer containing a rare gas element is formed as a gettering site over the barrier layer. Here, a semiconductor film containing a rare gas element is formed as the gettering layer by a CVD method or a sputtering method. When the gettering layer is formed, the sputtering conditions are controlled as appropriate so that a rare gas element is added to the gettering layer. The rare gas element may be one or more of helium (He), neon (Ne), argon (Ar), krypton (Kr), and xenon (Xe).

Note that when the gettering layer is formed by using a source gas containing phosphorus, which is an impurity element, or by using a target containing phosphorus, gettering can be performed by utilizing the coulomb force of phosphorus in addition to gettering using the rare gas element. In gettering, a metal element (such as nickel) tends to move to a region having a high concentration of oxygen; therefore, the concentration of oxygen contained in the gettering layer is preferably set at, for example, $5 \times 10^{18}$ cm$^{-3}$ or higher.

Next, the crystalline semiconductor film, the barrier layer, and the gettering layer are subjected to thermal treatment (e.g., heat treatment or irradiation with strong light), so that the metal element (such as nickel) is gettered; thus, the metal element in the crystalline semiconductor film is lowered in concentration or removed.

Next, a known etching method is performed using the barrier layer as the etching stopper so that only the gettering layer is selectively removed. After that, the barrier layer formed of an oxide film is removed by, for example, an etchant containing hydrofluoric acid.

Here, impurity ions may be doped in consideration of threshold characteristics of a TFT to be manufactured.

Next, a photo resist film (not shown) is applied over the semiconductor film 803 by a coating method, and is exposed to light and developed. A coating method includes a spin coating method, a spray method, a screen printing method, a paint method, or the like. Thus, a resist is formed over the semiconductor film 803. Then, the semiconductor film 803 is etched using the resist as a mask. Thus, island-shaped semiconductor films 872, 873, and 874 in which thin film transistors are formed are formed over the insulating film 802.

Then, after surfaces of the island-shaped semiconductor films 872 to 874 are cleaned with an etchant containing hydrofluoric acid or the like, a gate insulating film 804 having a thickness of 10 to 200 nm is formed over the island-shaped semiconductor films 872 to 874. The gate insulating film 804 is formed of an insulating film containing silicon as a main component, such as a silicon oxide film, a silicon nitride film, a silicon oxide film containing nitrogen, or a silicon nitride film containing oxygen. Further, the gate insulating film may have a single-layer structure or a stacked-layer structure. Note that the gate insulating film 804 is also formed over the insulating film 802.

After the gate insulating film 804 is formed, gate electrodes 865, 866, 867, and 868; an electrode 869; impurity regions 807a, 807b, 808a, 808b, 809a, 809b, 810a, 810b, 813a, 813b, 813c, 814a, 814b, 814c, and 814d; and channel formation regions 895, 896, and 897 (897a and 897b) are formed (see FIG. 15D).

The gate electrode 865 of a TFT 827 includes a lower gate electrode 805a and an upper gate electrode 806a. The gate electrode 866 of a TFT 829 includes a lower gate electrode 805b and an upper gate electrode 806b. The gate electrode 867 of a TFT 825 includes a lower gate electrode 805c and an upper gate electrode 806c, and the gate electrode 868 of the TFT 825 includes a lower gate electrode 805d and an upper gate electrode 806d.

The electrode 869 includes a lower electrode 861 and an upper electrode 862.

Each of the impurity regions 807a and 807b is a source region or a drain region of the TFT 827. The impurity regions 808a and 808b are low concentration impurity regions of the TFT 827. The channel formation region 895 is located between the impurity regions 808a and 808b.

Each of the impurity regions 809a and 809b are a source region or a drain region of the TFT 829. The impurity regions 810a and 810b are low concentration impurity regions of the TFT 829. The channel formation region 896 is located between the impurity regions 810a and 810b.

Each of the impurity regions 813a and 813c are a source region or a drain region of the TFT 825. The impurity region 813b is formed in the same step as the impurity regions 813a and 813c. The impurity regions 814a, 814b, 814c, and 814d are low concentration impurity regions of the TFT 825. The channel formation region 897a is located between the impurity regions 814a and 814b. The channel formation region 897b is located between the impurity regions 814c and 814d.

In this embodiment, the impurity regions 809a, 809b, 810a, 810b, 813a to 813c, and 814a to 814d are n-type impurity regions, and include an impurity element imparting n-type conductivity, such as phosphorus (P) or arsenic (As). The impurity regions 809a, 809b, and 813a to 813c are high concentration impurity regions, and they have impurity concentrations higher than those of the impurity regions 810a, 810b, and 814a to 814d, which are low concentration impurity regions.

In this embodiment, the impurity regions 807a, 807b, 808a, and 808b are p-type impurity regions, and include an impurity element imparting p-type conductivity, such as boron (B). The impurity regions 807a and 807b are high concentration impurity regions, and they have impurity concentrations higher than those of the impurity regions 808a and 808b, which are low concentration impurity regions.

That is, the TFTs 829 and 825 are n-channel transistors, and the TFT 827 is a p-channel transistor.

A manufacturing method of the gate electrodes 865 to 868 and the electrode 869 is described below.

After the gate insulating film 804 is formed, the gate insulating film 804 is cleaned. Then, a first conductive film and a second conductive film are formed in this order over the gate insulating film 804. For example, the first conductive film is a tungsten film and the second conductive film is a tantalum nitride film.

Next, a photo resist film is applied over the second conductive film, and is exposed to light and developed. Thus, a resist is formed over the second conductive film. Then, by using the resist as a mask, the first conductive film and the second conductive film are etched under a first condition, and further, the second conductive film is etched under a second condition. Thus, the lower gate electrode 805a and the upper gate electrode 806a are formed over the island-shaped semiconductor film 872; the lower gate electrode 805b and the upper gate electrode 806b are formed over the island-shaped semiconductor film 873; the lower gate electrode 805c and the upper gate electrode 806c, and the lower gate electrode 805d and the upper gate electrode 806d are formed over the island-shaped semiconductor film 874.

Inclined angles of side surfaces of the lower gate electrodes 805a to 805d are more moderate than inclined angles of side surfaces of the upper gate electrodes 806a to 806d.

In addition, the lower electrode 861 and the upper electrode 862 are formed at the same time.

Thereafter, the photo resist film is removed.

The impurity regions 807a, 807b, 808a, 808b, 809a, 809b, 810a, 810b, 813a to 813c, and 814a to 814d may be formed by introducing impurities in a self-aligned manner by using the gate electrodes 865 to 868 as masks, or may be formed by introducing impurities using a resist mask.

Thereafter, an insulating film (not shown) covering almost all surface is formed. The insulating film is, for example, a silicon oxide film formed by a plasma CVD method.

Next, heat treatment is performed on the island-shaped semiconductor films 872 to 874 to activate the impurity elements doped therewith. The heat treatment is performed by a rapid thermal annealing method (RTA method) using a lamp light source, irradiation of a YAG laser or an excimer laser from the back surface, heat treatment using a furnace, or a combination of a plurality of these methods.

By the heat treatment, the impurity elements are activated, and simultaneously the element (e.g., a metal element such as nickel) which is used as a catalyst for crystallizing the island-shaped semiconductor films 873 and 874 are gettered in the impurity regions 809a, 809b, and 813a to 813c including a high concentration impurity (such as phosphorus), and a nickel concentration mainly in a portion to be the channel formation regions 896, 897a, and 897b in the island-shaped semiconductor films 873 and 874 is reduced. As a result, the crystallinity of the channel formation regions is improved. Accordingly, an off-current value of the TFT is reduced and high electron field-effect mobility can be obtained. Thus, a TFT having favorable characteristics can be obtained.

Next, an insulating film 815 is formed over the entire surface including above the island-shaped semiconductor films 872 to 874. The insulating film 815 is, for example, a silicon nitride film formed by a plasma CVD method.

Then, a planarization film to be an interlayer insulating film 816 is formed over the insulating film 815. As the interlayer insulating film 816, a light-transmitting inorganic material (e.g., silicon oxide, silicon nitride, or silicon nitride containing oxygen); a photosensitive or non-photosensitive organic material (e.g., polyimide, acrylic, polyamide, polyimide amide, resist, or benzocyclobutene); a stacked-layer structure thereof; or the like is used. Alternatively, as another light-transmitting film used for the planarization film, an insulating film formed of a SiOx film containing an alkyl group obtained by a coating method, such as an insulating film formed using silica glass, an alkylsiloxane polymer, an alkylsilsesquioxane polymer, a hydrogen silsesquioxane polymer, a hydrogen alkylsilsesquioxane polymer, or the like can be used. Examples of siloxane-based polymers include coating insulating film materials such as PSB-K1 and PSB-K31 (product of Toray industries, Inc.) and ZRS-5PH (product of Catalysts & Chemicals Industries Co., Ltd.). The interlayer insulating film 816 may be a single-layer film or a multi-layer film.

Next, a photo resist film (not shown) is applied over the interlayer insulating film 816, and is exposed to light and developed. Thus, a resist is formed over the interlayer insulating film 816. Then, the interlayer insulating film 816, the insulating film 815, and the gate insulating film 804 are etched using the resist as a mask. Accordingly, contact holes 817a, 817b, 817c, 817d, 817e, 817f, 817g, and 817h are formed in the interlayer insulating film 816, the insulating film 815, and the gate insulating film 804.

The contact hole 817a is located over the impurity region 807a. The contact hole 817b is located over the impurity region 807b. The contact hole 817c is located over the impurity region 809a. The contact hole 817d is located over the impurity region 809b. The contact hole 817e is located over the impurity region 813a. The contact hole 817f is located over the impurity region 813c. The contact hole 817g is located over the conductive film 801. The contact hole 817h is located over the electrode 869.

Thereafter, the resist is removed.

Next, as shown in FIG. 16B, a first conductive film 875 is formed in the contact holes 817a to 817h and over the interlayer insulating film 816. The first conductive film 875 is a light-transmitting conductive film, such as an indium tin oxide film, a film of indium tin oxide containing silicon, or a film formed using a target in which zinc oxide of 2 to 20 wt % is mixed with indium oxide. Then, a second conductive film 876 is formed over the first conductive film 875. The second conductive film 876 is, for example, a metal film.

Next, a photo resist film 820 is applied over the second conductive film 876. Then, a reticle 840 is provided above the photo resist film 820. The reticle 840 has a structure where semi-transparent films 841a, 841b, 841c, 841d, 841e, 841f, and 841g are formed over a glass substrate, and light shielding films 842a, 842b, 842c, 842d, 842e, 842f, and 842g are formed over the semi-transparent films 841a, 841b, 841c, 841d, 841e, 841f, and 841g, respectively. The semi-transparent film 841a and the light shielding film 842a are located above the contact hole 817a. The semi-transparent film 841b and the light shielding film 842b are located above the contact hole 817b. The semi-transparent film 841c and the light shielding film 842c are located above the contact hole 817c. The semi-transparent film 841d and the light shielding film 842d are located above the contact hole 817d. The semi-transparent film 841e and the light shielding film 842e are located above the contact hole 817e. The semi-transparent film 841f and the light shielding film 842f are located above the contact hole 817f. The semi-transparent film 841g and the light shielding film 842g are located above the contact holes 817g and 871h.

Next, the photo resist film 820 is exposed to light using the reticle 840 as a mask. Thus, the photo resist film 820 is exposed to light except for portions below the light shielding films 842a to 842g and a lower layer of portions below the semi-transparent films 841a to 841g. Note that portions which are not exposed to light are denoted by regions 821a, 821b, 821c, 821d, 821e, 821f, and 821g.

Figure 17A:
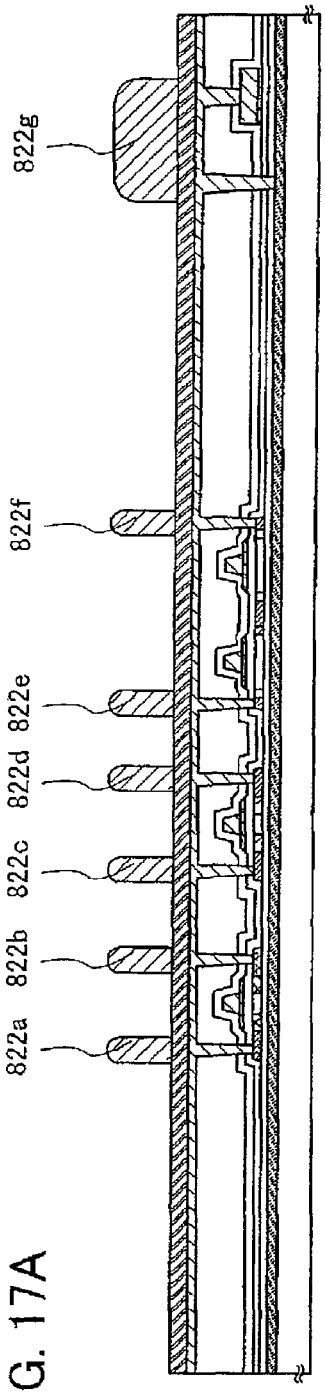
FIGS. 17A to 17C are cross-sectional views showing manufacturing steps of a liquid crystal display device of the invention.

Next, as shown in FIG. 17A, the photo resist film 820 is developed. Thus, portions of the photo resist film 820, which are exposed to light, are removed, and resists 822a, 822b, 822c, 822d, 822e, 822f, and 822g are formed. The resist 822a is located above the contact hole 817*a*. The resist 8226 is located above the contact hole 817*b*. The resist 822*c* is located above the contact hole 817*c*. The resist 822*d* is located above the contact hole 817*d*. The resist 822*e* is located above the contact hole 817*e*. The resist 822*f* is located above the contact hole 817*f*. The resist 822*g* is located above the contact holes 817*g* and 817*h*.

Figure 17B:
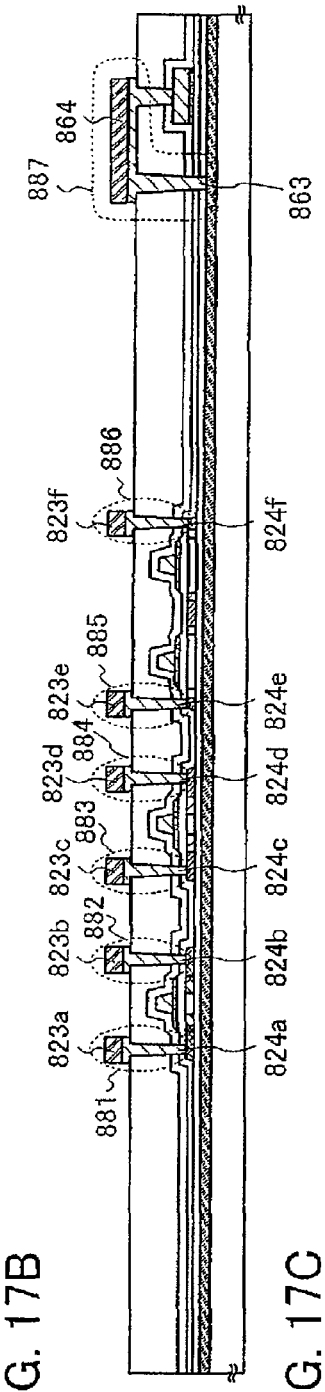

Then, as shown in FIG. 17B, the first conductive film 875 and the second conductive film 876 are etched using the resists 822*a* to 822*g* as masks. Thus, the first conductive film 818 and the second conductive film 819 in regions which are not covered with the resists 822*a* to 822*g* are removed.

Thereafter, the resists 822*a* to 822*g* are removed.

In such a manner, an electrode 881 having a lower electrode 824*a* and an upper electrode 823*a*, an electrode 882 having a lower electrode 824*b* and an upper electrode 823*b*, an electrode 883 having a lower electrode 824*c* and an upper electrode 823*c*, an electrode 884 having a lower electrode 824*d* and an upper electrode 823*d*, an electrode 885 having a lower electrode 824*e* and an upper electrode 823*e*, an electrode 886 having a lower electrode 824*f* and an upper electrode 823*f*, and an electrode 887 having a lower electrode 863 and an upper electrode 864 are formed with one resist and one etching treatment.

The electrodes 881 to 887 may be electrically connected to each other by forming an additional wiring or may be formed as wirings. In the latter case, the electrodes 881 to 887 are described as the wirings 881 to 887.

The electrodes 881, 882, 883, 884, 885, and 886 are electrically connected to the impurity regions 807*a*, 807*b*, 809*a*, 809*b*, 813*a*, and 813*c*, respectively. The electrode 887 is electrically connected to the conductive film 801 and the electrode 869.

Figure 17C:
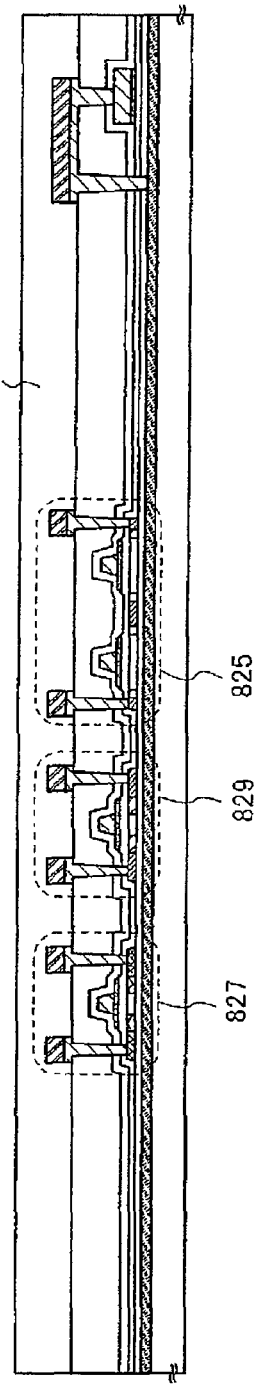
Figure 18:
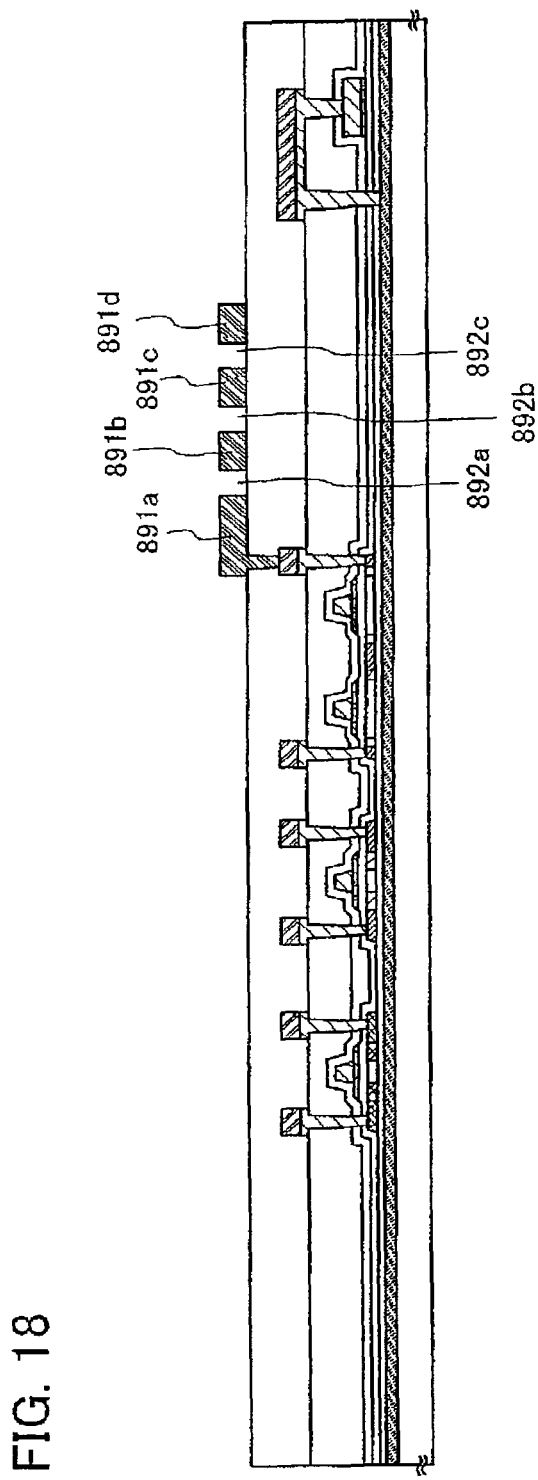
FIG. 18 is a cross-sectional view showing a manufacturing step of a liquid crystal display device of the invention.

Next, an interlayer insulating film 845 is formed over the interlayer insulating film 816 and the electrodes 881 to 887 (see FIG. 17C). The interlayer insulating film 845 may be formed of a material similar to that of the interlayer insulating film 816.

Next, a contact hole reaching the electrode 886 is formed in the interlayer insulating film 845. Then, pixel electrodes 891 (891*a*, 891*b*, 891*c*, 891*d*, and the like) which are electrically connected to the electrode 886 through the contact hole are formed (see FIG. 18). The pixel electrodes 891 is formed of a light-transmitting material, and a material similar to that of the conductive film 875 may be used. Grooves 892 (892*a*, 892*b*, 892*c*, and the like) are formed in the pixel electrodes 891. FIGS. 4, 7, 8A to 8D, and 9A to 9D may be used for shapes of the pixel electrodes 891 and the grooves 892.

Thereafter, a first alignment film 826 is formed. In such a manner, an active matrix substrate is formed.

Note that the TFTs 827 and 829 are formed in a gate signal line driver circuit 854. The TFTs separately formed are shown in FIG. 14B; however, the electrodes 882 and 883 may be electrically connected so that the TFTs 827 and 829 may be formed as a CMOS circuit.

Further, a first terminal electrode 838*a* and a second terminal electrode 838*b* (shown in FIG. 14B) which connect the active matrix substrate and the outside are formed.

Thereafter, as shown in a plan view of FIG. 14A and a cross-sectional view along a line K-L of FIG. 14B, an organic resin film such as an acrylic resin film is formed over the active matrix substrate. Then, the organic resin film is selectively removed by etching with the use of a mask film. Thus, a columnar spacer 833 is formed over the active matrix substrate. Next, after a sealing material 834 is formed in a sealing region 853, a liquid crystal is dropped on the active matrix substrate. Before the liquid crystal is dropped, a protective film may be formed over the sealing material to prevent the sealing material and the liquid crystal from reacting with each other.

Thereafter, an opposite substrate 830 provided with a color filter 832 and a second alignment film 831 is provided opposite to the active matrix substrate, and the two substrates are attached by the sealing material 834. At this time, the active matrix substrate and the opposite substrate 830 are attached with a uniform space therebetween by the spacer 833. Next, the space between the substrates is completely sealed by a sealing material (not shown). Thus, a liquid crystal 846 is sealed between the active matrix substrate and the opposite substrate.

Next, one or both of the active matrix substrate and the opposite substrate are cut into a desired shape when needed. Further, polarizing plates 835*a* and 835*b* are provided. Note that a retardation plate may be provided between the substrate 800 and the polarizing plate 835*a*, and between the opposite substrate 830 and the polarizing plate 835*b*. Furthermore, a retardation plate may be provided on surfaces of the polarizing plates 835*a* and 835*b*, which are opposite to surfaces in contact with the substrate, instead of between the substrate and the polarizing plate.

Next, a flexible printed circuit (hereinafter referred to as an FPC) 837 is connected to the second terminal electrode 838*b* provided in an external terminal connection region 852 through an anisotropy conductive film 836.

A structure of a liquid crystal display module formed in such a manner is described. A pixel region 856 is located at the center of the active matrix substrate. A plurality of pixels are formed in the pixel region 856. In FIG. 14A, the gate signal line driver circuits 854 for driving gate signal lines are provided above and below the pixel region 856. A source signal line driver circuit 857 for driving source signal lines is provided in a region between the pixel region 856 and the FPC 837. The gate signal line driver circuit 854 may be provided on only one side of the pixel region 856. An arrangement position of the gate signal line driver circuit 854 may be selected as appropriate in consideration of the substrate size or the like of the liquid crystal display module. Note that the gate signal line driver circuits 854 are preferably provided symmetrically with the pixel region 856 therebetween considering operation reliability, efficiency of driving, and the like. Signals are input from the FPC 837 to each driver circuit.

[Embodiment 2]

A liquid crystal display module according to Embodiment 1 is described with reference to FIGS. 19A, 19B, 20A, and 20B. A structure of a pixel portion 930 in each drawing is similar to the structure of the pixel region 856 in Embodiment 1, and a plurality of pixels are formed over the substrate 100.

Figure 19A:
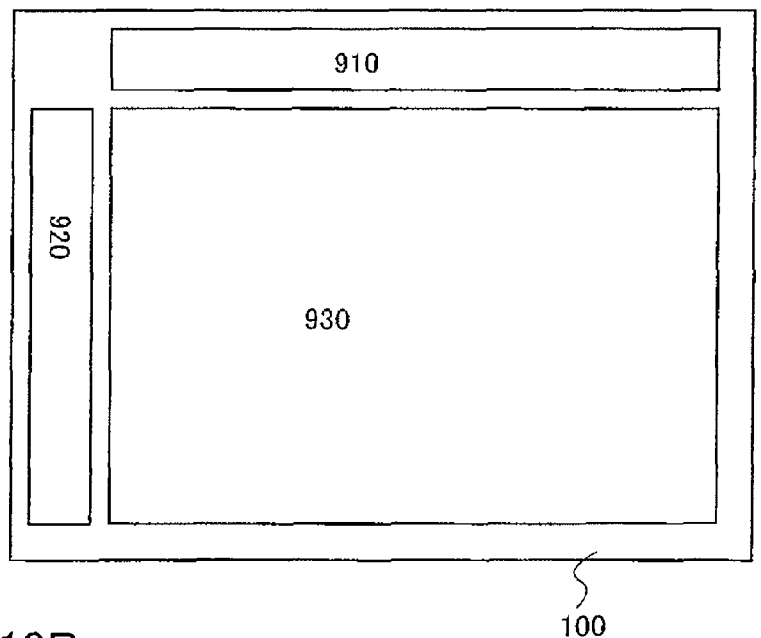
FIGS. 19A and 19B are circuit diagrams of a liquid crystal display device of the invention.
Figure 19B:
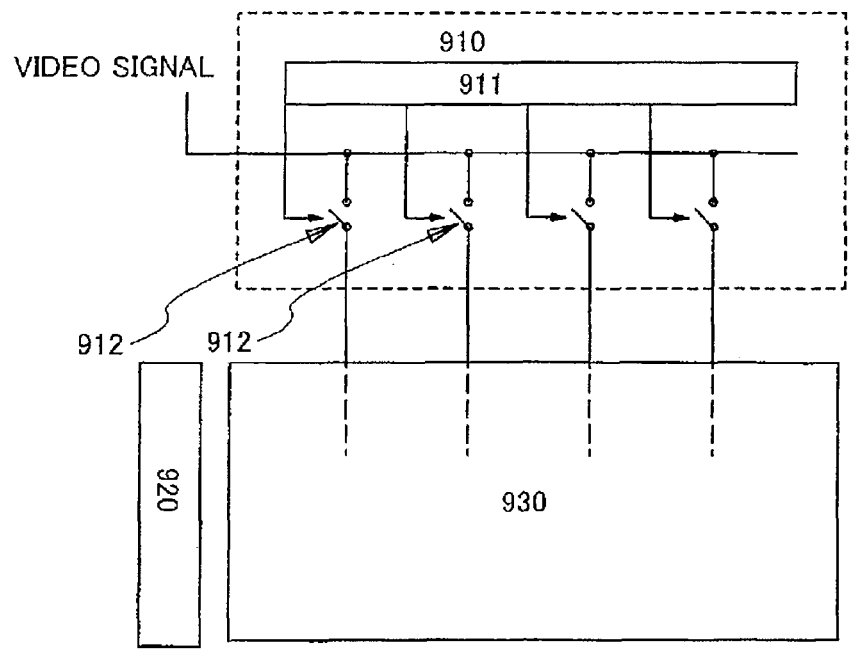

FIG. 19A is a plan view of a liquid crystal display module. FIG. 19B is a circuit diagram of a source driver (also referred to as a source signal line driver circuit) 910. As shown in FIG. 19A, both the source driver 910 and a gate driver (also referred to as a gate signal line driver circuit) 920 are formed over the substrate 100 same as the pixel portion 930. As shown in FIG. 19B, the source driver 910 includes a plurality of thin film transistors 912 for selecting the source signal line to which a video signal input is transmitted, and a shift register 911 for controlling the plurality of thin film transistors 912.

Figure 20A:
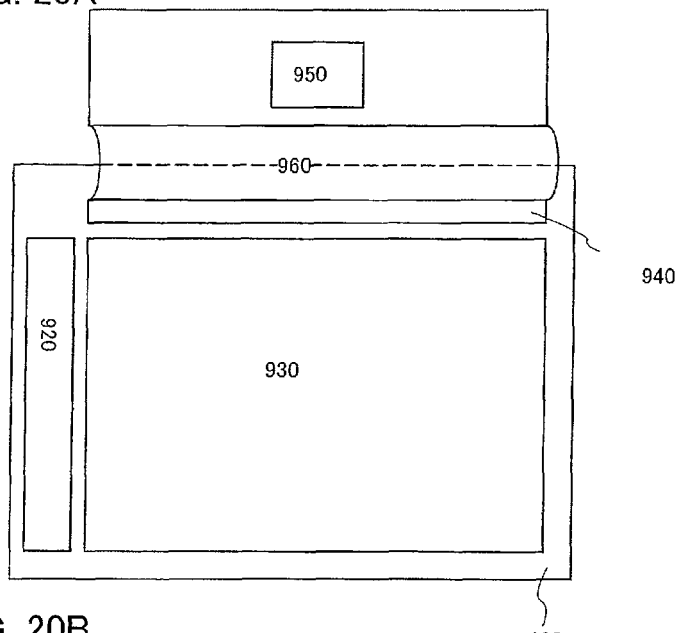
FIGS. 20A and 20B are circuit diagrams of a liquid crystal display device of the invention.
Figure 20B:
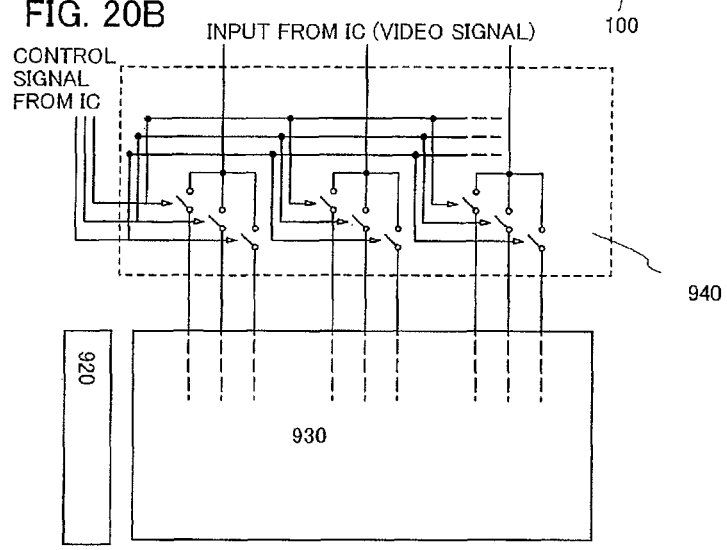

FIG. 20A is a plan view of a liquid crystal display module. FIG. 20B is a circuit diagram of a plurality of analog switch TFTs 940. As shown in FIG. 20A, the liquid crystal display module includes the plurality of analog switch TFTs 940 formed over the substrate 100 and an IC 950 formed separately from the substrate 100. The IC 950 and the plurality of analog switch TFTs 940 are electrically connected by an FPC 960, for example.

The IC 950 is formed using a single crystalline silicon substrate, for example. The IC 950 controls the plurality of analog switch TFTs 940 and inputs a video signal to the plurality of analog switch TFTs 940. The plurality of analog switch TFTs 940 for selecting the source signal line to which a video signal input is transmitted, based on a control signal from the IC.

According to the invention, a liquid crystal display device with a wide viewing angle and lower manufacturing cost than a conventional liquid crystal display device can be provided.

In the invention, since a conductive film is formed over an entire surface of a substrate, an impurity from the substrate can be prevented from being mixed into an active layer. Thus, a semiconductor device with high reliability can be obtained.

In the invention, when a semiconductor device including a top-gate thin film transistor is formed, a potential of a back gate is stabilized; thus, a semiconductor device with high reliability can be obtained.

[Embodiment 3]

Examples where the invention is applied to an electronic device are described with reference to FIGS. 21A to 21H. Each electronic device is provided with any of the display devices or the display modules in the aforementioned embodiment modes and embodiments.

Examples of electronic devices include cameras such as a video camera and a digital camera, a goggle-type display (a head-mounted display), a navigation system, an audio reproducing device (such as car audio components), a computer, a game machine, a portable information terminal (such as a mobile computer, a mobile phone, a mobile game machine, and an electronic book), an image reproducing device provided with a recording medium (specifically, a device for reproducing a recording medium such as a digital versatile disc (DVD) and having a display for displaying the reproduced image), and the like. FIGS. 21A to 21H show specific examples of these electronic devices.

Figure 21A:
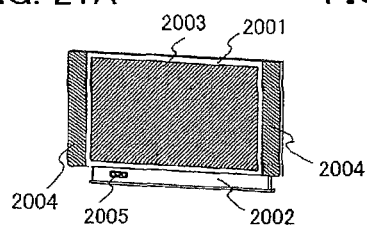
FIGS. 21A to 21H show examples of electronic devices each formed by using a liquid crystal display device of the invention.

FIG. 21A shows a monitor of a television receiving device or a personal computer, which includes a housing 2001, a support base 2002, a display portion 2003, speaker portions 2004, a video input terminal 2005, and the like. As the display portion 2003, any of the display devices or the display modules in the aforementioned embodiment modes and embodiments is used. A monitor in the invention has a wide viewing angle and can be formed at low manufacturing cost compared with a conventional monitor. Further, in a display portion of a monitor in the invention, a conductive film is formed over an entire surface of a substrate, so that an impurity from the substrate can be prevented from being mixed into an active layer. Thus, a monitor with high reliability can be obtained. Moreover, when a display portion including a top-gate thin film transistor is formed in a monitor of the invention, a potential of a back gate is stabilized; thus, a monitor with high reliability can be obtained.

Figure 21B:
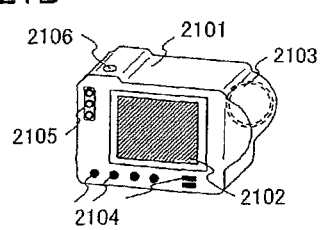

FIG. 21B shows a digital camera. An image receiving portion 2103 is provided in the front side of a main body 2101. A shutter button 2106 is provided at the upper portion of the main body 2101. A display portion 2102, operation keys 2104, and an external connection port 2105 are provided at the backside of the main body 2101. As the display portion 2102, any of the display devices or the display modules in the aforementioned embodiment modes and embodiments is used. A digital camera in the invention has a wide viewing angle and can be formed at low manufacturing cost compared with a conventional digital camera. Further, in a display portion of a digital camera in the invention, a conductive film is formed over an entire surface of a substrate, so that an impurity from the substrate can be prevented from being mixed into an active layer. Thus, a digital camera with high reliability can be obtained. Moreover, when a display portion including a top-gate thin film transistor is formed in a digital camera of the invention, a potential of a back gate is stabilized; thus, a digital camera with high reliability can be obtained.

Figure 21C:
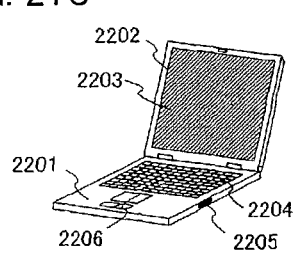

FIG. 21C shows a notebook personal computer. A main body 2201 is provided with a keyboard 2204, an external connection port 2205, and a pointing device 2206. A housing 2202 including a display portion 2203 is attached to the main body 2201. As the display portion 2203, any of the display devices or the display modules in the aforementioned embodiment modes and embodiments is used. A computer in the invention has a wide viewing angle and can be formed at low manufacturing cost compared with a conventional computer. Further, in a display portion of a computer in the invention, a conductive film is formed over an entire surface of a substrate, so that an impurity from the substrate can be prevented from being mixed into an active layer. Thus, a computer with high reliability can be obtained. Moreover, when a display portion including a top-gate thin film transistor is formed in a computer of the invention, a potential of a back gate is stabilized; thus, a computer with high reliability can be obtained.

Figure 21D:
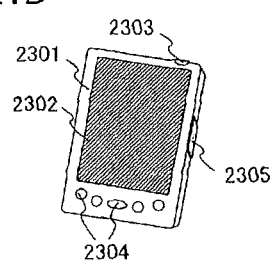

FIG. 21D shows a mobile computer, which includes a main body 2301, a display portion 2302, a switch 2303, operation keys 2304, an infrared port 2305, and the like. An active matrix display device is provided in the display portion 2302. As the display portion 2302, any of the display devices or the display modules in the aforementioned embodiment modes and embodiments is used. A computer in the invention has a wide viewing angle and can be formed at low manufacturing cost compared with a conventional computer. Further, in a display portion of a computer in the invention, a conductive film is formed over an entire surface of a substrate, so that an impurity from the substrate can be prevented from being mixed into an active layer. Thus, a computer with high reliability can be obtained. Moreover, when a display portion including a top-gate thin film transistor is formed in a computer of the invention, a potential of a back gate is stabilized; thus, a computer with high reliability can be obtained.

Figure 21E:
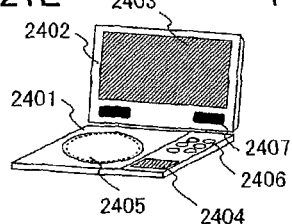

FIG. 21E shows an image reproducing device. A main body 2401 is provided with a display portion B 2404, a recording medium reading portion 2405, and an operation key 2406. A housing 2402 including a speaker portion 2407 and a display portion A 2403 is attached to the main body 2401. As each of the display portion A 2403 and the display portion B 2404, any of the display devices or the display modules in the aforementioned embodiment modes and embodiments is used. An image reproducing device in the invention has a wide viewing angle and can be formed at low manufacturing cost compared with a conventional image reproducing device. Further, in a display portion of an image reproducing device in the invention, a conductive film is formed over an entire surface of a substrate, so that an impurity from the substrate can be prevented from being mixed into an active layer. Thus, an image reproducing device with high reliability can be obtained. Moreover, when a display portion including a top-gate thin film transistor is formed in an image reproducing device of the invention, a potential of a back gate is stabilized; thus, an image reproducing device with high reliability can be obtained.

Figure 21F:
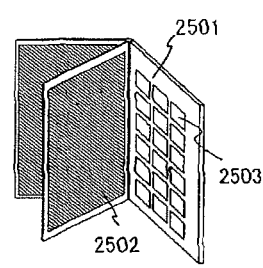

FIG. 21F shows an electronic book. A main body 2501 is provided with an operation key 2503. A plurality of display portions 2502 are attached to the main body 2501. As the display portions 2502, any of the display devices or the display modules in the aforementioned embodiment modes and embodiments is used. An electronic book in the invention has a wide viewing angle and can be formed at low manufacturing cost compared with a conventional electronic book. Further, in a display portion of an electronic book in the invention, a conductive film is formed over an entire surface of a substrate, so that an impurity from the substrate can be prevented from being mixed into an active layer. Thus, an electronic book with high reliability can be obtained. Moreover, when a display portion including a top-gate thin film transistor is formed in an electronic book of the invention, a potential of a back gate is stabilized; thus, an electronic book with high reliability can be obtained.

Figure 21G:
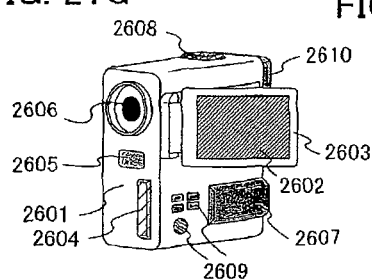

FIG. 21G shows a video camera. A main body 2601 is provided with an external connection port 2604, a remote control receiving portion 2605, an image receiving portion 2606, a battery 2607, an audio input portion 2608, operation keys 2609, and an eyepiece portion 2610. A housing 2603 including a display portion 2602 is attached to the main body 2601. As the display portions 2602, any of the display devices or the display modules in the aforementioned embodiment modes and embodiments is used. A video camera in the invention has a wide viewing angle and can be formed at low manufacturing cost compared with a conventional video camera. Further, in a display portion of a video camera in the invention, a conductive film is formed over an entire surface of a substrate, so that an impurity from the substrate can be prevented from being mixed into an active layer. Thus, a video camera with high reliability can be obtained. Moreover, when a display portion including a top-gate thin film transistor is formed in a video camera of the invention, a potential of a back gate is stabilized; thus, a video camera with high reliability can be obtained.

Figure 21H:
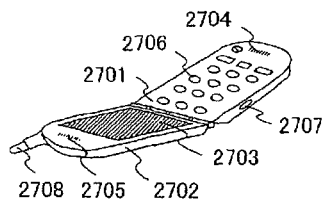

FIG. 21H shows a mobile phone, which includes a main body 2701, a housing 2702, a display portion 2703, an audio input portion 2704, an audio output portion 2705, an operation key 2706, an external connection port 2707, an antenna 2708, and the like. As the display portions 2703, any of the display devices or the display modules in the aforementioned embodiment modes and embodiments is used. A mobile phone in the invention has a wide viewing angle and can be formed at low manufacturing cost compared with a conventional mobile phone. Further, in a display portion of a mobile phone in the invention, a conductive film is formed over an entire surface of a substrate, so that an impurity from the substrate can be prevented from being mixed into an active layer. Thus, a mobile phone with high reliability can be obtained. Moreover, when a display portion including a top-gate thin film transistor is formed in a mobile phone of the invention, a potential of a back gate is stabilized; thus, a mobile phone with high reliability can be obtained.

This application is based on Japanese Patent Application serial No. 2006-297009 filed in Japan Patent Office on Oct. 31, 2006, the entire contents of which are hereby incorporated by reference.

What is claimed is:

1. A liquid crystal display device comprising:
    a transistor over a substrate;
    a first insulating film over the transistor;
    a first conductive film electrically connected to the transistor;
    a second conductive film over the substrate;
    a liquid crystal over the first conductive film and the second conductive film;
    a second insulating film between the first conductive film and the second conductive film; and
    a wiring electrically connected to the second conductive film, wherein the wiring and a gate of the transistor are provided on a same surface,
    wherein the second conductive film overlaps with an entire region of a channel formation region of the transistor,
    wherein an orientation of the liquid crystal is configured to be controlled by an electric field between the first conductive film and the second conductive film, and
    wherein the first conductive film is in direct contact with the transistor.

2. The liquid crystal display device according to claim 1, wherein the second conductive film is provided over an entire surface of one side of the substrate.

3. The liquid crystal display device according to claim 1, wherein the second insulating film is provided over the second conductive film.

4. The liquid crystal display device according to claim 1, wherein the transistor is provided over the second insulating film.

5. The liquid crystal display device according to claim 1, wherein the transistor comprises a semiconductor layer comprising indium, gallium, and zinc.

6. The liquid crystal display device according to claim 1, wherein the first conductive film comprises a slit.

7. The liquid crystal display device according to claim 1, wherein the first insulating film is provided between the first conductive film and the second conductive film.

8. The liquid crystal display device according to claim 1, wherein the first conductive film is provided over the second conductive film.

9. A liquid crystal display device comprising:
    a transistor over a substrate;
    a first insulating film over the transistor;
    a first conductive film electrically connected to the transistor through a contact hole in the first insulating film;
    a second conductive film over the substrate;
    a liquid crystal over the first conductive film and the second conductive film;
    a second insulating film between the first conductive film and the second conductive film;
    a first wiring electrically connected to the second conductive film, wherein the first wiring and a gate of the transistor are provided on a same surface; and
    a second wiring electrically connected to the transistor,
    wherein the second conductive film overlaps with an entire region of a channel formation region of the transistor,
    wherein an orientation of the liquid crystal is configured to be controlled by an electric field between the first conductive film and the second conductive film,
    wherein the second wiring is wound,
    wherein an outline of the first conductive film is wound along a wind of the second wiring, and
    wherein the first conductive film is in direct contact with the transistor.

10. The liquid crystal display device according to claim 9, wherein the second conductive film is provided over an entire surface of one side of the substrate.

11. The liquid crystal display device according to claim 9, wherein the second insulating film is provided over the second conductive film.

12. The liquid crystal display device according to claim 9, wherein the transistor is provided over the second insulating film.

13. The liquid crystal display device according to claim 9, wherein the transistor comprises a semiconductor layer comprising indium, gallium, and zinc.

14. The liquid crystal display device according to claim 9, wherein the first conductive film comprises a slit.

15. The liquid crystal display device according to claim 9, wherein the first insulating film is provided between the first conductive film and the second conductive film.

16. The liquid crystal display device according to claim 9, wherein the first conductive film is provided over the second conductive film.

17. A liquid crystal display device comprising:
a first conductive film over a substrate;
a transistor overlapping with the first conductive film with a first insulating film interposed therebetween;
a second conductive film overlapping with the transistor with a second insulating film interposed therebetween, wherein the second conductive film is electrically connected to the transistor through a contact hole in the second insulating film;
a liquid crystal over the first conductive film and the second conductive film with a third insulating film interposed therebetween; and
a wiring electrically connected to the first conductive film, wherein the wiring and a gate of the transistor are provided on a same surface,
wherein an orientation of the liquid crystal is configured to be controlled by an electric field between the first conductive film and the second conductive film, and
wherein the second conductive film is in direct contact with the transistor.

18. The liquid crystal display device according to claim 17, wherein the first conductive film is provided over an entire surface of one side of the substrate.

19. The liquid crystal display device according to claim 17, wherein the first insulating film is provided over the first conductive film.

20. The liquid crystal display device according to claim 17, wherein the transistor is provided over the first insulating film.

21. The liquid crystal display device according to claim 17, wherein the transistor comprises a semiconductor layer comprising indium, gallium, and zinc.

22. The liquid crystal display device according to claim 17, wherein the second conductive film comprises a slit.

23. The liquid crystal display device according to claim 17, wherein the third insulating film is an alignment film.

24. The liquid crystal display device according to claim 17, wherein the second conductive film is provided over the first conductive film.

* * * * *

UNITED STATES PATENT AND TRADEMARK OFFICE
CERTIFICATE OF CORRECTION

PATENT NO. : 8,780,307 B2
APPLICATION NO. : 13/409288
DATED : July 15, 2014
INVENTOR(S) : Hajime Kimura It is certified that error appears in the above-identified patent and that said Letters Patent is hereby corrected as shown below:

In the Specification

Column 37, line 45 – replace "29G" with --29G,--;

Column 41, line 14 – replace "(Loft)" with --(Loff)--;

Column 44, line 10 – replace "(s-Si:H)" with --(µ-Si:H)--;

Column 53, line 18 – replace "Si" with --S1--;

Column 63, line 46 – replace "|$V_1$" with --$TR_1$--;

Column 64, line 43 – replace "|$V_1$|" with --|$V_2$|--;

Column 64, line 58 – replace "$TR_3$" with --$TR_1$--;

Column 79, line 41 – replace "YAG;" with --YAG,--;

Column 82, line 14 – replace "8976" with --897b--;

Column 82, line 26 – replace "8076" with --807b--;

Column 85, line 1 – replace "8226" with --822b--;

Column 85, line 2 – replace "8176" with --817b--; and

Column 86, line 21 – replace "8356" with --835b--.

Signed and Sealed this
Sixteenth Day of June, 2015

Michelle K. Lee
*Director of the United States Patent and Trademark Office*